(12) United States Patent
Kim et al.

(10) Patent No.: US 12,550,482 B2
(45) Date of Patent: Feb. 10, 2026

(54) PASSIVATION COVERED LIGHT EMITTING UNIT STACK

(71) Applicant: Seoul Viosys Co., Ltd., Ansan-si (KR)

(72) Inventors: Chang Yeon Kim, Ansan-si (KR); Jong Hyeon Chae, Ansan-si (KR); Chung Hoon Lee, Ansan-si (KR); Seong Gyu Jang, Ansan-si (KR); Jong Min Jang, Ansan-si (KR); Ho Joon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 17/847,122

(22) Filed: Jun. 22, 2022

(65) Prior Publication Data

US 2022/0393063 A1 Dec. 8, 2022

Related U.S. Application Data

(63) Continuation of application No. 17/475,273, filed on Sep. 14, 2021, which is a continuation of application
(Continued)

(51) Int. Cl.
*H10H 20/813* (2025.01)
*H01L 25/04* (2023.01)
(Continued)

(52) U.S. Cl.
CPC ....... *H10H 20/813* (2025.01); *H01L 25/0756* (2013.01); *H10H 20/821* (2025.01);
(Continued)

(58) Field of Classification Search
CPC ....... H01L 33/36; H01L 33/38; H01L 33/385; H01L 33/62; H10H 20/813; H10H 20/857;
(Continued)

(56) References Cited

U.S. PATENT DOCUMENTS

| 5,383,349 A | 1/1995 | Blake-Coleman |
| 5,583,349 A | 12/1996 | Norman et al. |

(Continued)

FOREIGN PATENT DOCUMENTS

| CN | 1170383 A | 1/1998 |
| CN | 1423345 | 6/2003 |

(Continued)

OTHER PUBLICATIONS

Non-Final Office Action mailed Jul. 6, 2023, in U.S. Appl. No. 17/539,050.

(Continued)

*Primary Examiner* — Jesse Y Miyoshi
(74) *Attorney, Agent, or Firm* — Oblon, McClelland, Maier & Neustadt, L.L.P.

(57) ABSTRACT

A light emitting chip including a light emitting structure including first, second, and third light emitting sub-units to emit light of a first color, a second color, and a third color and vertically stacked on each other, and having at least one mesa structure and at least one sidewall having a stepped structure; a plurality of vias electrically connected to the light emitting sub-units, each via has a top surface exposed from the light emitting structure and a bottom surface contacting the light emitting structure, a part of the bottom surfaces of the vias disposed on substantially the same level; and a first passivation layer covering at least a part of the light emitting structure, in which the first passivation layer has a bottom surface exposing the light emitting structure to permit light from the first, second, and third sub-units to be emitted from the light emitting chip.

22 Claims, 69 Drawing Sheets

Related U.S. Application Data

No. 16/198,784, filed on Nov. 22, 2018, now Pat. No. 11,282,981.

(60) Provisional application No. 62/694,632, filed on Jul. 6, 2018, provisional application No. 62/635,284, filed on Feb. 26, 2018, provisional application No. 62/590,870, filed on Nov. 27, 2017, provisional application No. 62/590,854, filed on Nov. 27, 2017.

(51) Int. Cl.

| | |
|---|---|
| *H01L 25/065* | (2023.01) |
| *H01L 25/07* | (2006.01) |
| *H01L 25/075* | (2006.01) |
| *H10H 20/01* | (2025.01) |
| *H10H 20/821* | (2025.01) |
| *H10H 20/825* | (2025.01) |
| *H10H 20/831* | (2025.01) |
| *H10H 20/833* | (2025.01) |
| *H10H 20/84* | (2025.01) |
| *H10H 20/851* | (2025.01) |
| *H10H 20/857* | (2025.01) |
| *H10K 59/32* | (2023.01) |

(52) U.S. Cl.
CPC ...... *H10H 20/8314* (2025.01); *H10H 20/833* (2025.01); *H10H 20/84* (2025.01); *H10H 20/8514* (2025.01); *H10H 20/857* (2025.01); *H01L 25/043* (2013.01); *H01L 25/0657* (2013.01); *H01L 25/074* (2013.01); *H01L 25/0753* (2013.01); *H10H 20/018* (2025.01); *H10H 20/825* (2025.01); *H10K 59/32* (2023.02)

(58) Field of Classification Search
CPC .......... H10H 20/8504; H10H 29/0364; H10H 29/857; H10H 59/32
See application file for complete search history.

(56) References Cited

U.S. PATENT DOCUMENTS

| | | | |
|---|---|---|---|
| 5,583,350 | A | 12/1996 | Norman et al. |
| 5,696,389 | A | 12/1997 | Ishikawa et al. |
| 5,703,436 | A | 12/1997 | Forrest et al. |
| 5,707,745 | A | 1/1998 | Forrest et al. |
| 5,739,552 | A | 4/1998 | Kimura et al. |
| 6,046,543 | A | 4/2000 | Bulovic et al. |
| 6,100,103 | A * | 8/2000 | Shim .............. H01L 25/0756 438/455 |
| 6,337,492 | B1 | 1/2002 | Jones et al. |
| 6,358,631 | B1 | 3/2002 | Forrest et al. |
| 6,365,270 | B2 | 4/2002 | Forrest et al. |
| 6,888,305 | B2 | 5/2005 | Weaver |
| 7,282,741 | B2 | 10/2007 | Kim et al. |
| 7,514,720 | B2 | 4/2009 | Kim et al. |
| 7,570,310 | B2 | 8/2009 | Harada et al. |
| 7,714,504 | B2 | 5/2010 | Forrest et al. |
| 7,732,803 | B2 | 6/2010 | Shum et al. |
| 7,977,688 | B2 | 7/2011 | Kim |
| 7,982,228 | B2 | 7/2011 | Choi et al. |
| 8,017,955 | B2 | 9/2011 | Wang et al. |
| 8,022,421 | B2 | 9/2011 | Hsueh et al. |
| 8,035,115 | B2 | 10/2011 | Ogihara et al. |
| 8,058,663 | B2 | 11/2011 | Fan et al. |
| 8,089,074 | B2 | 1/2012 | Kim et al. |
| 8,207,547 | B2 | 6/2012 | Lin |
| 8,283,191 | B2 | 10/2012 | Rode et al. |
| 8,324,803 | B2 | 12/2012 | Forrest et al. |
| 8,390,020 | B2 | 3/2013 | Tanaka et al. |
| 8,436,346 | B2 | 5/2013 | Ushikubo et al. |
| 8,466,542 | B2 | 6/2013 | Kriman et al. |
| 8,546,836 | B2 | 10/2013 | Kamiya et al. |
| 8,563,144 | B2 | 10/2013 | Kim et al. |
| 8,618,551 | B2 | 12/2013 | Nishikawa et al. |
| 8,624,274 | B2 | 1/2014 | Hsueh et al. |
| 8,766,295 | B2 | 7/2014 | Kim |
| 8,835,948 | B2 | 9/2014 | Chang et al. |
| 8,884,316 | B2 | 11/2014 | Weaver et al. |
| 8,941,566 | B2 | 1/2015 | Haase |
| 9,018,834 | B2 | 4/2015 | Ide et al. |
| 9,052,096 | B2 | 6/2015 | Nishimura et al. |
| 9,076,929 | B2 | 7/2015 | Katsuno et al. |
| 9,099,631 | B2 | 8/2015 | Yang et al. |
| 9,136,498 | B2 | 9/2015 | Skipor |
| 9,142,748 | B2 | 9/2015 | Ohmae et al. |
| 9,153,750 | B2 | 10/2015 | Seo et al. |
| 9,202,994 | B2 | 12/2015 | Hashimoto et al. |
| 9,252,380 | B2 | 2/2016 | Seo et al. |
| 9,281,446 | B2 | 3/2016 | Suh et al. |
| 9,312,249 | B2 | 4/2016 | Choi et al. |
| 9,318,651 | B2 | 4/2016 | Avramescu et al. |
| 9,337,400 | B2 | 5/2016 | Hashimoto et al. |
| 9,362,335 | B2 | 6/2016 | Von Malm |
| 9,379,286 | B2 | 6/2016 | Gaertner et al. |
| 9,406,908 | B2 | 8/2016 | Kim et al. |
| 9,419,031 | B1 | 8/2016 | Or-Bach et al. |
| 9,419,241 | B2 | 8/2016 | Furukawa et al. |
| 9,443,833 | B2 | 9/2016 | Oraw |
| 9,515,278 | B2 | 12/2016 | Suzuki et al. |
| 9,559,263 | B2 | 1/2017 | Matsui et al. |
| 9,577,012 | B2 | 2/2017 | Ooki et al. |
| 9,748,313 | B2 | 8/2017 | Tsuji et al. |
| 9,786,817 | B2 | 10/2017 | Kim et al. |
| 9,786,859 | B2 | 10/2017 | Yamae et al. |
| 9,847,051 | B2 | 12/2017 | Choi et al. |
| 9,853,187 | B2 | 12/2017 | Kim |
| 9,893,233 | B2 | 2/2018 | Kong et al. |
| 9,905,725 | B2 | 2/2018 | Lee |
| 9,960,212 | B2 | 5/2018 | Gee et al. |
| 9,960,390 | B2 | 5/2018 | Höfle et al. |
| 9,966,369 | B2 | 5/2018 | Kim et al. |
| 10,008,544 | B2 | 6/2018 | Park et al. |
| 10,056,535 | B2 | 8/2018 | Chang et al. |
| 10,069,036 | B2 | 9/2018 | Atanackovic |
| 10,079,265 | B1 | 9/2018 | Wu et al. |
| 10,134,813 | B2 | 11/2018 | Choi |
| 10,170,666 | B2 | 1/2019 | Cha et al. |
| 10,205,058 | B2 | 2/2019 | Lee |
| 10,304,811 | B2 | 5/2019 | Zhang et al. |
| 10,326,056 | B2 | 6/2019 | Jung et al. |
| 10,381,519 | B2 | 8/2019 | Seo et al. |
| 10,388,978 | B2 | 8/2019 | Morris-Cohen et al. |
| 10,418,577 | B2 | 9/2019 | Yoo et al. |
| 10,475,957 | B2 | 11/2019 | Cha et al. |
| 10,515,580 | B2 | 12/2019 | Henry et al. |
| 10,559,557 | B2 | 2/2020 | Chang et al. |
| 10,586,896 | B2 | 3/2020 | Shioji |
| 10,686,099 | B2 | 6/2020 | Huppmann et al. |
| 10,686,149 | B2 | 6/2020 | Park et al. |
| 10,811,475 | B2 | 10/2020 | Zhang et al. |
| 2001/0000005 | A1 | 3/2001 | Forrest et al. |
| 2002/0154259 | A1 | 10/2002 | Freidhoff et al. |
| 2003/0047742 | A1 | 3/2003 | Hen |
| 2003/0168989 | A1 | 9/2003 | Hen |
| 2003/0213967 | A1 | 11/2003 | Forrest et al. |
| 2004/0232433 | A1 | 11/2004 | Doverspike et al. |
| 2005/0062049 | A1 | 3/2005 | Lin et al. |
| 2005/0067627 | A1 | 3/2005 | Shen et al. |
| 2005/0140278 | A1 | 6/2005 | Kato |
| 2005/0206759 | A1 | 9/2005 | Fukunaga et al. |
| 2005/0238310 | A1 | 10/2005 | Hoshi et al. |
| 2005/0264550 | A1 | 12/2005 | Ohshima et al. |
| 2006/0006792 | A1 | 1/2006 | Strip |
| 2006/0027820 | A1 | 2/2006 | Cao |
| 2006/0040463 | A1 | 2/2006 | Sunohara |
| 2006/0091794 | A1 | 5/2006 | Agostinelli et al. |
| 2006/0097269 | A1 | 5/2006 | Lester |
| 2006/0231852 | A1 | 10/2006 | Kususe et al. |
| 2006/0255343 | A1 | 11/2006 | Ogihara et al. |
| 2006/0258026 | A1 | 11/2006 | Miyachi et al. |

(56) References Cited

U.S. PATENT DOCUMENTS

| | | |
|---|---|---|
| 2007/0069220 A1 | 3/2007 | Ogihara |
| 2007/0120465 A1 | 5/2007 | Ito et al. |
| 2007/0170444 A1* | 7/2007 | Cao ............... H10H 29/14 257/E33.012 |
| 2007/0181887 A1 | 8/2007 | Kijima et al. |
| 2007/0222922 A1 | 9/2007 | Jin et al. |
| 2008/0099770 A1 | 5/2008 | Mendendorp et al. |
| 2008/0116470 A1 | 5/2008 | Nishimura |
| 2008/0128728 A1 | 6/2008 | Nemchuk et al. |
| 2008/0130278 A1 | 6/2008 | Ushikubo et al. |
| 2008/0143941 A1 | 6/2008 | Tomita et al. |
| 2008/0211416 A1 | 9/2008 | Negley et al. |
| 2008/0251799 A1* | 10/2008 | Ikezawa ............ H01L 25/0756 257/89 |
| 2008/0308819 A1 | 12/2008 | Louwsma et al. |
| 2009/0009101 A1 | 1/2009 | Kang et al. |
| 2009/0078955 A1 | 3/2009 | Fan et al. |
| 2009/0114931 A1 | 5/2009 | Hsueh et al. |
| 2009/0256995 A1 | 10/2009 | Ogasawara et al. |
| 2009/0272989 A1 | 11/2009 | Shum et al. |
| 2010/0032691 A1 | 2/2010 | Kim |
| 2010/0051975 A1 | 3/2010 | Suzuki et al. |
| 2010/0065867 A1 | 3/2010 | Unno |
| 2010/0066239 A1 | 3/2010 | Spindler et al. |
| 2010/0076527 A1 | 3/2010 | Hammond et al. |
| 2010/0084668 A1 | 4/2010 | Choi et al. |
| 2010/0144073 A1 | 6/2010 | Louwsma et al. |
| 2010/0159792 A1 | 6/2010 | Visser et al. |
| 2010/0187988 A1 | 7/2010 | Forrest et al. |
| 2010/0224860 A1 | 9/2010 | Ibbetson et al. |
| 2010/0276706 A1 | 11/2010 | Herrmann |
| 2011/0057211 A1 | 3/2011 | Lee et al. |
| 2011/0068330 A1 | 3/2011 | Akimoto et al. |
| 2011/0086486 A1 | 4/2011 | Lee et al. |
| 2011/0156087 A1 | 6/2011 | Tanaka et al. |
| 2011/0156114 A1 | 6/2011 | Park et al. |
| 2011/0204376 A1 | 8/2011 | Su et al. |
| 2011/0215714 A1 | 9/2011 | Seo et al. |
| 2012/0034714 A1 | 2/2012 | Tsai et al. |
| 2012/0094414 A1 | 4/2012 | Or-Bach et al. |
| 2012/0124903 A1 | 5/2012 | Takeuchi |
| 2012/0223875 A1 | 9/2012 | Lau et al. |
| 2012/0231572 A1 | 9/2012 | Or-Bach et al. |
| 2012/0236532 A1 | 9/2012 | Koo et al. |
| 2012/0305959 A1 | 12/2012 | Yu et al. |
| 2013/0009543 A1 | 1/2013 | Kadoma et al. |
| 2013/0056717 A1 | 3/2013 | Ishihara et al. |
| 2013/0056785 A1 | 3/2013 | Hwang |
| 2013/0069191 A1 | 3/2013 | Or-Bach et al. |
| 2013/0075696 A1 | 3/2013 | Hsieh et al. |
| 2013/0153873 A1 | 6/2013 | Watanabe et al. |
| 2013/0163632 A1 | 6/2013 | Arai et al. |
| 2013/0207139 A1 | 8/2013 | Weidner et al. |
| 2013/0228757 A1 | 9/2013 | Su et al. |
| 2013/0264587 A1 | 10/2013 | Chang |
| 2013/0285076 A1 | 10/2013 | Liu et al. |
| 2013/0292711 A1 | 11/2013 | Ogihara et al. |
| 2014/0145161 A1 | 5/2014 | Naijo |
| 2014/0184062 A1 | 7/2014 | Kolodin |
| 2014/0191243 A1 | 7/2014 | Singh et al. |
| 2014/0252382 A1 | 9/2014 | Hashimoto et al. |
| 2014/0284633 A1 | 9/2014 | Tsay et al. |
| 2015/0001572 A1 | 1/2015 | Katsuno et al. |
| 2015/0008390 A1 | 1/2015 | Lewis et al. |
| 2015/0099728 A1 | 4/2015 | Frank et al. |
| 2015/0221627 A1 | 8/2015 | Nielson et al. |
| 2015/0270512 A1 | 9/2015 | Yamae et al. |
| 2015/0325555 A1 | 11/2015 | Hashimoto et al. |
| 2015/0340348 A1 | 11/2015 | Katsuno et al. |
| 2015/0340641 A1 | 11/2015 | Kuroki |
| 2015/0362165 A1 | 12/2015 | Chu et al. |
| 2015/0380681 A1 | 12/2015 | Furukawa et al. |
| 2016/0005375 A1 | 1/2016 | Naijo et al. |
| 2016/0043290 A1 | 2/2016 | Sogo et al. |
| 2016/0064439 A1 | 3/2016 | Or-Bach et al. |
| 2016/0099384 A1 | 4/2016 | Kim et al. |
| 2016/0155378 A1 | 6/2016 | Hack et al. |
| 2016/0155892 A1 | 6/2016 | Li et al. |
| 2016/0163940 A1 | 6/2016 | Huang et al. |
| 2016/0293783 A1 | 10/2016 | Shiomi et al. |
| 2016/0315068 A1 | 10/2016 | Lee et al. |
| 2016/0322293 A1 | 11/2016 | Kimura et al. |
| 2016/0336482 A1 | 11/2016 | Lu et al. |
| 2016/0359143 A1 | 12/2016 | Osawa et al. |
| 2017/0012173 A1 | 1/2017 | Lee et al. |
| 2017/0025593 A1 | 1/2017 | Bower et al. |
| 2017/0062680 A1 | 3/2017 | Yoo et al. |
| 2017/0064785 A1 | 3/2017 | Kim et al. |
| 2017/0069612 A1 | 3/2017 | Zhang et al. |
| 2017/0084876 A1 | 3/2017 | Suzuki |
| 2017/0104035 A1 | 4/2017 | Lee et al. |
| 2017/0117259 A1 | 4/2017 | Xu |
| 2017/0133357 A1 | 5/2017 | Kuo et al. |
| 2017/0162746 A1 | 6/2017 | Cha et al. |
| 2017/0186917 A1* | 6/2017 | Jeon ............... H10H 20/851 |
| 2017/0194298 A1 | 7/2017 | Negley et al. |
| 2017/0194535 A1 | 7/2017 | Park et al. |
| 2017/0213502 A1 | 7/2017 | Henry et al. |
| 2017/0213989 A1 | 7/2017 | Tsunoi et al. |
| 2017/0236866 A1 | 8/2017 | Lee et al. |
| 2017/0250329 A1 | 8/2017 | Takeya et al. |
| 2017/0286044 A1 | 10/2017 | Kim et al. |
| 2017/0288088 A1 | 10/2017 | Won Cheol |
| 2017/0288093 A1 | 10/2017 | Cha et al. |
| 2017/0309677 A1 | 10/2017 | Kuroki et al. |
| 2017/0331009 A1 | 11/2017 | Shioji |
| 2017/0331021 A1 | 11/2017 | Chae et al. |
| 2017/0338275 A1 | 11/2017 | Banna et al. |
| 2017/0345801 A1 | 11/2017 | Lin et al. |
| 2018/0040665 A1 | 2/2018 | Ohmae et al. |
| 2018/0083170 A1 | 3/2018 | Shepherd |
| 2018/0151548 A1 | 5/2018 | Pfeffer et al. |
| 2018/0156965 A1 | 6/2018 | El-Ghoroury et al. |
| 2018/0158808 A1 | 6/2018 | Zhang et al. |
| 2018/0166499 A1 | 6/2018 | Pfeuffer et al. |
| 2018/0212104 A1 | 7/2018 | Chu |
| 2018/0233492 A1 | 8/2018 | Liu et al. |
| 2018/0240952 A1 | 8/2018 | Moon et al. |
| 2018/0283642 A1 | 10/2018 | Liao et al. |
| 2019/0053347 A1 | 2/2019 | Lee et al. |
| 2019/0074324 A1 | 3/2019 | Kim et al. |
| 2019/0097088 A1 | 3/2019 | Huppmann et al. |
| 2019/0148612 A1 | 5/2019 | Lee et al. |
| 2019/0165207 A1 | 5/2019 | Kim et al. |
| 2019/0181181 A1 | 6/2019 | Yeon et al. |
| 2019/0229149 A1 | 7/2019 | Yoo |
| 2019/0267436 A1 | 8/2019 | Zhang et al. |
| 2019/0333964 A1 | 10/2019 | Lee et al. |
| 2020/0063920 A1 | 2/2020 | Vampola |
| 2020/0212017 A1 | 7/2020 | Oh et al. |
| 2020/0212262 A1 | 7/2020 | Jang et al. |
| 2020/0219858 A1 | 7/2020 | Chang |

FOREIGN PATENT DOCUMENTS

| | | |
|---|---|---|
| CN | 10-0419020 | 2/2004 |
| CN | 101819979 A | 9/2010 |
| CN | 102386295 A | 3/2012 |
| CN | 102593290 | 7/2012 |
| CN | 102593303 | 7/2012 |
| CN | 102903857 A | 1/2013 |
| CN | 103824923 A | 5/2014 |
| CN | 104797975 A | 7/2015 |
| CN | 105074941 A | 11/2015 |
| CN | 105789237 | 7/2016 |
| CN | 106328673 A | 1/2017 |
| CN | 106848043 | 6/2017 |
| CN | 107342352 A | 11/2017 |
| CN | 107342352 | 5/2019 |
| DE | 10 2006 062 473 A1 | 7/2008 |
| EP | 1482566 | 12/2004 |
| EP | 3122158 | 1/2017 |
| FR | 2964498 | 3/2012 |
| JP | 01-231380 | 9/1989 |

(56) References Cited

FOREIGN PATENT DOCUMENTS

| | | |
|---|---|---|
| JP | H0613655 | 1/1994 |
| JP | 07-254732 | 10/1995 |
| JP | 08-088407 | 4/1996 |
| JP | 08-213657 | 8/1996 |
| JP | 08-274376 | 10/1996 |
| JP | 9-148628 | 6/1997 |
| JP | 2001-273979 | 10/2001 |
| JP | 2003-197968 | 7/2003 |
| JP | 2005-019874 | 1/2005 |
| JP | 2005072323 | 3/2005 |
| JP | 2006-245524 | 9/2006 |
| JP | 2006-319099 | 11/2006 |
| JP | 2006-339551 | 12/2006 |
| JP | 2006-339646 | 12/2006 |
| JP | 2007-057667 | 3/2007 |
| JP | 2008-263127 | 10/2008 |
| JP | 2009-302201 | 12/2009 |
| JP | 2010-041057 | 2/2010 |
| JP | 2010-62351 A | 3/2010 |
| JP | 2010-525555 | 7/2010 |
| JP | 2011-151346 | 8/2011 |
| JP | 2011-159671 | 8/2011 |
| JP | 2012-504856 | 2/2012 |
| JP | 2012-195529 | 10/2012 |
| JP | 2012-209264 | 10/2012 |
| JP | 2012-253046 | 12/2012 |
| JP | 2013-229218 | 11/2013 |
| JP | 2014-099668 | 5/2014 |
| JP | 2014-175427 | 9/2014 |
| JP | 2014-187366 | 10/2014 |
| JP | 2015-012244 | 1/2015 |
| JP | 2015-501085 | 1/2015 |
| JP | 2015-022107 | 2/2015 |
| JP | 2016-039361 | 3/2016 |
| JP | 2016-207924 | 12/2016 |
| JP | 2017-011202 | 1/2017 |
| JP | 2017-513234 | 5/2017 |
| JP | 2017-111401 | 6/2017 |
| JP | 2017-521859 A | 8/2017 |
| JP | 2017-529557 | 10/2017 |
| JP | 2017-204571 | 11/2017 |
| JP | 2019-509636 | 4/2019 |
| KR | 10-2006-0095690 | 9/2006 |
| KR | 10-2007-0089172 | 8/2007 |
| KR | 10-2008-0054626 | 6/2008 |
| KR | 10-2009-0119209 | 11/2009 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |
| TW | 200402586 | 2/2004 |
| WO | 2015073286 | 5/2015 |
| WO | 2016152321 | 9/2016 |
| WO | 2017153123 | 9/2017 |

OTHER PUBLICATIONS

Non-Final Office Action mailed Jul. 13, 2023, in U.S. Appl. No. 17/847,136.
Final Office Action mailed Aug. 23, 2023, in U.S. Appl. No. 17/475,273.
Non-Final Office Action mailed Sep. 27, 2023, in U.S. Appl. No. 17/518,602.
Non-Final Office Action mailed Sep. 27, 2023, in U.S. Appl. No. 17/366,462.
Office Action dated Dec. 6, 2022 for Japanese Patent Application No. 2020-533800(with English Translation).
Notice of Allowance issued in U.S. Appl. No. 17/366,462, filed Jan. 24, 2023.
Notice of Allowance issued in U.S. Appl. No. 17/366,510, filed Jan. 24, 2023.
Ex Parte Quayle Action mailed Jan. 24, 2023, in U.S. Appl. No. 17/518,602.
Substantive Examination Report Notice mailed Jun. 15, 2022, in Saudi Arabian Patent Application No. 520412046.
Notice of Allowance issued in U.S. Appl. No. 16/673,184, filed Jun. 23, 2022.
Office Action dated Jul. 5, 2022 for Japanese Patent Application No. 2020-536804(with English Translation).
Office Action dated Jul. 19, 2022 for Japanese Patent Application No. 2020-528916(with English Translation).
Notice of Allowance issued in U.S. Appl. No. 16/673,114, filed Jul. 27, 2022.
Office Action dated Aug. 2, 2022 for Japanese Patent Application No. 2020-529153(with English Translation).
Office Action dated Aug. 2, 2022 for Japanese Patent Application No. 2020-527964(with English Translation).
Notice of Allowance issued in U.S. Appl. No. 16/198,873, filed Aug. 9, 2022.
Notice of Allowance issued in U.S. Appl. No. 16/228,601, filed Aug. 9, 2022.
Non-Final Office Action mailed Aug. 23, 2022, in U.S. Appl. No. 16/200,036.
International Search Report dated Feb. 26, 2019, issued in International Application No. PCT/KR2018/014671.
Written Opinion of the International Searching Authority dated Feb. 26, 2019, issued in International Application No. PCT/KR2018/014671.
International Search Report dated Feb. 26, 2019, issued in International Application No. PCT/KR2018/014674.
Written Opinion of the International Searching Authority dated Feb. 26, 2019, issued in International Application No. PCT/KR2018/014674.
International Search Report dated Mar. 6, 2019, issued in International Application No. PCT/KR2018/014728.
Written Opinion of the International Searching Authority dated Mar. 6, 2019, issued in International Application No. PCT/KR2018/014728.
International Searching Report dated Mar. 6, 2019, issued in International Application No. PCT/KR2018/014734.
Written Opinion of the International Searching Authority dated Mar. 6, 2019, issued in International Application No. PCT/KR2018/014734.
International Search Report dated Mar. 6, 2019, issued in International Application No. PCT/KR2018/014672.
Written Opinion of the International Searching Authority dated Mar. 6, 2019, issued in International Application No. PCT/KR2018/014672.
International Search Report dated Apr. 3, 2019, issued in International Application No. PCT/KR2018/015268.
Written Opinion of the International Searching Authority dated Apr. 3, 2019, issued in International Application No. PCT/KR2018/015268.
Takatoshi Tsujimura et al. Development of a color-tunable polychromatic organic-light-emitting-diode device for roll-to-roll manufacturing. Journal of the Society For Information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, pp. 19482-19487.
International Search Report dated Apr. 3, 2019, issued in International Application No. PCT/KR2018/015888.
Written Opinion of the International Searching Authority dated Apr. 3, 2019, issued in International Application No. PCT/KR2018/015888.
International Search Report dated Apr. 3, 2019, issued in International Application No. PCT/KR2018/016482.
Written Opinion of the International Searching Authority dated Apr. 3, 2019, issued in International Application No. PCT/KR2018/016482.
International Search Report dated Apr. 4, 2019, issued in International Application No. PCT/KR2019/000014.

(56) References Cited

OTHER PUBLICATIONS

Written Opinion of the International Searching Authority dated Apr. 4, 2019, issued in International Application No. PCT/KR2019/000014.
International Search Report dated Apr. 18, 2019, issued in International Application No. PCT/KR2019/000062.
Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
Notice of Allowance issued on Nov. 7, 2019, in U.S. Appl. No. 16/207,881.
Non-Final Office Action issued on Oct. 24, 2019, in U.S. Appl. No. 16/228,621.
Non-Final Office Action issued on Nov. 19, 2019, in U.S. Appl. No. 16/198,792.
Ex Parte Quayle Action issued on Nov. 19, 2019, in U.S. Appl. No. 16/198,796.
Non-Final Office Action issued on Oct. 31, 2019, in U.S. Appl. No. 16/198,850.
Non-Final Office Action issued on Jan. 9, 2020, in U.S. Appl. No. 16/673,184.
Notice of Allowance issued on Feb. 10, 2020, in U.S. Appl. No. 16/198,796.
Non-Final Office Action issued on Mar. 5, 2020, in U.S. Appl. No. 16/228,601.
Notice of Allowance issued on Mar. 31, 2020, in U.S. Appl. No. 16/234,541.
Notice of Allowance issued on Apr. 9, 2020, in U.S. Appl. No. 16/198,792.
Non-Final Office Action issued on Apr. 15, 2020, in U.S. Appl. No. 16/198,873.
Final Office Action issued on Apr. 20, 2020, in U.S. Appl. No. 16/228,621.
Non-Final Office Action issued on Mar. 23, 2020, in U.S. Appl. No. 16/219,716.
Final Office Action issued on May 29, 2020, in U.S. Appl. No. 16/198,850.
Final Office Action for U.S. Appl. No. 16/673,184 dated Jul. 23, 2020.
Notice of Allowance for U.S. Appl. No. 16/198,796 dated Aug. 26, 2020.
Notice of Allowance for U.S. Appl. No. 16/219,716 dated Sep. 3, 2020.
Non-Final Office Action for U.S. Appl. No. 16/673,114 dated Sep. 3, 2020.
Non-Final Office Action for U.S. Appl. No. 16/236,737 dated Jun. 24, 2020.
Final Office Action for U.S. Appl. No. 16/228,601 dated Jun. 25, 2020.
Notice of Allowance for U.S. Appl. No. 16/236,737 dated Oct. 28, 2020.
Non-Final Office Action for U.S. Appl. No. 16/200,036 dated Sep. 24, 2020.
Non-Final Office Action for U.S. Appl. No. 16/228,621 dated Sep. 29, 2020.
Final Office Action for U.S. Appl. No. 16/198,873 dated Oct. 15, 2020.
Office Action dated Mar. 7, 2023 for Japanese Patent Application No. 2020-528905(with English Translation).
Office Action dated Mar. 28, 2023 for Japanese Patent Application No. 2020-528919(with English Translation).
Non-Final Office Action mailed Apr. 5, 2023, in U.S. Appl. No. 17/475,273.
Notice of Allowance issued in U.S. Appl. No. 17/518,602, filed Apr. 5, 2023.
Non-Final Office Action mailed Apr. 21, 2023, in U.S. Appl. No. 18/079,789.
Non-Final Office Action issued on Feb. 19, 2021, in U.S. Appl. No. 16/198,850.
Final Office Action issued on Feb. 23, 2021, in U.S. Appl. No. 16/228,621.
Non-Final Office Action issued on Mar. 1, 2021, in U.S. Appl. No. 16/899,522.
Final Office Action issued on Mar. 4, 2021, in U.S. Appl. No. 16/673,114.
Non-Final Office Action issued on Apr. 15, 2021, in U.S. Appl. No. 16/673,184.
Final Office Action issued on Mar. 25, 2021 in U.S. Appl. No. 16/200,036.
Non-Final Office Action issued on Apr. 7, 2021, in U.S. Appl. No. 16/915,384.
Non-Final Office Action issued on Mar. 18, 2021 in U.S. Appl. No. 16/228,601.
Notice of Allowance issued on Aug. 26, 2021, in U.S. Appl. No. 16/789,877.
Non-Final Office Action issued on Jun. 10, 2021, in U.S. Appl. No. 16/198,873.
Non-Final Office Action issued on Nov. 4, 2019, in U.S. Appl. No. 16/198,784.
Non-Final Office Action issued on Nov. 19, 2020, in U.S. Appl. No. 16/198,784.
Final Office Action issued on Apr. 21, 2021, in U.S. Appl. No. 16/198,784.
Notice of Allowance issued on Jul. 12, 2021, in U.S. Appl. No. 16/198,784.
Extended European Search Report issued on Aug. 9, 2021, in European Patent Application No. 18890359.5.
Extended European Search Report issued on Sep. 6, 2021, in European Patent Application No. 19736098.5.
Extended European Search Report issued on Sep. 14, 2021, in European Patent Application No. 18881496.6.
Notice of Allowance issued on Sep. 14, 2021, in U.S. Appl. No. 16/899,522.
Notice of Allowance issued on Sep. 22, 2021, in U.S. Appl. No. 16/200,036.
Final Office Action issued on Sep. 27, 2021, in U.S. Appl. No. 16/915,384.
Extended European Search Report issued on Sep. 29, 2021, in European Patent Application No. 18891199.4.
Final Office Action issued on Sep. 30, 2021, in U.S. Appl. No. 16/228,601.
Final Office Action issued on Sep. 30, 2021, in U.S. Appl. No. 16/198,850.
Extended European Search Report issued on Oct. 5, 2021, in European Patent Application No. 18882087.2.
Extended European Search Report issued on Oct. 5, 2021, in European Patent Application No. 19736023.3.
Extended European Search Report issued on Oct. 7, 2021, in European Patent Application No. 21182984.1.
Notice of Reasons for Refusal drafted on Sep. 14, 2021, in Japanese Patent Application No. 2020-532747.
Non-Final Office Action issued on Jul. 8, 2021, in U.S. Appl. No. 16/228,621.
Final Office Action issued on Dec. 2, 2021, in U.S. Appl. No. 16/228,621.
Notice of Allowance issued on Dec. 9, 2021, in U.S. Appl. No. 16/915,384.
Final Office Action issued on Dec. 24, 2021, in U.S. Appl. No. 16/198,873.
Non-Final Office Action issued on Jan. 12, 2022, in U.S. Appl. No. 16/988,272.

(56) References Cited

OTHER PUBLICATIONS

Non-Final Office Action issued on Jan. 21, 2022, in U.S. Appl. No. 16/673,114.
Final Office Action issued on Nov. 12, 2021, in U.S. Appl. No. 16/673,184.
Notice of Allowance issued in U.S. Appl. No. 16/228,621, filed Feb. 17, 2022.
Notice of Allowance issued in U.S. Appl. No. 16/673,184, filed Mar. 15, 2022.
Notice of Allowance issued in U.S. Appl. No. 16/198,873, filed Mar. 16, 2022.
Notice of Allowance issued in U.S. Appl. No. 16/228,601, filed Mar. 17, 2022.
Notice of Allowance issued in U.S. Appl. No. 16/198,850, filed Mar. 30, 2022.
Search Report issued in European Patent Application 21182998.1 on Oct. 12, 2021.
Search Report issued in European Patent Application 21182996.5 on Oct. 22, 2021.
Examination Report issued in Indian Patent Application 202037026000 on Mar. 25, 2022.
Examination Report issued in Indian Patent Application 202037028070 on Mar. 30, 2022.
Extended European Search Report issued in European Patent Application 18886954.9 on Aug. 3, 2021.
Examination Report issued in Indian Patent Application 202037026094 on Mar. 28, 2022.
Notice of Allowance issued in U.S. Appl. No. 16/915,384, filed Apr. 21, 2022.
Non-Final Office Action mailed May 11, 2022, in U.S. Appl. No. 17/164,829.
Notice of Allowance issued in U.S. Appl. No. 16/988,272, filed Jun. 8, 2022.
Notice of Allowance issued in U.S. Appl. No. 16/228,621, filed Jun. 15, 2022.
Office Action dated Aug. 30, 2022 for Japanese Patent Application No. 2020-529553(with English Translation).
Office Action dated Aug. 30, 2022 for Japanese Patent Application No. 2020-534346(with English Translation).
Office Action dated Aug. 30, 2022 for Japanese Patent Application No. 2020-532579(with English Translation).
Substantive Examination Report Notice mailed Aug. 29, 2022, in Saudi Arabian Patent Application No. 520412047.
Notice of Allowance issued in U.S. Appl. No. 16/198,850, filed Sep. 8, 2022.
Substantive Examination Report Notice mailed Aug. 28, 2022, in Saudi Arabian Patent Application No. 520412187.
Takatoshi Tsujimura et al., Development of a color-tunable polychromatic organic-light-emitting-diode device for roll-to-roll manufacturing, Apr. 14, 2016, pp. 262-269, Journal of the SID.
Office Action dated Sep. 20, 2022 for Japanese Patent Application No. 2020-528905(with English Translation).
Office Action dated Sep. 20, 2022 for Japanese Patent Application No. 2020-528919(with English Translation).
Notice of Allowance issued in U.S. Appl. No. 17/164,829, filed Sep. 26, 2022.
Notice of Allowance issued in U.S. Appl. No. 16/915,384, filed Nov. 8, 2022.
Notice of Allowance issued in U.S. Appl. No. 17/366,420, filed Nov. 21, 2022.
Office Action dated Nov. 22, 2022 for Japanese Patent Application No. 2020-526484(with English Translation).
Notice of Allowance issued in U.S. Appl. No. 16/988,272, filed Nov. 25, 2022.
Office Action issued Feb. 6, 2024, in corresponding Brazilian Patent Application No. BR112020011226-7 (with English Translation), 6 pages.
Office Action issued Feb. 6, 2024, in corresponding Brazilian Patent Application No. BR112020010682-8 (with English Translation), 6 pages.
Combined United Arab Emirates Office Action and Search Report issued Dec. 12, 2023 in United Arab Emirates Patent Application No. P6000749/2020, 8 pages.
Office Action mailed on Oct. 26, 2023 in U.S. Appl. No. 18/079,789, 34 pages.
Office Action mailed on Nov. 17, 2023 in U.S. Appl. No. 18/136,843, 66 pages.
Office Action mailed on Nov. 17, 2023 in U.S. Appl. No. 18/121,598, 73 pages.
Office Action mailed on Dec. 7, 2023 in U.S. Appl. No. 18/077,188, 80 pages.
Notice of Allowance mailed on Dec. 12, 2023 in U.S. Appl. No. 17/847,136, 13 pages.
Office Action mailed on Dec. 15, 2023 in U.S. Appl. No. 17/539,050, 16 pages.
Combined Chinese Office Action and Search Report issued on Oct. 27, 2023 in Chinese Patent Application No. 201880044515.8 (submitting English translation only), 9 pages.
Japanese Office Action issued on Dec. 19, 2023 in Japanese Patent Application No. 2022-210352 (submitting English translation only), 7 pages.
Office Action mailed Nov. 6, 2024 in co-pending U.S. Appl. No. 17/475,273.
Office Action mailed Dec. 13, 2024 in co-pending U.S. Appl. No. 18/079,789.
Office Action mailed Jan. 6, 2025 in co-pending U.S. Appl. No. 17/539,050.
Office Action mailed Apr. 9, 2024 in co-pending U.S. Appl. No. 17/847,122.
Office Action mailed Apr. 11, 2024 in Chinese Application No. 201880040525.4 filed Dec. 18, 2019 (w/computer-generated English translation).
Office Action mailed Apr. 3, 2024 in Chinese Application No. 201911011120.0 filed Oct. 23, 20219 (w/computer-generated English translation).
Notice of Allowance mailed Apr. 19, 2024 in co-pending U.S. Appl. No. 18/121,598.
Notice of Allowance mailed Apr. 19, 2024 in co-pending U.S. Appl. No. 18/136,843.
Notice of Allowance dated Apr. 19, 2024, issued in U.S. Appl. No. 18/121,598.
Notice of Allowance dated Apr. 19, 2024, issued in U.S. Appl. No. 18/136,843.
Notice of Allowance dated Feb. 22, 2024, issued in U.S. Appl. No. 17/366,462.
Office Action mailed Jun. 10, 2024 in European Application No. 18 880 706.9 filed Nov. 27, 2018, 7 pages.
Office Action mailed Jul. 30, 2024 in Chinese Application No. 201911011120.0 filed Nov. 27, 2018, 34 pages (w/machine English translation).
Office Action mailed Dec. 15, 2023 in co-pending U.S. Appl. No. 17/539,050.
Office Action mailed Sep. 6, 2024 in co-pending U.S. Appl. No. 18/079,789.
Japanese Office Action issued Jul. 29, 2025 in Japanese Patent Application No. 2024-173486, 6 pages.
Final Office Action mailed May 14, 2025, in co-pending U.S. Appl. No. 17/539,050.
Non-Final Office Action mailed Oct. 1, 2025, in co-pending U.S. Appl. No. 17/475,273 Examiner Miyoshi, Jesse Y.

* cited by examiner

PASSIVATION COVERED LIGHT EMITTING UNIT STACK

CROSS REFERENCE TO RELATED APPLICATIONS

This application is a Continuation of U.S. patent application Ser. No. 17/475,273, filed on Sep. 14, 2021, which is a Continuation of U.S. patent application Ser. No. 16/198,784, filed on Nov. 22, 2018, now issued as U.S. Pat. No. 11,282,981, which claims priority from and the benefit of U.S. Provisional Patent Application No. 62/590,870, filed on Nov. 27, 2017, U.S. Provisional Patent Application No. 62/590,854, filed on Nov. 27, 2017, U.S. Provisional Patent Application No. 62/635,284, filed on Feb. 26, 2018, U.S. Provisional Patent Application No. 62/694,632, filed on Jul. 6, 2018, the disclosures each of which is hereby incorporated by reference for all purposes as if fully set forth herein.

BACKGROUND

Field

Exemplary implementations of the invention relate generally to a light emitting chip and a light emitting cell unit including the same, and more specifically, to a micro light emitting chip including a micro light emitting diode and a light emitting cell unit including the same.

Discussion of the Background

Light emitting diodes as inorganic light sources are widely used in various fields, such as display devices, vehicle lamps, and general lighting. Light emitting diodes are rapidly replacing existing light sources due to their longer lifetime, lower power consumption, and faster response speed.

For example, a display device generally implements various colors by using mixed colors of blue, green, and red. Each pixel of a display device includes blue, green, and red sub pixels, and the color of a particular pixel is determined through the colors of these sub pixels, and an image is implemented by a combination of pixels.

Light emitting diodes have been mainly used as backlight sources in display devices. However, recently, a micro LED display has been developed as a next generation display that is capable of implementing images directly from the using light emitting diodes.

In a micro LED display, micro LEDs may be arranged on a two-dimensional plane or may be vertically stacked to correspond to each pixel. The micro LED generally has a form factor of about 10,000 square micrometers or less, in surface area, as is known in the art.

Because of the small form factor of a micro LED, it is difficult to handle micro LEDs, and thus, it is not easy to mount micro LEDs on a display panel, especially when millions or tens of millions of micro LEDs need to be transferred and mounted on the display panel. In addition, micro LEDs may be damaged by an external shock, and thus, defects may be formed in the micro LEDs during carriage.

Moreover, since the sub pixels are arranged in a two-dimensional plane in the display, a relatively large area is occupied by one pixel including the typical sub pixels for blue, green, and red colors. As such, arranging the sub pixels within a limited area may require reducing the area of each sub pixel, which in turn may deteriorate brightness of the sub pixels due to reduction in luminous area.

The above information disclosed in this Background section is only for understanding of the background of the inventive concepts, and, therefore, it may contain information that does not constitute prior art.

SUMMARY

Light emitting chips and a light emitting cell unit including the same constructed according to the principles and some exemplary implementations of the invention are capable of protecting a light emitting chip or a micro light emitting diode from an external shock.

Light emitting diodes and displays using the light emitting diodes, including e.g., micro LEDs, constructed according to the principles and some exemplary implementations of the invention provide a light emitting diode for a display, in which each subpixel has an increased luminous area achieved without increasing the pixel area.

Light emitting diodes and displays using light emitting diodes, including e.g., micro LEDs, constructed according to the principles and some exemplary implementations of the invention further provide a light emitting diode for a display, which allows for simultaneous manufacture of a plurality of pixels to obviate the need for individually mounting the LEDs, such as micro LEDs, on a display panel.

Light emitting diodes and displays using light emitting diodes, including e.g., micro LEDs, constructed according to the principles and some exemplary implementations of the invention provide a vertically stacked sub-unit structure, in which the sub-unit that emits the longest wavelength light may be disposed at the top of or intermediate the other sub-units without the use of color filters therebetween.

Light emitting diodes constructed according to the principles and some exemplary implementations of the invention and displays using the same have sub-pixels that may be independently driven.

Additional features of the inventive concepts will be set forth in the description which follows, and in part will be apparent from the description, or may be learned by practice of the inventive concepts.

A light emitting chip according to an exemplary embodiment includes a light emitting structure including a first light emitting sub-unit, a second light emitting sub-unit, and a third light emitting sub-unit vertically stacked on each other, and a first passivation layer covering at least part of the light emitting structure, in which the first passivation layer has a bottom surface that exposes the light emitting structure to permit light from the first, second, and third sub-units to be emitted from the light emitting chip.

The first passivation layer may include a polymer material.

The first passivation layer may include at least one of polyimide and EMC (epoxy molding compound).

The first light emitting sub-unit may include a first transparent electrode and a first mesa structure, the first mesa structure having a first n-type semiconductor layer, a first active layer, and a first p-type semiconductor layer vertically stacked on each other, the second light emitting sub-unit may include a second transparent electrode and a second mesa structure, the second mesa structure having a second p-type semiconductor layer, a second active layer, and a second n-type semiconductor layer vertically stacked on each other, and the third light emitting sub-unit may include a third transparent electrode and a third mesa structure, the third mesa structure having a third p-type semiconductor layer, a third active layer, and a third n-type semiconductor layer vertically stacked on each other.

The light emitting chip may further include a first thin film conductive pattern electrically coupled with the first n-type semiconductor layer, a second thin film conductive pattern electrically coupled with the second n-type semiconductor layer, a third thin film conductive pattern electrically coupled with the third n-type semiconductor layer, and a fourth thin film conductive pattern electrically coupled with the first, second, and third p-type semiconductor layers.

The light emitting chip may further include a first thin film conductive pattern electrically coupled with the first p-type semiconductor layer, a second thin film conductive pattern electrically coupled with the second p-type semiconductor layer, a third thin film conductive pattern electrically coupled with the third p-type semiconductor layer, and a fourth thin film conductive pattern electrically coupled with the first, second, and third n-type semiconductor layers.

The third n-type semiconductor layer may have an area smaller than the third transparent electrode, and exposes a portion of the third transparent electrode, the third transparent electrode may have an area smaller than the second n-type semiconductor layer, and exposes a portion of the second n-type semiconductor layer, the second n-type semiconductor layer may have an area smaller than the second transparent electrode, and exposes a portion of the second transparent electrode, the second transparent electrode may have an area smaller than the first transparent electrode, and exposes a portion of the first transparent electrode, and the first transparent electrode may have an area smaller than the first n-type semiconductor layer, and exposes a portion of the first n-type semiconductor layer.

The third transparent electrode exposed by the third n-type semiconductor layer may be thinner than the third transparent electrode covered by the third n-type semiconductor layer, the second transparent electrode exposed by the second n-type semiconductor layer may be thinner than the second transparent electrode covered by the second n-type semiconductor layer, and the first transparent electrode exposed by the second transparent electrode may be thinner than the first transparent electrode covered by the second transparent electrode.

The light emitting chip may further include a first conductive pattern disposed on a portion of the first n-type semiconductor layer exposed by the first transparent electrode, and electrically coupled with the first n-type semiconductor layer, a second conductive pattern disposed on a portion of the first transparent electrode exposed by the second transparent electrode and on a portion of the second transparent electrode exposed by the second n-type semiconductor layer, and electrically coupled with the first and second transparent electrodes, a third conductive pattern disposed on a portion of the second n-type semiconductor layer exposed by the third transparent electrode, and electrically coupled with the second n-type semiconductor layer, a fourth conductive pattern disposed on a portion of the third transparent electrode exposed by the third n-type semiconductor layer, and electrically coupled with the third transparent electrode, and a fifth conductive pattern disposed on the third n-type semiconductor layer, and electrically coupled with the third n-type semiconductor layer.

The light emitting chip may further include a first thin film conductive pattern electrically coupled with the first conductive pattern, a second thin film conductive pattern electrically coupled with the second and fourth conductive patterns, a third thin film conductive pattern electrically coupled with the third conductive pattern, and a fourth thin film conductive pattern electrically coupled with the fifth conductive pattern.

The light emitting structure may have a width that decreases from a top surface thereof, the first n-type semiconductor layer may include a first n-type extended semiconductor layer extending from a sidewall of the first mesa structure, and each of the first, second, third, and fourth thin film conductive pattern may extend from a top surface of the third light emitting sub-unit to the first n-type extended semiconductor layer, cover the first n-type extended semiconductor layer, and include a connector portion.

The light emitting chip may further include a first via contact passing through the first passivation layer, and electrically coupled with the connector portion of the first thin film conductive pattern disposed on the first n-type extended semiconductor layer, a second via contact passing through the first passivation layer, and electrically coupled with the connector portion of the second thin film conductive pattern disposed on the first n-type extended semiconductor layer, a third via contact passing through the first passivation layer, and electrically coupled with the connector portion of the third thin film conductive pattern disposed on the first n-type extended semiconductor layer, and a fourth via contact passing through the first passivation layer, and electrically coupled with the connector portion of the fourth thin film conductive pattern disposed on the first n-type extended semiconductor layer.

Each of the first, second, third, and fourth via contacts may overlap at least a portion of the first, second, and third active layers.

The first via contact may overlap with at least a portion of the first conductive pattern.

The light emitting chip may further include a second passivation layer disposed on the first passivation layer, and may include fifth, sixth, seventh, and eighth via contacts configured to electrically communicate with the first, second, third, and forth via contacts, respectively.

The light emitting chip may further include a through-silicon via (TSV) substrate disposed on the first passivation layer, the TSV substrate including patterns that correspond to the first, second, third, and forth via contacts, respectively.

The light emitting structure may have at least one mesa structure, and the light emitting structure may have at least one sidewall having a stepped structure.

The light emitting structure may have an inclined sidewall.

The light emitting chip may further include a first color filter and a first bonding portion disposed between the first and second light emitting sub-units, and a second color filter and a second bonding portion disposed between the second and third light emitting sub-units.

The light emitting structure may include a micro light emitting diode having a surface area less than about 10,000 square µm.

The bottom surface of the first passivation layer and a surface of the first light emitting sub-unit may be disposed in substantially the same plane.

The first light emitting sub-unit may be configured to emit one of red, green, or blue light, the second light emitting sub-unit may be configured to emit a different one of red, green, or blue light from the first light emitting sub-unit, and is stacked above the first light emitting sub-unit, and the third light emitting sub-unit may be configured to emit a different one of red, green or blue light from the first and second light emitting sub-units, and is stacked above the second light emitting sub-unit.

There may be no color filters disposed between first and second light emitting sub-units and between the second and third light emitting sub-units.

A light emitting cell unit according to an exemplary embodiment includes a plurality of light emitting chips each including a light emitting structure, each light emitting structure including a first light emitting sub-unit, a second light emitting sub-unit, and a third light emitting sub-unit vertically stacked on each other, a first passivation layer covering at least part of the light emitting chip, and a pad disposed on the first passivation layer and electrically connected to at least one of the first, second, and third light emitting sub-units, in which the first passivation layer has a bottom surface that exposes at least one of the light emitting chips, and a distance between the pads of adjacent light emitting chips is less than a distance between the adjacent light emitting chips.

Each of the first, second, and third light emitting sub-units may include a p-type semiconductor layer and an n-type semiconductor layer, each of the light emitting chips may further include a first via contact passing through the first passivation layer, and electrically coupled with the p-type semiconductor layers of the first, second, and third light emitting sub-units, a second via contact passing through the first passivation layer, and electrically coupled with an n-type semiconductor layer of the first light emitting sub-unit, a third via contact passing through the first passivation layer, and electrically coupled with an n-type semiconductor layer of the second light emitting sub-unit, and a fourth via contact passing through the first passivation layer, and electrically coupled with an n-type semiconductor layer of the third light emitting sub-unit, and the distance between the pads of adjacent light emitting chips may be less than a distance between first via contacts of the adjacent light emitting chips.

The light emitting cell unit may further include a second passivation layer disposed between the first passivation layer and the pad, the second passivation layer including fifth, sixth, seventh, and eighth via contacts corresponding to the first, second, third, and fourth via contacts, respectively.

The light emitting cell unit may further include a TSV substrate disposed between the first passivation layer and the pad, the TSV substrate including conductive patterns corresponding to the first, second, third, and fourth via contacts, respectively.

At least one of the light emitting chips may include a micro light emitting diode having a surface area less than about 10,000 square μm.

A light emitting chip according to an exemplary embodiment includes a first light emitting sub-unit, a second light emitting sub-unit disposed on the first light emitting sub-unit, and a third light emitting sub-unit disposed on the second light emitting sub-unit, in which each of the first, second, and third light emitting sub-units includes a p-type semiconductor layer and an n-type semiconductor layer vertically stacked on each other, and one of the first, second, and third light emitting sub-units has a stacked sequence of the p-type and n-type semiconductor layers different from the stacked sequence of the remaining ones of the first, second, and third light emitting sub-units.

The light emitting chip may include a micro LED chip having a surface area less than about 10,000 square μm.

The first light emitting sub-unit may be configured to emit light having the longest wavelength among the light emitting sub-units, and the third light emitting sub-unit may be covered by the second and third light emitting sub-units.

The first light emitting sub-unit may be configured to emit light having a shorter wavelength than at least one of the other the light emitting sub-units, and there may be no color filters disposed between the first and second light emitting sub-units, nor between the second and third light emitting sub-units.

The light emitting chip may further include a conductive pattern covering a portion of a side surface of the light emitting chip, in which adjacent p-type semiconductor layers contact the conductive pattern.

The light emitting chip may further include a conductive extension connected to the conductive pattern, the conductive extension having a flat surface that does not overlap the first, second, and third light emitting sub-units.

The p-type semiconductor layers of the first, second, and third light emitting sub-units may be electrically connected to each other, the n-type semiconductor layers of the first, second, and third light emitting sub-units may be isolated from each other, and light emitted from each light emitting sub-unit is individually controllable.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
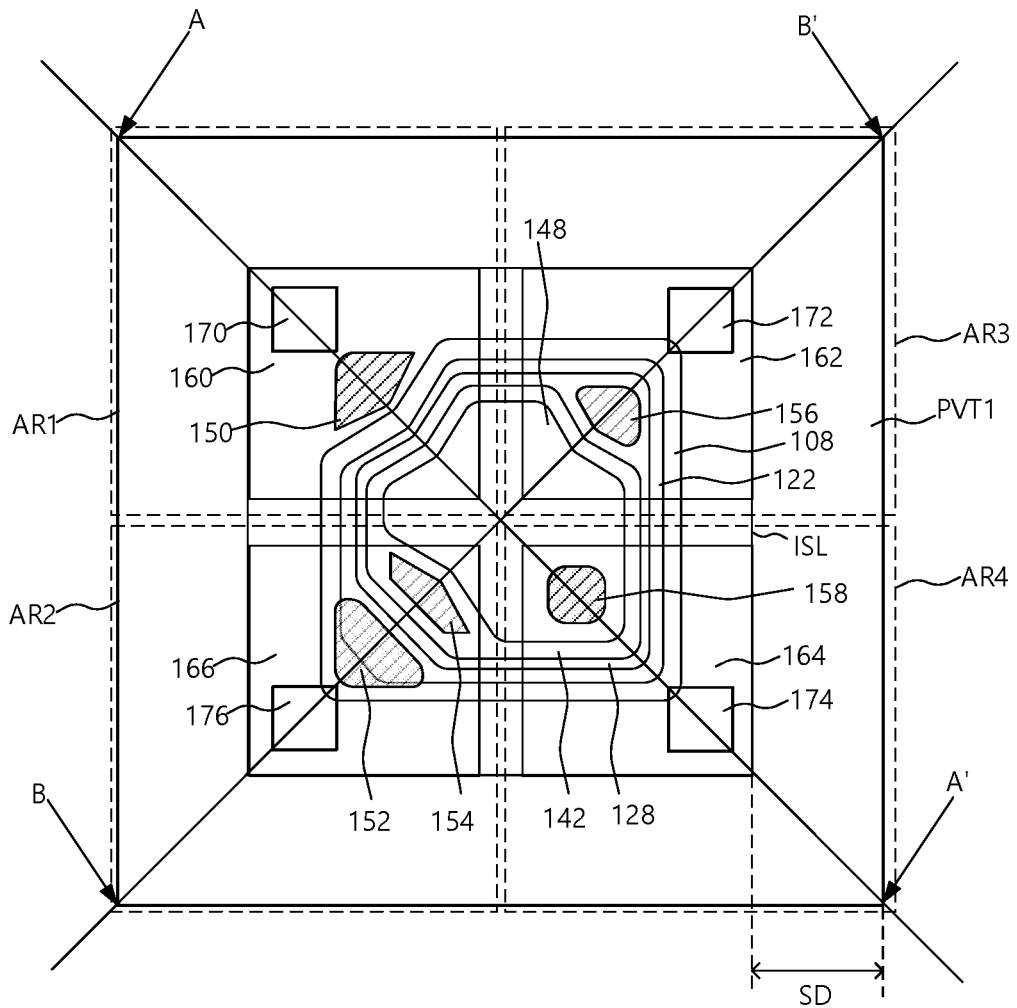
FIG. 1A is a plan view of a light emitting chip according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/of" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Figure 1B:
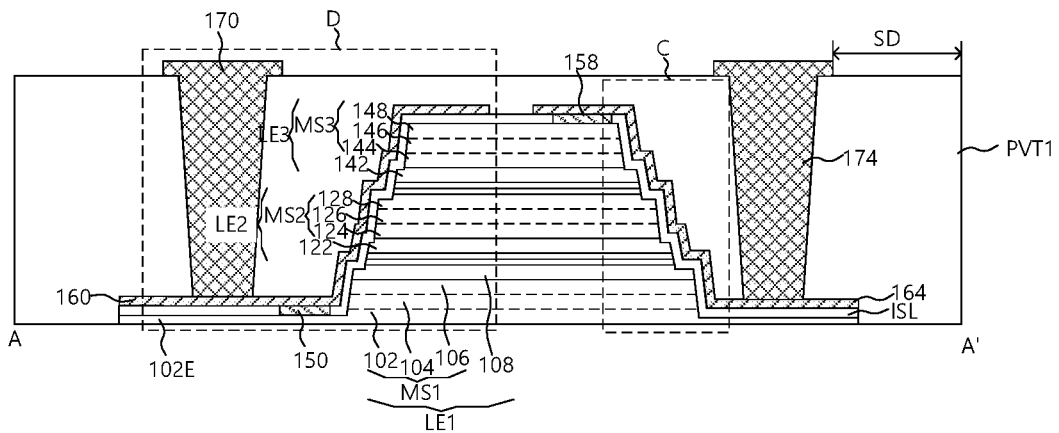
FIG. 1B is a cross-sectional view taken along line A-A' of FIG. 1A.
Figure 1C:
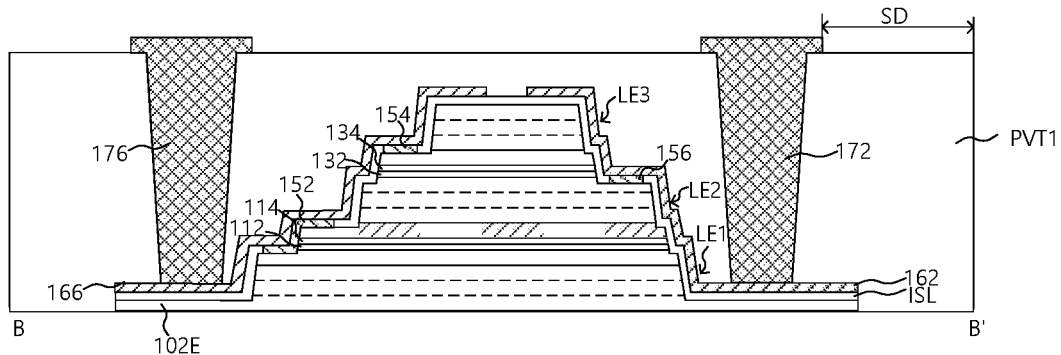
FIG. 1C is a cross-sectional view taken along line B-B' of FIG. 1A.
Figure 2A:
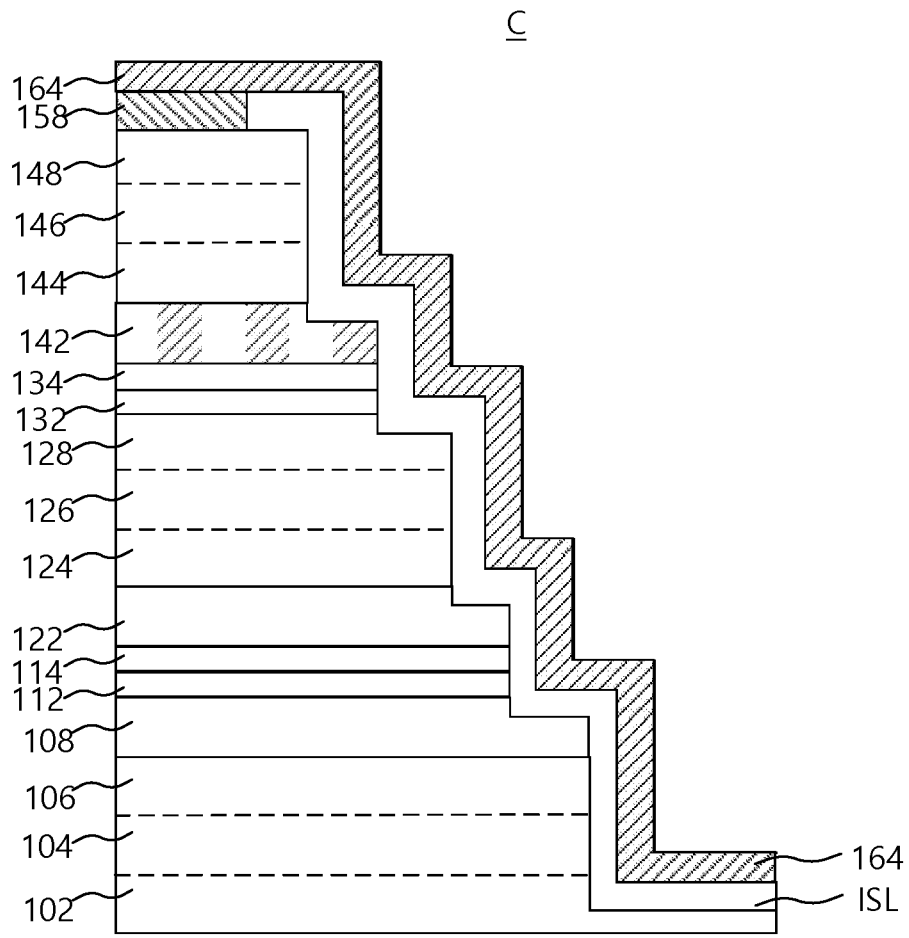
FIG. 2A and FIG. 2B are cross-sectional views of the portion C of the light emitting chip of FIG. 1B according to exemplary embodiments.
Figure 2B:
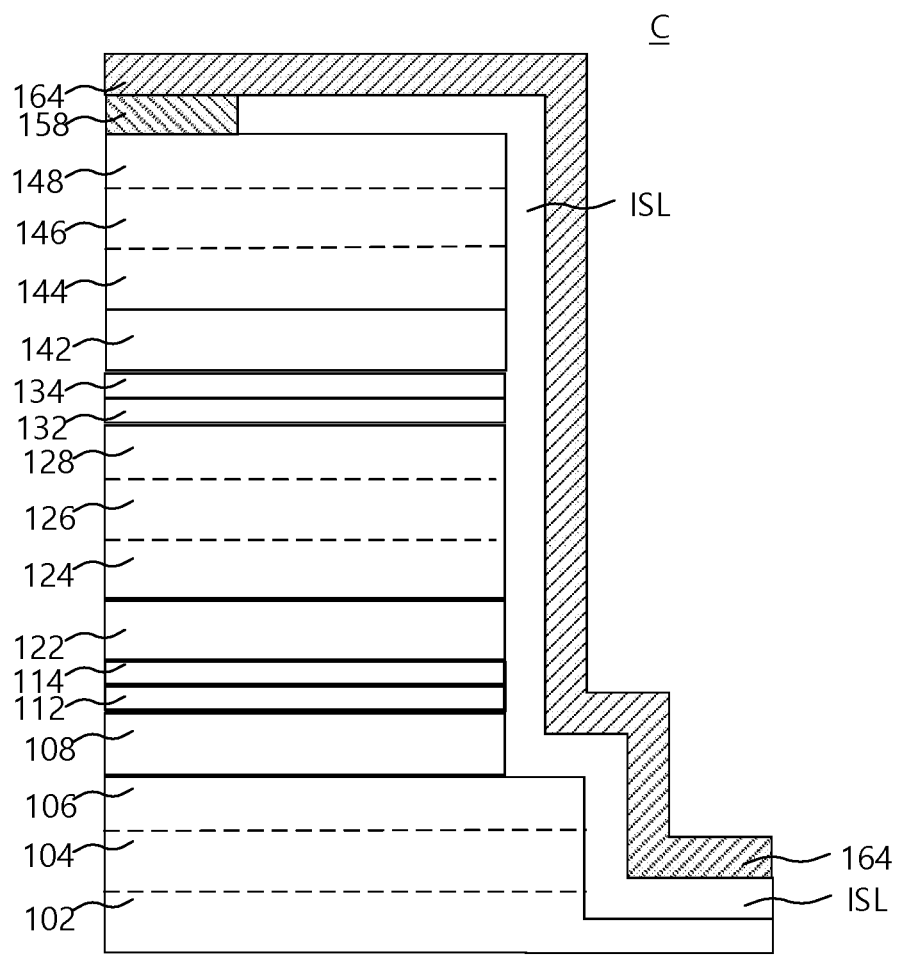
Figure 2C:
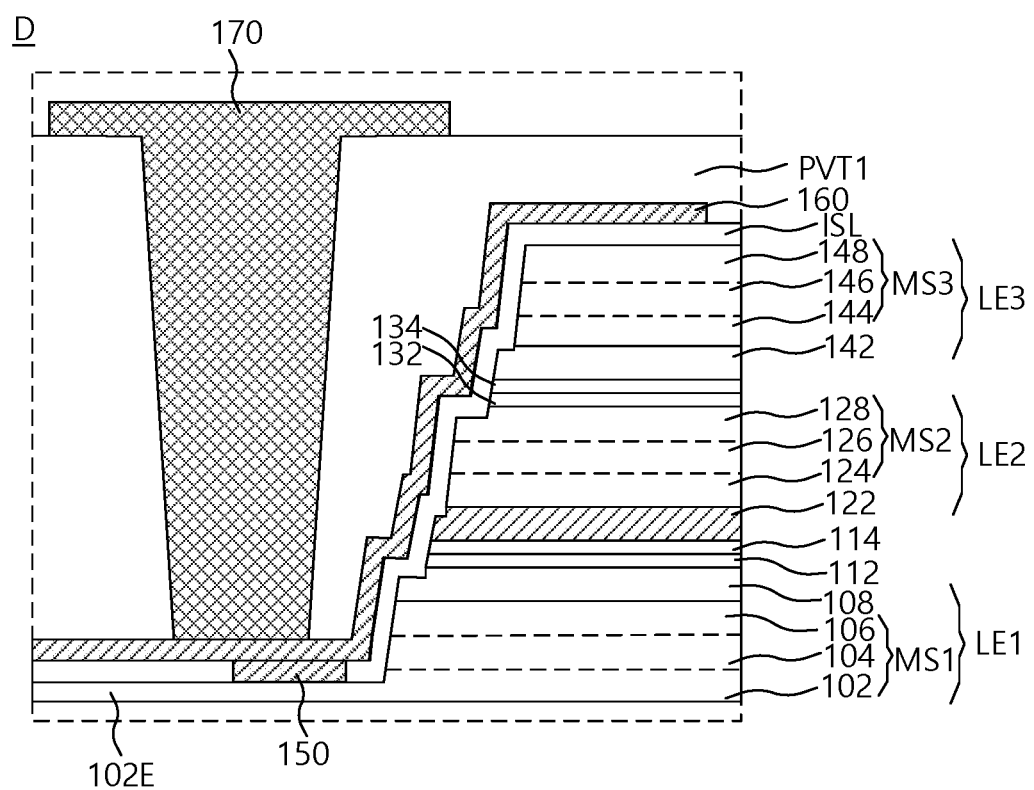
FIG. 2C is a cross-sectional view of the portion D of the light emitting chip of FIG. 1B according to an exemplary embodiment.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein Hereinafter, a light emitting chip and a light emitting cell unit including the same will be described below with reference to the accompanying drawings through various exemplary embodiments. As used herein, a light emitting diode chip or a light emitting diode according to exemplary embodiments may include a micro LED, which has a surface area less than about 10,000 square μm as known in the art. In other exemplary embodiments, the micro LED's may have a surface area of less than about 4,000 square μm, or less than about 2,500 square μm, depending upon the particular application FIG. 1A is a plan view of a light emitting chip according to an exemplary embodiment. FIG. 1B is a cross-sectional view taken along line A-A' of FIG. 1A, and FIG. 1C is a cross-sectional view taken along line B-B' of FIG. 1A. FIGS. 2A and 2B are cross-sectional views of the portion C of the light emitting chip of FIG. 1B according to exemplary embodiments, and FIG. 2C is a cross-sectional view of the portion D of the light emitting chip of FIG. 1B according to an exemplary embodiment.

Referring to FIGS. 1A to 1C, a light emitting chip may include a light emitting structure including a first light emitting part LE1, a second light emitting part LE2, and a third light emitting part LE3 vertically stacked with each other, and a first passivation layer PVT1 which covers the top surface and side surface of the light emitting structure.

The bottom surface of the light emitting structure may be a light emitting surface. The light emitting surface may be the bottom surface of the first light emitting part LE1. According to an exemplary embodiment, the bottom surface of the first passivation layer PVT1 may be coplanar with the bottom surface of the first light emitting part LE1. As such, the light emitting surface and the bottom surface of the first passivation layer PVT1 may be coplanar with each other. The first passivation layer PVT1 may have a top surface positioned at a higher level than the top surface of the light emitting structure. The first passivation layer PVT1 may be disposed to cover the side surface of the light emitting structure. As such, the top surface and side surface of the light emitting structure, except for the bottom surface (e.g., the light emitting surface), may be substantially or completely protected by the first passivation layer PVT1. Thus, it is possible to suppress the light emitting structure from breaking or being damaged by an external shock, which will be described in more detail later.

According to an exemplary embodiment, when the light emitting surface of the light emitting structure is the bottom surface of the first light emitting part LE1, the wavelength of the first light emitting part LE1 may be the shortest, the wavelength of the second light emitting part LE2 may be longer than the wavelength of the first light emitting part LE1 and be shorter than the wavelength of the third light emitting part LE3, and the wavelength of the third light emitting part LE3 may be the longest. For example, the first light emitting part LE1 may emit blue light, the second light emitting part LE2 may emit green light, and the third light emitting part LE3 may emit red light. Further, according to an exemplary embodiment, the first light emitting part LE1 may have an area larger than the second light emitting part LE2, and the second light emitting part LE2 may have an area larger than the third light emitting part LE3. When the light emitting parts LE1, LE2 and LE3 are implemented as micro LEDs, they may be stacked in different color orders without adversely affecting operation, even if color filters are not used. For example, the light emitting part that emits blue light need not be arranged at the bottom of the stack adjacent even if no color filters are used due to the small form factor of the micro LEDs.

The light emitting structure may be implemented as a mesa structure. According to an exemplary embodiment, the light emitting structure may have a plurality of stepped sidewalls. Referring to FIG. 1B, for example, each of the stepped sidewalls may have an inclined side surface, however, the inventive concepts are not limited thereto. For example, each of the stepped sidewalls may have a generally vertical side surface, as shown in FIG. 2A, or the light emitting chip may have a generally vertical sidewall, as shown in FIG. 2B.

The light emitting structure may further include a first color filter 112 and a first bonding portion 114 between the first light emitting part LE1 and the second light emitting part LE2. For example, the first color filter 112, the first bonding portion 114, and the second light emitting part LE2 may be sequentially stacked on the first light emitting part LE1. As another example, the first bonding portion 114, the first color filter 112, and the second light emitting part LE2 may be sequentially stacked on the first light emitting part LE1.

The light emitting structure may further include a second color filter 132 and a second bonding portion 134 between the second light emitting part LE2 and the third light emitting part LE3. For example, the second color filter 132, the second bonding portion 134, and the third light emitting part LE3 may be sequentially stacked on the second light emitting part LE2. As another example, the second bonding portion 134, the second color filter 132, and the third light emitting part LE3 may be sequentially stacked on the second light emitting part LE2.

The first light emitting part LE1 may include a first mesa structure MS1 including a first n-type semiconductor layer 102, a first active layer 104, and a first p-type semiconductor layer 106, and a first transparent electrode 108. According to an exemplary embodiment, the first n-type semiconductor layer 102 may include a first n-type extended semiconductor layer 102E which extends from the sidewall of the first mesa structure MS1. The first n-type extended semiconductor layer 102E may be thinner than the first n-type semiconductor layer 102 in the first mesa structure MS1. The first n-type extended semiconductor layer 102E may have substantially a quadrangular shape in a plan view.

The first transparent electrode 108 may be disposed on the first mesa structure MS1. The first transparent electrode 108 may have substantially a quadrangular shape with one corner cut in a plan view. For example, the one corner that is cut in the first transparent electrode 108 may be the one positioned in a first area AR1. The corner-cut portion of the first transparent electrode 108 may have a generally V-shaped sidewall, which is bent inwardly in a plan view, as shown in FIG. 1A. The first mesa structure MS1, which is disposed under the first transparent electrode 108, may have substantially the same structure as the first transparent electrode 108 in a plan view. As such, the first mesa structure MS1 may also have substantially a quadrangular structure with one corner cut. The corner-cut portion of the first mesa structure MS1 may have a generally V-shaped sidewall, which is bent inwardly in a plan view, as shown in FIG. 1A.

According to an exemplary embodiment, each of the first mesa structure MS1 and the first transparent electrode 108 may have an inclined sidewall, and the sidewall of the first mesa structure MS1 and the sidewall of the first transparent electrode 108 may be disposed on the same plane. In this case, the first n-type semiconductor layer 102 of the first mesa structure MS1 may have an area larger than the first active layer 104, the first active layer 104 may have an area larger than the first p-type semiconductor layer 106, and the first p-type semiconductor layer 106 may have an area larger than the first transparent electrode 108. According to another exemplary embodiment shown in FIG. 2A, each of the first mesa structure MS1 and the first transparent electrode 108 may have a generally vertical sidewall, and the sidewall of the first mesa structure MS1 and the sidewall of the first transparent electrode 108 may be disposed on the same plane. In this case, the first mesa structure MS1 and the first transparent electrode 108 may have substantially the same area.

According to an exemplary embodiment, the light emitting chip may additionally include a first conductive pattern 150 exposed by the cut corner portions of the first transparent electrode 108 and the first mesa structure MS1 in the first area AR1. The first conductive pattern 150 may be electrically coupled with the first n-type extended semiconductor layer 102E, and disposed on the first n-type extended semiconductor layer 102E. When viewed from the top, the first conductive pattern 150 may have a shape corresponding to the cut corner of the first transparent electrode 108. As shown in FIG. 1A, the first conductive pattern 150 may include a generally V-shaped sidewall which is convexly bent toward the center of the first transparent electrode 108.

The first color filter 112, the first bonding portion 114, and a second transparent electrode 122 may be sequentially stacked on the first transparent electrode 108. The first color filter 112 may selectively pass light generated from the second light emitting part LE2 and the third light emitting part LE3, and may reflect the light generated from the first light emitting part LE1 to prevent the light from being incident on the second light emitting part LE2 or the third light emitting part LE3. For example, the first color filter 112 may include a distributed Bragg reflector (DBR). The first bonding portion 114 may bond the first transparent electrode 108 and the second transparent electrode 122, and may fixedly attach the first light emitting part LE1 and the second light emitting part LE2. For example, the first bonding portion 114 may include one of optical clear adhesive (OCA) and optical clear resin (OCR). The first color filter 112 and the first bonding portion 114 may include a material having excellent light transmittance.

The first color filter 112, the first bonding portion 114, and the second transparent electrode 122 may be disposed on the first transparent electrode 108, and may have areas smaller than the first transparent electrode 108. When viewed from the top, the second transparent electrode 122 may be disposed inside the first transparent electrode 108, and the sidewall of the second transparent electrode 122 may be disposed inside the sidewall of the first transparent electrode 108. As such, the peripheral portion of the first transparent electrode 108 may be exposed by the second transparent electrode 122. According to an exemplary, the peripheral portion of the first transparent electrode 108 exposed by the second transparent electrode 122 may have a thickness less than a portion thereof overlapping the second transparent electrode 122.

According to an exemplary embodiment, when viewed from the top, the second transparent electrode 122 may have generally substantially a quadrangular shape with two corners cut. For example, the second transparent electrode 122 may have substantially a quadrangular shape, in which the first corner in the first area AR1 and the second corner of a second area AR2 neighboring the first area AR1 are cut. In the second transparent electrode 122, the first corner-cut portion may have a generally V-shaped first sidewall by being concavely bent inwardly toward the center of the second transparent electrode 122. The second corner-cut portion may have an unbent second sidewall.

The first color filter 112 and the first bonding portion 114 may have substantially the same structure as the second transparent electrode 122. According to an exemplary embodiment, each of the second transparent electrode 122, the first bonding portion 114, and the first color filter 112 may have an inclined sidewall, and the sidewall of the second transparent electrode 122, the sidewall of the first bonding portion 114, and the sidewall of the first color filter 112 may be disposed on the same plane. In this case, the first color filter 112 may have an area larger than the first bonding portion 114, and the first bonding portion 114 may have an area larger than the second transparent electrode 122. According to another exemplary embodiment shown in FIG. 2A, each of the second transparent electrode 122, the first bonding portion 114, and the first color filter 112 may have a generally vertical sidewall, and the sidewall of the second transparent electrode 122, the sidewall of the first bonding portion 114, and the sidewall of the first color filter 112 may be disposed on the same plane. In this case, the first color filter 112, the first bonding portion 114, and the second transparent electrode 122 may have substantially the same area.

A second mesa structure MS2 may be disposed on the second transparent electrode 122. The second mesa structure MS2 may include a second p-type semiconductor layer 124, a second active layer 126, and a second n-type semiconductor layer 128 vertically stacked with each other. The second mesa structure MS2 may have an area smaller than the second transparent electrode 122. When viewed from the top, the second mesa structure MS2 may be disposed inside the second transparent electrode 122. For example, the sidewall of the second mesa structure MS2 may be disposed inside the sidewall of the second transparent electrode 122. Therefore, the peripheral portion of the second transparent electrode 122 may be exposed by the second mesa structure MS2. According to an exemplary embodiment, the peripheral portion of the second transparent electrode 122, exposed by the second mesa structure MS2 may have a thickness less than a portion thereof overlapping the second mesa structure MS2.

According to an exemplary embodiment, the second mesa structure MS2 may have an inclined sidewall. In this case, the second p-type semiconductor layer 124 may have an area larger than the second active layer 126, and the second active layer 126 may have an area larger than the second n-type semiconductor layer 128. According to another exemplary embodiment shown in FIG. 2A, the second mesa structure MS2 may have a generally vertical sidewall. In this case, the second p-type semiconductor layer 124, the second active layer 126, and the second n-type semiconductor layer 128 may have substantially the same area.

According to an exemplary embodiment, the second mesa structure MS2 may have substantially a quadrangular shape with two corners cut. For example, the second mesa structure MS2 may have substantially a quadrangular structure, in which a first corner disposed in the first area AR1 and a second corner disposed in the second area AR2 are cut. In the second mesa structure MS2, the first corner-cut portion may have a structure corresponding to the first corner-cut portion of the second transparent electrode 122. For example, when viewed from the top, in the second mesa structure MS2, the first corner-cut portion may have a generally V-shaped first sidewall which is concavely bent inwardly towards the center of the second mesa structure MS2. In the second mesa structure MS2, the second corner-cut portion may have an unbent second sidewall.

In the second area AR2, the top surface of the second transparent electrode 122 may be exposed by the second sidewall of the second mesa structure MS2. Also, the top surface of the peripheral portion of the first transparent electrode 108 may be exposed by the second transparent electrode 122. The light emitting chip may further include a second conductive pattern 152, which electrically contacts the first transparent electrode 108 and the second transparent electrode 122. When viewed from the top, the second conductive pattern 152 may have substantially a triangular shape. One surface of the second conductive pattern 152 may be disposed on the second transparent electrode 122, and may have a structure corresponding to the second sidewall of the second mesa structure MS2, and may include, for example, an unbent planar surface. The other surface of the second conductive pattern 152 opposite to the one surface may be disposed on the first transparent electrode 108, and may have a structure corresponding to the outer sidewall of the first transparent electrode 108, and may include, for example, a vertically bent surface.

The second bonding portion 134, the second color filter 132, and a third transparent electrode 142 may be disposed on the second mesa structure MS2. The second bonding portion 134 may bond the second mesa structure MS2 and the third transparent electrode 142, and may fixedly attach the second light emitting part LE2 and the third light emitting part LE3. For example, the second bonding portion 134 may include substantially the same material as the first bonding portion 114, for example, one of OCA and OCR. The second color filter 132 may selectively pass light generated from the third light emitting part LE3, and may reflect light generated from the second light emitting part LE2 and the first light emitting part LE1 to prevent the light from being incident on the third light emitting part LE3. For example, the second color filter 132 may include a DBR which is different from the first color filter 112 in terms of thickness or component ratio. Meanwhile, the second color filter 132 and the second bonding portion 134 may include a material having excellent light transmittance.

Each of the second bonding portion 134, the second color filter 132, and the third transparent electrode 142 may be disposed on the second mesa structure MS2, and may have an area smaller than the second mesa structure MS2. According to an exemplary embodiment, each of the second color filter 132, the second bonding portion 134, and the third transparent electrode 142 may have an inclined sidewall. The sidewall of the second color filter 132, the sidewall of the second bonding portion 134, and the sidewall of the third transparent electrode 142 may be coplanar with one another. In this case, the second color filter 132 may have an area larger than the second bonding portion 134, and the second bonding portion 134 may have an area larger than the third transparent electrode 142. According to another exemplary embodiment shown in FIG. 2A, each of the second color filter 132, the second bonding portion 134, and the third transparent electrode 142 may have a generally vertical sidewall, and the sidewall of the second color filter 132, the sidewall of the second bonding portion 134, and the sidewall of the third transparent electrode 142 may be disposed on the same plane. In this case, the second color filter 132, the second bonding portion 134, and the third transparent electrode 142 may have substantially the same area.

When viewed from the top, the third transparent electrode 142 may be disposed inside the second mesa structure MS2. For example, the sidewall of the third transparent electrode 142 may be disposed inside the sidewall of the second mesa structure MS2. Therefore, the peripheral portion of the second mesa structure MS2 may be exposed by the third transparent electrode 142. According to an exemplary embodiment, the peripheral portion of the second n-type semiconductor layer 128 of the second mesa structure MS2 which is exposed by the third transparent electrode 142 may have a thickness less than a portion of the second n-type semiconductor layer 128 overlapping the third transparent electrode 142.

According to an exemplary embodiment, the third transparent electrode 142 may have substantially a quadrangular shape with three corners cut. For example, in the third transparent electrode 142, a first corner disposed in the first area AR1 may be cut, a second corner disposed in the second area AR2 may be cut, and a third corner disposed in a third area AR3 may be cut. In the third transparent electrode 142, the first corner-cut portion may have a structure corresponding to the first corner-cut portion of the second mesa structure MS2. For example, when viewed from the top, in the third transparent electrode 142, the first corner-cut portion may have a generally V-shaped first sidewall which is concavely bent inwardly towards the center of the third transparent electrode 142. In the third transparent electrode 142, the second corner-cut portion may have a structure corresponding to the second corner-cut portion of the second mesa structure MS2. For example, when viewed from the top, in the third transparent electrode 142, the second corner-cut portion may have an unbent second sidewall. In the third transparent electrode 142, the third corner-cut portion may have a generally V-shaped third sidewall which is concavely bent inwardly towards the center of the third transparent electrode 142. By the third corner-cut portion, a portion of the second n-type semiconductor layer 128 of the second mesa structure MS2 may be exposed.

According to an exemplary embodiment, in the third area AR3, the second n-type semiconductor layer 128 of the second mesa structure MS2 may be exposed by the third corner-cut portion of the third transparent electrode 142. The light emitting chip may further include a fourth conductive pattern 156 which is electrically coupled with the second n-type semiconductor layer 128 exposed by the third transparent electrode 142. When viewed from the top, the fourth conductive pattern 156 may have substantially a triangular shape. According to an exemplary embodiment, the fourth conductive pattern 156 may have one surface of a structure corresponding to the third sidewall of the third transparent electrode 142. For example, the one surface of the fourth conductive pattern 156 may have a generally V shape which is convexly bent inwardly towards the center of the third transparent electrode 142. The fourth conductive pattern 156 may have the other surface which is opposite to the one surface, and is vertically bent in correspondence to the outer sidewall of the second mesa structure MS2.

A third mesa structure MS3 may be disposed on the third transparent electrode 142. The third mesa structure MS3 may include a third p-type semiconductor layer 144, a third active layer 146, and a third n-type semiconductor layer 148, which are sequentially stacked. The third mesa structure MS3 may have an area smaller than the third transparent electrode 142. According to an exemplary embodiment, the third mesa structure MS3 may have an inclined sidewall. In this case, the third p-type semiconductor layer 144 may have an area larger than the third active layer 146, and the third active layer 146 may have an area larger than the third n-type semiconductor layer 148. According to another exemplary embodiment shown in FIG. 2A, the third mesa structure MS3 may have a generally vertical sidewall. In this case, the third p-type semiconductor layer 144, the third active layer 146, and the third n-type semiconductor layer 148 may have substantially the same area.

When viewed from the top, the third mesa structure MS3 may be disposed inside the third transparent electrode 142. For example, the sidewall of the third mesa structure MS3 may be disposed inside the sidewall of the third transparent electrode 142. Therefore, the peripheral portion of the third transparent electrode 142 may be exposed by the third mesa structure MS3. According to an exemplary embodiment, the peripheral portion of the third transparent electrode 142 exposed by the third mesa structure MS3 may have a thickness less than a portion thereof overlapping the third mesa structure MS3.

According to an exemplary embodiment, the third mesa structure MS3 may have substantially a quadrangular shape with three corners cut. For example, the third mesa structure MS3 may have substantially a quadrangular structure in which a first corner disposed in the first area AR1 is cut, a second corner disposed in the second area AR2 is cut, and a third corner disposed in the third area AR3 is cut. In the third mesa structure MS3, the first corner-cut portion may have a structure corresponding to the first corner-cut portion of the third transparent electrode 142. For example, when viewed from the top, in the third mesa structure MS3, the first corner-cut portion may have a generally V-shaped first sidewall which is concavely bent inwardly towards the center of the third mesa structure MS3. When viewed from the top, in the third mesa structure MS3, the second corner-cut portion may have a generally V-shaped second sidewall which is concavely bent inwardly towards the center of the third mesa structure MS3. When viewed from the top, in the third mesa structure MS3, the third corner-cut portion may have a generally V-shaped third sidewall which is concavely bent inwardly towards the center of the third mesa structure MS3.

According to an exemplary embodiment, in the second area AR2, the third transparent electrode 142 may be exposed by the second sidewall of the third mesa structure MS3. The light emitting chip may further include a third conductive pattern 154 which is electrically coupled with the third transparent electrode 142 and disposed on the third transparent electrode 142 exposed by the second sidewall of the third mesa structure MS3. According to an exemplary embodiment, when viewed from the top, the third conductive pattern 154 may have a shape corresponding to the shape of the third transparent electrode 142 exposed by the second sidewall of the third mesa structure MS3. For example, when viewed from the top, the third conductive pattern 154 may have one surface which is unbent to correspond to the second sidewall of the third transparent electrode 142. Also, the third conductive pattern 154 may have the other surface which is opposite to the one surface and has a generally V-shaped structure projecting inwardly towards the center of the third mesa structure MS3 to correspond to the second sidewall of the third mesa structure MS3.

According to an exemplary embodiment, the light emitting chip may further include a fifth conductive pattern 158 which is electrically coupled with the third n-type semiconductor layer 148 of the third mesa structure MS3. The fifth conductive pattern 158 may be disposed on the corner of the third n-type semiconductor layer 148, which is positioned in a fourth region AR4 opposing the first area AR1. The fifth conductive pattern 158 may have substantially a quadrangular shape, when viewed from the top, without being limited thereto.

The light emitting chip may further include an insulation layer ISL which is substantially conformally disposed along the top surface and side surface of the light emitting structure. According to an exemplary embodiment, the insulation layer ISL may have a structure which extends from the top surface of the third light emitting part LE3 of the light emitting structure to the top of the first n-type extended semiconductor layer 102E. When viewed from the top, the insulation layer ISL may have substantially the same quadrangular structure as the first n-type extended semiconductor layer 102E.

The insulation layer ISL may include a first opening OP1 (see FIGS. 13A to 13C) which exposes a portion of the first n-type extended semiconductor layer 102E in the first area AR1, a second opening OP2 (see FIGS. 13A to 13C) which exposes a portion of the first transparent electrode 108 and a portion of the second transparent electrode 122 in the second area AR2, a third opening OP3 (see FIGS. 13A to 13C) which exposes the third transparent electrode 142 in the second area AR2, a fourth opening OP4 (see FIGS. 13A to 13C) which exposes a portion of the second n-type semiconductor layer 128 in the third area AR3, and a fifth opening OP5 (see FIGS. 13A to 13C) which exposes a portion of the third n-type semiconductor layer 148 in the fourth area AR4.

According to an exemplary embodiment, the first conductive pattern 150, the second conductive pattern 152, the third conductive pattern 154, the fourth conductive pattern 156, and the fifth conductive pattern 158 may be disposed in the first opening OP1, the second opening OP2, the third opening OP3, the fourth opening OP4, and the fifth opening OP5, respectively. Therefore, the first conductive pattern 150 may be electrically coupled with the first n-type extended semiconductor layer 102E in the first area AR1. The second conductive pattern 152 may be electrically coupled with the first transparent electrode 108 and the second transparent electrode 122 in the second area AR2. The third conductive pattern 154 may be electrically coupled with the third transparent electrode 142 in the second area AR2. The fourth conductive pattern 156 may be electrically coupled with the second n-type semiconductor layer 128 in the third area AR3. The fifth conductive pattern 158 may be electrically coupled with the third n-type semiconductor layer 148 in the fourth area AR4.

The first conductive pattern 150 may have, in the first area AR1, generally V-shaped one surface which is convexly bent inwardly towards the center of the first n-type semiconductor layer 102, and may have the other surface which faces away from the one surface and is vertically bent.

The second conductive pattern 152 may have, in the second area AR2, one surface which is disposed on the second transparent electrode 122 and is not bent, and may have the other surface, which is opposite to the one surface, disposed on the first transparent electrode 108 and is vertically bent. In particular, in order to increase a contact area with the first transparent electrode 108, the other surface of the second conductive pattern 152 may be disposed adjacent to the corner of the first transparent electrode 108. For example, the other surface of the second conductive pattern 152 may have a structure which covers at least a portion of the corner of the first transparent electrode 108 in the second area AR2, is parallel to the corner of the first transparent electrode 108, and is parallel to surfaces extending from the second sidewall of the second transparent electrode 122.

The third conductive pattern 154 may have a structure corresponding to the space defined by the sidewall of the third n-type semiconductor layer 148 and the sidewall of the third transparent electrode 142 in the second area AR2. For example, one surface of the third conductive pattern 154, which corresponds to the sidewall of the third n-type semiconductor layer 148, may have a V-shape that is convexed inwardly towards the center of the third n-type semiconductor layer 148. The other surface of the third conductive pattern 154, which is opposite to the one surface, may correspond to the sidewall of the third transparent electrode 142 and, for example, is not bent.

The fourth conductive pattern 156 may have a structure corresponding to the space defined by the sidewall of the third transparent electrode 142 and the sidewall of the second n-type semiconductor layer 128 in the third area AR3. For example, the fourth conductive pattern 156 may have one surface which corresponds to the sidewall of the third transparent electrode 142 and has, for example, a V-shape that is convexed inwardly towards the center of the third transparent electrode 142. The other surface of the fourth conductive pattern 156, which is opposite to the one surface, corresponds to the sidewall of the second n-type semiconductor layer 128 and, for example, is vertically bent.

The fifth conductive pattern 158 may be formed in the fourth area AR4, and may have substantially a quadrangular structure when viewed from the top.

The light emitting chip may further include a first thin film conductive pattern 160 electrically coupled with the first n-type semiconductor layer 102, a second thin film conductive pattern 162 electrically coupled with the second n-type semiconductor layer 128, a third thin film conductive pattern 164 electrically coupled with the third n-type semiconductor layer 148, and a fourth thin film conductive pattern 166 electrically couples the first transparent electrode 108, the second transparent electrode, 122 and the third transparent electrode 142 to each other.

The first thin film conductive pattern 160 of the light emitting chip may be electrically coupled with the first n-type semiconductor layer 102 by being electrically coupled with the first conductive pattern 150, the second thin film conductive pattern 162 may be electrically coupled with the second n-type semiconductor layer 128 by being electrically coupled with the fourth conductive pattern 156, the third thin film conductive pattern 164 may be electrically coupled with the third n-type semiconductor layer 148 by being electrically coupled with the fifth conductive pattern 158, and the fourth thin film conductive pattern 166 may be electrically coupled with the first transparent electrode 108, the second transparent electrode 122, and the third transparent electrode 142 by being electrically coupled with the second conductive pattern 152 and the third conductive pattern 154.

The first thin film conductive pattern 160 may be disposed in the first area AR1, and may have substantially a quadrangular shape when viewed from the top. The first thin film conductive pattern 160 may be disposed to cover at least a portion of the top of the third n-type semiconductor layer 148 of the third light emitting part LE3, continuously extend along the top and side surfaces of the light emitting structure, and cover the first n-type extended semiconductor layer 102E. The insulation layer ISL may be disposed between the first thin film conductive pattern 160 and the light emitting structure to insulate them from each other, and the first thin film conductive pattern 160 may electrically contact the first conductive pattern 150 through the first opening OP1.

The second thin film conductive pattern 162 may be disposed in the third area AR3, and may have substantially a quadrangular shape when viewed from the top. The second thin film conductive pattern 162 may be disposed to cover at least a portion of the top of the third n-type semiconductor layer 148 of the third light emitting part LE3, continuously extend along the top and side surfaces of the light emitting structure, and cover the first n-type extended semiconductor layer 102E. The insulation layer ISL may be disposed between the second thin film conductive pattern 162 and the light emitting structure to insulate them from each other, and the second thin film conductive pattern 162 may electrically contact the fourth conductive pattern 156 through the fourth opening OP4.

The third thin film conductive pattern 164 may be disposed in the fourth area AR4, and may have substantially a quadrangular shape when viewed from the top. The third thin film conductive pattern 164 may be disposed to cover at least a portion of the top of the third n-type semiconductor layer 148 of the third light emitting part LE3, continuously extend along the top and side surfaces of the light emitting structure, and cover the first n-type extended semiconductor layer 102E. The insulation layer ISL may be disposed between the third thin film conductive pattern 164 and the light emitting structure to insulate them from each other, and the third thin film conductive pattern 164 may electrically contact the fifth conductive pattern 158 through the fifth opening OP5.

The fourth thin film conductive pattern 166 may be disposed in the second area AR2, and may have substantially a quadrangular structure when viewed from the top. The fourth thin film conductive pattern 166 may be disposed to cover at least a portion of the top of the third n-type semiconductor layer 148 of the third light emitting part LE3, continuously extend along the top and side surfaces of the light emitting structure, and cover the first n-type extended semiconductor layer 102E. The insulation layer ISL may be disposed between the fourth thin film conductive pattern 166 and the light emitting structure to insulate them from each other, and the fourth thin film conductive pattern 166 may electrically contact the second conductive pattern 152 and the third conductive pattern 154 through the second opening OP2 and the third opening OP3.

According to an exemplary embodiment, each of the first thin film conductive pattern 160, the second thin film conductive pattern 162, the third thin film conductive pattern 164, and the fourth thin film conductive pattern 166 may extend from the top of the light emitting structure to the first n-type extended semiconductor layer 102E. Accordingly, the first to fourth thin film conductive patterns 160, 162, 164, and 166, which are disposed on the first n-type extended semiconductor layer 102E, may have portions that are substantially flat.

The first passivation layer PVT1 may substantially or completely cover the light emitting structure, the insulation layer ISL, the first to fifth conductive patterns 150, 152, 154, 156, and 158, and the first to fourth thin film conductive patterns 160, 162, 164, and 166. According to an exemplary embodiment, the first passivation layer PVT1 may include a polymer material, for example, polyimide or epoxy molding compound (EMC).

When viewed from the top, the first passivation layer PVT1 may have substantially a quadrangular structure, and the quadrangle of the first passivation layer PVT1 may be larger than the quadrangle of the first n-type semiconductor layer 102. In this case, the outer sidewall of the first n-type extended semiconductor layer 102E may be closer to the center of the light emitting chip than the outer sidewall of the first passivation layer PVT1.

According to an exemplary embodiment, the first passivation layer PVT1 may have a top surface positioned at a higher level than the top surfaces of the respective first to fourth thin film conductive patterns 160, 162, 164, and 166 that are disposed on the light emitting structure. The bottom surface of the first passivation layer PVT1 may be coplanar with the bottom surface of the light emitting structure.

In this manner, as the first passivation layer PVT1 substantially or completely covers the light emitting structure including the first to fourth thin film conductive patterns 160, 162, 164, and 166, and thus, it is possible to prevent the peripheral portion of the light emitting chip from breaking or being damaged while moving or operating the light emitting chip. Also, even though the peripheral portion of the light emitting chip breaks or is damaged, since the light emitting structure is protected by the first passivation layer PVT1, damage to the light emitting structure may be prevented. Further, as the first passivation layer PVT1 surrounds the side surface of the light emitting structure, light generated from the light emitting structure may be reflected by the side surface, and thus, the amount of light loss may be reduced and increase light efficiency.

The first passivation layer PVT1 may have a first via hole, a second via hole, a third via hole, and a fourth via hole. The first via hole may expose at least a portion of the first thin film conductive pattern 160. For example, the first via hole may expose a portion of the first thin film conductive pattern 160, which is flat and disposed on the first n-type extended semiconductor layer 102E. The second via hole may expose at least a portion of the second thin film conductive pattern 162. For example, the second via hole may expose a portion of the second thin film conductive pattern 162, which is flat and disposed on the first n-type extended semiconductor layer 102E. The third via hole may expose at least a portion of the third thin film conductive pattern 164. For example, the third via hole may expose a portion of the third thin film conductive pattern 164, which is flat and disposed on the first n-type extended semiconductor layer 102E. The fourth via hole may expose at least a portion of the fourth thin film conductive pattern 166. For example, the fourth via hole may expose a portion of the fourth thin film conductive pattern 166, which is flat and disposed on the first n-type extended semiconductor layer 102E.

The light emitting chip may further include a first via contact 170 which fills the first via hole and electrically contacts the first thin film conductive pattern 160, a second via contact 172 which fills the second via hole and electrically contacts the second thin film conductive pattern 162, a third via contact 174 which fills the third via hole and electrically contacts the third thin film conductive pattern 164, and a fourth via contact 176 which fills the fourth via hole and electrically contacts the fourth thin film conductive pattern 166. Since the first via hole, the second via hole, the third via hole, and the fourth via hole expose the first thin film conductive pattern 160, the second thin film conductive pattern 162, the third thin film conductive pattern 164, and the fourth thin film conductive pattern 166, respectively, each of which are disposed on a flat portion of the first n-type extended semiconductor layer 102E (e.g., a connector), the first via contact 170, the second via contact 172, the third via contact 174, and the fourth via contact 176 filling the first via hole, the second via hole, the third via hole, and the fourth via hole, respectively, may be formed on a substantially flat surface.

According to an exemplary embodiment, the first to fourth via contacts 170, 172, 174, and 176 may include portions which fill the first to fourth via holes, respectively, and portions which project upward out of the first passivation layer PVT1. For example, the first via contact 170 may include a portion which fills the first via hole and a portion which projects upward out of the first passivation layer PVT1. The portion which projects upward out of the first passivation layer PVT1 may have an area wider than the portion filling the first via hole. According to another exemplary embodiment, the top surface of each of the first to fourth via contacts 170, 172, 174, and 176 may be substantially coplanar with the top surface of the first passivation layer PVT1.

According to an exemplary embodiment, a separation distance SD from each of the first to fourth via contacts 170, 172, 174, and 176 to the sidewall of the first passivation layer PVT1 may be varied depending on a device to which the light emitting chip is mounted. For example, a separation distance SD from the first via contact 170 to the sidewall of the first passivation layer PVT1 may refer to a distance from the sidewall of the first via contact 170 having the widest width to the sidewall of the first passivation layer PVT1. Meanwhile, in general, in a device (e.g., a display device) to which light emitting chips are mounted, standardized arrangement and separation distances, in which the light emitting chips are disposed, are set. As such, the separation distance SD from each of the first to fourth via contacts 170, 172, 174, and 176 to the first passivation layer PVT1 may be preset depending on a standardized distance. For example, the separation distance SD from the first via contact 170 to the first passivation layer PVT1 may be about half of the separation distance between two adjacent light emitting chips in a device to which light emitting chips are mounted.

Referring to FIG. 2C, each of the first to fourth via contacts 170, 172, 174, and 176 may overlap at least one of the first to third active layers 104, 126, and 146. For example, the first via contact 170 may overlap at least one of the first to third active layers 104, 126, and 146 by a portion which projects upward out of the first passivation layer PVT1. In particular, the first via contact 170 may overlap a portion of the first conductive pattern 150.

According to the exemplary embodiments described above with reference to FIGS. 1A to 1C and 2A to 2C, the first to third thin film conductive patterns 160, 162, and 164 are described as being electrically coupled with the first to third n-type semiconductor layers 102, 128, and 148, respectively, and the fourth thin film conductive pattern 166 is described as being a common electrode which couples the first to third transparent electrodes 108, 122, and 142 to each other. However, the inventive concepts are not limited thereto, and the first to third thin film conductive patterns 160, 162, and 164 may be electrically coupled with the first to third transparent electrodes 108, 122, and 142, respectively, and the fourth thin film conductive pattern 166 may be a common electrode which couples the first to third n-type semiconductor layers 102, 128, and 148 to each other.

Figure 3A:
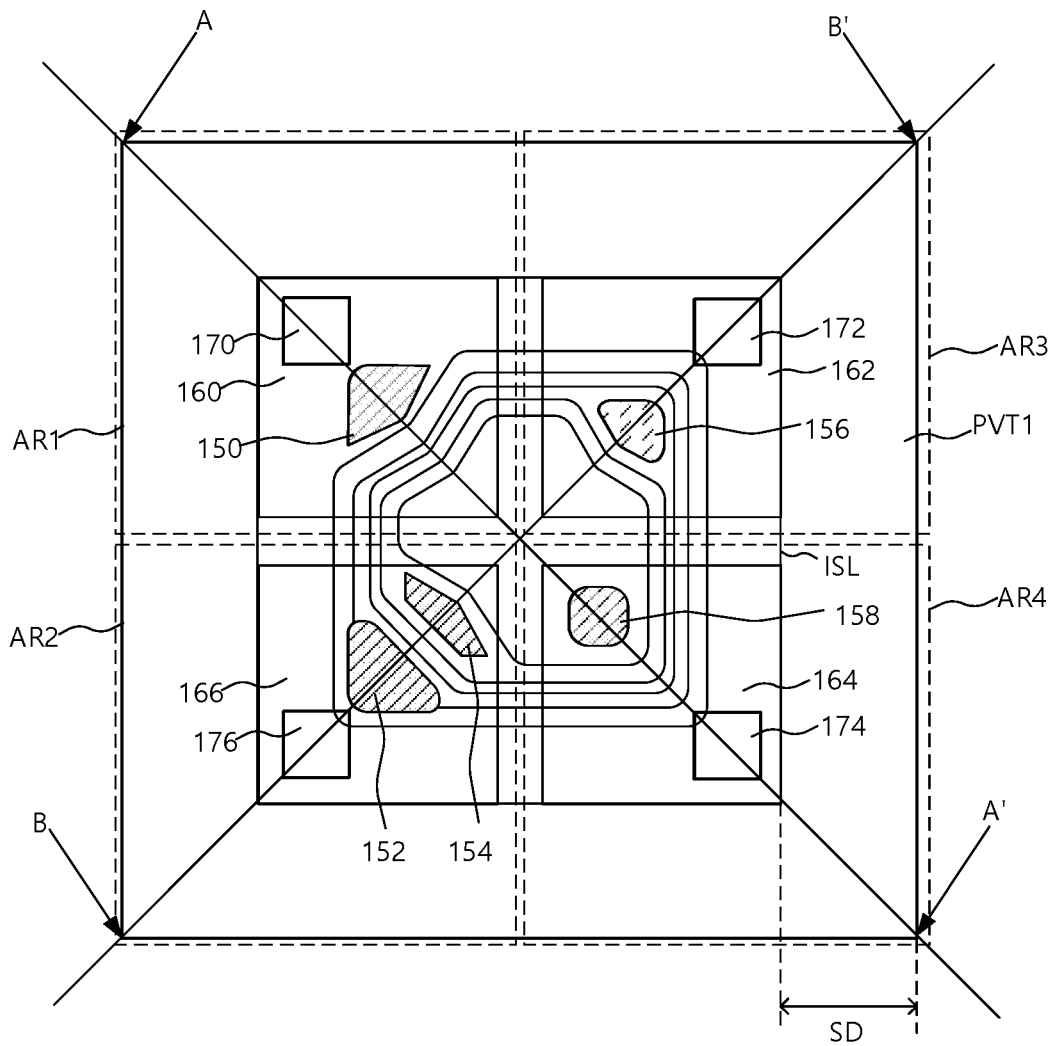
FIG. 3A is a plan view of a light emitting chip according to an exemplary embodiment.
Figure 3B:
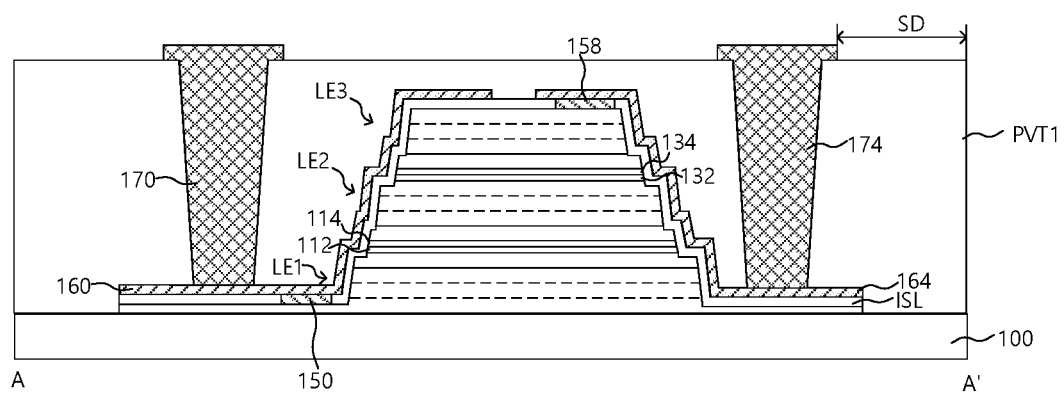
FIG. 3B and FIG. 3C are cross-sectional views taken along line A-A' and B-B' of FIG. 3A, respectively.
Figure 3C:
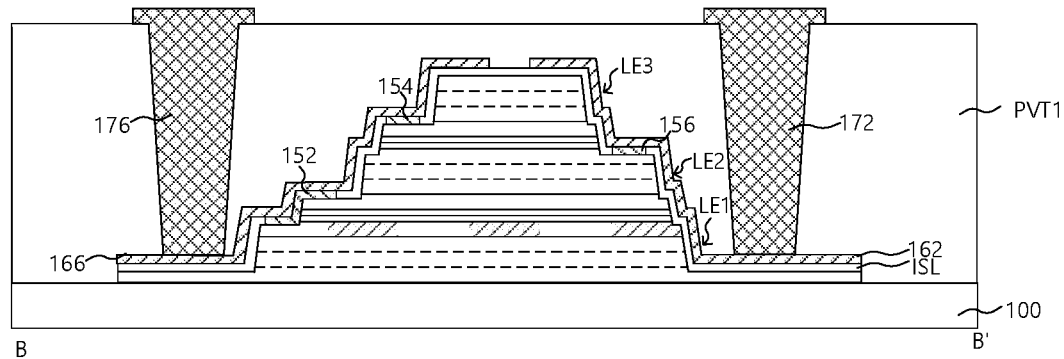
Figure 4A:
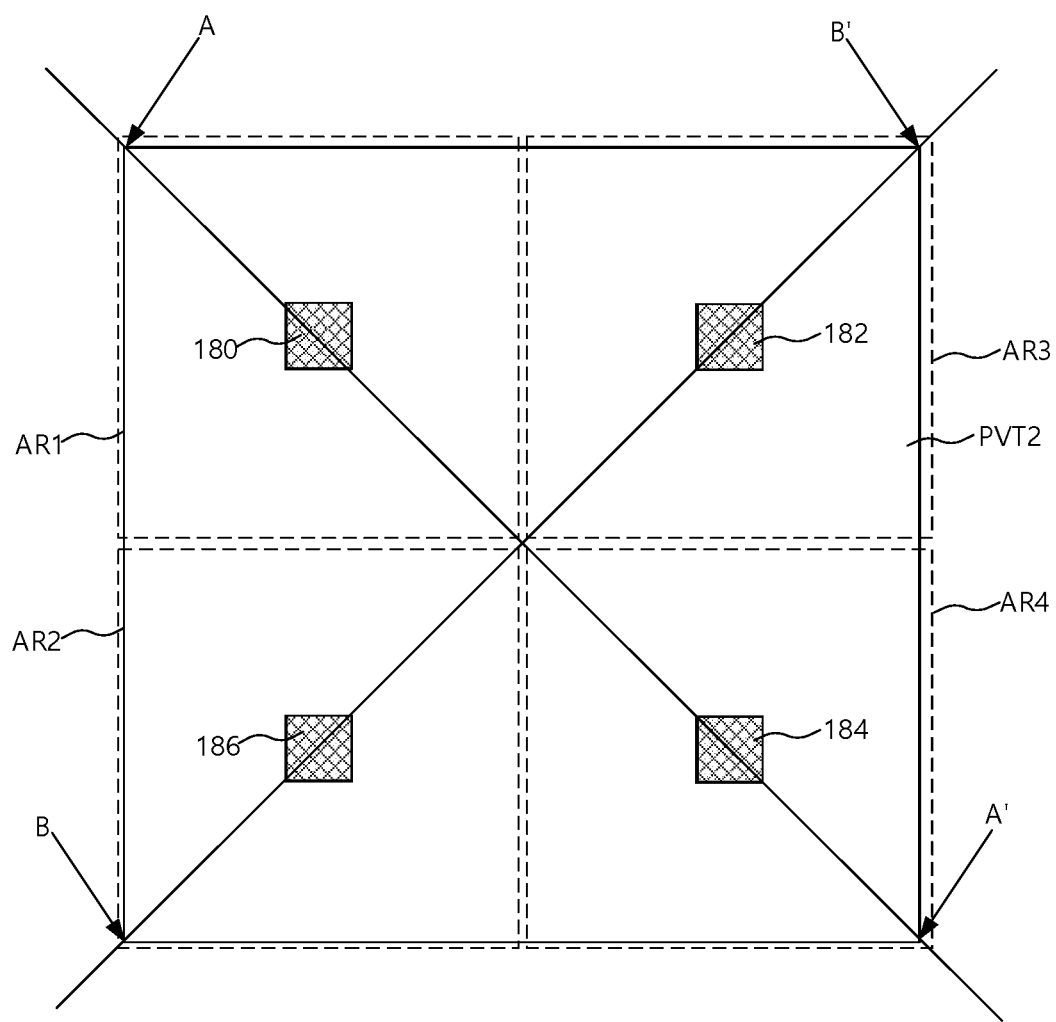
FIG. 4A is a plan view of a light emitting chip according to an exemplary embodiment.
Figure 4B:
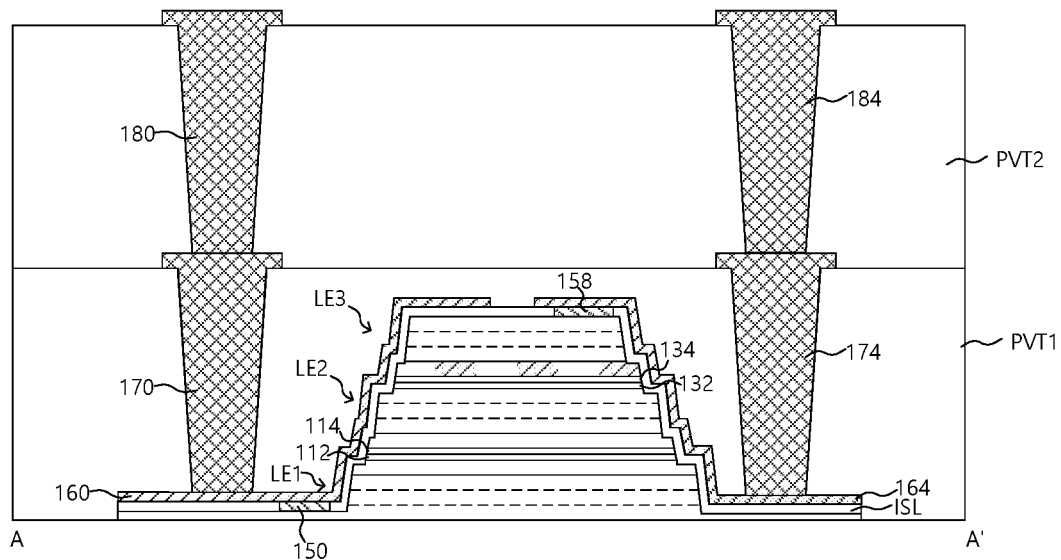
FIGS. 4B and 4C are cross-sectional views taken along line A-A' and B-B' of FIG. 4A, respectively.
Figure 4C:
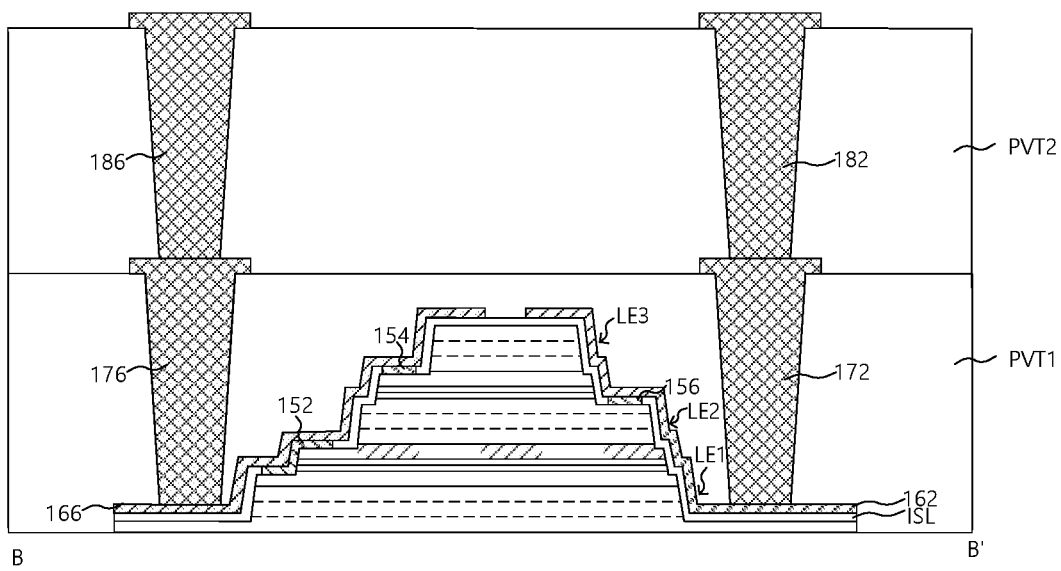
Figure 5A:
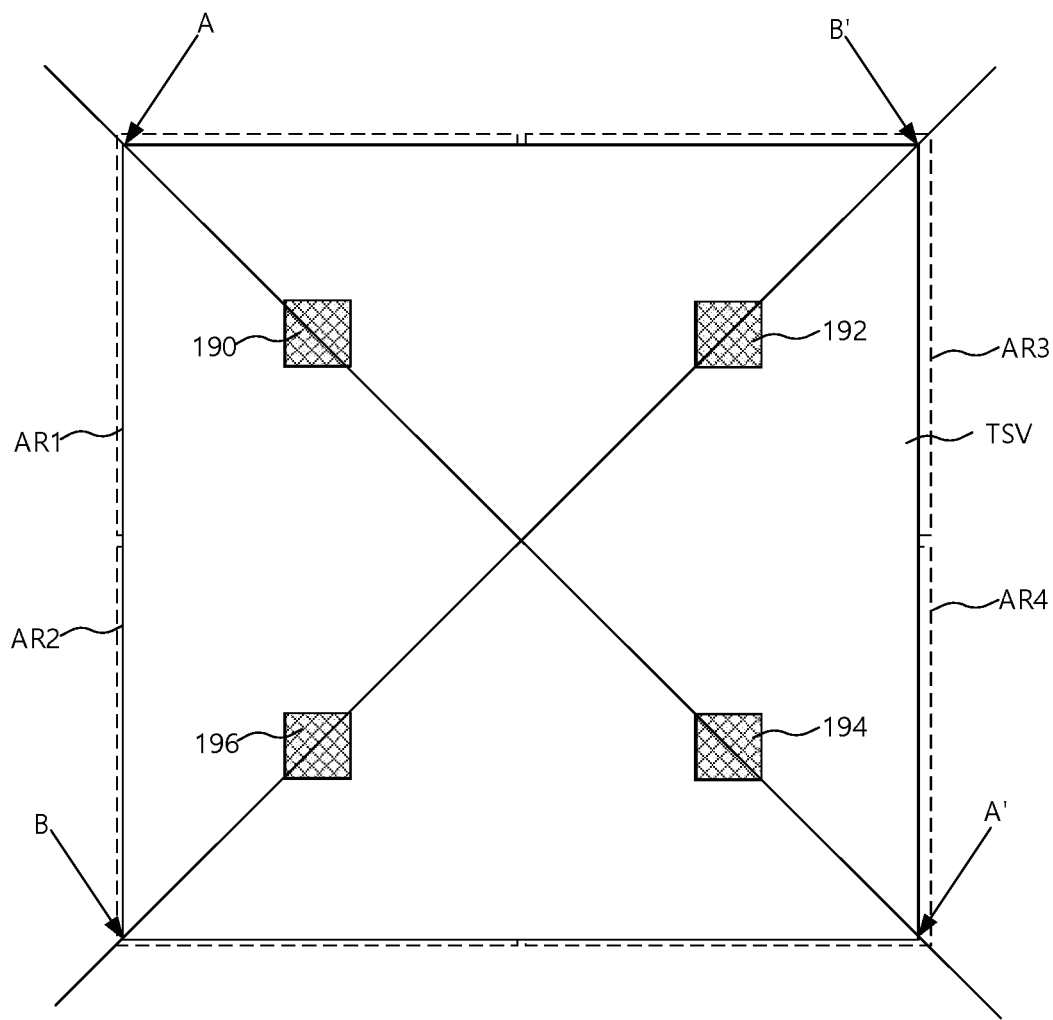
FIG. 5A is a plan view of a light emitting chip according to an exemplary embodiment.
Figure 5B:
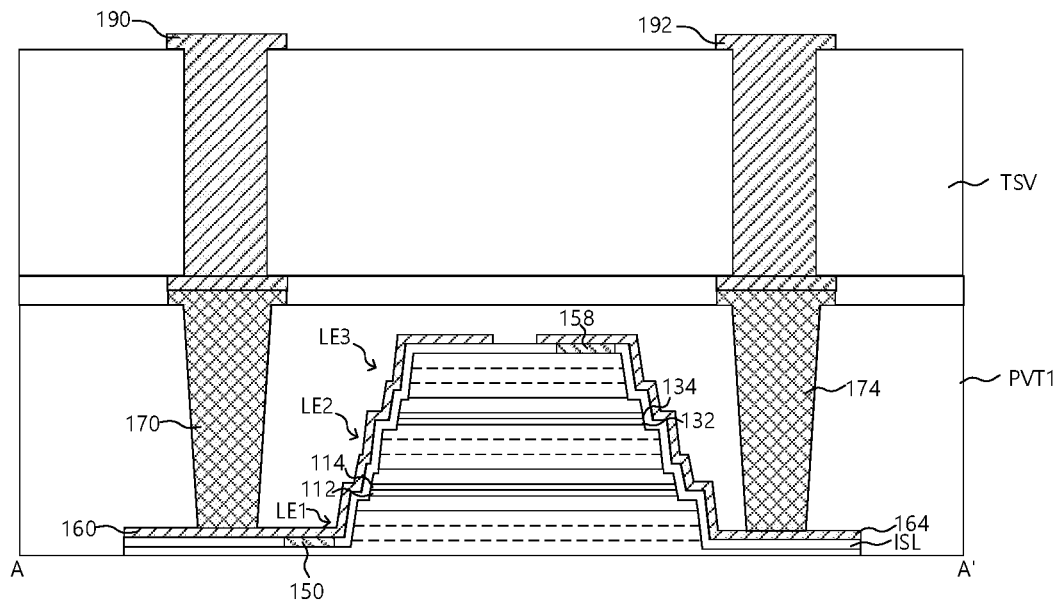
FIGS. 5B and 5C are cross-sectional views taken along line A-A' and B-B' of FIG. 5A, respectively.

FIGS. 3A, 4A, and 5A are plan views of light emitting chips according to exemplary embodiments, FIGS. 3B, 4B, and 5B are cross-sectional views taken along lines A-A' of FIGS. 3A, 4A, and 5A, and FIGS. 3C, 4C, and 5C are cross-sectional views taken along lines B-B' of FIGS. 3A to 5A, respectively.

Referring to FIGS. 3A to 5C, each of light emitting chips may include a light emitting structure LE1, 112, 114, LE2, 132, 134 and LE3, an insulation layer ISL, first to fifth conductive patterns 150, 152, 154, 156, and 158, first to fourth thin film conductive patterns 160, 162, 164, and 166, a first passivation layer PVT1 and first to fourth via contacts 170, 172, 174, and 176. Since the light emitting structure LE1, 112, 114, LE2, 132, 134, and LE3, the insulation layer ISL, the first to fifth conductive patterns 150, 152, 154, 156, and 158, the first to fourth thin film conductive patterns 160, 162, 164, and 166, the first passivation layer PVT1, and the first to fourth via contacts 170, 172, 174, and 176 according to exemplary embodiments are substantially the same as the light emitting structure LE1, 112, 114, LE2, 132, 134, and LE3, the insulation layer ISL, the first to fifth conductive patterns 150, 152, 154, 156, and 158, the first to fourth thin film conductive patterns 160, 162, 164, and 166, the first passivation layer PVT1, and the first to fourth via contacts 170, 172, 174, and 176 described above with reference to FIGS. 1A to 2B, detailed descriptions thereof will be omitted to avoid redundancy.

Referring to FIGS. 3A, 3B, and 3C, the light emitting chip according to an exemplary embodiment may further include a substrate 100 disposed on the bottom surface of the light emitting structure LE1, 112, 114, LE2, 132, 134, and LE3. The substrate 100 may be capable of growing a nitride semiconductor layer of the group III element of the first light emitting part LE1 thereon, and may be a sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate.

The substrate 100 may be in contact with the bottom surface of the first n-type semiconductor layer 102 including the first n-type extended semiconductor layer 102E and the bottom surface of the first passivation layer PVT1. The top and side surface of the light emitting structure may be protected by the first passivation layer PVT1, and the bottom surface of the light emitting structure may be protected by the substrate 100.

Since the thickness of the light emitting chip including the light emitting structure, the insulation layer ISL, the first to fifth conductive patterns 150, 152, 154, 156, and 158, the first to fourth thin film conductive patterns 160, 162, 164 and 166, the first passivation layer PVT1, and the first to fourth via contacts 170, 172, 174, and 176 is generally substantially thin, a phenomenon in which the light emitting chip warps may occur. According to an exemplary embodiment, by disposing the substrate 100 on the bottom surface of the light emitting structure, the warpage phenomenon the light emitting chip may be prevented.

Referring to FIGS. 4A, 4B, and 4C, the light emitting chip according to an exemplary embodiment may further include a second passivation layer PVT2, and fifth to eighth via contacts 180, 182, 184, and 186 disposed on the first passivation layer PVT1. The second passivation layer PVT2 may include substantially the same material as the first passivation layer PVT1, for example, polyimide or EMC. The second passivation layer PVT2 may have a fifth via hole which exposes the top of the first via contact 170, a sixth via hole which exposes the top of the second via contact 172, a seventh via hole which exposes the top of the third via contact 174, and an eighth via hole which exposes the top of the fourth via contact 176.

According to an exemplary embodiment, the fifth to eighth via contacts 180, 182, 184, and 186 may include portions which fill the fifth to eighth via holes, respectively, and portions which project upward out of the second passivation layer PVT2. For example, the fifth via contact 180 may include a portion which fills the fifth via hole and a portion which projects upward out of the second passivation layer PVT2. The portion which projects upward out of the second passivation layer PVT2 may have an area wider than the portion which fills the fifth via hole. According to another exemplary embodiment, the top surface of each of the fifth to eighth via contacts 180, 182, 184, and 186 may be substantially coplanar with the top surface of the second passivation layer PVT2.

Since the light emitting chip according to an exemplary embodiment includes the plurality of passivation layers PVT1 and PVT2 that are stacked, the warpage phenomenon to the light emitting chip may be prevented.

Figure 5C:
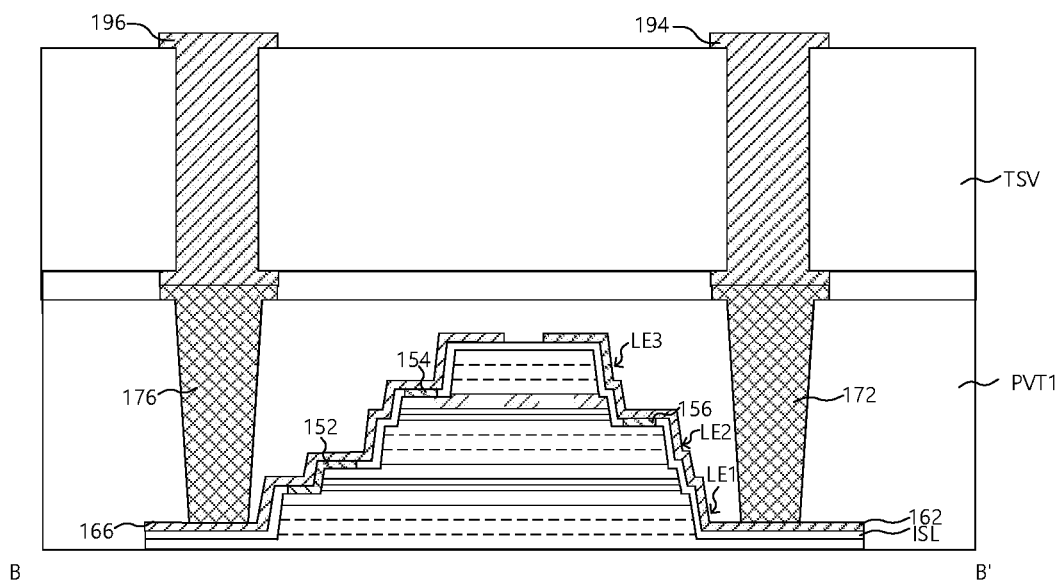

Referring to FIGS. 5A, 5B and 5C, the light emitting chip according to an exemplary embodiment may further include a through-silicon via (TSV) substrate TSV disposed on the first passivation layer PVT1.

In general, multiple layers of conductive patterns are formed in the TSV substrate TSV. Conductive patterns which are electrically coupled with the first to fourth via contacts 170, 172, 174, and 176 may be disposed on one surface of the TSV substrate TSV, and conductive patterns 190, 192, 194, and 196 which correspond to the respective positions of the fifth to eighth via contacts 180, 182, 184, and 186 described above with reference to FIG. 4B may be disposed on the other surface of the TSV substrate TSV. By using the TSV substrate TSV, the warpage phenomenon the light emitting chip may be prevented.

Hereinafter, a method for manufacturing a light emitting chip according to an exemplary embodiment will be described.

FIGS. 6A, 7A, 8A, 9A, 10A, 11A, 12A, 13A, 14A, 15A, 16A, and 17A are plan views for illustrating a method for manufacturing a light emitting chip according to an exemplary embodiment. FIGS. 6B, 7B, 8B, 9B, 10B, 11B, 12B, 13B, 14B, 15B, 16B, and 17B are cross-sectional views taken along lines A-A' of FIGS. 6A to 17A, and FIGS. 6C, 7C, 8C, 9C, 10C, 11C, 12C, 13C, 14C, 15C, 16C, and 17C are cross-sectional views taken along lines B-B' of FIGS. 6A to 17A.

Figure 6A:
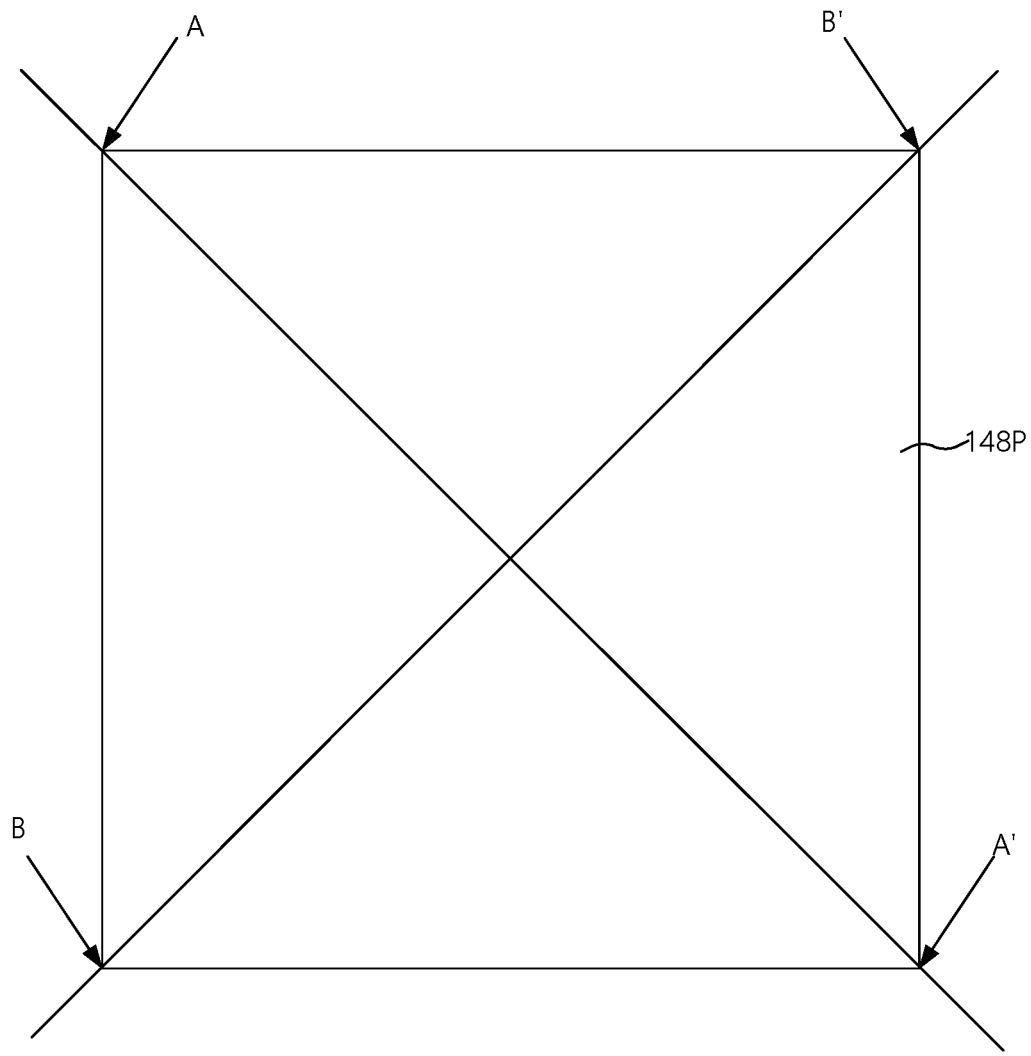
FIG. 6A is a plan view of a light emitting chip according to an exemplary embodiment.
Figure 6B:
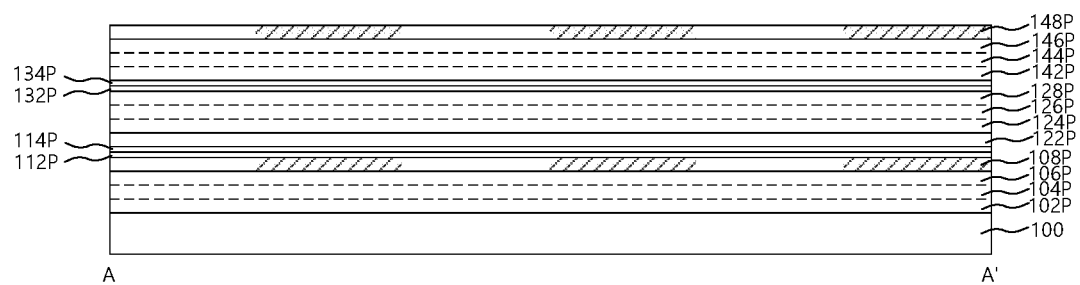
FIGS. 6B and 6C are cross-sectional views taken along line A-A' and B-B' of FIG. 6A, respectively.
Figure 6C:
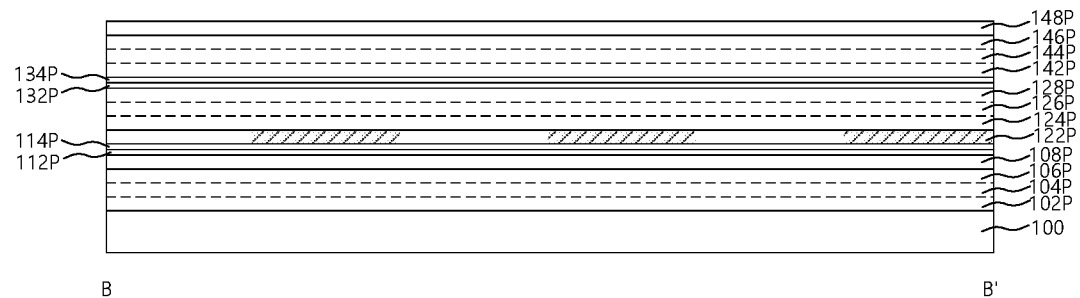

Referring to FIGS. 6A and 6B, a pre-first light emitting part, a pre-first color filter 112P, a pre-first bonding portion 114P, a pre-second light emitting part, a pre-second color filter 132P, a pre-second bonding portion 134P, and a pre-third light emitting part may be sequentially stacked on a first substrate 100.

The first substrate 100 may be a sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate. A pre-first n-type semiconductor layer 102P, a pre-first active layer 104P, and a pre-first p-type semiconductor layer 106P may be sequentially grown on the first substrate 100 through a process such as metal organic chemical vapor deposition (MOCVD) or molecular beam epitaxy (MBE). A pre-first transparent electrode 108P may be formed on the pre-first p-type semiconductor layer 106P by using a chemical vapor deposition method. For example, the pre-first transparent electrode 108P may include at least one of ITO (indium tin oxide), IZO (indium zinc oxide), IZTO (indium zinc tin oxide) and ZnO. In this manner, the pre-first light emitting part including the pre-first n-type semiconductor layer 102P, the pre-first active layer 104P, the pre-first p-type semiconductor layer 106P, and the pre-first transparent electrode 108P may be formed. For example, when the pre-first light emitting part emits blue light, the first substrate 100 may include sapphire, and the pre-first transparent electrode 108P may include ZnO.

A pre-second n-type semiconductor layer 128P, a pre-second active layer 126P, and a pre-second p-type semiconductor layer 124P may be sequentially grown on a second substrate through a process such as MOCVD or MBE. A pre-second transparent electrode 122P may be formed on the pre-second p-type semiconductor layer 124P by a chemical vapor deposition method. For example, the pre-second transparent electrode 122P may include at least one of ITO, IZO, IZTO and ZnO. In this manner, the pre-second light emitting part including the pre-second n-type semiconductor layer 128P, the pre-second active layer 126P, the pre-second p-type semiconductor layer 124P, and the pre-second transparent electrode 122P may be formed. For example, when the pre-second light emitting part emits green light, the second substrate may include one of sapphire and GaN, and the pre-second transparent electrode 122P may include ZnO.

A pre-third n-type semiconductor layer 148P, a pre-third active layer 146P, and a pre-third p-type semiconductor layer 144P may be sequentially grown on a third substrate through a process such as MOCVD or MBE. A pre-third transparent electrode 142P may be formed on the pre-third p-type semiconductor layer 144P by a chemical vapor deposition method. For example, the pre-third transparent electrode 142P may include at least one of ITO, IZO, IZTO, and ZnO. In this manner, the pre-third light emitting part including the pre-third n-type semiconductor layer 148P, the pre-third active layer 146P, the pre-third p-type semiconductor layer 144P, and the pre-third transparent electrode 142P may be formed. For example, when the pre-third light emitting part emits red light, the third substrate may include GaAsN, and the pre-third transparent electrode 142P may include ITO.

According to an exemplary embodiment, a pre-first color filter 112P may be formed on the pre-first transparent electrode 108P by using a chemical vapor deposition method. The pre-first color filter 112P may include a DBR, which is formed by alternately forming two transparent materials having different refractive indexes, for example, $TiO_2$ and $SiO_2$. According to another exemplary embodiment, the pre-first color filter 112P may be alternatively formed on the pre-second transparent electrode 122P.

The pre-first light emitting part on the first substrate 100 and the pre-second light emitting part on the second substrate may be bonded with each other by disposing the pre-first color filter 112P on the first substrate 100 and the pre-second transparent electrode 122P on the second substrate to face each other, with a pre-first bonding portion 114P between the pre-first color filter 112P and the pre-second transparent electrode 122P. Then, the second substrate may be removed through a laser lift-off process or the like. As such, the pre-first light emitting part and the pre-second light emitting part may be disposed on the first substrate 100.

According to an exemplary embodiment, a pre-second color filter 132P may be formed on the pre-second n-type semiconductor layer 128P, which has been removed from the second substrate, by using a chemical vapor deposition method. The pre-second color filter 132P may include a DBR which is formed by alternately forming two transparent materials having different refractive indexes, for example, $TiO_2$ and $SiO_2$. In this case, in the pre-second color filter 132P, the types of light to be transmitted and reflected may be determined by changing the thickness and a component ratio of the pre-second color filter 132P to be different from those of the pre-first color filter 112P. According to another exemplary embodiment, the pre-second color filter 132P may be formed on the pre-third transparent electrode 142P by using a chemical vapor deposition method.

The pre-first light emitting part and the pre-second light emitting part on the first substrate 100 and the pre-third light emitting part on the third substrate may be bonded with each other by disposing the pre-second color filter 132P and the pre-third transparent electrode 142P on the third substrate to face each other with a pre-second bonding portion 134P between the pre-second color filter 132P and the pre-third transparent electrode 142P. Then, the third substrate may be removed through a laser lift-off process or the like.

Figure 7A:
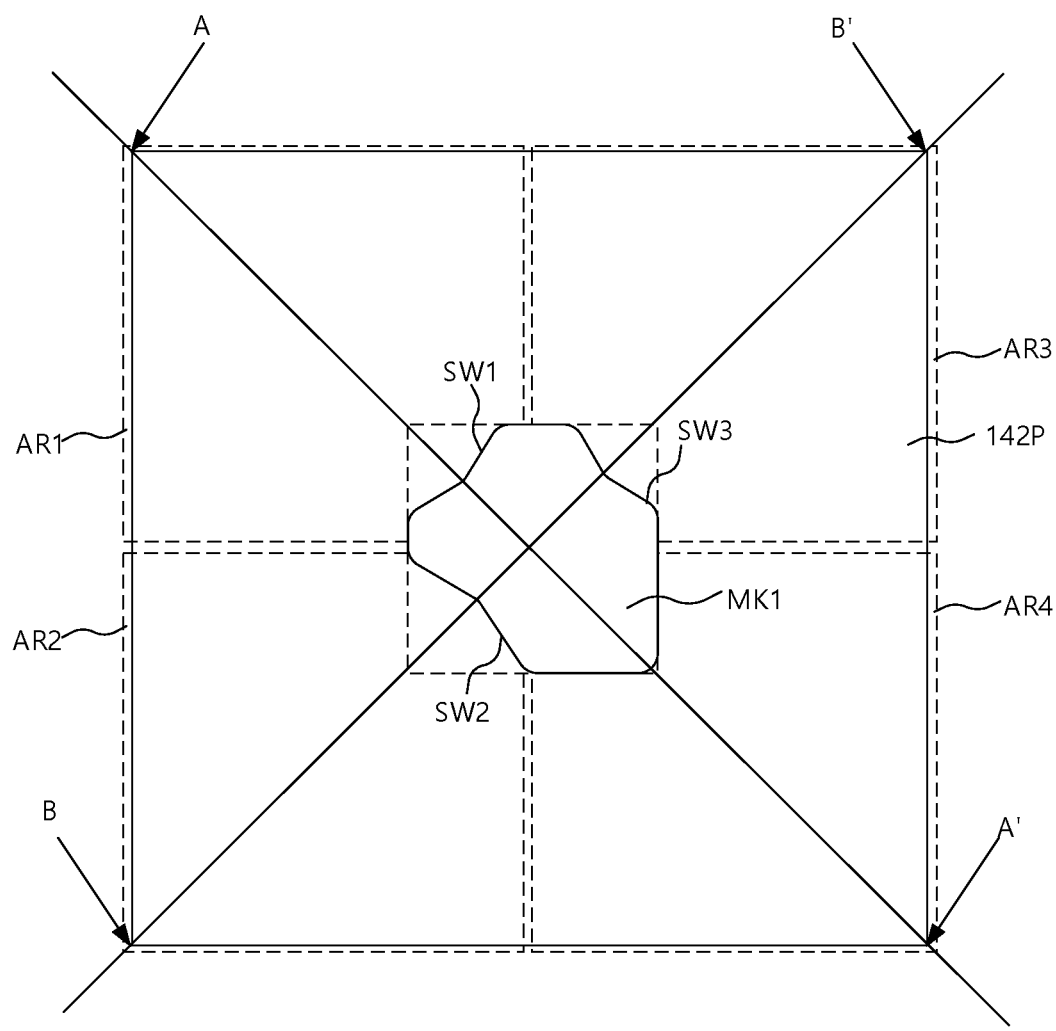
FIG. 7A is a plan view of a light emitting chip according to an exemplary embodiment.
Figure 7B:
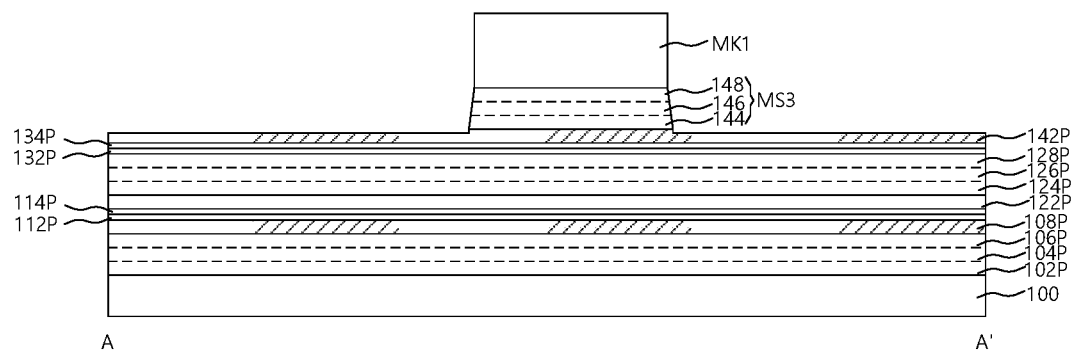
FIGS. 7B and 7C are cross-sectional views taken along line A-A' and B-B' of FIG. 7A, respectively.
Figure 7C:
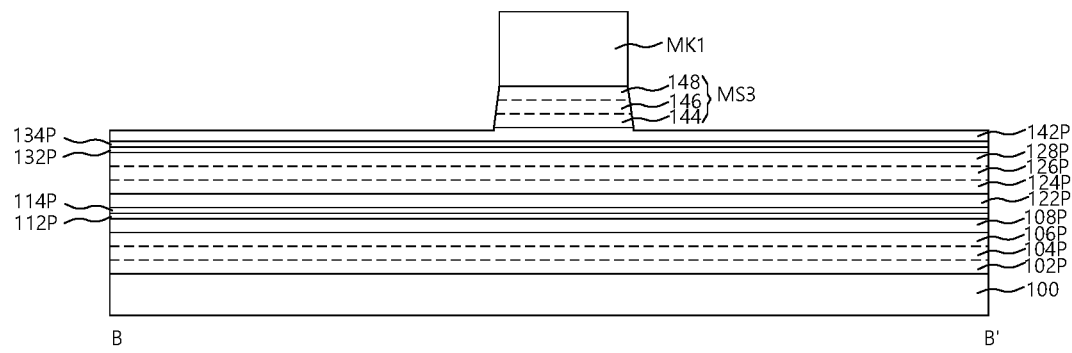

Referring to FIGS. 7A to 7C, a third n-type semiconductor layer 148, a third active layer 146, and a third p-type semiconductor layer 144 may be formed by forming a first mask pattern MK1 on the pre-third light emitting part, and etching the pre-third n-type semiconductor layer 148P, the pre-third active layer 146P, and the pre-third p-type semiconductor layer 144P through using the first mask pattern MK1 as an etch mask.

The first mask pattern MK1 may have a substantially quadrangular structure when viewed from the top. In particular, the first mask pattern MK1 may have corners positioned in a first area AR1, a second area AR2 neighboring the first area AR1, and a third area AR3 opposing the second area AR2 which are cut. As shown in FIG. 7A, the first mask pattern MK1 may have a first sidewall SW1 which is disposed in the first area AR1 and has a substantially V-shape concavely recessed inwardly towards the center of the pre-third light emitting part, a second sidewall SW2 which is disposed in the second area AR2 and has a substantially V-shape concavely recessed inwardly towards the center of the pre-third light emitting part, and a third sidewall SW3 which is disposed in the third area AR3 and has a substantially V-shape concavely recessed inwardly towards the center of the pre-third light emitting part.

According to an exemplary embodiment, the corner portion cut in the second area AR2 may have an area larger than the corner portion cut in the first area AR1 or the third area AR3. In the second region AR2, the removed portion at the corner may be a position where a second conductive pattern 152 and a third conductive pattern 154 (see FIGS. 14A, 14B and 14C) may be formed, by which a first p-type semiconductor layer 106, a second p-type semiconductor layer 124, and the third p-type semiconductor layer 144 are electrically coupled. In the first area AR1, the removed portion at the corner may be a position where a first conductive pattern 150 (see FIGS. 14A, 14B and 14C) may be formed, which is electrically coupled with a first n-type semiconductor layer 102. In the third area AR3, the removed portion at the corner may be a position where a fourth conductive pattern 156 (see FIGS. 14A, 14B and 14C) may be formed, which is electrically coupled with a second n-type semiconductor layer 128.

According to an exemplary embodiment, after the etching process, the third n-type semiconductor layer 148, the third active layer 146, and the third p-type semiconductor layer 144 may have inclined sidewalls, respectively, and the sidewall of the etched third n-type semiconductor layer 148, the sidewall of the etched third active layer 146, and the sidewall of the etched third p-type semiconductor layer 144 may be substantially formed in the same plane. According to another exemplary embodiment, the third n-type semiconductor layer 148, the third active layer 146, and the third p-type semiconductor layer 144 may have generally vertical sidewalls, respectively, and the sidewall of the etched third n-type semiconductor layer 148, the sidewall of the etched third active layer 146, and the sidewall of the etched third p-type semiconductor layer 144 may be substantially formed in the same plane.

According to an exemplary embodiment, the pre-third transparent electrode 142P may function as an etch stop layer. In particular, the etching process may be performed until the pre-third transparent electrode 142P is exposed. However, the inventive concepts are not limited thereto, and a portion of the top surface of the pre-third transparent electrode 142P, which is exposed by the third n-type semiconductor layer 148, the third active layer 146, and the third p-type semiconductor layer 144 may be selectively etched.

By the etching process, the peripheral portion of the pre-third transparent electrode 142P may be exposed. Also, in the pre-third transparent electrode 142P, portions corresponding to the corner-cut portions of the first mask pattern MK1 positioned in the first area AR1, the second area AR2, and the third area AR3 may be exposed.

According to an exemplary embodiment, the third n-type semiconductor layer 148, the third active layer 146, and the third p-type semiconductor layer 144 may have at least a predetermined size such that a third light emitting part LE3, which is to be subsequently completed, may function as a light emitting diode.

After performing the etching process, the first mask pattern MK1 may be removed.

Figure 8A:
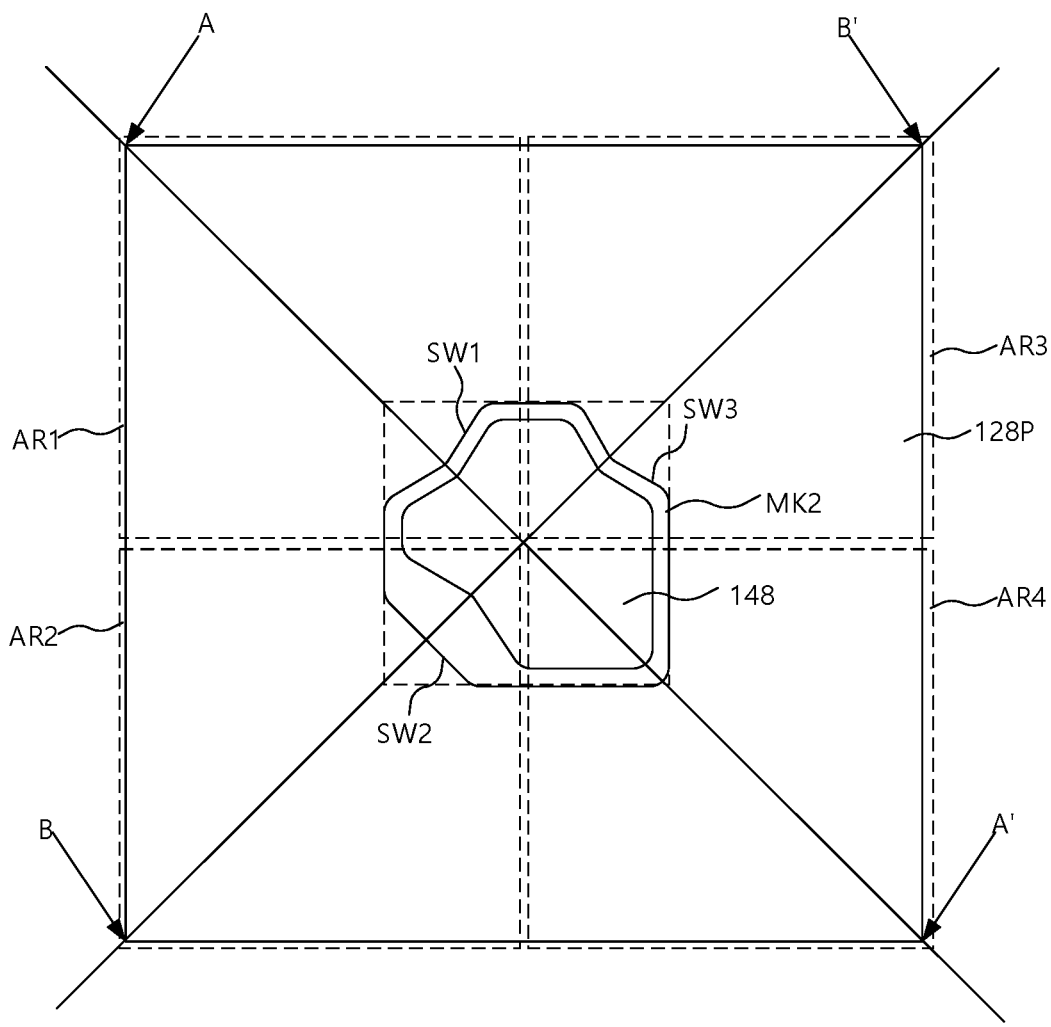
FIG. 8A is a plan view of a light emitting chip according to an exemplary embodiment.
Figure 8B:
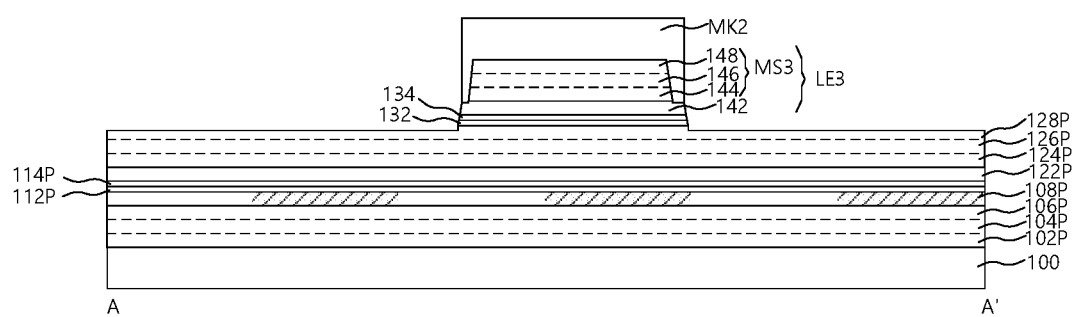
FIGS. 8B and 8C are cross-sectional views taken along line A-A' and B-B' of FIG. 8A, respectively.
Figure 8C:
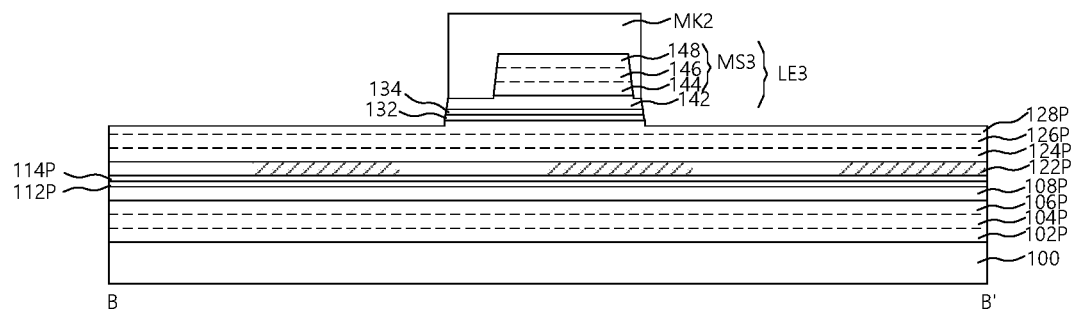

Referring to FIGS. 8A to 8C, a second mask pattern MK2 covering the third n-type semiconductor layer 148, the third active layer 146, and the third p-type semiconductor layer 144 may be formed on the pre-third transparent electrode 142P. The pre-third transparent electrode 142P, the pre-second bonding portion 134P, and the pre-second color filter 132P may be etched by using the second mask pattern MK2 as an etch mask. Through the etching process, the third light emitting part LE3 including the third n-type semiconductor layer 148, the third active layer 146, the third p-type semiconductor layer 144, and the third transparent electrode 142 may be formed, and a second bonding portion 134 and a second color filter 132 may be formed.

The second mask pattern MK2 may have a substantially quadrangular structure when viewed from the top. The second mask pattern MK2 may have corners positioned in the first area AR1, the second area AR2, and the third area AR3 which are cut. As shown in FIG. 8A, the second mask pattern MK2 may have a first sidewall SW1 disposed in the first area AR1, corresponding to the first sidewall SW1 of the first mask pattern MK1, and has, for example, a substantially V-shape concavely recessed inwardly towards the center of the third transparent electrode 142, a second sidewall SW2 disposed in the second area AR2 and having an unbent planar surface, and a third sidewall SW3 disposed in the third area AR3, corresponding to the third sidewall SW3 of the first mask pattern MK1, and has, for example, a substantially V-shape concavely recessed inwardly towards the center of the third transparent electrode 142.

In this manner, a space in the second area AR2 may be secured between the sidewall of at least one of the third n-type semiconductor layer 148, the third active layer 146, and the third p-type semiconductor layer 144 and the sidewall of the second mask pattern MK2. After the etching process utilizing the second mask pattern MK2 as an etch mask, a portion of the top surface of the pre-second transparent electrode 122P may be exposed in the space secured at the second area AR2, and the exposed pre-second transparent electrode 122P may be provided as a space where a third conductive pattern 154 (see FIGS. 14A, 14B and 14C) may be formed in a subsequent process.

According to an exemplary embodiment, the third transparent electrode 142, the second bonding portion 134, and the second color filter 132 may have inclined sidewalls, and the sidewall of the third transparent electrode 142, the sidewall of the second bonding portion 134 and the sidewall of the second color filter 132 may be formed substantially in the same plane. According to another exemplary embodiment, the third transparent electrode 142, the second bonding portion 134, and the second color filter 132 may have generally vertical sidewalls. In this case, the sidewall of the third transparent electrode 142, the sidewall of the second bonding portion 134, and the sidewall of the second color filter 132 may be substantially formed in the same plane.

In the etching process, a processing recipe, such as an etch gas injection time, may be adjusted such that the etching process stops at a point where the pre-second n-type semiconductor layer 128P is exposed. According to an exemplary, a portion of the top of the pre-second n-type semiconductor layer 128P may be etched. In this case, a portion of the pre-second n-type semiconductor layer 128P exposed by the third light emitting part LE3 may be thinner than the pre-second n-type semiconductor layer 128P disposed inside the third light emitting part LE3.

The peripheral portion of the pre-second n-type semiconductor layer 128P may be exposed by the second mask pattern MK2. Also, in the pre-second n-type semiconductor layer 128P, portions corresponding to the corner-removed portions of the second mask pattern MK2 positioned in the first area AR1, the second area AR2 and the third area AR3 may be exposed.

After the etching process, the second mask pattern MK2 may be removed.

Figure 9A:
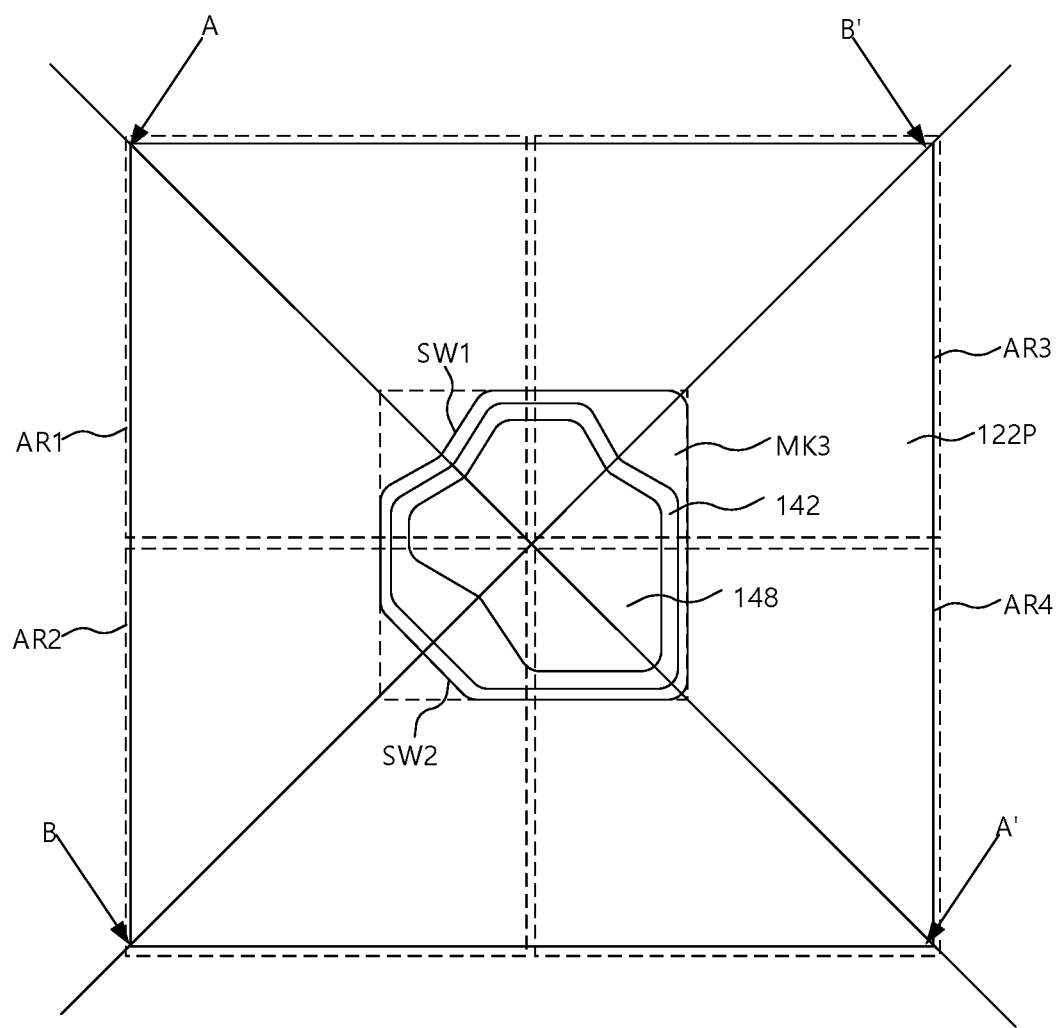
FIG. 9A is a plan view of a light emitting chip according to an exemplary embodiment.
Figure 9B:
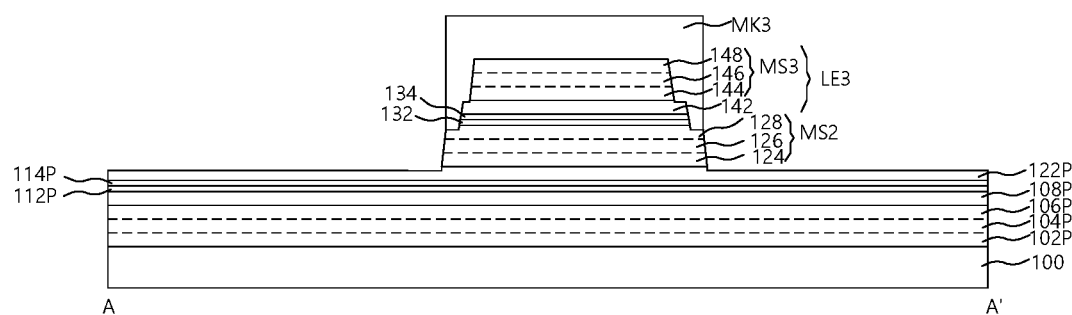
FIGS. 9B and 9C are cross-sectional views taken along line A-A' and B-B' of FIG. 9A, respectively.
Figure 9C:
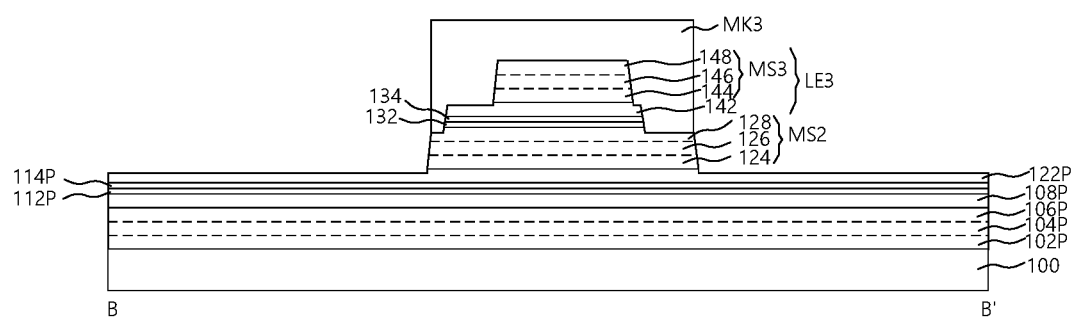

Referring to FIGS. 9A to 9C, a third mask pattern MK3 covering the third light emitting part LE3, the second bonding portion 134, and the second color filter 132 may be formed on the pre-second n-type semiconductor layer 128P. The pre-second n-type semiconductor layer 128P, the pre-second active layer 126P, and the pre-second p-type semiconductor layer 124P may be etched by using the third mask pattern MK3 as an etch mask. Through the etching process, a second n-type semiconductor layer 128, a second active layer 126, and a second p-type semiconductor layer 124 may be formed.

The third mask pattern MK3 may have a substantially quadrangular structure when viewed from the top. The third mask pattern MK3 may have corners positioned in the first area AR1 and the second area AR2 which are cut. As shown in FIG. 9A, the third mask pattern MK3 may have a first sidewall SW1 disposed in the first area AR1, corresponding to the first sidewall SW1 of the second mask pattern MK2, and has, for example, a substantially V-shape concavely recessed inwardly towards the center of the second n-type semiconductor layer 128, and a second sidewall SW2 disposed in the second area AR2, corresponding to the second sidewall SW2 of the second mask pattern MK2, and has, for example, an unbent planar surface.

According to an exemplary embodiment, a space in the third area AR3 may be secured between the sidewall of at least one of the third transparent electrode 142, the second bonding portion 134, and the second color filter 132 and the sidewall of the third mask pattern MK3. After etching by using the third mask pattern MK3 as an etch mask, a portion of the top surface of the second n-type semiconductor layer 128 may be exposed by the space secured in the third area AR3, and the exposed second n-type semiconductor layer 128 may be provided as a space where a fourth conductive pattern 156 (see FIGS. 14A, 14B and 14C) is to be formed in a subsequent process.

According to an exemplary embodiment, the second n-type semiconductor layer 128, the second active layer 126, and the second p-type semiconductor layer 124 may have inclined sidewalls, respectively, and the sidewall of the second n-type semiconductor layer 128, the sidewall of the second active layer 126, and the sidewall of the second p-type semiconductor layer 124 may be formed substantially in the same plane. According to another exemplary embodiment, the second n-type semiconductor layer 128, the second active layer 126, and the second p-type semiconductor layer 124 may have generally vertical sidewalls, respectively. In this case, the sidewall of the second n-type semiconductor layer 128, the sidewall of the second active layer 126, and the sidewall of the second p-type semiconductor layer 124 may be formed substantially in the same plane.

According to an exemplary embodiment, the pre-second transparent electrode 122P may function as an etch stop layer. In particular, the etching process may be performed until the pre-second transparent electrode 122P is exposed. However, the inventive concepts are not limited thereto, and a portion of the top surface of the pre-second transparent electrode 122P exposed by the second n-type semiconductor layer 128, the second active layer 126, and the second p-type semiconductor layer 124 may be selectively etched. In this case, the pre-second transparent electrode 122P exposed by the second n-type semiconductor layer 128, the second active layer 126, and the second p-type semiconductor layer 124 may be thinner than the pre-second transparent electrode 122P disposed inside the second n-type semiconductor layer 128, the second active layer 126, and the second p-type semiconductor layer 124.

By the etching process, the peripheral portion of the pre-second transparent electrode 122P may be exposed. Also, in the pre-second transparent electrode 122P, portions corresponding to the corner-removed portions of the third mask pattern MK3 positioned in the first area AR1 and the second area AR2 may be exposed.

After performing the etching process, the third mask pattern MK3 may be removed.

Figure 10A:
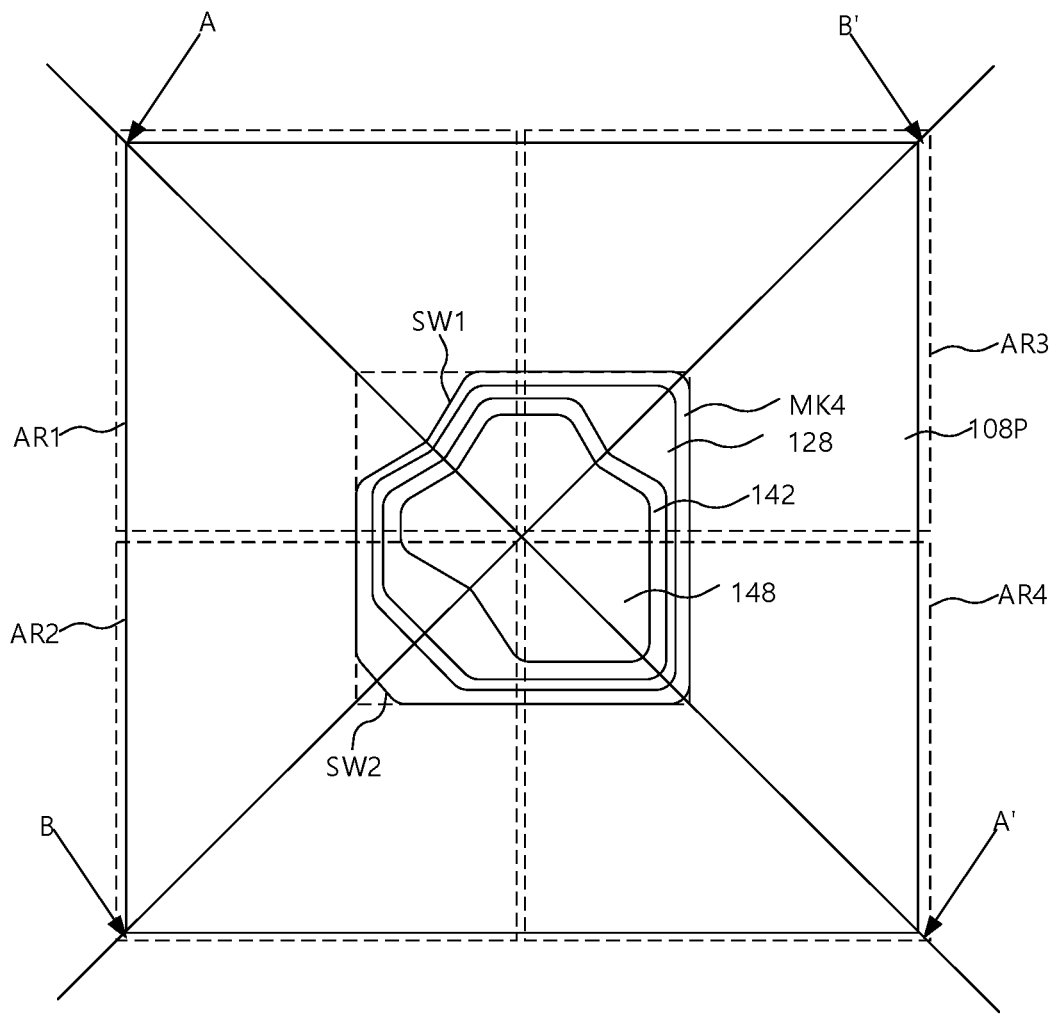
FIG. 10A is a plan view of a light emitting chip according to an exemplary embodiment.
Figure 10B:
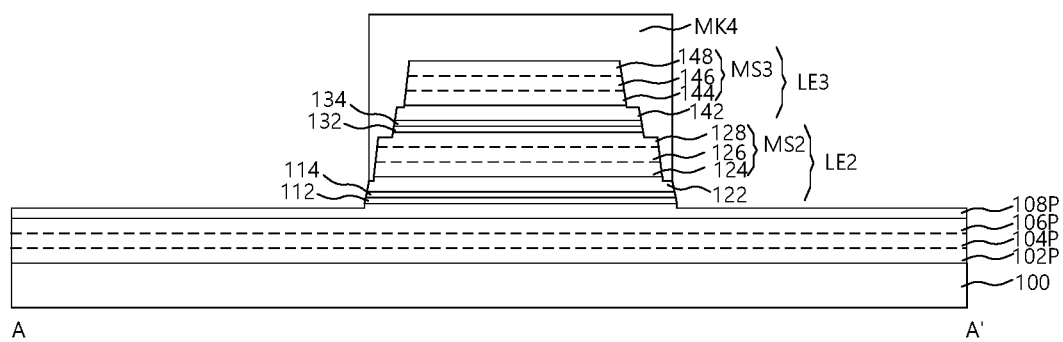
FIGS. 10B and 10C are cross-sectional views taken along line A-A' and B-B' of FIG. 10A, respectively.
Figure 10C:
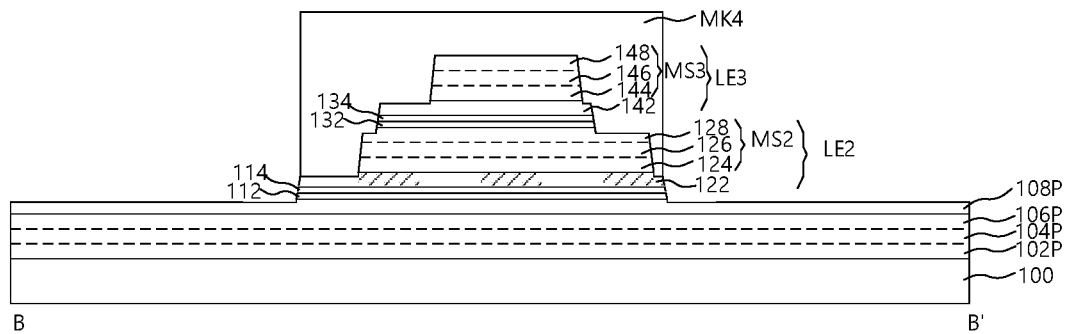

Referring to FIGS. 10A to 10C, a fourth mask pattern MK4 covering the third light emitting part LE3, the second bonding portion 134, the second color filter 132, the second n-type semiconductor layer 128, the second active layer 126, and the second p-type semiconductor layer 124 may be formed on the pre-second transparent electrode 122P, and the pre-first color filter 112P, and the pre-first bonding portion 114P. The pre-first color filter 112P may be etched by using the fourth mask pattern MK4 as an etch mask. Through the etching process, a second light emitting part LE2 including the second n-type semiconductor layer 128, the second active layer 126, the second p-type semiconductor layer 124, and a second transparent electrode 122, a first bonding portion 114, and a first color filter 112 may be formed.

The fourth mask pattern MK4 may have a substantially quadrangular structure when viewed from the top. The fourth mask pattern MK4 may have corners positioned in the first area AR1 and the second area AR2 which are cut. As shown in FIG. 10A, the fourth mask pattern MK4 may have a first sidewall SW1 disposed in the first area AR1, corresponding to the first sidewall SW1 of the third mask pattern MK3, and has, for example, a substantially V-shape concavely recessed inwardly towards the center of the second transparent electrode 122, and a second sidewall SW2 disposed in the second area AR2, corresponding to the second sidewall SW2 of the third mask pattern MK3, and has, for example, an unbent planar surface. In this case, a space in the second area AR2 may be secured between the sidewall of at least one of the second transparent electrode 122, the first bonding portion 114, and the first color filter 112 and the sidewall of the fourth mask pattern MK4. After etching by using the fourth mask pattern MK4 as an etch mask, a portion of the top surface of the pre-first transparent electrode 108P may be exposed by the space secured in the second area AR2, and the exposed pre-first transparent electrode 108P may be provided as a space where the second conductive pattern 152 (see FIGS. 14A, 14B, and 14C) is to be formed in a subsequent process.

According to an exemplary embodiment, the second transparent electrode 122, the first bonding portion 114, and the first color filter 112 may have inclined sidewalls, and the sidewall of the second transparent electrode 122, the sidewall of the first bonding portion 114, and the sidewall of the first color filter 112 may be formed substantially in the same plane. According to another exemplary embodiment, the second transparent electrode 122, the first bonding portion 114, and the first color filter 112 may have generally vertical sidewalls. In this case, the sidewall of the second transparent electrode 122, the sidewall of the first bonding portion 114, and the sidewall of the first color filter 112 may be formed substantially in the same plane.

According to an exemplary embodiment, the pre-first transparent electrode 108P may function as an etch stop layer. In particular, the etching process may be performed until the pre-first transparent electrode 108P is exposed. However, the inventive concepts are not limited thereto, and a portion of the top surface of the pre-first transparent electrode 108P exposed by the second transparent electrode 122, the first bonding portion 114, and the first color filter 112 may be selectively etched. In this case, the pre-first transparent electrode 108P exposed by the second transparent electrode 122, the first bonding portion 114, and the first color filter 112 may be thinner than the pre-first transparent electrode 108P disposed inside the first color filter 112.

The peripheral portion of the pre-first transparent electrode 108P may be exposed by the fourth mask pattern MK4. Also, in the pre-first transparent electrode 108P, portions corresponding to the corner-removed portions of the fourth mask pattern MK4 positioned in the first area AR1 and the second area AR2 may be exposed.

After the etching process, the fourth mask pattern MK4 may be removed.

Figure 11A:
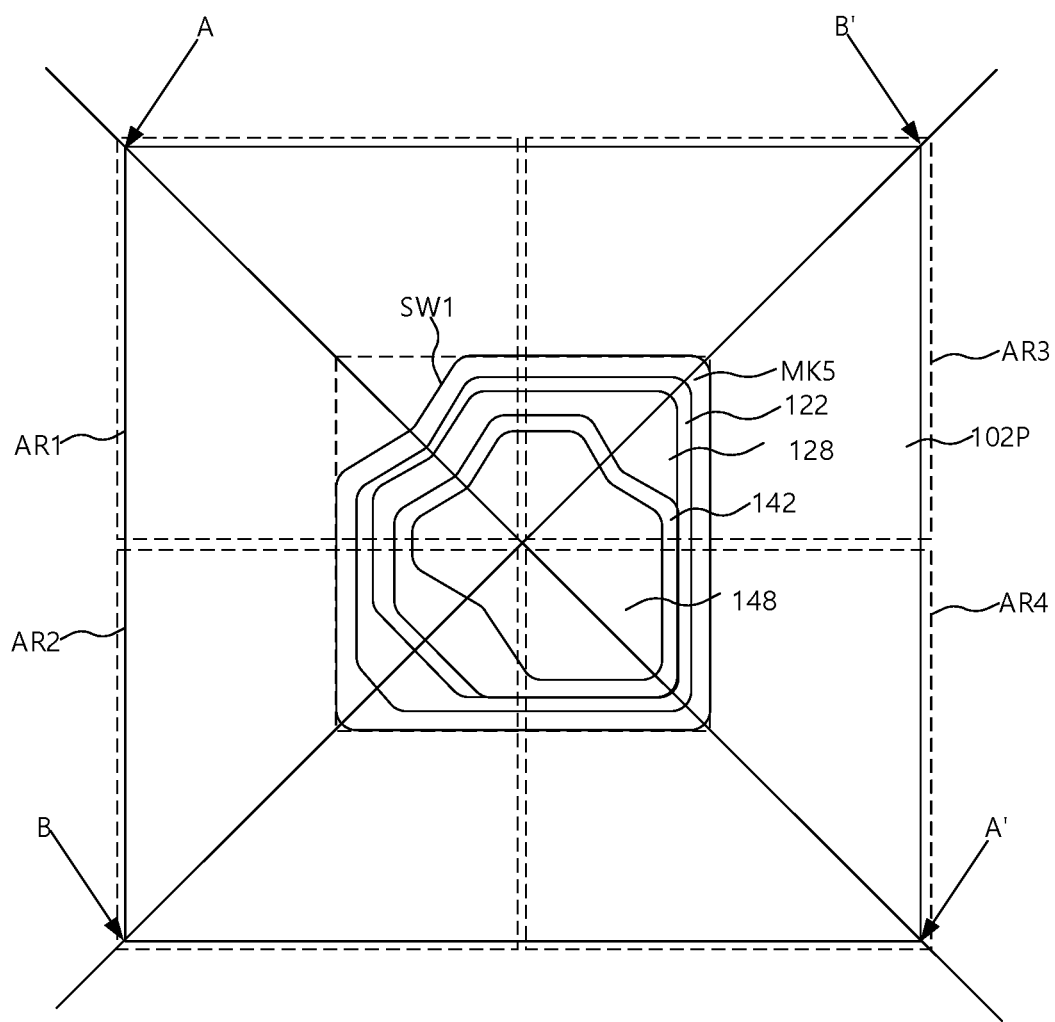
FIG. 11A is a plan view of a light emitting chip according to an exemplary embodiment.
Figure 11B:
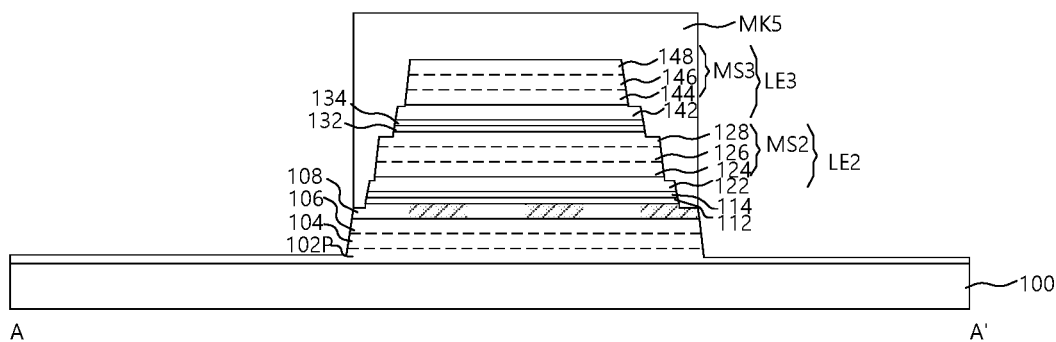
FIGS. 11B and 11C are cross-sectional views taken along line A-A' and B-B' of FIG. 11A, respectively.
Figure 11C:
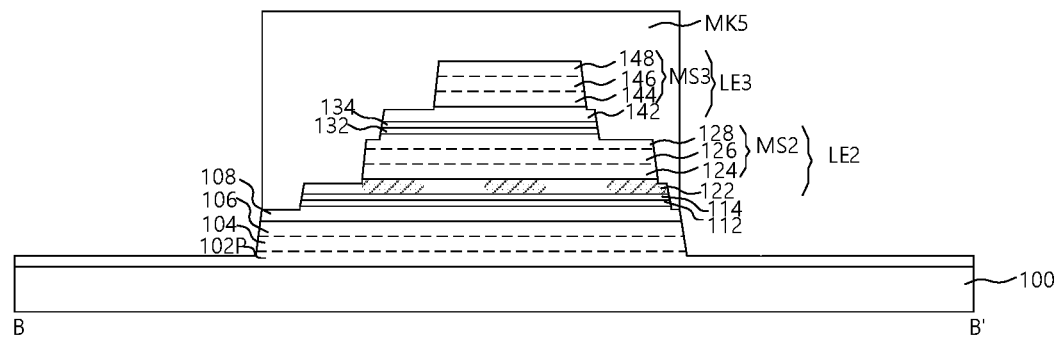

Referring to FIGS. 11A to 11C, a fifth mask pattern MK5 covering the third light emitting part LE3, the second bonding portion 134, the second color filter 132, the second light emitting part LE2, the first bonding portion 114, and the first color filter 112 may be formed on the pre-first transparent electrode 108P. The pre-first transparent electrode 108P, the pre-first p-type semiconductor layer 106P, and the pre-first active layer 104P may be etched by using the fifth mask pattern MK5 as an etch mask. Through the etching process, a first transparent electrode 108, a first p-type semiconductor layer 106, and a first active layer 104 may be formed.

The fifth mask pattern MK5 may have a substantially quadrangular structure when viewed from the top. The fifth mask pattern MK5 may have a corner positioned in the first area AR1 which is cut. As shown in FIG. 11A, the fifth mask pattern MK5 may have a sidewall SW1 disposed in the first area AR1, corresponding to the first sidewall SW1 of the fourth mask pattern MK4, and has, for example, a substantially V-shape concavely recessed inwardly towards the center of the first transparent electrode 108. In the fifth mask pattern MK5, since the corner positioned in the second area AR2 is not removed, a space may be secured between the sidewall of at least one of the first transparent electrode 108, the first p-type semiconductor layer 106, and the first active layer 104, and the sidewall of the fifth mask pattern MK5. After etching by using the fifth mask pattern MK5 as an etch mask, a portion of the top surface of the first transparent electrode 108 may be exposed by the space secured in the second area AR2, and the exposed first transparent electrode 108 may be provided as a space where the second conductive pattern 152 (see FIGS. 14A, 14B and 14C) is to be formed in a subsequent process.

According to an exemplary embodiment, the first transparent electrode 108, the first p-type semiconductor layer 106, and the first active layer 104 may have inclined sidewalls, respectively, and the sidewall of the first transparent electrode 108, the sidewall of the first p-type semiconductor layer 106, and the sidewall of the first active layer 104 may be formed substantially in the same plane. According to another exemplary embodiment, the first transparent electrode 108, the first p-type semiconductor layer 106, and the first active layer 104 may have generally vertical sidewalls. In this case, the sidewall of the first transparent electrode 108, the sidewall of the first p-type semiconductor layer 106, and the sidewall of the first active layer 104 may be formed substantially in the same plane.

In the etching process, a processing recipe, such as an etch gas injection time may be adjusted such that the etching process is stopped at a point where the pre-first n-type semiconductor layer 102P is exposed. According to an exemplary embodiment, a portion of the top of the pre-first n-type semiconductor layer 102P may be etched. In this case, the pre-first n-type semiconductor layer 102P exposed by the first transparent electrode 108 may be thinner than the pre-first n-type semiconductor layer 102P disposed inside the first transparent electrode 108.

After the etching process, the fifth mask pattern MK5 may be removed.

Figure 12A:
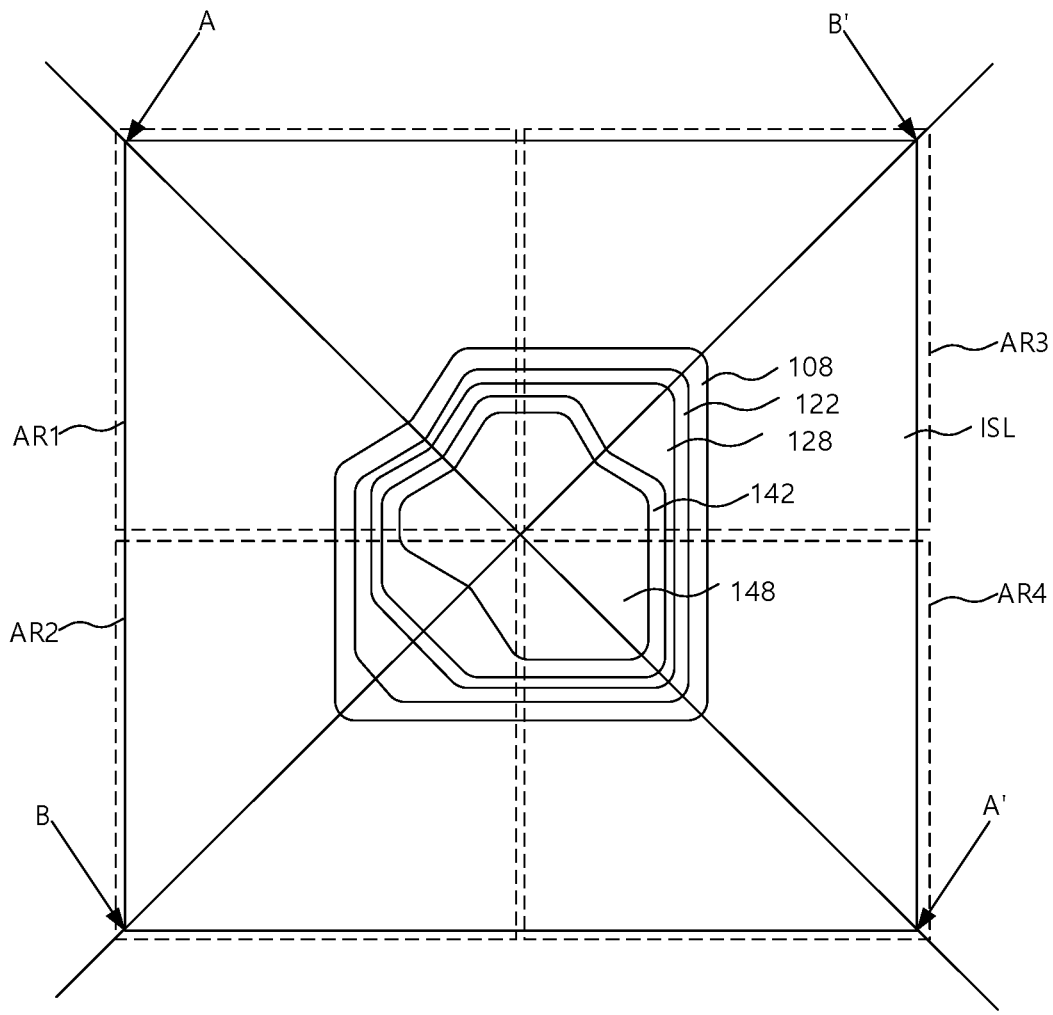
FIG. 12A is a plan view of a light emitting chip according to an exemplary embodiment.
Figure 12B:
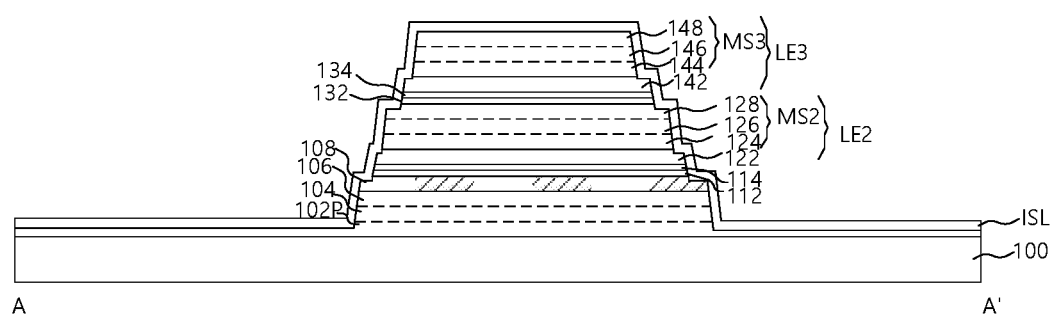
FIGS. 12B and 12C are cross-sectional views taken along line A-A' and B-B' of FIG. 12A, respectively.
Figure 12C:
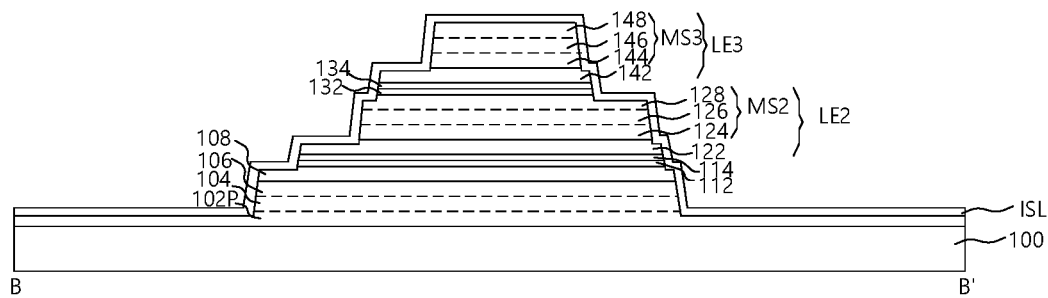

Referring to FIGS. 12A to 12C, an insulation layer ISL may be conformally formed on mesa structures including the pre-first n-type semiconductor layer 102P, the first active layer 104, the first p-type semiconductor layer 106, the first color filter 112, the first bonding portion 14, the second light emitting part LE2, the second bonding portion 134, the second color filter 132, and the third light emitting part LE3 which are vertically stacked. The insulation layer ISL may include an oxide, for example, silicon oxide.

As the mesa structures have stepped sidewalls as shown in FIGS. 12B and 12C, the insulation layer ISL may be conformally deposited on the mesa structures with a constant thickness. According to an exemplary embodiment, since the mesa structures have inclinations while having the stepped sidewalls, the insulation layer ISL may be conformally deposited with a constant thickness even at the tops or bottoms of the mesa structures or between the mesa structures.

Figure 13A:
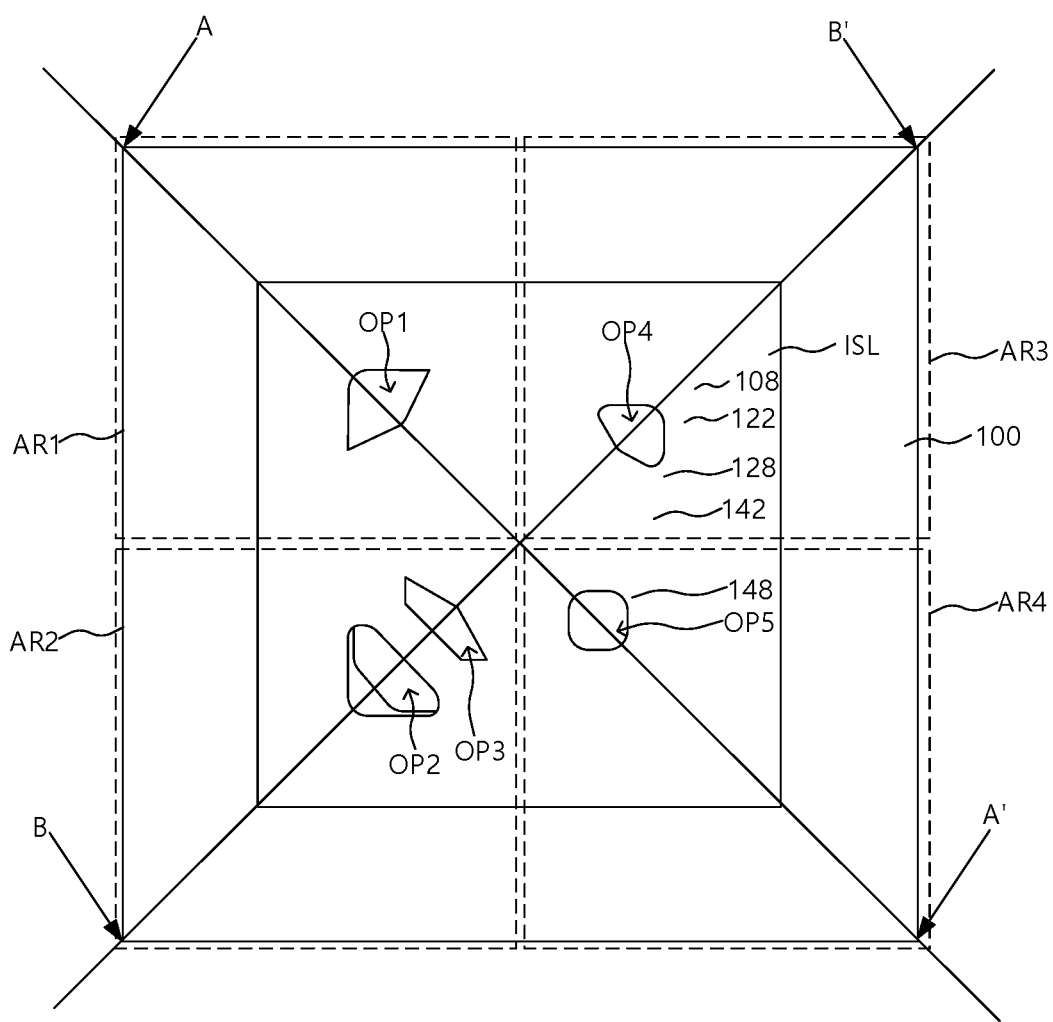
FIG. 13A is a plan view of a light emitting chip according to an exemplary embodiment.
Figure 13B:
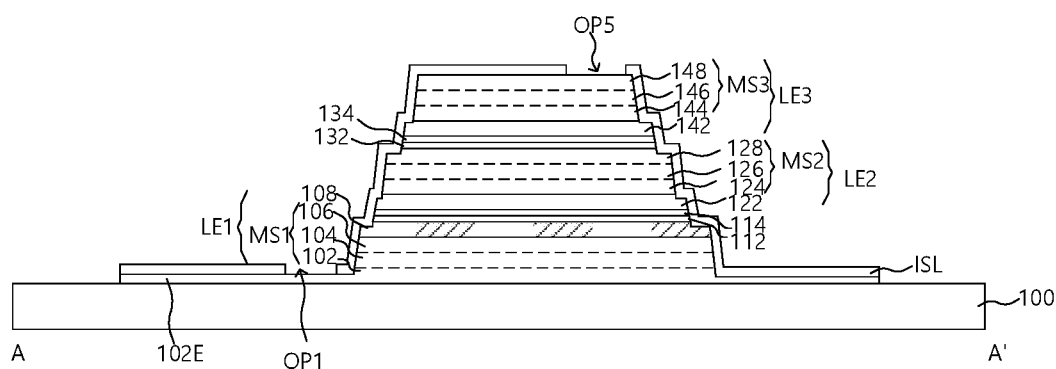
FIGS. 13B and 13C are cross-sectional views taken along line A-A' and B-B' of FIG. 13A, respectively.
Figure 13C:
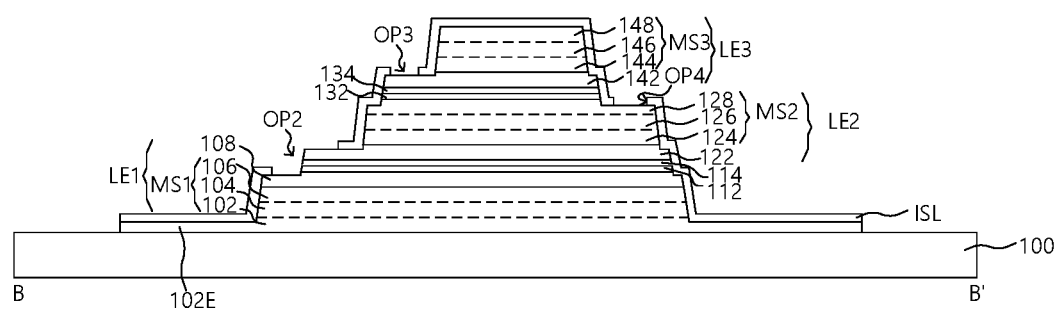

Referring to FIGS. 13A to 13C, by patterning the insulation layer ISL, a first opening OP1, a second opening OP2, a third opening OP3, a fourth opening OP4, and a fifth opening OP5 may be formed.

The first opening OP1 may expose a portion of the pre-first n-type semiconductor layer 102P in the first area AR1. The second opening OP2 may expose a portion of the top surface of the first transparent electrode 108 and a portion of the top surface of the second transparent electrode 122 in the second area AR2. The third opening OP3 may expose a portion of the top surface of the third transparent electrode 142 in the second area AR2. The fourth opening OP4 may expose a portion of the top surface of the second n-type semiconductor layer 128 in the third area AR3. The fifth opening OP5 may expose a portion of the top surface of the third n-type semiconductor layer 148 in the fourth area AR4.

According to an exemplary embodiment, while forming the first to fifth openings OP1, OP2, OP3, OP4, and OP5, by etching the pre-first n-type semiconductor layer 102P to expose the peripheral portion of the first substrate 100, a first n-type semiconductor layer 102 including a first n-type extended semiconductor layer 102E may be formed. The first n-type extended semiconductor layer 102E may have a substantially quadrangular structure when viewed from the top, and the outer sidewall of the first n-type extended semiconductor layer 102E and the outer sidewall of the insulation layer ISL may be formed substantially in the same plane.

By patterning the insulation layer ISL, a first light emitting part LE1 including the first n-type semiconductor layer 102, the first active layer 104, the first p-type semiconductor layer 106, and the first transparent electrode 108 may be formed on the first substrate 100. Also, a light emitting structure including the first light emitting part LE1, the first color filter 112, the first bonding portion 114, the second light emitting part LE2, the second bonding portion 134, the second color filter 132, and the third light emitting part LE3 may be completed.

Figure 14A:
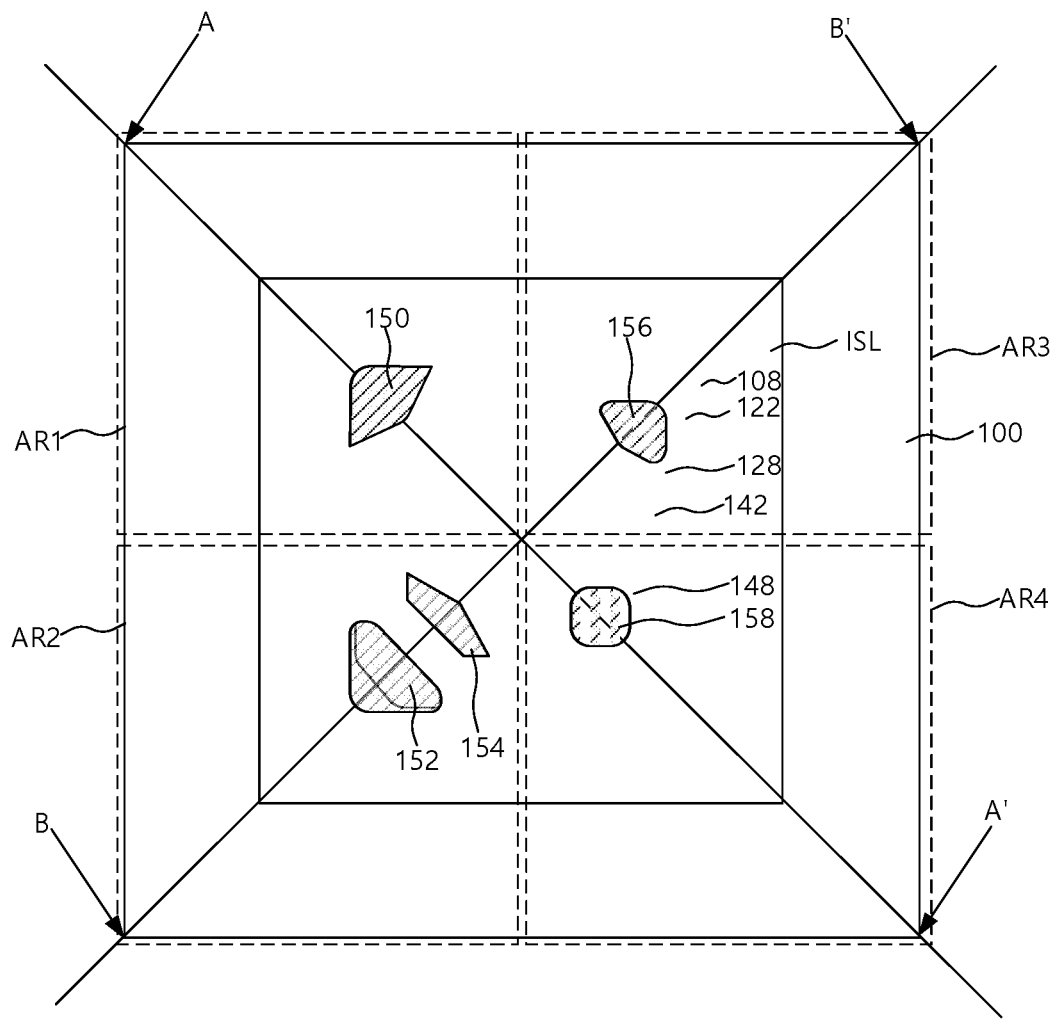
FIG. 14A is a plan view of a light emitting chip according to an exemplary embodiment.
Figure 14B:
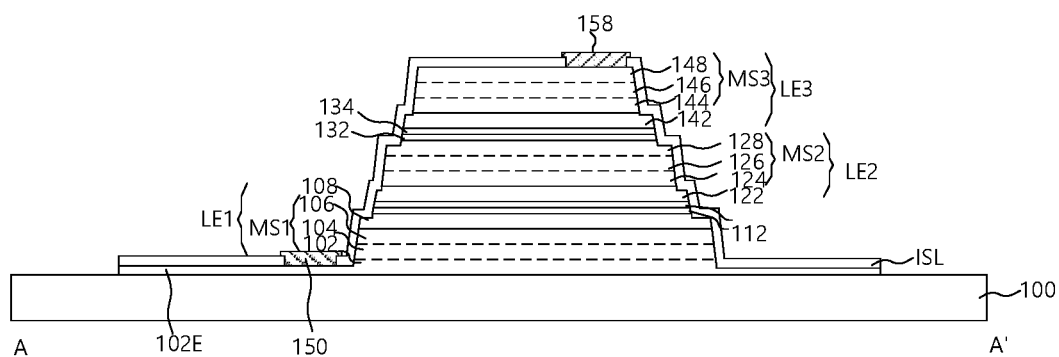
FIGS. 14B and 14C are cross-sectional views taken along line A-A' and B-B' of FIG. 14A, respectively.
Figure 14C:
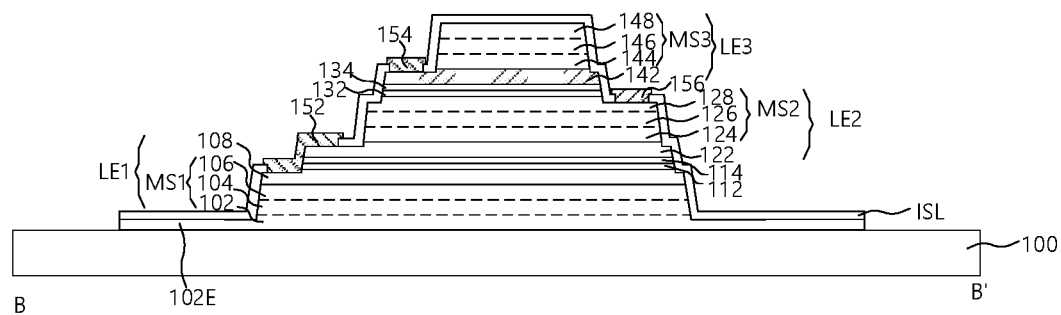

Referring to FIGS. 14A to 14C, a first conductive pattern 150, a second conductive pattern 152, a third conductive pattern 154, a fourth conductive pattern 156, and a fifth conductive pattern 158 which fill the first opening OP1, the second opening OP2, the third opening OP3, the fourth opening OP4 and the fifth opening OP5, respectively, may be formed.

In particular, a first conductive layer may be conformally formed on the insulation layer ISL. As shown in FIGS. 14B and 14C, as the mesa structures formed with the insulation layer ISL have the stepped sidewalls, the first conductive layer may be conformally deposited on the mesa structures formed with the insulation layer ISL, with a constant thickness. According to an exemplary embodiment, since the mesa structures have inclinations while having the stepped sidewalls, the first conductive layer may be conformally deposited with a constant thickness even at the tops or bottoms of the mesa structures or between the mesa structures.

The first conductive layer may include at least one of Ni, Ag, Au, Pt, Ti, Al, and Cr. By patterning the first conductive layer, the first conductive pattern 150 which fills the first opening OP1, the second conductive pattern 152 which fills the second opening OP2, the third conductive pattern 154 which fills the third opening OP3, the fourth conductive pattern 156 which fills the fourth opening OP4, and the fifth conductive pattern 158 which fills the fifth opening OP5 may be respectively formed. According to an exemplary embodiment, the top surface of each of the first to fifth conductive patterns 150, 152, 154, 156, and 158 may be positioned at a level higher than the top surface of the insulation layer ISL. According to another exemplary embodiment, the top surface of each of the first to fifth conductive patterns 150, 152, 154, 156, and 158 may be coplanar with the top surface of the insulation layer ISL.

Figure 15A:
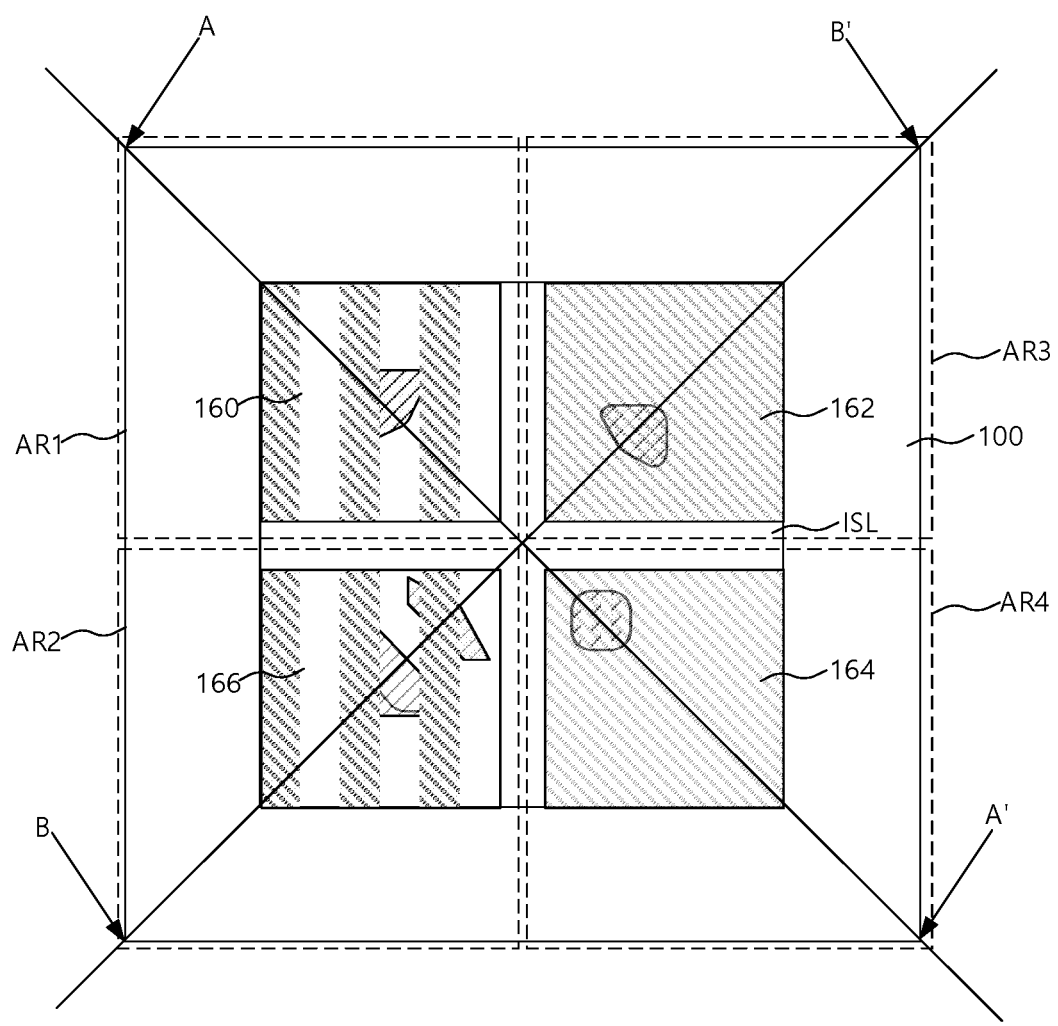
FIG. 15A is a plan view of a light emitting chip according to an exemplary embodiment.
Figure 15B:
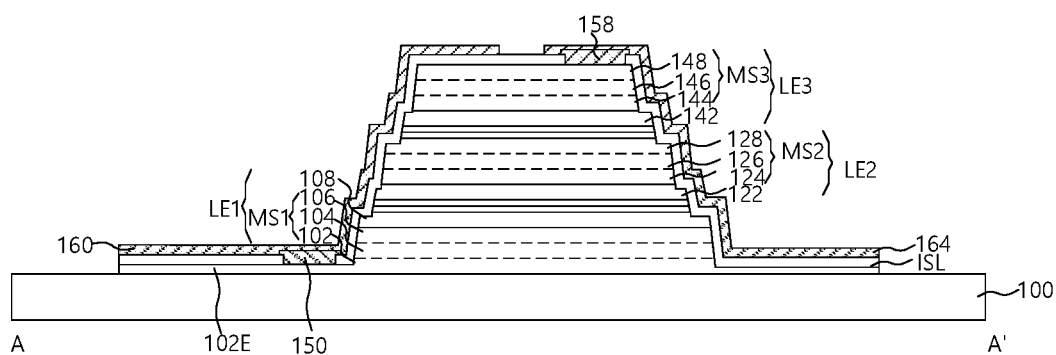
FIGS. 15B and 15C are cross-sectional views taken along line A-A' and B-B' of FIG. 15A, respectively.
Figure 15C:
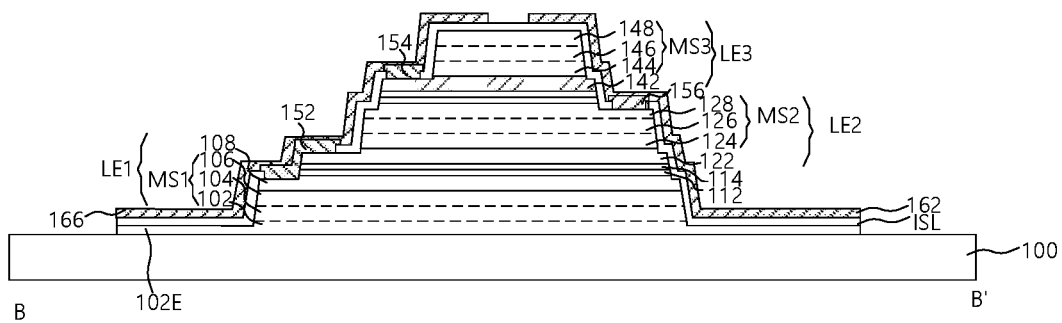

Referring to FIGS. 15A to 15C, a first thin film conductive pattern 160 which is electrically coupled with the first conductive pattern 150 in the first area AR1, a second thin film conductive pattern 162 which is electrically coupled with the fourth conductive pattern 156 in the third area AR3, a third thin film conductive pattern 164 which is electrically coupled with the fifth conductive pattern 158 in the fourth area AR4, and a fourth thin film conductive pattern 166 which is electrically coupled with the second conductive pattern 152 and the third conductive pattern 154 in the second area AR2 may be formed.

A second conductive layer may be conformally formed on the insulation layer ISL, which is formed with the first to fifth conductive patterns 150, 152, 154, 156, and 158. As shown in FIGS. 15B and 15C, as the mesa structures formed with the insulation layer ISL, which is formed with the first to fifth conductive patterns 150, 152, 154, 156, and 158, have the stepped sidewalls, the second conductive layer may be conformally deposited on the mesa structures with a constant thickness. According to an exemplary embodiment, since the mesa structures have inclinations while having the stepped sidewalls, the second conductive layer may be conformally deposited with a constant thickness even at the tops or bottoms of the mesa structures or between the mesa structures. The second conductive layer may include at least one of Ni, Ag, Au, Pt, Ti, Al, and Cr. When the second conductive layer includes substantially the same material as the first conductive layer, it may be difficult to identify the boundaries between the first to fifth conductive patterns 150, 152, 154, 156, and 158 and the second conductive layer.

By patterning the second conductive layer, the first thin film conductive pattern 160 which is electrically coupled with the first conductive pattern 150, the second thin film conductive pattern 162 which is electrically coupled with the fourth conductive pattern 156, the third thin film conductive pattern 164 which is electrically coupled with the fifth conductive pattern 158, and the fourth thin film conductive pattern 166 which is electrically coupled with the second and third conductive patterns 152 and 154 may be respectively formed.

According to an exemplary embodiment, each of the first to fourth thin film conductive patterns 160, 162, 164, and 166 may have a substantially quadrangular structure when viewed from the top. Each of the first to fourth thin film conductive patterns 160, 162, 164, and 166 may have a structure which extends from the top of the third n-type semiconductor layer 148 of the third light emitting part LE3 to the first n-type extended semiconductor layer 102E. A portion of each of the first to fourth thin film conductive patterns 160, 162, 164, and 166 may be disposed on the first n-type extended semiconductor layer 102E, which is substantially flat with no uneven portion.

Although the first to fourth thin film conductive patterns 160, 162, 164, and 166 are described as being formed after the first to fifth conductive patterns 150, 152, 154, 156, and 158 are formed, however, the inventive concepts are not limited thereto. For example, after conformally forming a second conductive layer on the insulation layer ISL formed with the first to fifth openings OP1, OP2, OP3, OP4, and OP5, by patterning the second conductive layer, first to fifth conductive patterns 150, 152, 154, 156, and 158 which respectively fill the first to fifth openings OP1, OP2, OP3, OP4, and OP5, and first to fourth thin film conductive patterns 160, 162, 164, and 166 which are electrically coupled respectively with the first to fifth conductive patterns 150, 152, 154, 156, and 158 may be formed together.

Figure 16A:
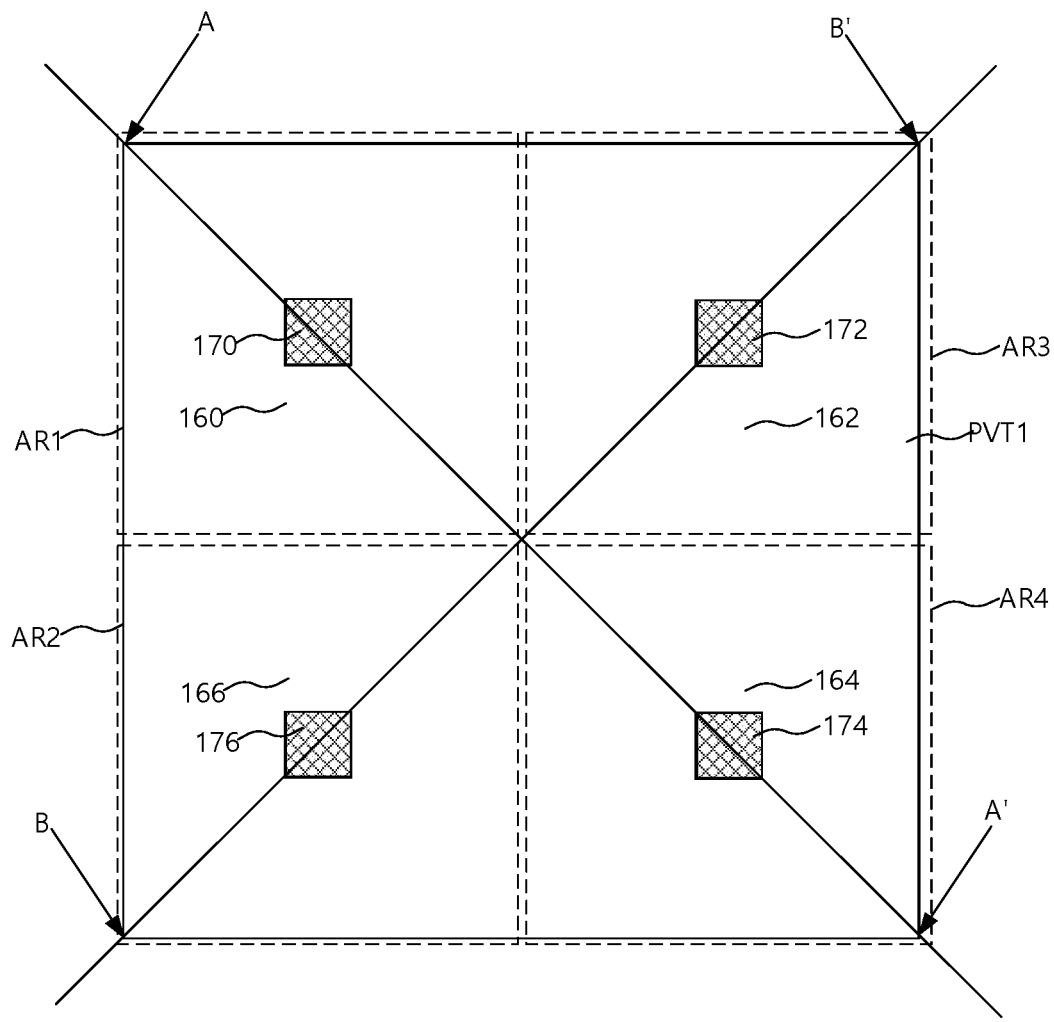
FIG. 16A is a plan view of a light emitting chip according to an exemplary embodiment.
Figure 16B:
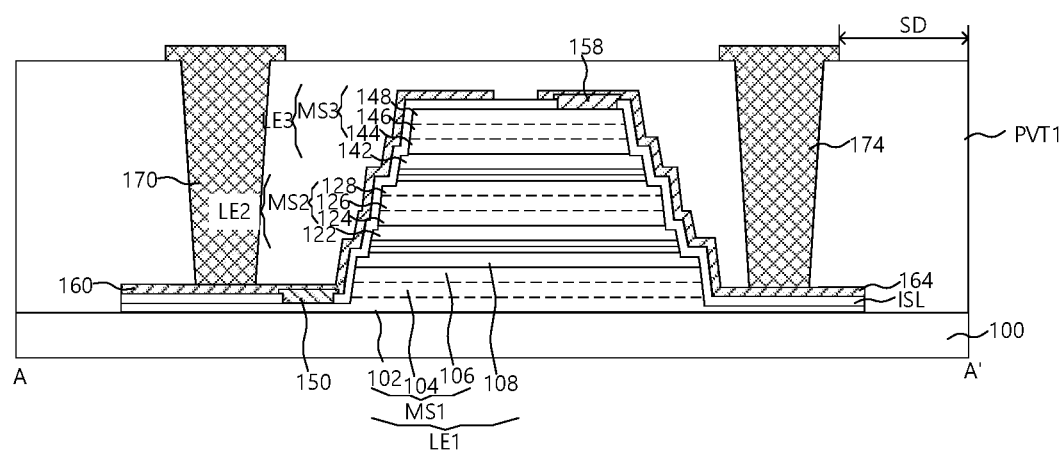
FIGS. 16B and 16C are cross-sectional views taken along line A-A' and B-B' of FIG. 16A, respectively.
Figure 16C:
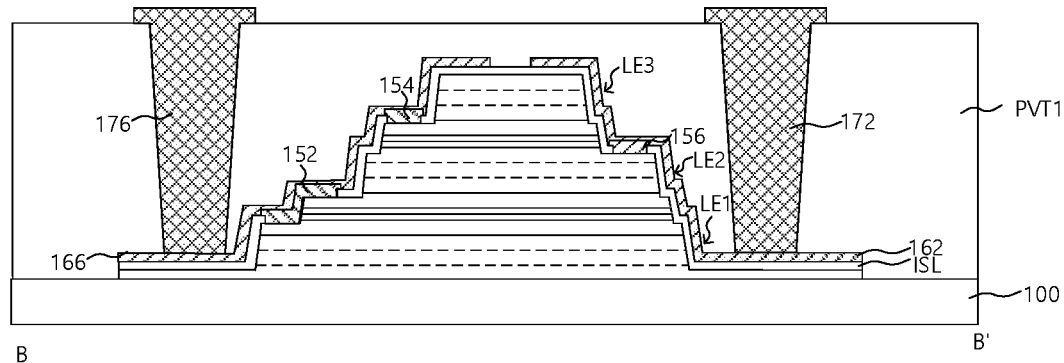

Referring to FIGS. 16A to 16C, a first passivation layer PVT1 which may substantially or completely cover the light emitting structure may be formed on the first substrate 100. The first passivation layer PVT1 may include a polymer material, for example, polyimide or EMC. According to an exemplary embodiment, the top surface of the first passivation layer PVT1 may be positioned at a level higher than the top surface of each of the first to fourth thin film conductive patterns 160, 162, 164, and 166. Also, the first passivation layer PVT1 may have a sidewall which is coplanar with the sidewall of the first substrate 100. As such, the first substrate 100, the light emitting structure, the insulation layer ISL, and the first to fourth thin film conductive patterns 160, 162, 164, and 166 may be positioned inside the first passivation layer PVT1.

Then, by etching the first passivation layer PVT1, a first via hole, a second via hole, a third via hole, and a fourth via hole, which expose the first to fourth thin film conductive patterns 160, 162, 164, and 166, respectively, may be formed. The first via hole may expose at least a portion of the top surface of the first thin film conductive pattern 160 which covers the first n-type extended semiconductor layer 102E. The second via hole may expose at least a portion of the top surface of the second thin film conductive pattern 162 which covers the first n-type extended semiconductor layer 102E. The third via hole may expose at least a portion of the top surface of the third thin film conductive pattern 164 which covers the first n-type extended semiconductor layer 102E. The fourth via hole may expose at least a portion of the top surface of the fourth thin film conductive pattern 166 which covers the first n-type extended semiconductor layer 102E. In this manner, as the first to fourth via holes are formed on substantially flat portions with no uneven portions, and thus, the reliability of processing may be improved.

According to an exemplary embodiment, each of the first to fourth via holes may have a width that gradually narrows from the top to the bottom, and may have an inclined sidewall.

Then, a first via contact 170, a second via contact 172, a third via contact 174, and a fourth via contact 176 which fill the first to fourth via holes, respectively, may be formed.

The first via contact 170 may be positioned in the first area AR1, electrically coupled with the first conductive pattern 150 through the first thin film conductive pattern 160, and apply and/or transmit a negative voltage to the first n-type semiconductor layer 102. The second via contact 172 may be positioned in the third area AR3, electrically coupled with the fourth conductive pattern 156 through the second thin film conductive pattern 162, and apply and/or transmit a negative voltage to the second n-type semiconductor layer 128. The third via contact 174 may be positioned in the fourth area AR4, electrically coupled with the fifth conductive pattern 158 through the third thin film conductive pattern 164, and apply and/or transmit a negative voltage to the third n-type semiconductor layer 148. The fourth via contact 176 may be positioned in the second area AR2, electrically coupled with the second and third conductive patterns 152 and 154 through the fourth thin film conductive pattern 166, and apply and/or transmit a positive voltage to the first to third p-type semiconductor layers 106, 124, and 144.

As described above, as each of the first to fourth via holes has a width that gradually narrows toward the bottom, each of the first to fourth via contacts 170, 172, 174, and 176 may have a width that gradually narrows toward the bottom and may have an inclined sidewall.

According to an exemplary embodiment, each of the first to fourth via contacts 170, 172, 174, and 176 may have a top surface higher than the top surface of the first passivation layer PVT1. For example, the first via contact 170 may include a portion which fills the first via hole and a portion which projects upward out of the first passivation layer PVT1. The portion which projects upward out of the first passivation layer PVT1 may have a width larger than the width of the top of the first via hole, as shown in FIG. 16B. According to another exemplary embodiment, each of the first to fourth via contacts 170, 172, 174, and 176 may have a top surface which is substantially flush (or disposed in the same level) with the top surface of the first passivation layer PVT1.

The distance from each of the first to fourth via contacts 170, 172, 174, and 176 to the sidewall of the first passivation layer PVT1 may be varied depending on a type of a device in which the light emitting chip is mounted.

In this manner, the light emitting chip shown in FIGS. 3A to 3C may be completed.

Then, the first substrate 100 may be removed. The first substrate 100 may be removed by a laser lift-off process or the like. If the first substrate 100 is removed, the bottom surface of the first n-type semiconductor layer 102, the bottom surface of the first n-type extended semiconductor layer 102E, and the bottom surface of the first passivation layer PVT1 may be exposed. In this manner, the light emitting chip shown in FIGS. 1A to 1C may be completed.

Figure 17A:
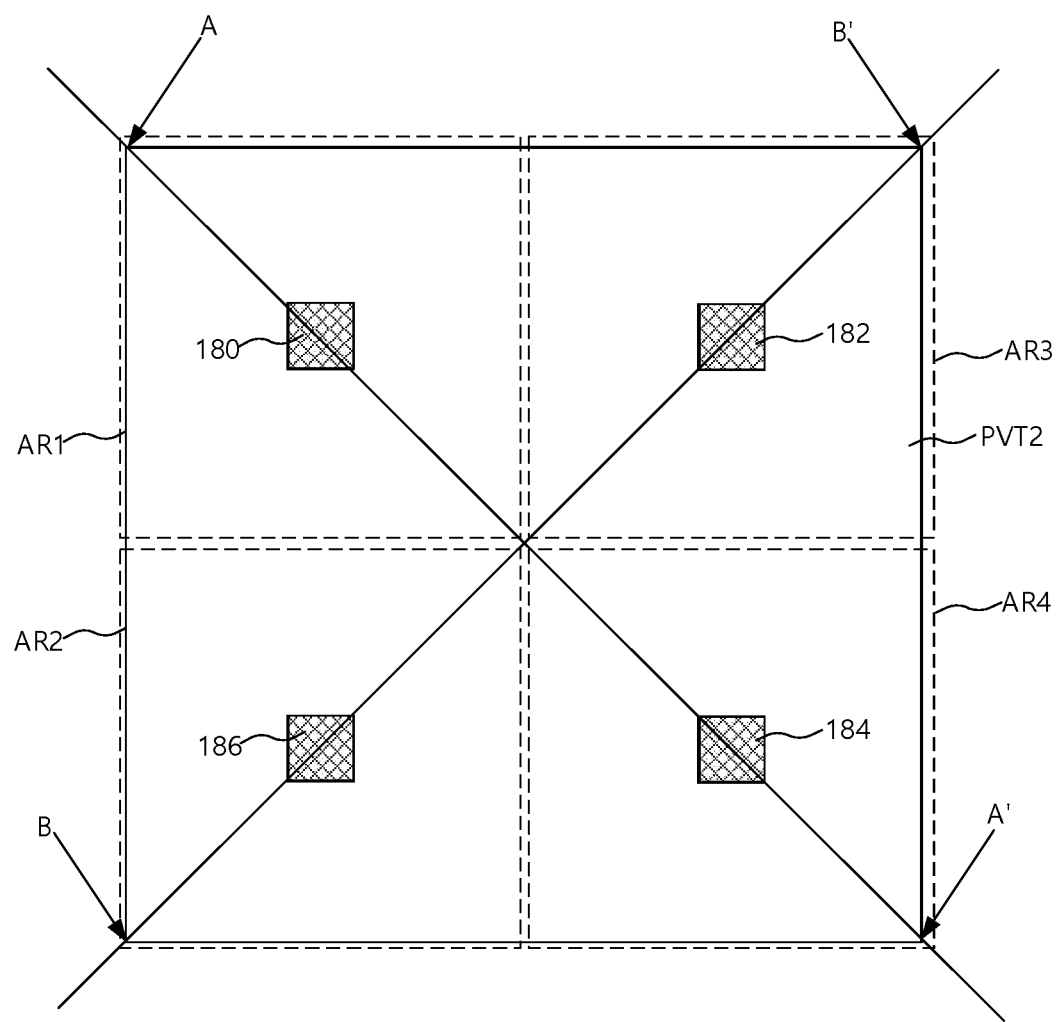
FIG. 17A is a plan view of a light emitting chip according to an exemplary embodiment.
Figure 17B:
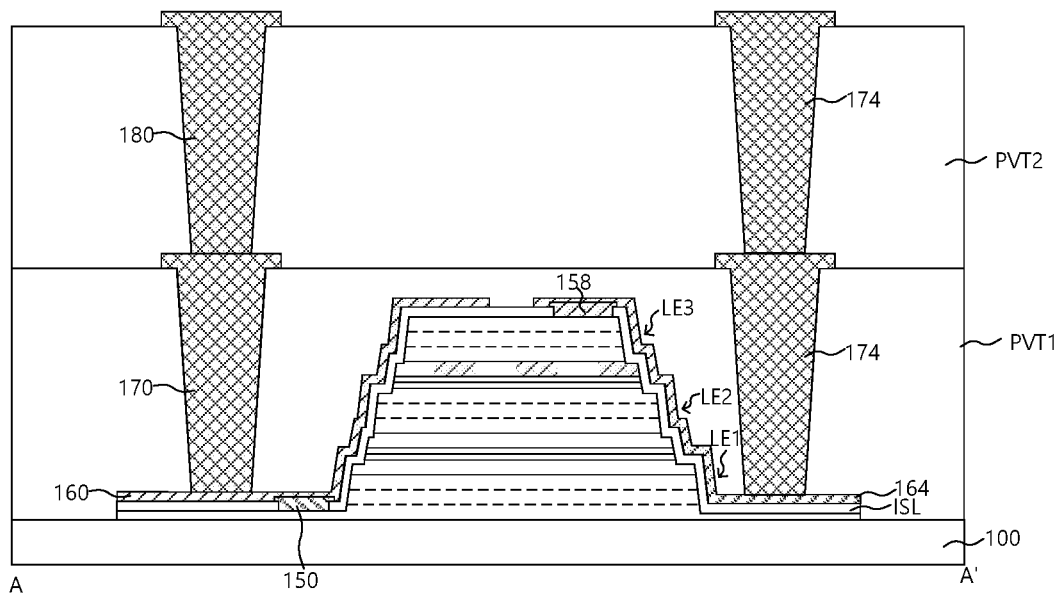
FIGS. 17B and 17C are cross-sectional views taken along line A-A' and B-B' of FIG. 17A, respectively.
Figure 17C:
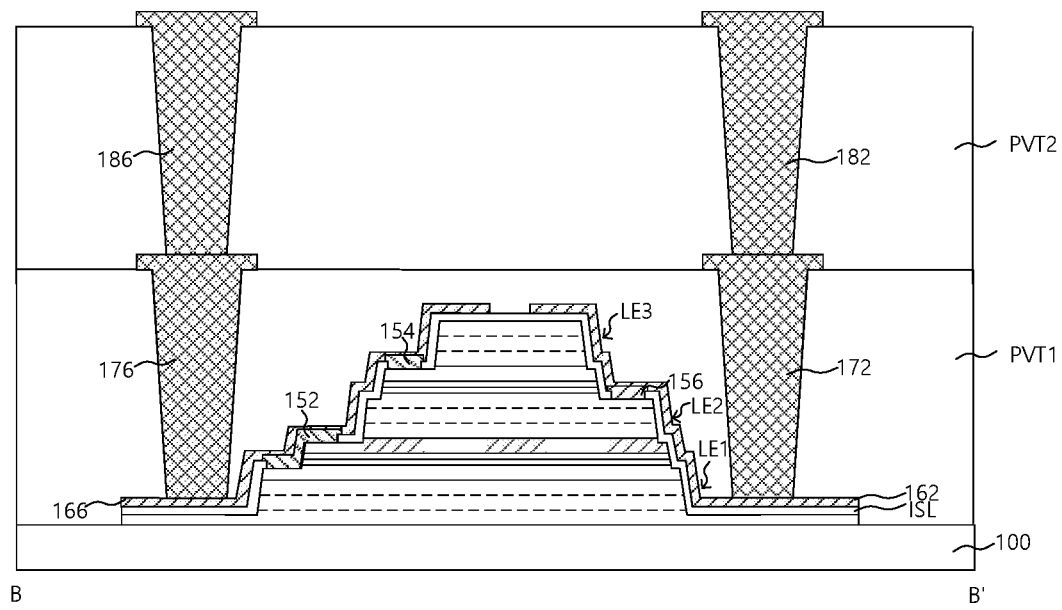

According to another exemplary embodiment shown in FIGS. 17A to 17C, before removing the first substrate 100, a second passivation layer PVT2 including fifth to eighth via holes which expose the top surfaces of the first to fourth via contacts 170, 172, 174, and 176, respectively, may be formed on the first passivation layer PVT1. The second passivation layer PVT2 may include substantially the same material as the first passivation layer PVT1, for example, polyimide or EMC. Then, by filling the fifth to eighth via holes with a conductive material, fifth to eighth via contacts 180, 182, 184, and 186 which are electrically coupled with the first to fourth via contacts 170, 172, 174 and 176, respectively, may be formed. According to an exemplary embodiment, each of the fifth to eighth via contacts 180, 182, 184, and 186 may have a top surface higher than the top surface of the second passivation layer PVT2. For example, the fifth via contact 180 may include a portion which fills the fifth via hole and a portion which projects upward out of the second passivation layer PVT2. The portion which projects upward out of the second passivation layer PVT2 may have a width larger than the width of the top of the fifth via hole. According to another exemplary embodiment, each of the fifth to eighth via contacts 180, 182, 184 and, 186 may have a top surface which is substantially flush with the top surface of the second passivation layer PVT2. The position of each of the fifth to eighth via contacts 180, 182, 184, and 186 may be varied depending on the standard separation distance of a device in which the light emitting chip is mounted. Then, the first substrate 100 may be removed. By this fact, the light emitting chip shown in FIGS. 4A to 4C may be completed.

Alternatively, according to another exemplary embodiment, before removing the first substrate 100, a TSV substrate may be bonded onto the first passivation layer PVT1. In general, multiple layers of conductive patterns may be formed in the TSV substrate. Conductive patterns which are electrically coupled with the first to fourth via contacts 170, 172, 174, and 176 may be formed on one surface of the TSV substrate, and conductive patterns 190, 192, 194 and, 196 which correspond to the respective positions of the fifth to eighth via contacts 180, 182, 184, and 186 may be disposed on the other surface of the TSV substrate. In this manner, the light emitting chip shown in FIGS. 5A to 5C may be completed.

Hereinafter, a light emitting cell unit which includes the above-described light emitting chip will be described.

Figure 18A:
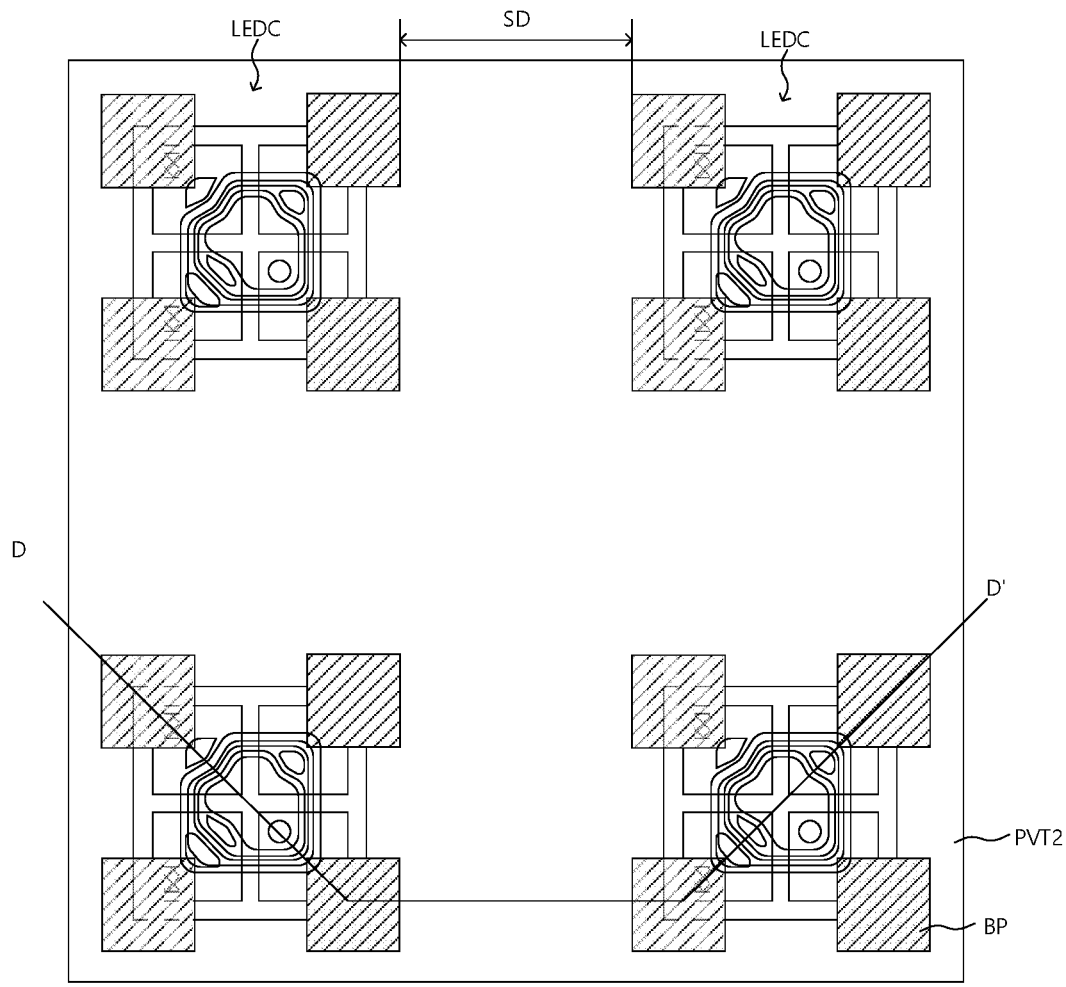
FIG. 18A is a plan view of a light emitting cell unit according to an exemplary embodiment.
Figure 18B:
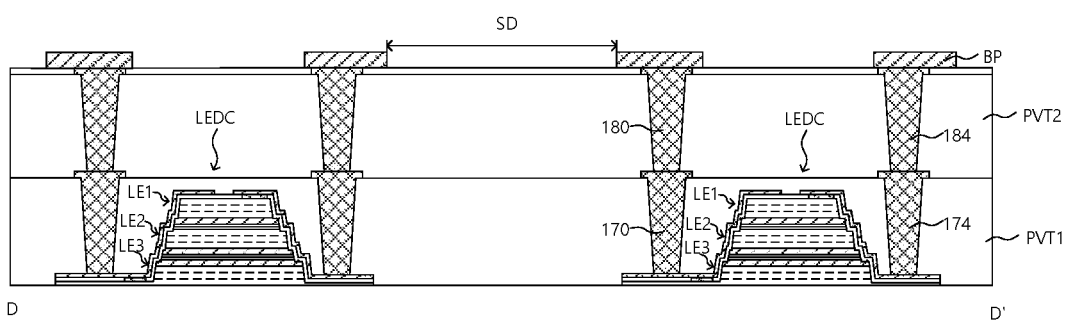
FIG. 18B is a cross-sectional view taken along line D-D' of FIG. 18A.

FIG. 18A is a plan view of a light emitting cell unit according to an exemplary embodiment, and FIG. 18B is a cross-sectional view taken along line D-D' of FIG. 18A, illustrating the light emitting cell unit.

Referring to FIGS. 18A and 18B, a light emitting cell unit may include a plurality of light emitting chips LEDC. The light emitting cell unit may have a substantially quadrangular structure when viewed from the top. The plurality of light emitting chips LEDC in the light emitting cell unit may be disposed at the respective corners of the quadrangular structure of the light emitting cell unit. Each of the light emitting chips LEDC in the light emitting cell unit according to an exemplary embodiment will be described as including the light emitting chip of FIGS. 1A to 1C, and thus, detailed descriptions of the structure and characteristics of the light emitting chip will be omitted to avoid redundancy. The light emitting chips LEDC in the light emitting cell unit may be separated and insulated from one another by a passivation layer PVT1 and/or PVT2.

According to an exemplary embodiment, the light emitting cell unit may be a unit to which light emitting chips may be mounted at once. For example, when there are four light emitting chips LEDC disposed in the light emitting cell unit, the four light emitting chips LEDC may be mounted at once in a target device through a single mounting process. While FIG. 18A shows that the light emitting cell unit includes four light emitting chips LEDC, however, the inventive concepts are not limited to a particular number of light emitting chips. As such, as one light emitting cell unit is mounted in a target device, the plurality of light emitting chips LEDC in the light emitting cell unit may be mounted at once. In this manner, the mounting process may be simplified, and reduce the time and costs for the manufacture.

In general, single chips are individually mounted in a target device, and one single chip has a standardized size, and a standardized distance between adjacent single chips is preset. As such, each of the light emitting chips LEDC in the light emitting cell unit has a size that is standardized for a target device, and adjacent light emitting chips LEDC may be disposed at a predetermined distance SD in the light emitting cell unit according to the standardized distance.

According to an exemplary embodiment, when the separation distance SD between the light emitting chips LEDC is shorter than the standardized distance of the target device, bumps BP may be additionally disposed on the second passivation layer PVT2, such that the separation distance SD between the bumps BP may become substantially the same as the standardized distance of the target device.

In the light emitting chip and the light emitting cell unit including the same according to exemplary embodiments, since the sidewall and top surface of a micro light emitting chip are protected by a passivation layer, it is possible to prevent the micro light emitting chip from breaking or being damaged during carriage or by an external shock. Also, since the passivation layer includes a polymer material, such as polyimide and epoxy molding compound (EMC), the amount of lost light may be reduced as the light emitted from the light emitting chip is reflected to improve light efficiency.

According to exemplary embodiments, a light emitting diode stack has a structure in which the first to third LED stacks are stacked one above another. In this manner, the light emitting diode stack can increase a luminous area of each subpixel without increasing a pixel area. Furthermore, light generated from the first LED stack may be emitted outside through the second LED stack and the third LED stack, and light generated from the second LED stack may be emitted outside through the third LED stack, thereby improving luminous efficacy.

For example, the first, second and third LED stacks are sequentially disposed to emit light having gradually decreasing wavelengths in the stated order. For example, the first, second, and third LED stacks may emit red light, green light and blue light, respectively. Since the first, second, and third LED stacks emit light having gradually decreasing wavelengths in the stated order, it is possible to prevent interference of light between the LED stacks.

Figure 19:
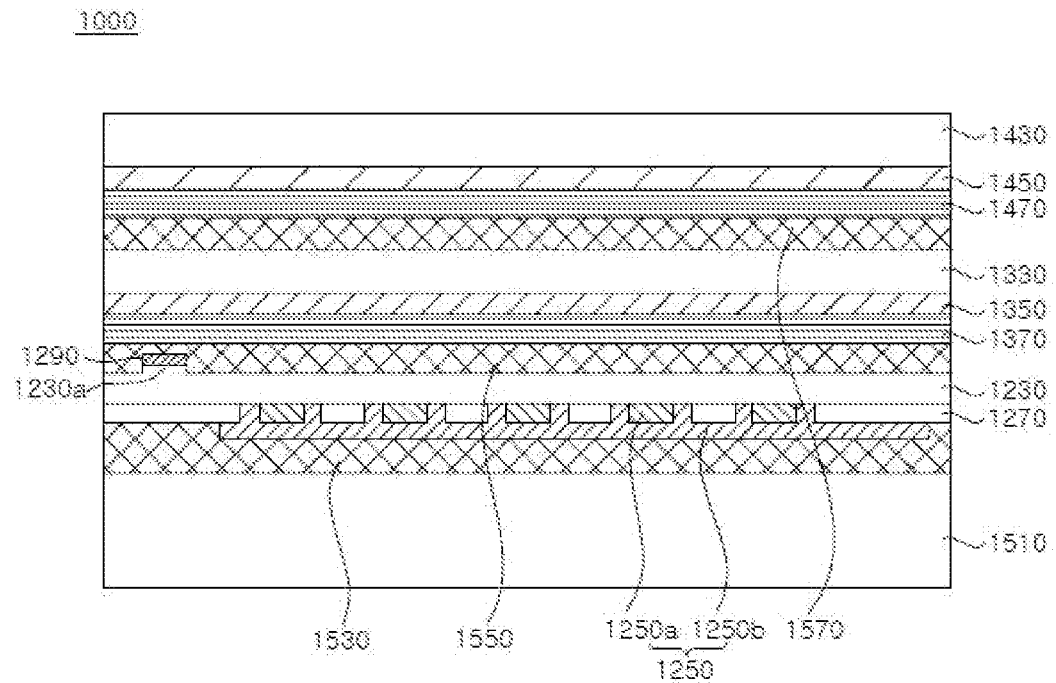
FIG. 19 is a schematic cross-sectional view of a light emitting diode stack for a display according to an exemplary embodiment.

FIG. 19 is a schematic cross-sectional view of a light emitting diode stack 1000 for a display according to an exemplary embodiment.

Referring to FIG. 19, the light emitting diode stack 1000 includes a support substrate 1510, a first LED stack 1230, a second LED stack 1330, a third LED stack 1430, a reflective electrode 1250, an ohmic electrode 1290, a second-p transparent electrode 1350, a third-p transparent electrode 1450, an insulation layer 1270, a first color filter 1370, a second color filter 1470, a first bonding layer 1530, a second bonding layer 1550, and a third bonding layer 1570. In addition, the first LED stack 1230 may include an ohmic contact portion 1230a for ohmic contact. As used for the exemplary embodiments disclosed herein, a light emitting diode stack may refer to a micro LED (or a micro LED stack).

The support substrate 1510 supports the LED stacks 1230, 1330, and 1430. The support substrate 1510 may include a circuit on a surface thereof or therein, but the inventive concepts are not limited thereto. The support substrate 1510 may include, for example, a Si substrate or a Ge substrate.

Each of the first LED stack 1230, the second LED stack 1330 and the third LED stack 1430 includes an n-type semiconductor layer, a p-type semiconductor layer, and an active layer interposed therebetween. The active layer may have a multi-quantum well structure.

For example, the first LED stack 1230 may be an inorganic light emitting diode configured to emit red light, the second LED stack 1330 may be an inorganic light emitting diode configured to emit green light, and the third LED stack 1430 may be an inorganic light emitting diode configured to emit blue light. The first LED stack 1230 may include a GaInP-based well layer, and each of the second LED stack 1330 and the third LED stack 1430 may include a GaInN-based well layer.

In addition, both surfaces of each of the first to third LED stacks 1230, 1330, and 1430 are an n-type semiconductor layer and a p-type semiconductor layer, respectively. In the illustrated exemplary embodiment, each of the first to third LED stacks 1230, 1330, and 1430 has an n-type upper surface and a p-type lower surface. Since the third LED stack 1430 has an n-type upper surface, a roughened surface may be formed on the upper surface of the third LED stack 1430 through chemical etching. However, the inventive concepts are not limited thereto, and the semiconductor types of the upper and lower surfaces of each of the LED stacks can be alternatively arranged.

The first LED stack 1230 is disposed near the support substrate 1510; the second LED stack 1330 is disposed on the first LED stack 1230; and the third LED stack 1430 is disposed on the second LED stack 1330. Since the first LED stack 1230 emits light having a longer wavelength than the second and third LED stacks 1330 and 1430, light generated from the first LED stack 1230 can be emitted outside through the second and third LED stacks 1330 and 1430. In addition, since the second LED stack 1330 emits light having a longer wavelength than the third LED stack 1430, light generated from the second LED stack 1330 can be emitted outside through the third LED stack 1430.

The reflective electrode 1250 forms ohmic contact with the p-type semiconductor layer of the first LED stack 1230, and reflects light generated from the first LED stack 1230. For example, the reflective electrode 1250 may include an ohmic contact layer 1250a and a reflective layer 1250b.

The ohmic contact layer 1250a partially contacts the p-type semiconductor layer of the first LED stack 1230. In order to prevent absorption of light by the ohmic contact layer 1250a, a region in which the ohmic contact layer 1250a contacts the p-type semiconductor layer may not exceed 50% of the total area of the p-type semiconductor layer. The reflective layer 1250b covers the ohmic contact layer 1250a and the insulation layer 1270. As shown in FIG. 19, the reflective layer 1250b may cover substantially the entire ohmic contact layer 1250a, without being limited thereto. Alternatively, the reflective layer 1250b may cover a portion of the ohmic contact layer 1250a.

Since the reflective layer 1250b covers the insulation layer 1270, an omnidirectional reflector can be formed by the stacked structure of the first LED stack 1230 having a relatively high index of refraction, and the insulation layer 1270 and the reflective layer 1250b having a relatively low index of refraction. The reflective layer 1250b may cover 50% or more of the area of the first LED stack 1230 or most of the first LED stack 1230, thereby improving luminous efficacy.

The ohmic contact layer 1250a and the reflective layer 1250b may be metal layers, which may include Au. The reflective layer 1250b may be formed of a metal having relatively high reflectance with respect to light generated from the first LED stack 1230, for example, red light. On the other hand, the reflective layer 1250b may be formed of a metal having relatively low reflectance with respect to light generated from the second LED stack 1330 and the third LED stack 1430, for example, green light or blue light, to reduce interference of light having been generated from the second and third LED stacks 1330 and 1430 and traveling toward the support substrate 1510.

The insulation layer 1270 is interposed between the support substrate 1510 and the first LED stack 1230 and has openings that expose the first LED stack 1230. The ohmic contact layer 1250a is connected to the first LED stack 1230 in the openings of the insulation layer 1270.

The ohmic electrode 1290 is disposed on the upper surface of the first LED stack 1230. In order to reduce ohmic contact resistance of the ohmic electrode 1290, the ohmic contact portion 1230a may protrude from the upper surface of the first LED stack 1230. The ohmic electrode 1290 may be disposed on the ohmic contact portion 1230a.

The second-p transparent electrode 1350 forms ohmic contact with the p-type semiconductor layer of the second LED stack 1330. The second-p transparent electrode 1350 may be composed of a metal layer or a conducive oxide layer transparent with respect to red light and green light.

In addition, the third-p transparent electrode 1450 forms ohmic contact with the p-type semiconductor layer of the third LED stack 1430. The third-p transparent electrode 1450 may include a metal layer or a conducive oxide layer that is transparent to red light, green light, and blue light.

The reflective electrode 1250, the second-p transparent electrode 1350, and the third-p transparent electrode 1450 may assist in current spreading through ohmic contact with the p-type semiconductor layer of corresponding LED stack.

The first color filter 1370 may be interposed between the first LED stack 1230 and the second LED stack 1330. The second color filter 1470 may be interposed between the second LED stack 1330 and the third LED stack 1430. The first color filter 1370 transmits light generated from the first LED stack 1230 while reflecting light generated from the second LED stack 1330. The second color filter 1470 transmits light generated from the first and second LED stacks 1230 and 1330, while reflecting light generated from the third LED stack 1430. As such, light generated from the first LED stack 1230 can be emitted outside through the second LED stack 1330 and the third LED stack 1430, and light generated from the second LED stack 1330 can be emitted outside through the third LED stack 1430. Further, light generated from the second LED stack 1330 may be prevented from entering the first LED stack 1230, and light generated from the third LED stack 1430 may be prevented from entering the second LED stack 1330, thereby preventing light loss.

In some exemplary embodiments, the first color filter 1370 may reflect light generated from the third LED stack 1430.

The first and second color filters 1370 and 1470 may be, for example, a low pass filter that transmits light in a low frequency band, that is, in a long wavelength band, a band pass filter that transmits light in a predetermined wavelength band, or a band stop filter that prevents light in a predetermined wavelength band from passing therethrough. In particular, each of the first and second color filters 1370 and 1470 may include a distributed Bragg reflector (DBR). The distributed Bragg reflector may be formed by alternately stacking insulation layers having different indices of refraction one above another, for example, $TiO_2$ and $SiO_2$. In addition, the stop band of the distributed Bragg reflector can be controlled by adjusting the thicknesses of $TiO_2$ and $SiO_2$ layers. The low pass filter and the band pass filter may also be formed by alternately stacking insulation layers having different indices of refraction one above another.

The first bonding layer 1530 couples the first LED stack 1230 to the support substrate 1510. As shown in FIG. 19, the reflective electrode 1250 may adjoin the first bonding layer 1530. The first bonding layer 1530 may be a light transmissive or opaque layer.

The second bonding layer 1550 couples the second LED stack 1330 to the first LED stack 1230. As shown in FIG. 19, the second bonding layer 1550 may adjoin the first LED stack 1230 and the first color filter 1370. The ohmic electrode 1290 may be covered by the second bonding layer 1550. The second bonding layer 1550 transmits light generated from the first LED stack 1230. The second bonding layer 1550 may be formed of, for example, light transmissive spin-on-glass.

The third bonding layer 1570 couples the third LED stack 1430 to the second LED stack 1330. As shown in FIG. 19, the third bonding layer 1570 may adjoin the second LED stack 1330 and the second color filter 1470. However, the inventive concepts are not limited thereto. For example, a transparent conductive layer may be disposed on the second LED stack 1330. The third bonding layer 1570 transmits light generated from the first LED stack 1230 and the second LED stack 1330. The third bonding layer 1570 may be formed of, for example, light transmissive spin-on-glass.

FIGS. 20A, 20B, 20C, 20D, and 20E are schematic cross-sectional views illustrating a method of manufacturing a light emitting diode stack for a display according to an exemplary embodiment.

Figure 20A:
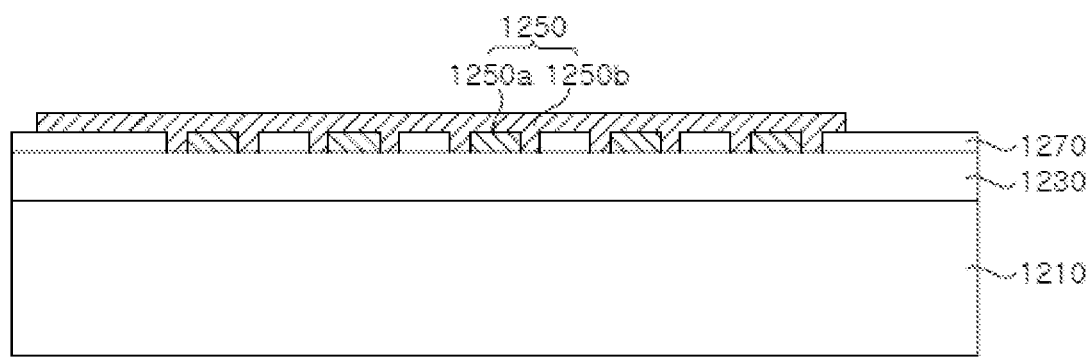
FIGS. 20A, 20B, 20C, 20D, and 20E are schematic cross-sectional views illustrating a method of manufacturing a light emitting diode stack for a display according to an exemplary embodiment.

Referring to FIG. 20A, a first LED stack 1230 is grown on a first substrate 1210. The first substrate 1210 may be, for example, a GaAs substrate. The first LED stack 1230 may be formed of AlGaInP-based semiconductor layers and includes an n-type semiconductor layer, an active layer, and a p-type semiconductor layer.

An insulation layer 1270 is formed on the first LED stack 1230, and is patterned to form opening(s). For example, a $SiO_2$ layer is formed on the first LED stack 1230 and a photoresist is deposited onto the $SiO_2$ layer, followed by photolithography and development to form a photoresist pattern. Then, the $SiO_2$ layer is patterned through the photoresist pattern used as an etching mask, thereby forming the insulation layer 1270.

Then, an ohmic contact layer 1250a is formed in the opening(s) of the insulation layer 1270. The ohmic contact layer 1250a may be formed by a lift-off process or the like. After the ohmic contact layer 1250a is formed, a reflective layer 1250b is formed to cover the ohmic contact layer 1250a and the insulation layer 1270. The reflective layer 1250b may be formed by a lift-off process or the like. The reflective layer 1250b may cover a portion of the ohmic contact layer 1250a or the entirety thereof, as shown in FIG. 20A. The ohmic contact layer 1250a and the reflective layer 1250b form a reflective electrode 1250.

The reflective electrode 1250 forms ohmic contact with the p-type semiconductor layer of the first LED stack 1230, and thus, will hereinafter be referred to as a first-p reflective electrode 1250.

Figure 20B:
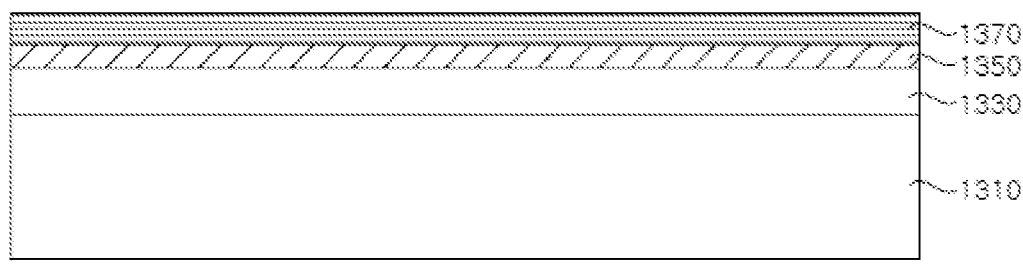

Referring to FIG. 20B, a second LED stack 1330 is grown on a second substrate 1310, and a second-p transparent electrode 1350 and a first color filter 1370 are formed on the second LED stack 1330. The second LED stack 1330 may be formed of GaN-based semiconductor layers, and include a GaInN well layer. The second substrate 1310 is a substrate on which GaN-based semiconductor layers may be grown thereon, and is different from the first substrate 1210. The composition ratio of GaInN for the second LED stack 1330 may be determined such that the second LED stack 1330 emits green light. The second-p transparent electrode 1350 forms ohmic contact with the p-type semiconductor layer of the second LED stack 1330.

Figure 20C:
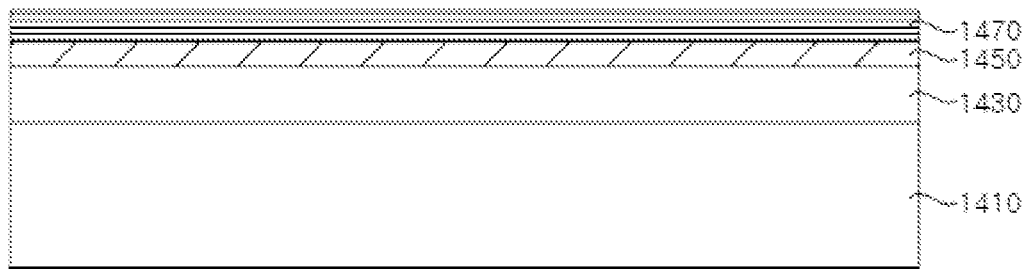

Referring to FIG. 20C, a third LED stack 1430 is grown on a third substrate 1410, and a third-p transparent electrode 1450 and a second color filter 1470 are formed on the third LED stack 1430. The third LED stack 1430 may be formed of GaN-based semiconductor layers and include a GaInN well layer. The third substrate 1410 is a substrate on which GaN-based semiconductor layers may be grown thereon, and is different from the first substrate 1210. The composition ratio of GaInN for the third LED stack 1430 may be determined such that the third LED stack 1430 emits blue light. The third-p transparent electrode 1450 forms ohmic contact with the p-type semiconductor layer of the third LED stack 1430.

The first color filter 1370 and the second color filter 1470 are substantially the same as those described with reference to FIG. 19, and thus, repeated descriptions thereof will be omitted to avoid redundancy.

As such, the first LED stack 1230, the second LED stack 1330, and the third LED stack 1430 may be grown on different substrates, and the formation sequence thereof is not limited to a particular sequence.

Figure 20D:
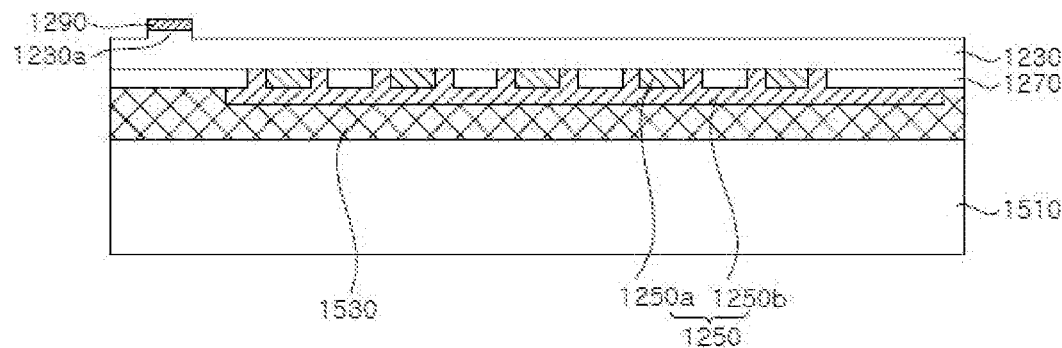

Referring to FIG. 20D, the first LED stack 1230 is coupled to the support substrate 1510 via a first bonding layer 1530. The first bonding layer 1530 may be previously formed on the support substrate 1510, and the reflective electrode 1250 may be bonded to the first bonding layer 1530 to face the support substrate 1510. The first substrate 1210 is removed from the first LED stack 1230 by chemical etching or the like. Accordingly, the upper surface of the n-type semiconductor layer of the first LED stack 1230 is exposed.

Then, an ohmic electrode 1290 is formed in the exposed region of the first LED stack 1230. In order to reduce ohmic contact resistance of the ohmic electrode 1290, the ohmic electrode 1290 may be subjected to heat treatment. The ohmic electrode 1290 may be formed in each pixel region so as to correspond to the pixel regions.

Figure 20E:
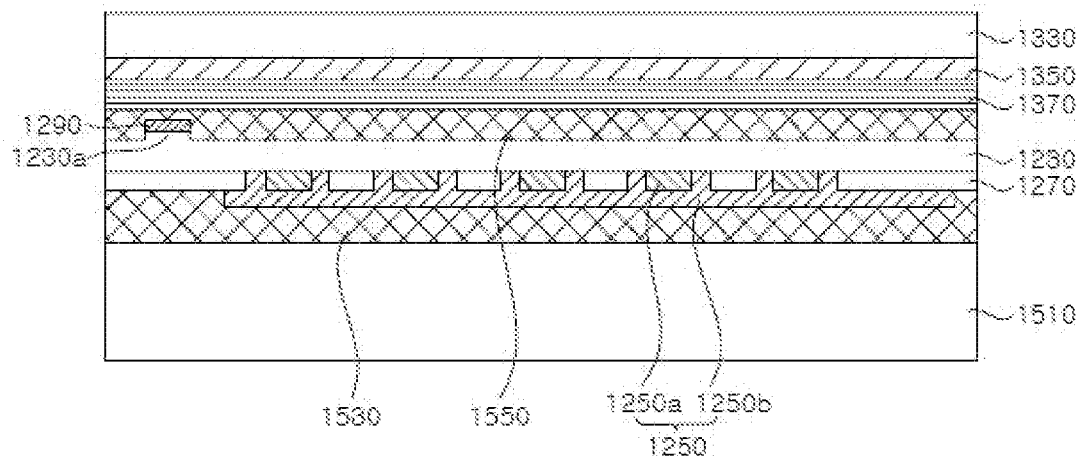

Referring to FIG. 20E, the second LED stack 1330 is coupled to the first LED stack 1230, on which the ohmic electrode 1290 is formed, via a second bonding layer 1550. The first color filter 1370 is bonded to the second bonding layer 1550 to face the first LED stack 1230. The second bonding layer 1550 may be previously formed on the first LED stack 1230 so that the first color filter 1370 may face and be bonded to the second bonding layer 1550. The second substrate 1310 may be separated from the second LED stack 1330 by a laser lift-off or chemical lift-off process.

Then, referring to FIG. 19 and FIG. 20C, the third LED stack 1430 is coupled to the second LED stack 1330 via a third bonding layer 1570. The second color filter 1470 is bonded to the third bonding layer 1570 to face the second LED stack 133. The third bonding layer 1570 may be previously disposed on the second LED stack 1330 so that the second color filter 1470 may face and be bonded to the third bonding layer 1570. The third substrate 1410 may be separated from the third LED stack 1430 by a laser lift-off or chemical lift-off process. As such, a light emitting diode stack for a display may be formed as shown in FIG. 19, which has the n-type semiconductor layer of the third LED stack 1430 exposed to the outside.

A display apparatus according to an exemplary embodiment may be provided by patterning the stack of the first to third LED stacks 1230, 1330, and 1430 on the support substrate 1510 in pixel units, followed by connecting the first to third LED stacks to one another through interconnections. Hereinafter, a display apparatus according to exemplary embodiments will be described.

Figure 21:
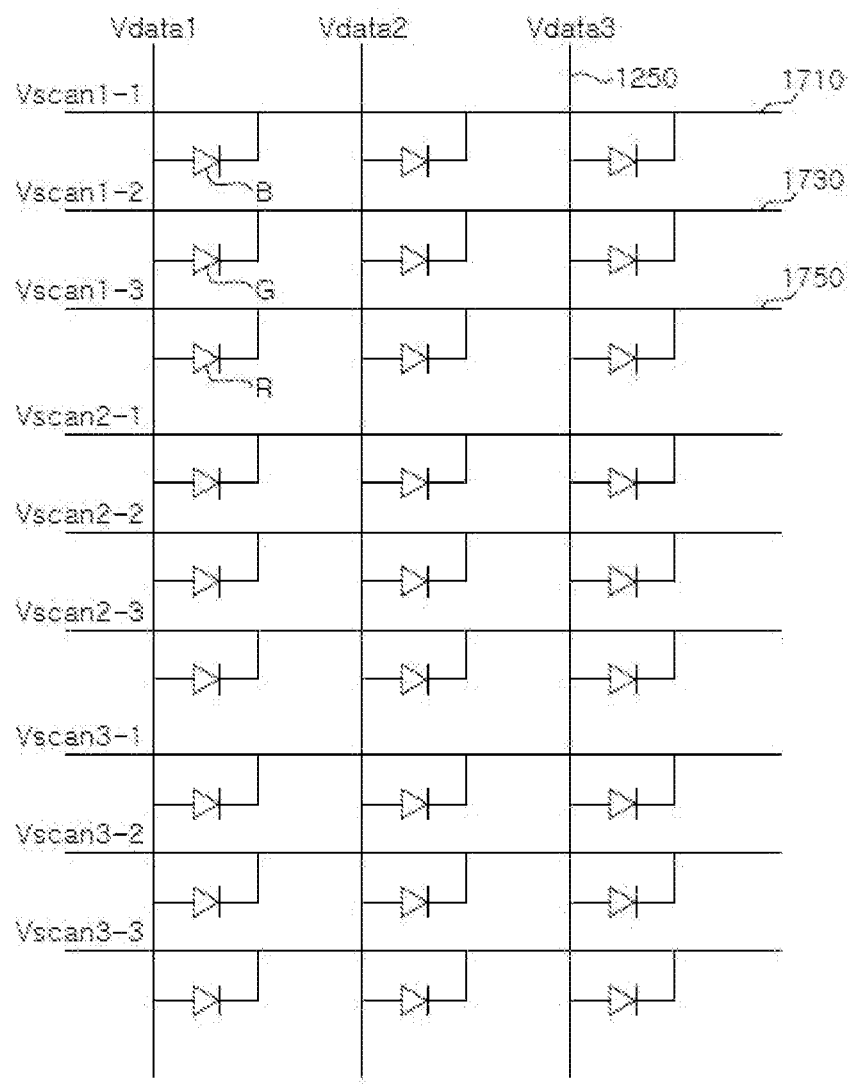
FIG. 21 is a schematic circuit diagram a display apparatus according to an exemplary embodiment.
Figure 22:
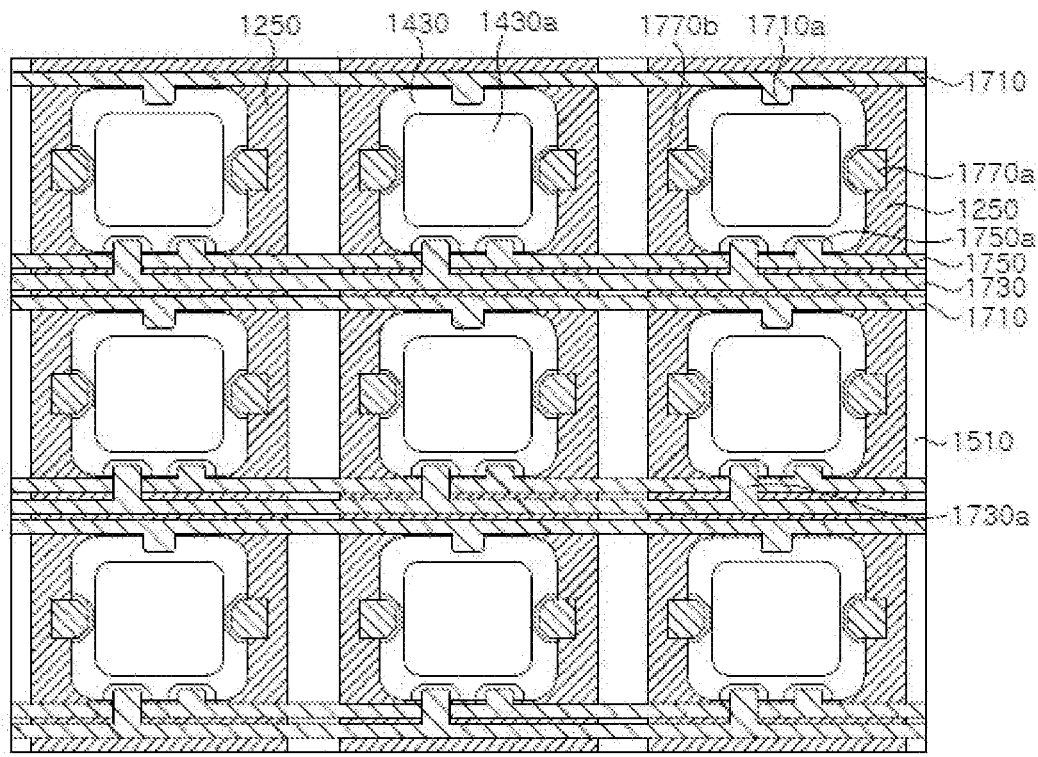
FIG. 22 is a schematic plan view of a display apparatus according to an exemplary embodiment.

FIG. 21 is a schematic circuit diagram of a display apparatus according to an exemplary embodiment, and FIG. 22 is a schematic plan view of the display apparatus according to an exemplary embodiment.

Referring to FIG. 21 and FIG. 22, a display apparatus according to an exemplary embodiment may be operated in a passive matrix manner.

For example, since the light emitting diode stack for a display of FIG. 19 includes the first to third LED stacks 1230, 1330, and 1430 stacked in the vertical direction, one pixel may include three light emitting diodes R, G, and B. A first light emitting diode R may correspond to the first LED stack 1230, a second light emitting diode G may correspond to the second LED stack 1330, and a third light emitting diode B may correspond to the third LED stack 1430.

In FIGS. 21 and 22, one pixel includes the first to third light emitting diodes R, G, and B, each of which corresponds to a subpixel. Anodes of the first to third light emitting diodes R, G, and B are connected to a common line, for example, a data line, and cathodes thereof are connected to different lines, for example, scan lines. More particularly, in a first pixel, the anodes of the first to third light emitting diodes R, G, and B are commonly connected to a data line Vdata1 and the cathodes thereof are connected to scan lines Vscan1-1, Vscan1-2, and Vscan1-3, respectively. As such, the light emitting diodes R, G, and B in each pixel can be driven independently.

In addition, each of the light emitting diodes R, G, and B may be driven by a pulse width modulation or by changing the magnitude of electric current, thereby controlling the brightness of each subpixel.

Referring to FIG. 22, a plurality of pixels is formed by patterning the light emitting diode stack 1000 described with reference to FIG. 19, and each of the pixels is connected to the reflective electrodes 1250 and interconnection lines 1710, 1730, and 1750. As shown in FIG. 21, the reflective electrode 1250 may be used as the data line Vdata and the interconnection lines 1710, 1730, and 1750 may be formed as the scan lines.

The pixels may be arranged in a matrix form, in which the anodes of the light emitting diodes R, G, and B of each pixel are commonly connected to the reflective electrode 1250, and the cathodes thereof are connected to the interconnection lines 1710, 1730, and 1750 separated from one another. Here, the interconnection lines 1710, 1730, and 1750 may be used as the scan lines Vscan.

Figure 23:
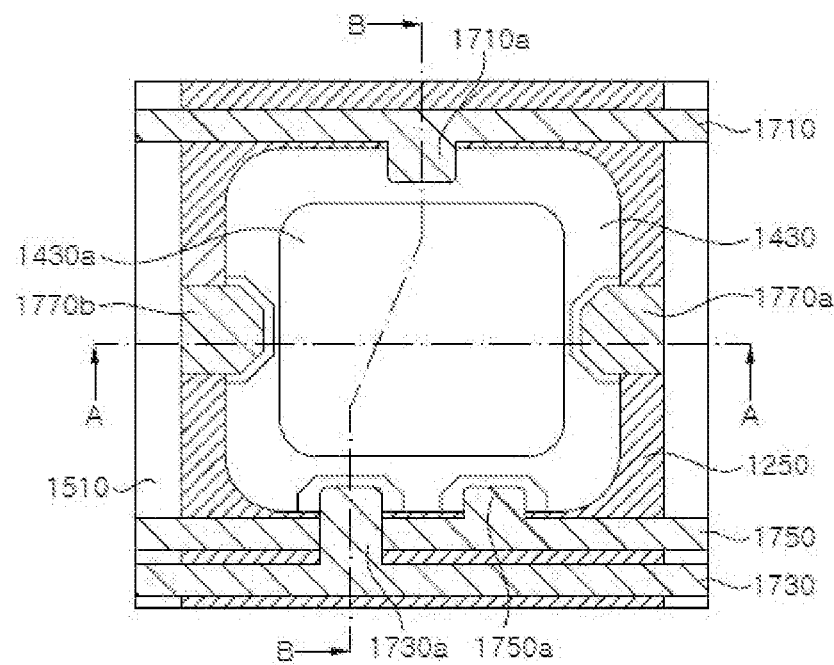
FIG. 23 is an enlarged plan view of one pixel of the display apparatus of FIG. 22.
Figure 24:
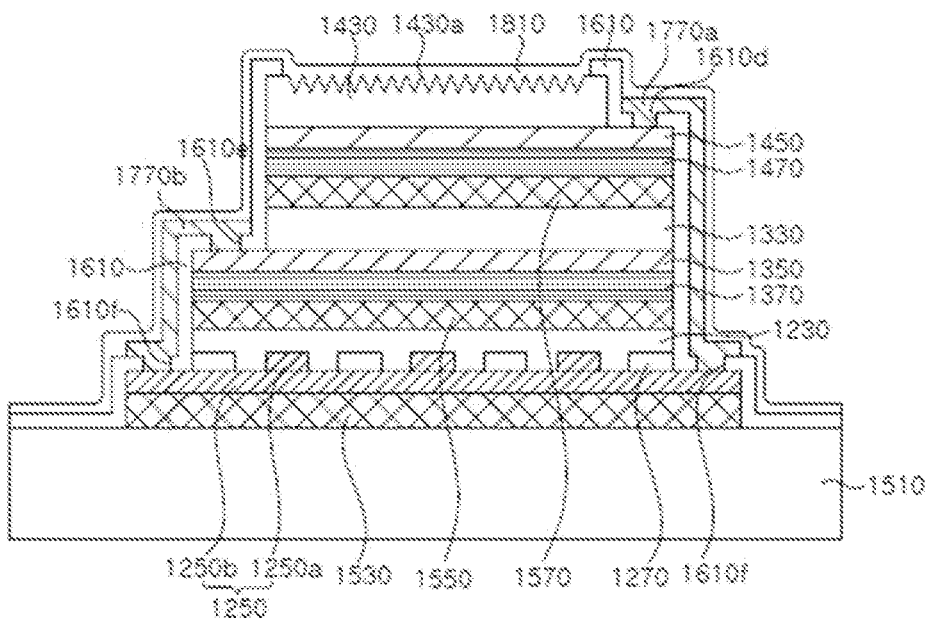
FIG. 24 is a schematic cross-sectional view taken along line A-A of FIG. 23.
Figure 25:
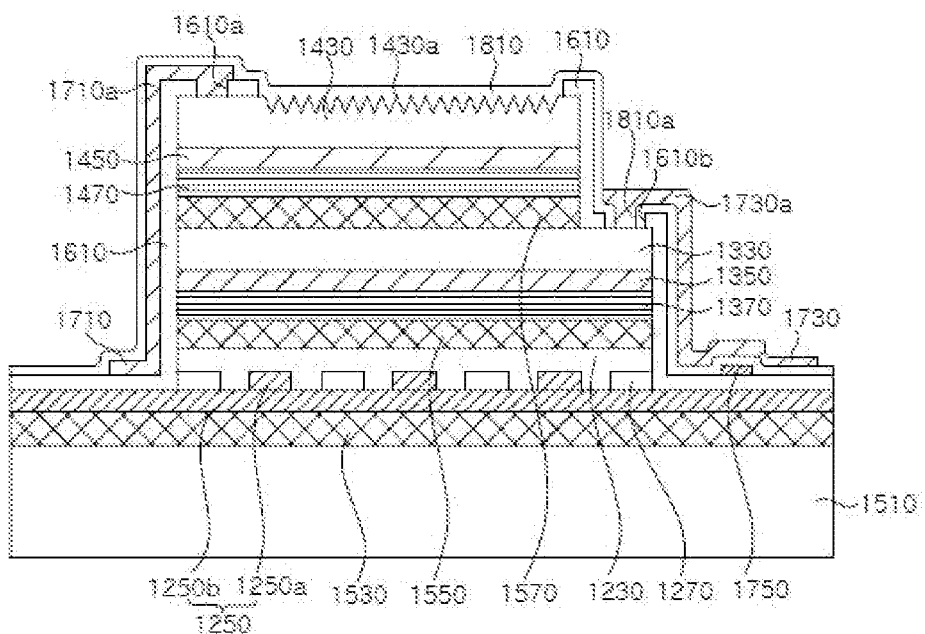
FIG. 25 is a schematic cross-sectional view taken along line B-B of FIG. 23.

FIG. 23 is an enlarged plan view of one pixel of the display apparatus of FIG. 22, FIG. 24 is a schematic cross-sectional view taken along line A-A of FIG. 23, and FIG. 25 is a schematic cross-sectional view taken along line B-B of FIG. 23.

Referring to FIG. 22, FIG. 23, FIG. 24 and FIG. 25, in each pixel, a portion of the reflective electrode 1250, the ohmic electrode 1290 formed on the upper surface of the first LED stack 1230, a portion of the second-p transparent electrode 1350, a portion of the upper surface of the second LED stack 1330, a portion of the third-p transparent electrode 1450, and the upper surface of the third LED stack 1430 are exposed to the outside.

The third LED stack 1430 may have a roughened surface 1430a on the upper surface thereof. The roughened surface 1430a may be formed over the entirety of the upper surface of the third LED stack 1430 or may be formed in some regions thereof, as shown in FIG. 24.

A lower insulation layer 1610 may cover a side surface of each pixel. The lower insulation layer 1610 may be formed of a light transmissive material, such as $SiO_2$. In this case, the lower insulation layer 1610 may cover the entire upper surface of the third LED stack 1430. Alternatively, the lower insulation layer 1610 may include a distributed Bragg reflector to reflect light traveling towards the side surfaces of the first to third LED stacks 1230, 1330, and 1430. In this case, the lower insulation layer 1610 partially exposes the upper surface of the third LED stack 1430.

The lower insulation layer 1610 may include an opening 1610a which exposes the upper surface of the third LED stack 1430, an opening 1610b which exposes the upper surface of the second LED stack 1330, an opening 1610c (see FIG. 26H) which exposes the ohmic electrode 1290 of the first LED stack 1230, an opening 1610d which exposes the third-p transparent electrode 1450, an opening 1610e which exposes the second-p transparent electrode 1350, and openings 1610f which expose the first-p reflective electrode 1250.

The interconnection lines 1710 and 1750 may be formed near the first to third LED stacks 1230, 1330, and 1430 on the support substrate 1510, and may be disposed on the lower insulation layer 1610 to be insulated from the first-p reflective electrode 1250. A connecting portion 1770a connects the third-p transparent electrode 1450 to the reflective electrode 1250, and a connecting portion 1770b connects the second-p transparent electrode 1350 to the reflective electrode 1250, such that the anodes of the first LED stack 1230, the second LED stack 1330, and the third LED stack 1430 are commonly connected to the reflective electrode 1250.

A connecting portion 1710a connects the upper surface of the third LED stack 1430 to the interconnection line 1710, and a connecting portion 1750a connects the ohmic electrode 1290 on the first LED stack 1230 to the interconnection line 1750.

An upper insulation layer 1810 may be disposed on the interconnection lines 1710 and 1750 and the lower insulation layer 1610 to cover the upper surface of the third LED stack 1430. The upper insulation layer 1810 may have an opening 1810*a* which partially exposes the upper surface of the second LED stack 1330.

The interconnection line 1730 may be disposed on the upper insulation layer 1810, and the connecting portion 1730*a* may connect the upper surface of the second LED stack 1330 to the interconnection line 1730. The connecting portion 1730*a* may pass through an upper portion of the interconnection line 1750 and is insulated from the interconnection line 1750 by the upper insulation layer 1810.

Although the electrodes of each pixel according to the illustrate exemplary embodiment are described as being connected to the data line and the scan lines, various implementations are possible. In addition, although the interconnection lines 1710 and 1750 are described as being formed on the lower insulation layer 1610, and the interconnection line 1730 is formed on the upper insulation layer 1810, the inventive concepts are not limited thereto. For example, each of the interconnection lines 1710, 1730, and 1750 may be formed on the lower insulation layer 1610, and covered by the upper insulation layer 1810, which may have openings to expose the interconnection line 1730. In this structure, the connecting portion 1730*a* may connect the upper surface of the second LED stack 1330 to the interconnection line 1730 through the openings of the upper insulation layer 1810.

Alternatively, the interconnection lines 1710, 1730, and 1750 may be formed inside the support substrate 1510, and the connecting portions 1710*a*, 1730*a*, and 1750*a* on the lower insulation layer 1610 may connect the ohmic electrode 1290, the upper surface of the second LED stack 1330, and the upper surface of the third LED stack 1430 to the interconnection lines 1710, 1730, and 1750.

FIG. 26A to FIG. 26K are schematic plan views illustrating a method of manufacturing a display apparatus including the pixel of FIG. 23 according to an exemplary embodiment.

First, the light emitting diode stack 1000 described in FIG. 19 is prepared.

Figure 26A:
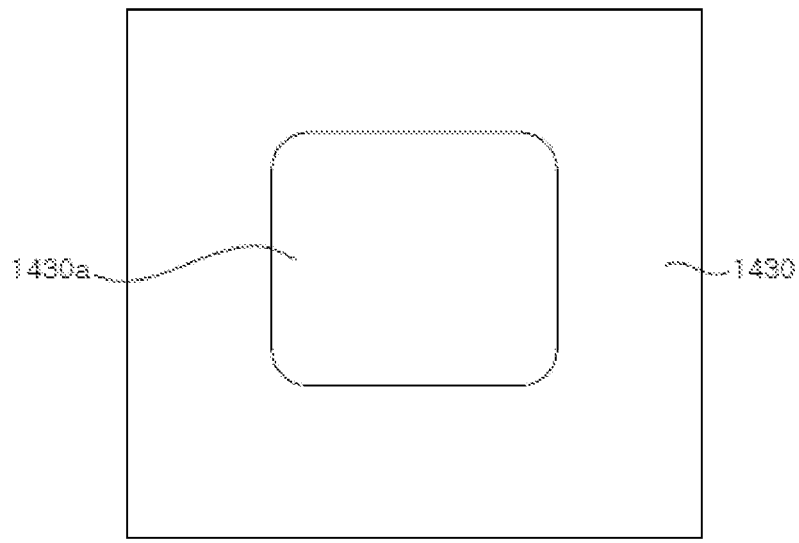
FIGS. 26A, 26B, 26C, 26D, 26E, 26F, 26G, 26H, 26I, 26J, and 26K are schematic plan views illustrating a method of manufacturing a display apparatus according to an exemplary embodiment.

Then, referring to FIG. 26A, a roughened surface 1430*a* may be formed on the upper surface of the third LED stack 1430. The roughened surface 1430*a* may be formed on the upper surface of the third LED stack 1430 so as to correspond to each pixel region. The roughened surface 1430*a* may be formed by chemical etching, for example, photo-enhanced chemical etching (PEC) or the like.

The roughened surface 1430*a* may be partially formed in each pixel region by taking into account a region of the third LED stack 1430 to be etched in the subsequent process, without being limited thereto. Alternatively, the roughened surface 1430*a* may be formed over the entire upper surface of the third LED stack 1430.

Figure 26B:
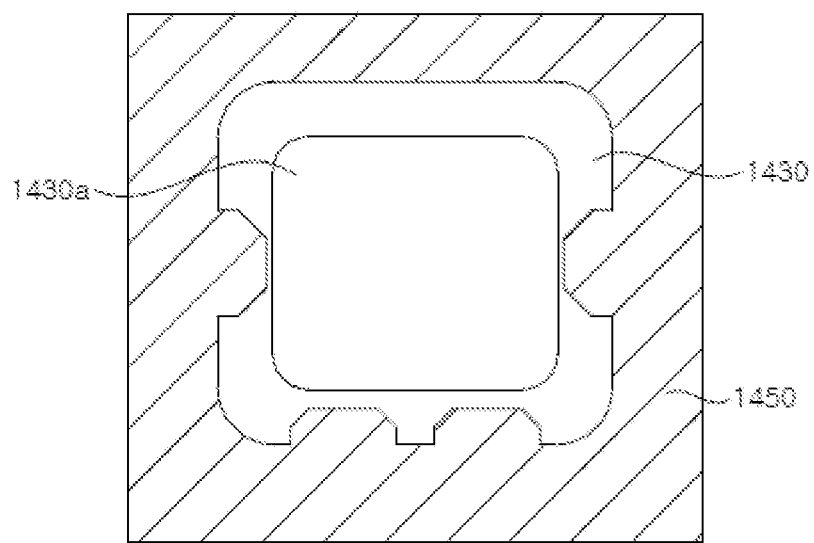

Referring to FIG. 26B, a surrounding region of the third LED stack 1430 in each pixel is removed by etching to expose the third-p transparent electrode 1450. As shown in FIG. 26B, the third LED stack 1430 may be remained to have a rectangular shape or a square shape. The third LED stack 1430 may have a plurality of depressions along edges thereof.

Figure 26C:
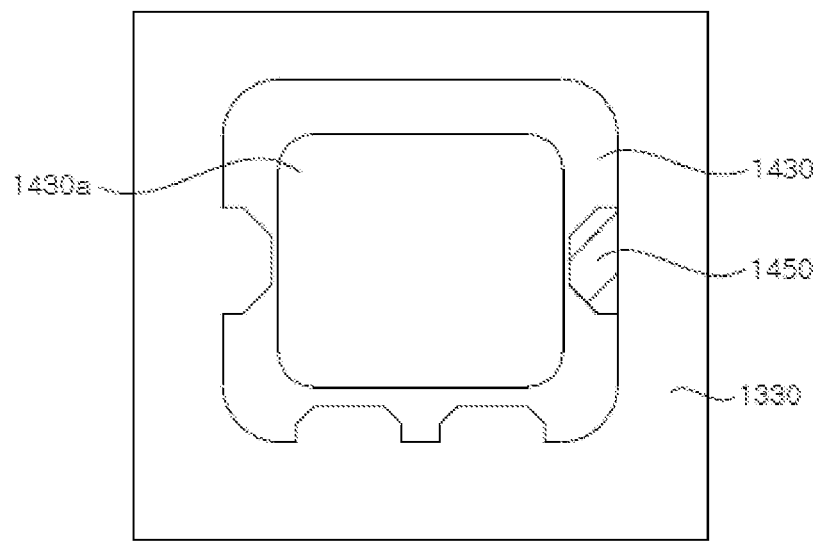

Referring to FIG. 26C, the upper surface of the second LED stack 1330 is exposed by removing the exposed third-p transparent electrode 1450 in areas other than one depression of the third LED stack 1430. Accordingly, the upper surface of the second LED stack 1330 is exposed around the third LED stack 1430 and in other depressions excluding the depression in which the third-p transparent electrode 1450 partially remains.

Figure 26D:
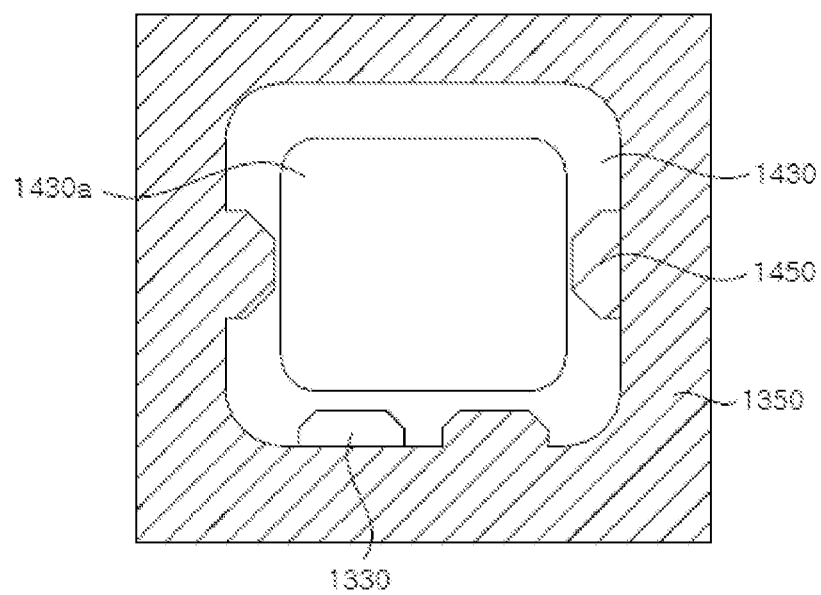

Referring to FIG. 26D, the second-p transparent electrode 1350 is exposed by removing the exposed second LED stack 1330 in areas other the another depression of the third LED stack 1430.

Figure 26E:
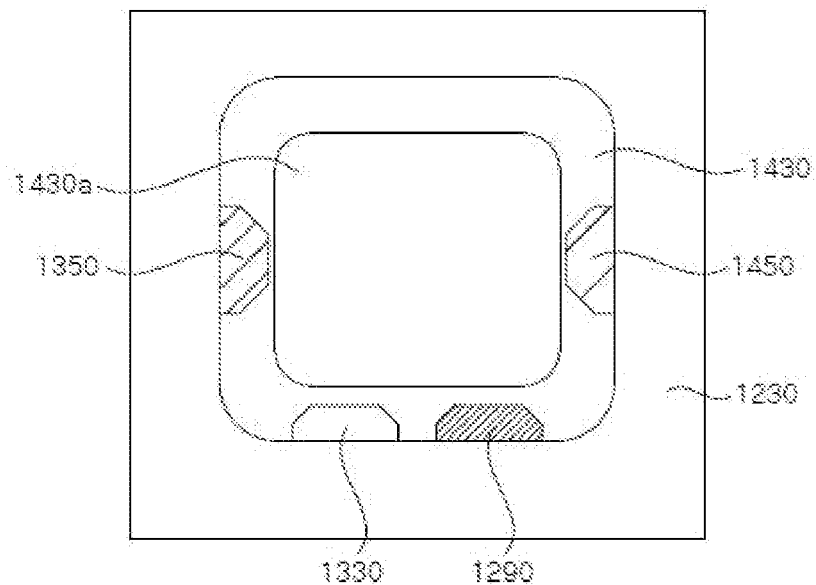

Referring to FIG. 26E, the ohmic electrode 1290 is exposed together with the upper surface of the first LED stack 1230 by removing the exposed second-p transparent electrode 1350 in areas other than another depression of the third LED stack 1430. In this case, the ohmic electrode 1290 may be exposed in one depression. Accordingly, the upper surface of the first LED stack 1230 is exposed around the third LED stack 1430, and an upper surface of the ohmic electrode 1290 is exposed in at least one of the depressions formed in the third LED stack 1430.

Figure 26F:
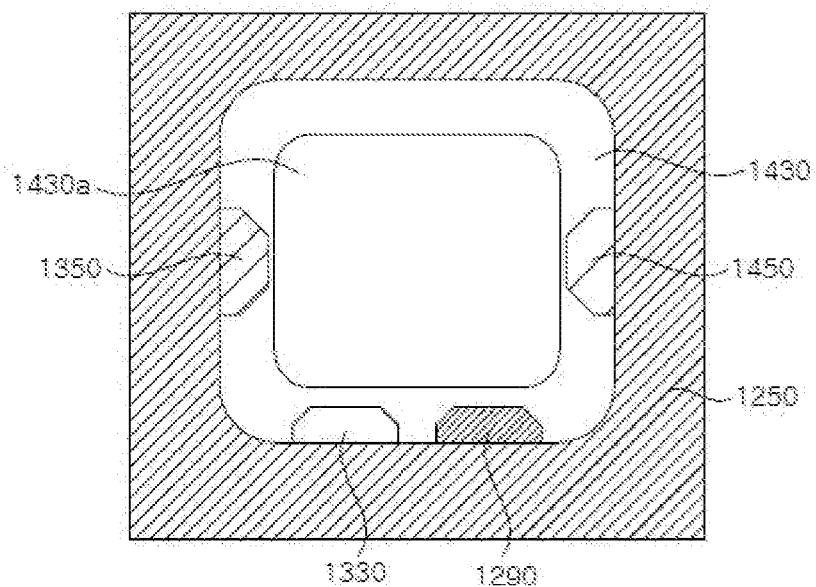

Referring to FIG. 26F, the reflective electrode 1250 is exposed by removing an exposed portion of the first LED stack 1230 other than the ohmic electrode 1290 exposed in one depression. The reflective electrode 1250 is exposed around the third LED stack 1430.

Figure 26G:
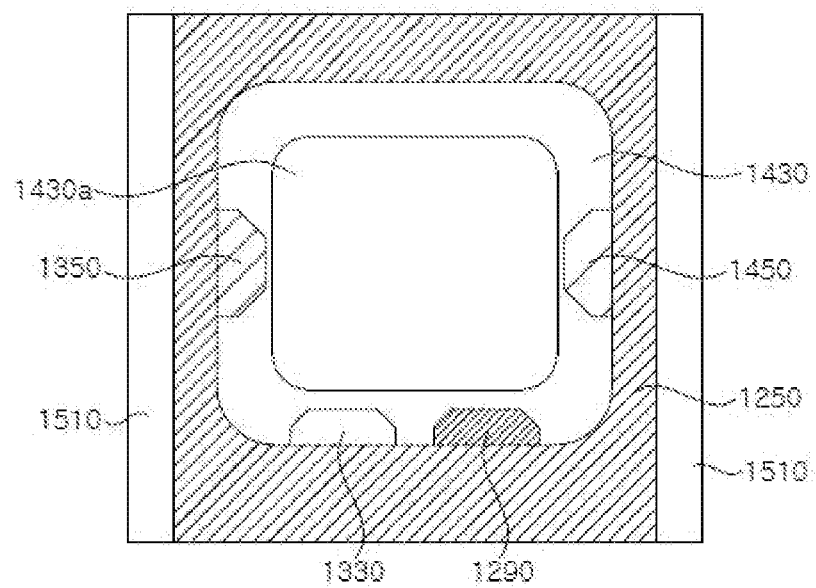

Referring to FIG. 26G, linear interconnection lines are formed by patterning the reflective electrode 1250. Here, the support substrate 1510 may be exposed. The reflective electrode 1250 may connect pixels arranged in one row to each other among pixels arranged in a matrix (see FIG. 22).

Figure 26H:
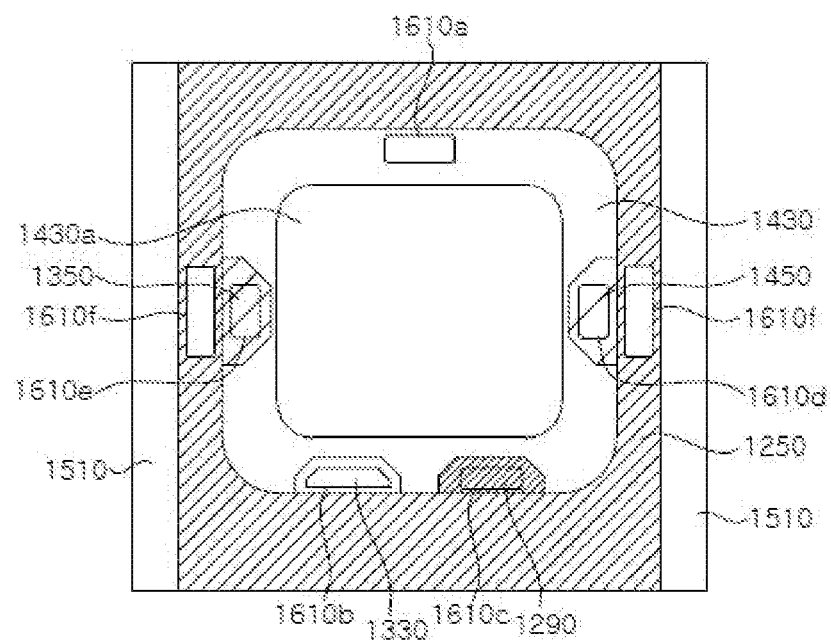

Referring to FIG. 26H, a lower insulation layer 1610 (see FIG. 24 and FIG. 25) is formed to cover the pixels. The lower insulation layer 1610 covers the reflective electrode 1250 and side surfaces of the first to third LED stacks 1230, 1330, and 1430. In addition, the lower insulation layer 1610 may at least partially cover the upper surface of the third LED stack 1430. If the lower insulation layer 1610 is a transparent layer such as a $SiO_2$ layer, the lower insulation layer 1610 may cover the entire upper surface of the third LED stack 1430. Alternatively, when the lower insulation layer 1610 includes a distributed Bragg reflector, the lower insulation layer 1610 may at least partially expose the upper surface of the third LED stack 1430 such that light may be emitted to the outside.

The lower insulation layer 1610 may include an opening 1610*a* which exposes the third LED stack 1430, an opening 1610*b* which exposes the second LED stack 1330, an opening 1610*c* which exposes the ohmic electrode 1290, an opening 1610*d* which exposes the third-p transparent electrode 1450, an opening 1610*e* which exposes the second-p transparent electrode 1350, and an opening 1610*f* which exposes the reflective electrode 1250. One or more openings 1610*f* may be formed to expose the reflective electrode 1250.

Figure 26I:
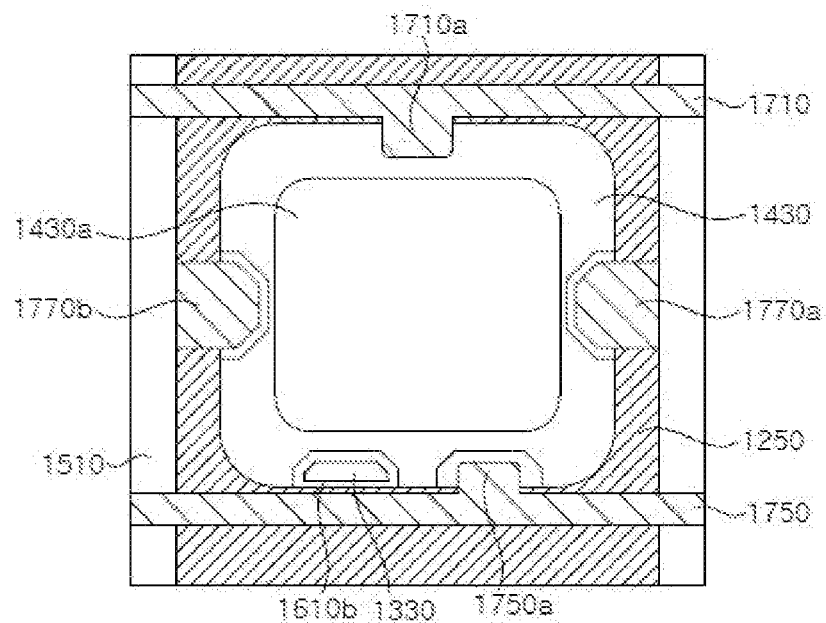

Referring to FIG. 26I, interconnection lines 1710, 1750 and connecting portions 1710*a*, 1750*a*, 1770*a*, 1770*b* are formed. These may be formed by a lift-off process or the like. The interconnection lines 1710 and 1750 are insulated from the reflective electrode 1250 by the lower insulation layer 1610. The connecting portion 1710*a* electrically connects the third LED stack 1430 to the interconnection line 1710, and the connecting portion 1750*a* electrically connects the ohmic electrode 1290 to the interconnection line 1750 such that the first LED stack 1230 is electrically connected to the interconnection line 1750. The connecting portion 1770*a* electrically connects the third-p transparent electrode 1450 to the first-p reflective electrode 1250, and the connecting portion 1770*b* electrically connects the second-p transparent electrode 1350 to the first-p reflective electrode 1250.

Figure 26J:
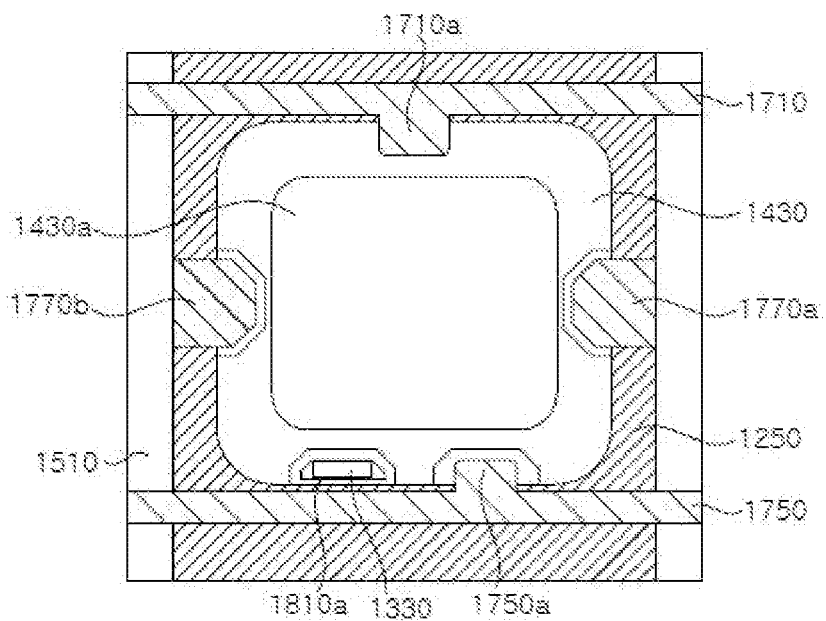

Referring to FIG. 26J, an upper insulation layer 1810 (see FIG. 24 and FIG. 25) covers the interconnection lines 1710 and 1750 and the connecting portions 1710a, 1750a, 1770a, 1770b. The upper insulation layer 1810 may also cover the entire upper surface of the third LED stack 1430. The upper insulation layer 1810 has an opening 1810a which exposes the upper surface of the second LED stack 1330. The upper insulation layer 1810 may be formed of, for example, silicon oxide or silicon nitride, and may include a distributed Bragg reflector. When the upper insulation layer 1810 includes the distributed Bragg reflector, the upper insulation layer 1810 may expose at least part of the upper surface of the third LED stack 1430 such that light may be emitted to the outside.

Figure 26K:
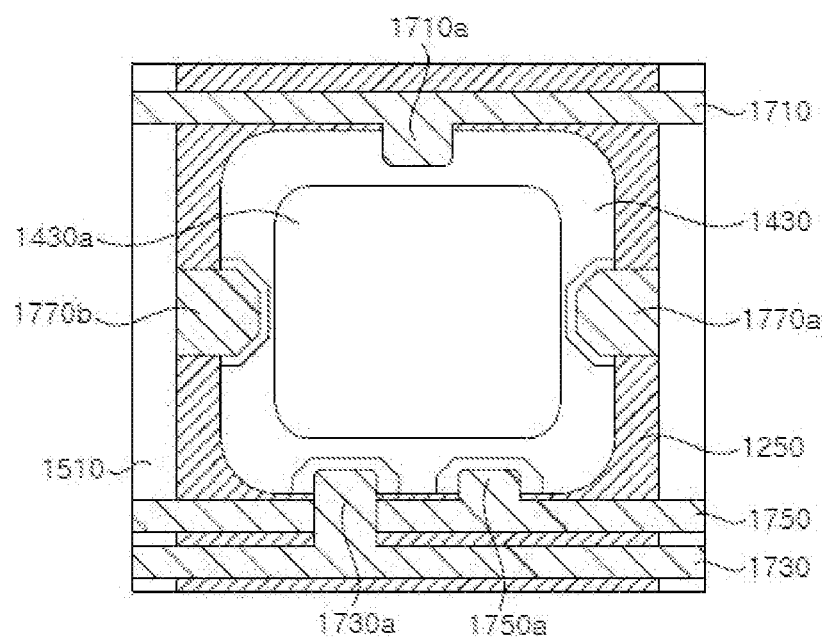

Referring to FIG. 26K, an interconnection line 1730 and a connecting portion 1730a are formed. An interconnection line 1730 and a connecting portion 1730a may be formed by a lift-off process or the like. The interconnection line 1730 is disposed on the upper insulation layer 1810, and is insulated from the reflective electrode 1250 and the interconnection lines 1710 and 1750. The connecting portion 1730a electrically connects the second LED stack 1330 to the interconnection line 1730. The connecting portion 1730a may pass through an upper portion of the interconnection line 1750 and is insulated from the interconnection line 1750 by the upper insulation layer 1810.

As such, a pixel region as shown in FIG. 23 may be formed. In addition, as shown in FIG. 22, a plurality of pixels may be formed on the support substrate 1510 and may be connected to one another by the first-p the reflective electrode 1250 and the interconnection lines 1710, 1730, and 1750 to be operated in a passive matrix manner.

Although the display apparatus above has been described as being configured to be operated in the passive matrix manner, the inventive concepts are not limited thereto. More particularly, a display apparatus according to some exemplary embodiments may be manufactured in various ways so as to be operated in the passive matrix manner using the light emitting diode stack shown in FIG. 19.

For example, although the interconnection line 1730 is illustrated as being formed on the lower insulation layer 1610, the interconnection line 1730 may be formed together with the interconnection lines 1710 and 1750 on the lower insulation layer 1610, and the connecting portion 1730a may be formed on the upper insulation layer 1810 to connect the second LED stack 1330 to the interconnection line 1730. Alternatively, the interconnection lines 1710, 1730, and 1750 may be disposed inside the support substrate 1510.

Figure 27:
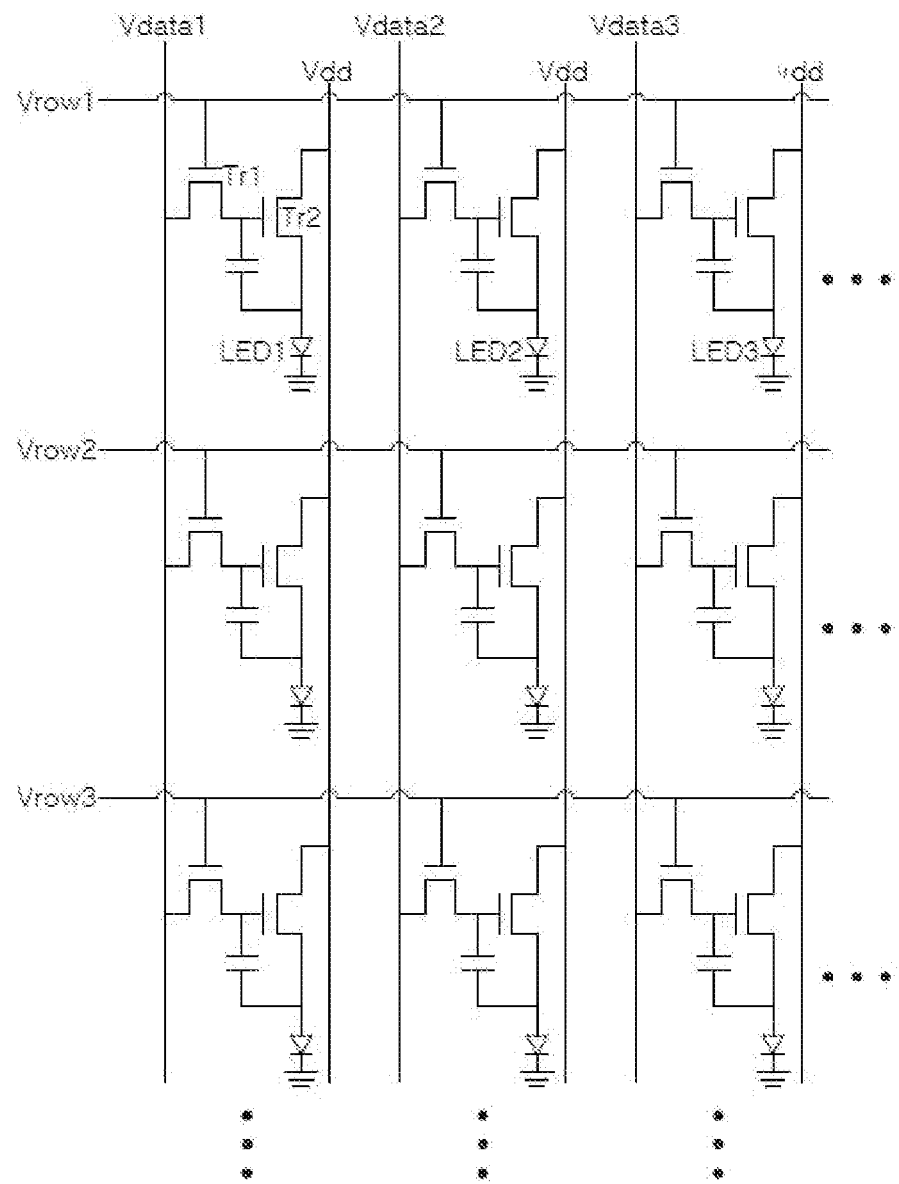
FIG. 27 is a schematic circuit diagram of a display apparatus according to another exemplary embodiment.

FIG. 27 is a schematic circuit diagram of a display apparatus according to another exemplary embodiment. The display apparatus according to the illustrated exemplary embodiment may be driven in an active matrix manner.

Referring to FIG. 27, the drive circuit according to an exemplary embodiment includes at least two transistors Tr1, Tr2 and a capacitor. When a power source is connected to selection lines Vrow1 to Vrow3, and voltage is applied to data lines Vdata1 to Vdata3, the voltage is applied to the corresponding light emitting diode. In addition, the corresponding capacitor is charged according to the values of Vdata1 to Vdata3. Since a turned-on state of a transistor Tr2 can be maintained by the charged voltage of the capacitor, the voltage of the capacitor can be maintained and applied to the light emitting diodes LED1 to LED3 even when power supplied to Vrow1 is cut off. In addition, electric current flowing in the light emitting diodes LED1 to LED3 can be changed depending upon the values of Vdata1 to Vdata3. Electric current can be continuously supplied through Vdd, such that light may be emitted continuously.

The transistors Tr1, Tr2 and the capacitor may be formed inside the support substrate 1510. For example, thin film transistors formed on a silicon substrate may be used for active matrix driving.

The light emitting diodes LED1 to LED3 may correspond to the first to third LED stacks 1230, 1330, and 1430 stacked in one pixel, respectively. The anodes of the first to third LED stacks are connected to the transistor Tr2 and the cathodes thereof are connected to the ground.

Although FIG. 27 shows the circuit for active matrix driving according to an exemplary embodiment, other types of circuits may be used. In addition, although the anodes of the light emitting diodes LED1 to LED3 are described as being connected to different transistors Tr2, and the cathodes thereof are described as being connected to the ground, the inventive concepts are not limited thereto, and the anodes of the light emitting diodes may be connected to current supplies Vdd and the cathodes thereof may be connected to different transistors.

Figure 28:
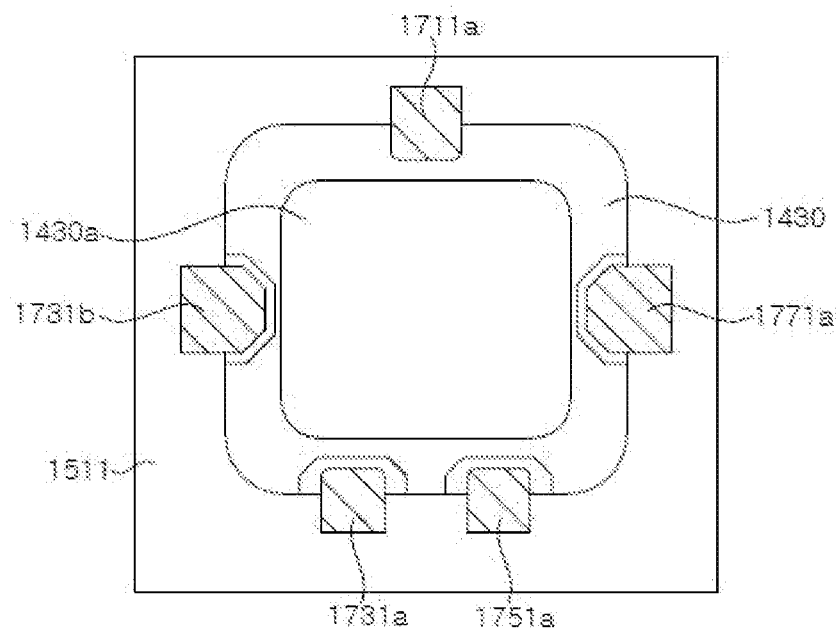
FIG. 28 is a schematic plan view of a display apparatus according to another exemplary embodiment.

FIG. 28 is a schematic plan view of a pixel of a display apparatus according to another exemplary embodiment. The pixel described herein may be one of plurality of pixels arranged on the support substrate 1511.

Referring to FIG. 28, the pixels according to the illustrated exemplary embodiment are substantially similar to the pixels described with reference to FIG. 22 to FIG. 25, except that the support substrate 1511 is a thin film transistor panel including transistors and capacitors, and the reflective electrode is disposed in a lower region of the first LED stack.

The cathode of the third LED stack is connected to the support substrate 1511 through the connecting portion 1711a. For example, as shown in FIG. 27, the cathode of the third LED stack may be connected to the ground through electrical connection to the support substrate 1511. The cathodes of the second LED stack and the first LED stack may also be connected to the ground through electrical connection to the support substrate 1511 via the connecting portions 1731a and 1751a.

The reflective electrode is connected to the transistors Tr2 (see FIG. 27) inside the support substrate 1511. The third-p transparent electrode and the second-p transparent electrode are also connected to the transistors Tr2 (see FIG. 27) inside the support substrate 1511 through the connecting portions 1711b and 1731b.

In this manner, the first to third LED stacks are connected to one another, thereby constituting a circuit for active matrix driving, as shown in FIG. 27.

Although FIG. 28 shows electrical connection of a pixel for active matrix driving according to an exemplary embodiment, the inventive concepts are not limited thereto, and the circuit for the display apparatus can be modified into various circuits for active matrix driving in various ways.

In addition, while the reflective electrode 1250, the second-p transparent electrode 1350, and the third-p transparent electrode 1450 of FIG. 19 are described as forming ohmic contact with the corresponding p-type semiconductor layer of each of the first LED stack 1230, the second LED stack 1330, and the third LED stack 1430, and the ohmic electrode 1290 forms ohmic contact with the n-type semiconductor layer of the first LED stack 1230, the n-type semiconductor layer of each of the second LED stack 1330 and the third LED stack 1430 is not provided with a separate ohmic contact layer. When the pixels have a small size of 200 μm or less, there is less difficulty in current spreading even without formation of a separate ohmic contact layer in the n-type semiconductor layer. However, according to some exemplary embodiments, a transparent electrode layer may be disposed on the n-type semiconductor layer of each of the LED stacks in order to secure current spreading.

In addition, although the first to third LED stacks 1230, 1330, and 1430 are coupled to each other via bonding layers 1530, 1550, and 1570, the inventive concepts are not limited thereto, and the first to third LED stacks 1230, 1330, and 1430 may be connected to one another in various sequences and using various structures.

According to exemplary embodiments, since it is possible to form a plurality of pixels at the wafer level using the light emitting diode stack 1000 for a display, individual mounting of light emitting diodes may be obviated. In addition, the light emitting diode stack according to the exemplary embodiments has the structure in which the first to third LED stacks 1230, 1330, and 1430 are stacked in the vertical direction, thereby securing an area for subpixels in a limited pixel area. Furthermore, the light emitting diode stack according to the exemplary embodiments allows light generated from the first LED stack 1230, the second LED stack 1330, and the third LED stack 1430 to be emitted outside therethrough, thereby reducing light loss.

Figure 29:
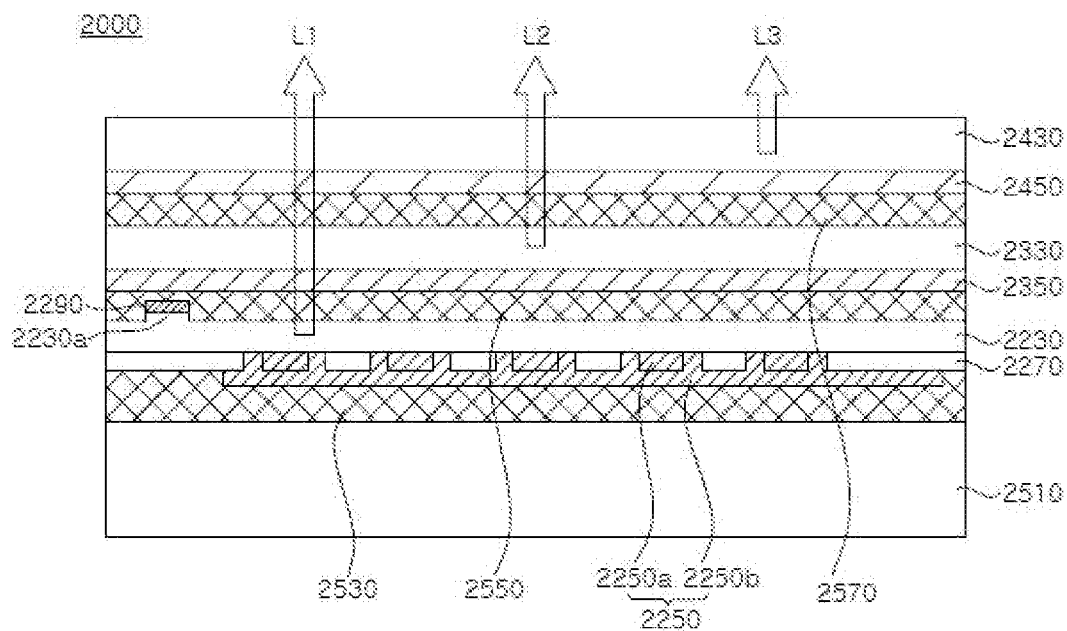
FIG. 29 is a schematic cross-sectional view of a light emitting diode stack for a display according to an exemplary embodiment.

FIG. 29 is a schematic cross-sectional view of a light emitting diode stack 2000 for a display according to an exemplary embodiment.

A light emitting diode stack for a display according to an exemplary embodiment includes a first LED stack, a second LED stack disposed on the first LED stack, and a third LED stack disposed on the second LED stack, in which light generated from the first LED stack is emitted to the outside through the second LED stack and the third LED stack, and light generated from the second LED stack is emitted to the outside through the third LED stack.

In this manner, in which the first to third LED stacks are stacked one above another, the light emitting diode stack can increase a luminous area of each subpixel without increasing a pixel area. More particularly, light generated from the first LED stack may be emitted to the outside through the second LED stack and the third LED stack, and light generated from the second LED stack may be emitted to the outside through the third LED stack, thereby improving luminous efficacy.

Light generated from the first LED stack may have a longer wavelength than light generated from the second LED stack, and light generated from the second LED stack may have a longer wavelength than light generated from the third LED stack. Accordingly, light generated from the first LED stack may be emitted to the outside through the second LED stack and the third LED stack, and light generated from the second LED stack may be emitted outside through the third LED stack. For example, the first, second, and third LED stacks may emit red light, green light, and blue light, respectively. However, the inventive concepts are not limited to the stacked sequence of the LED stacks emitting different colors of light. For example, when the first, second, and third LED stacks use micro LEDs, the first LED stack may emit any one of red, green, or blue color light, and the second and the third LED stacks may emit the remaining one of the red, green, and blue color light, respectively, without adversely affecting operation or requiring color filters between the LED stacks due to the small form factor of the micro LEDs.

A portion of light generated from the second LED stack may enter the first LED stack to generate light in the first LED stack, and a portion of light generated from the third LED stack may enter the second LED stack to generate light in the second LED stack.

In some exemplary embodiments, the intensity of light generated from the second LED stack and emitted to the outside may be about 10 times or more the intensity of the light generated from the first LED stack caused by the light generated from the second LED stack, and the intensity of light generated from the third LED stack and emitted to the outside may be about times or more the intensity of the light generated from the second LED stack caused by the light generated from the third LED stack.

In general, since light is generated from the first LED stack by the light generated from the second LED stack, a color filter may be interposed between the second LED stack and the first LED stack. In addition, since light is generated from the second LED stack by the light generated from the third LED stack, a color filter may also be interposed between the third LED stack and the second LED stack.

However, while the color filters may prevent interference of light, forming color filters would increase manufacturing complexity. A display apparatus according to exemplary embodiments may suppress generation of secondary light between the LED stacks without arrangement of the color filters therebetween.

In some exemplary embodiments, interference of light between the LED stacks can be reduced by controlling the bandgap of each of the LED stacks, which will be described in more detail below.

Referring to FIG. 29, the light emitting diode stack 2000 includes a support substrate 2510, a first LED stack 2230, a second LED stack 2330, a third LED stack 2430, a reflective electrode 2250, an ohmic electrode 2290, a second-p transparent electrode 2350, a third-p transparent electrode 2450, an insulation layer 2270, a first bonding layer 2530, a second bonding layer 2550, and a third bonding layer 2570. In addition, the first LED stack 2230 may include an ohmic contact portion 2230*a* for ohmic contact.

The support substrate 2510 supports the LED stacks 2230, 2330, and 2430. The support substrate 2510 may include a circuit on a surface thereof or therein, but the inventive concepts are not limited thereto. The support substrate 2510 may include, for example, a Si substrate, a Ge substrate, a sapphire substrate, a patterned sapphire substrate, a glass substrate, or a patterned glass substrate.

Each of the first LED stack 2230, the second LED stack 2330, and the third LED stack 2430 includes an n-type semiconductor layer, a p-type semiconductor layer, and an active layer interposed therebetween. The active layer may have a multi-quantum well structure.

Light L1 generated from the first LED stack 2230 has a longer wavelength than light L2 generated from the second LED stack 2330, which has a longer wavelength than light L3 generated from the third LED stack 2430.

The first LED stack 2230 may be an inorganic light emitting diode configured to emit red light, the second LED stack 2330 may be an inorganic light emitting diode configured to emit green light, and the third LED stack 2430 may be an inorganic light emitting diode configured to emit blue light. The first LED stack 2230 may include a GaInP-based well layer, and each of the second LED stack 2330 and the third LED stack 2430 may include a GaInN-based well layer.

Although the light emitting diode stack 2000 of FIG. 29 is illustrated as including three LED stacks 2230, 2330, and 2430, the inventive concepts are not limited to a particular number of LED stacks one over the other. For example, an LED stack for emitting yellow light may be further added between the first LED stack 2230 and the second LED stack 2330.

Both surfaces of each of the first to third LED stacks 2230, 2330, and 2430 are an n-type semiconductor layer and a p-type semiconductor layer, respectively. In FIG. 29, each of the first to third LED stacks 2230, 2330, and 2430 is described as having an n-type upper surface and a p-type lower surface. Since the third LED stack 2430 has an n-type upper surface, a roughened surface may be formed on the upper surface of the third LED stack 2430 through chemical etching or the like. However, the inventive concepts are not limited thereto, and the semiconductor types of the upper and lower surfaces of each of the LED stacks can be formed alternatively.

The first LED stack 2230 is disposed near the support substrate 2510, the second LED stack 2330 is disposed on the first LED stack 2230, and the third LED stack 2430 is disposed on the second LED stack. Since the first LED stack 2230 emits light having a longer wavelength than the second and third LED stacks 2330 and 2430, light L1 generated from the first LED stack 2230 can be emitted to the outside through the second and third LED stacks 2330, and 2430. In addition, since the second LED stack 2330 emits light having a longer wavelength than the third LED stack 2430, light L2 generated from the second LED stack 2330 can be emitted to the outside through the third LED stack 2430. Light L3 generated in the third LED stack 2430 is directly emitted outside from the third LED stack 2430.

In an exemplary embodiment, the n-type semiconductor layer of the first LED stack 2230 may have a bandgap wider than the bandgap of the active layer of the first LED stack 2230, and narrower than the bandgap of the active layer of the second LED stack 2330. Accordingly, a portion of light generated from the second LED stack 2330 may be absorbed by the n-type semiconductor layer of the first LED stack 2230 before reaching the active layer of the first LED stack 2230. As such, the intensity of light generated in the active layer of the first LED stack 2230 may be reduced by the light generated from the second LED stack 2330.

In addition, the n-type semiconductor layer of the second LED stack 2330 has a bandgap wider than the bandgap of the active layer of each of the first LED stack 2230 and the second LED stack 2330, and narrower than the bandgap of the active layer of the third LED stack 2430. Accordingly, a portion of light generated from the third LED stack 2430 may be absorbed by the n-type semiconductor layer of the second LED stack 2330 before reaching the active layer of the second LED stack 2330. As such, the intensity of light generated in the second LED stack 2330 or the first LED stack 2230 may be reduced by the light generated from the third LED stack 2430.

The p-type semiconductor layer and the n-type semiconductor layer of the third LED stack 2430 has wider bandgaps than the active layers of the first LED stack 2230 and the second LED stack 2330, thereby transmitting light generated from the first and second LED stacks 2230 and 2330 therethrough.

According to an exemplary embodiment, it is possible to reduce interference of light between the LED stacks 2230, 2330, and 2430 by adjusting the bandgaps of the n-type semiconductor layers or the p-type semiconductor layers of the first and second LED stacks 2230 and 2330, which may obviate the need for other components such as color filters. For example, the intensity of light generated from the second LED stack 2330 and emitted to the outside may be about 10 times or more the intensity of light generated from the first LED stack 2230 caused by the light generated from the second LED stack 2330. Likewise, the intensity of light generated from the third LED stack 2430 and emitted to the outside may be about 10 times or more the intensity of the light generated from the second LED stack 2330 caused by the light generated from the third LED stack 2430. In this case, the intensity of the light generated from the third LED stack 2430 and emitted to the outside may be about 10 times or more the intensity of the light generated from the first LED stack 2230 caused by the light generated from the third LED stack 2430. Accordingly, it is possible to realize a display apparatus free from color contamination caused by interference of light.

The reflective electrode 2250 forms ohmic contact with the p-type semiconductor layer of the first LED stack 2230 and reflects light generated from the first LED stack 2230. For example, the reflective electrode 2250 may include an ohmic contact layer 2250a and a reflective layer 2250b.

The ohmic contact layer 2250a partially contacts the p-type semiconductor layer of the first LED stack 2230. In order to prevent absorption of light by the ohmic contact layer 2250a, a region in which the ohmic contact layer 2250a contacts the p-type semiconductor layer may not exceed 50% of the total area of the p-type semiconductor layer. The reflective layer 2250b covers the ohmic contact layer 2250a and the insulation layer 2270. As shown in the drawings, the reflective layer 2250b may cover substantially the entire ohmic contact layer 2250a, without being limited thereto. Alternatively, the reflective layer 2250b may cover a portion of the ohmic contact layer 2250a.

Since the reflective layer 2250b covers the insulation layer 2270, an omnidirectional reflector can be formed by the stacked structure of the first LED stack 2230 having a relatively high index of refraction, and the insulation layer 2270 and the reflective layer 2250b having a relatively low index of refraction. The reflective layer 2250b may cover 50% or more of the area of the first LED stack 2230, or most of the first LED stack 2230, thereby improving luminous efficacy.

The ohmic contact layer 2250a and the reflective layer 2250b may be metal layers, which may include Au. The reflective layer 2250b may be formed of a metal having relatively high reflectance with respect to light generated from the first LED stack 2230, for example, red light. On the other hand, the reflective layer 2250b may be formed of a metal having relatively low reflectance with respect to light generated from the second LED stack 2330 and the third LED stack 2430, for example, green light or blue light, to reduce interference of light having been generated from the second and third LED stacks 2330 and 2430 and traveling toward the support substrate 2510.

The insulation layer 2270 is interposed between the support substrate 2510 and the first LED stack 2230 and has openings that expose the first LED stack 2230. The ohmic contact layer 2250a is connected to the first LED stack 2230 in the openings of the insulation layer 2270.

The ohmic electrode 2290 is disposed on the upper surface of the first LED stack 2230. In order to reduce ohmic contact resistance of the ohmic electrode 2290, the ohmic contact portion 2230a may protrude from the upper surface of the first LED stack 2230. The ohmic electrode 2290 may be disposed on the ohmic contact portion 2230a.

The second-p transparent electrode 2350 forms ohmic contact with the p-type semiconductor layer of the second LED stack 2330. The second-p transparent electrode 2350 may include a metal layer or a conducive oxide layer that is transparent to red light and green light.

The third-p transparent electrode 2450 forms ohmic contact with the p-type semiconductor layer of the third LED stack 2430. The third-p transparent electrode 2450 may include a metal layer or a conducive oxide layer that is transparent to red light, green light, and blue light.

The reflective electrode 2250, the second-p transparent electrode 2350, and the third-p transparent electrode 2450 may assist in current spreading through ohmic contact with the p-type semiconductor layer of corresponding LED stack.

The first bonding layer 2530 couples the first LED stack 2230 to the support substrate 2510. The reflective electrode 2250 may adjoin the first bonding layer 2530. The first bonding layer 2530 may be a light transmissive or opaque layer.

The second bonding layer 2550 couples the second LED stack 2330 to the first LED stack 2230. As shown in the drawings, the second bonding layer 2550 may adjoin the first LED stack 2230 and the second-p transparent electrode 2350. The ohmic electrode 2290 may be covered by the second bonding layer 2550. The second bonding layer 2550 transmits light generated from the first LED stack 2230. The second bonding layer 2550 may be formed of a light transmissive bonding material, for example, a light transmissive organic bonding agent or light transmissive spin-on-glass. Examples of the light transmissive organic bonding agent may include SU8, poly(methyl methacrylate) (PMMA), polyimide, Parylene, benzocyclobutene (BCB), and the like. In addition, the second LED stack 2330 may be bonded to the first LED stack 2230 by plasma bonding or the like.

The third bonding layer 2570 couples the third LED stack 2430 to the second LED stack 2330. As shown in the drawings, the third bonding layer 2570 may adjoin the second LED stack 2330 and the third-p transparent electrode 2450. However, the inventive concepts are not limited thereto. For example, a transparent conductive layer may be disposed on the second LED stack 2330. The third bonding layer 2570 transmits light generated from the first LED stack 2230 and the second LED stack 2330, and may be formed of, for example, light transmissive spin-on-glass.

Each of the second bonding layer 2550 and the third bonding layer 2570 may transmit light generated from the third LED stack 2430 and light generated from the second LED stack 2330.

FIG. 30A to FIG. 30E are schematic cross-sectional views illustrating a method of manufacturing a light emitting diode stack for a display according to an exemplary embodiment.

Figure 30A:
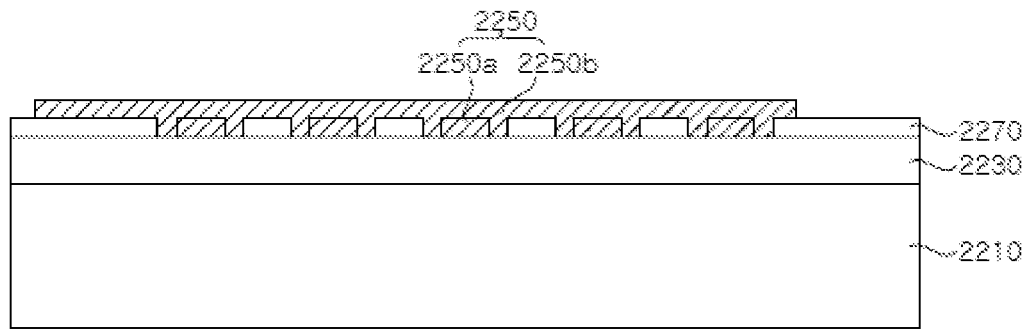
FIGS. 30A, 30B, 30C, 30D, and 30E are schematic cross-sectional views illustrating a method of manufacturing a light emitting diode stack for a display according to an exemplary embodiment.

Referring to FIG. 30A, a first LED stack 2230 is grown on a first substrate 2210. The first substrate 2210 may be, for example, a GaAs substrate. The first LED stack 2230 is formed of AlGaInP-based semiconductor layers, and includes an n-type semiconductor layer, an active layer and a p-type semiconductor layer. In some exemplary embodiments, the n-type semiconductor layer may have an energy bandgap capable absorbing light generated from the second LED stack 2330, and the p-type semiconductor layer may have an energy bandgap capable absorbing light generated from the second LED stack 2330.

An insulation layer 2270 is formed on the first LED stack 2230 and patterned to form opening(s) therein. For example, a SiO$_2$ layer is formed on the first LED stack 2230, and a photoresist is deposited onto the SiO$_2$ layer, followed by photolithography and development to form a photoresist pattern. Then, the SiO$_2$ layer is patterned through the photoresist pattern used as an etching mask, thereby forming the insulation layer 2270 having the opening(s).

Then, an ohmic contact layer 2250a is formed in the opening(s) of the insulation layer 2270. The ohmic contact layer 2250a may be formed by a lift-off process or the like. After the ohmic contact layer 2250a is formed, a reflective layer 2250b is formed to cover the ohmic contact layer 2250a and the insulation layer 2270. The reflective layer 2250b may be formed by a lift-off process or the like. The reflective layer 2250b may cover a portion of the ohmic contact layer 2250a or the entirety thereof. The ohmic contact layer 2250a and the reflective layer 2250b form a reflective electrode 2250.

The reflective electrode 2250 forms ohmic contact with the p-type semiconductor layer of the first LED stack 2230, and thus, will hereinafter be referred to as a first-p reflective electrode 2250.

Figure 30B:
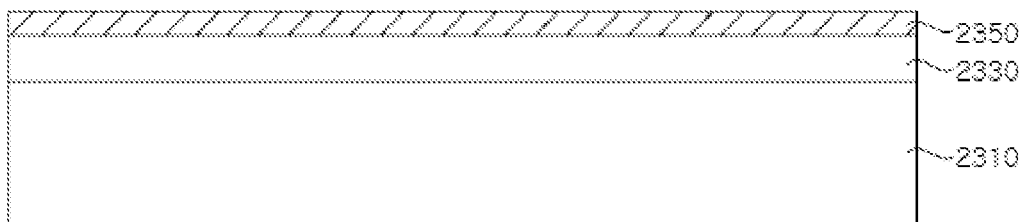

Referring to FIG. 30B, a second LED stack 2330 is grown on a second substrate 2310 and a second-p transparent electrode 2350 is formed on the second LED stack 2330. The second LED stack 2330 may be formed of GaN-based semiconductor layers and may include a GaInN well layer. The second substrate 2310 is a substrate on which GaN-based semiconductor layers may be grown thereon, and is different from the first substrate 2210. The composition ratio of GaInN for the second LED stack 2330 may be determined such that the second LED stack 2330 emits green light. The second-p transparent electrode 2350 forms ohmic contact with the p-type semiconductor layer of the second LED stack 2330. The second LED stack 2330 may include an n-type semiconductor layer, an active layer, and a p-type semiconductor layer. In some exemplary embodiments, the n-type semiconductor layer of the second LED stack 2330 may have an energy bandgap capable of absorbing light generated from the third LED stack 2430, and the p-type semiconductor layer of the second LED stack 2330 may have an energy bandgap capable of absorbing light generated from the third LED stack 2430.

Figure 30C:
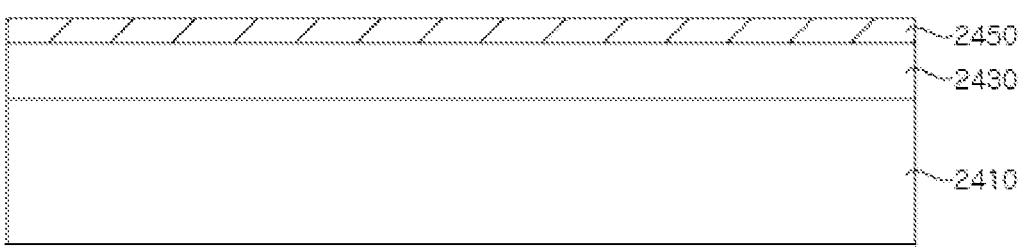

Referring to FIG. 30C, a third LED stack 2430 is grown on a third substrate 2410, and a third-p transparent electrode 2450 is formed on the third LED stack 2430. The third LED stack 2430 may be formed of GaN-based semiconductor layers and may include a GaInN well layer. The third substrate 2410 is a substrate on which GaN-based semiconductor layers may be grown thereon, and is different from the first substrate 2210. The composition ratio of GaInN for the third LED stack 2430 may be determined such that the third LED stack 2430 emits blue light. The third-p transparent electrode 2450 forms ohmic contact with the p-type semiconductor layer of the third LED stack 2430.

As such, the first LED stack 2230, the second LED stack 2330, and the third LED stack 2430 are grown on different substrates, and thus, the formation sequence thereof is not limited to a particular sequence.

Figure 30D:
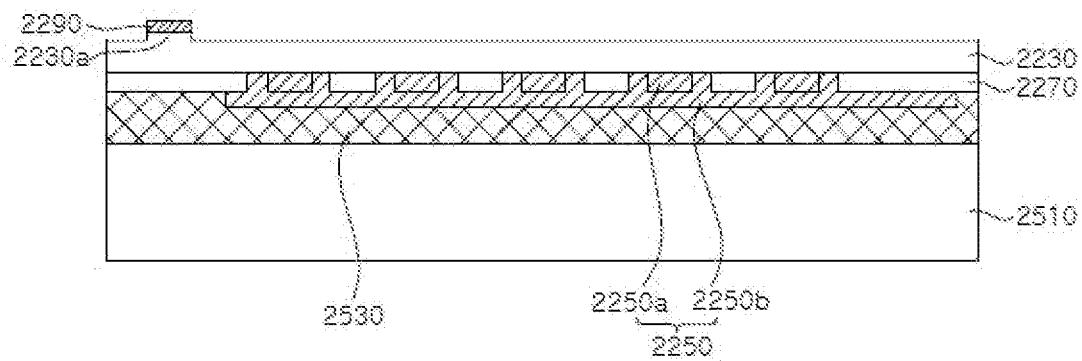

Referring to FIG. 30D, the first LED stack 2230 is coupled to the support substrate 2510 via a first bonding layer 2530. The first bonding layer 2530 may be previously formed on the support substrate 2510 and the reflective electrode 2250 may be bonded to the first bonding layer 2530 to face the support substrate 2510. The first substrate 2210 is removed from the first LED stack 2230 by chemical etching or the like. Accordingly, the upper surface of the n-type semiconductor layer of the first LED stack 2230 is exposed.

Then, an ohmic electrode 2290 is formed in the exposed region of the first LED stack 2230. In order to reduce ohmic contact resistance of the ohmic electrode 2290, the ohmic electrode 2290 may be subjected to heat treatment. The ohmic electrode 2290 may be formed in each pixel region so as to correspond to the pixel regions.

Figure 30E:
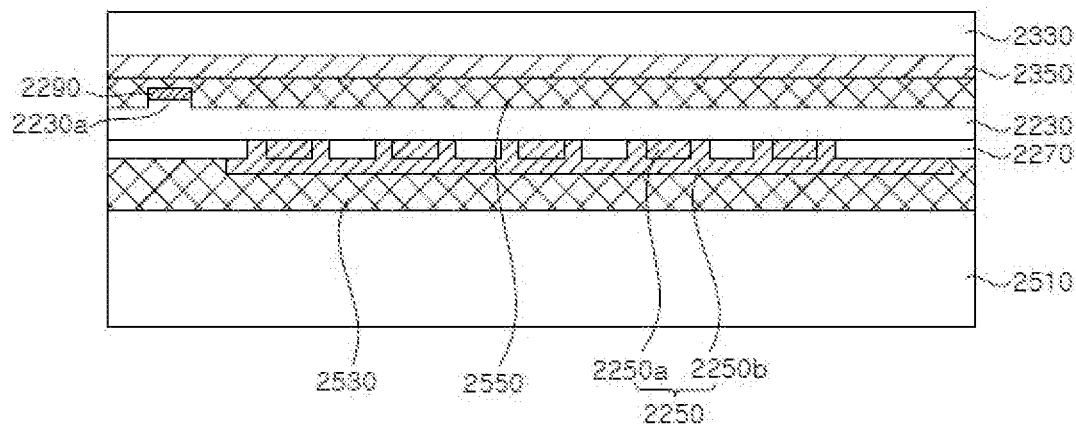

Referring to FIG. 30E, the second LED stack 2330 is coupled to the first LED stack 2230, on which the ohmic electrode 2290 is formed, via a second bonding layer 2550.

The second-p transparent electrode 2350 is bonded to the second bonding layer 2550 to face the first LED stack 2230. The second bonding layer 2550 may be previously formed on the first LED stack 2230 such that the second-p transparent electrode 2350 may face and be bonded to the second bonding layer 2550. The second substrate 2310 may be separated from the second LED stack 2330 by a laser lift-off or chemical lift-off process.

Then, referring to FIG. 29 and FIG. 30C, the third LED stack 2430 is coupled to the second LED stack 2330 via a third bonding layer 2570. The third-p transparent electrode 2450 is bonded to the third bonding layer 2570 to face the second LED stack 2330 and bonded to the third bonding layer 2570. The third bonding layer 2570 may be previously formed on the second LED stack 2330 such that the third-p transparent electrode 2450 may face and be bonded to the third bonding layer 2570. The third substrate 2410 may be separated from the third LED stack 2430 by a laser lift-off or chemical lift-off process. As such, the light emitting diode stack for a display as shown in FIG. 29 may be formed, which has the n-type semiconductor layer of the third LED stack 2430 exposed to the outside.

A display apparatus may be formed by patterning the stack of the first to third LED stacks 2230, 2330, and 2430 disposed on the support substrate 2510 in pixel units, followed by connecting the first to third LED stacks 2230, 2330, and 2430 to one another through interconnections. However, the inventive concepts are not limited to. For example, a display apparatus may be manufactured by dividing the stack of the first to third LED stacks 2230, 2330, and 2430 into individual units, and transferring the first to third LED stacks 2230, 2330, and 2430 to other support substrates, such as a printed circuit board.

Figure 31:
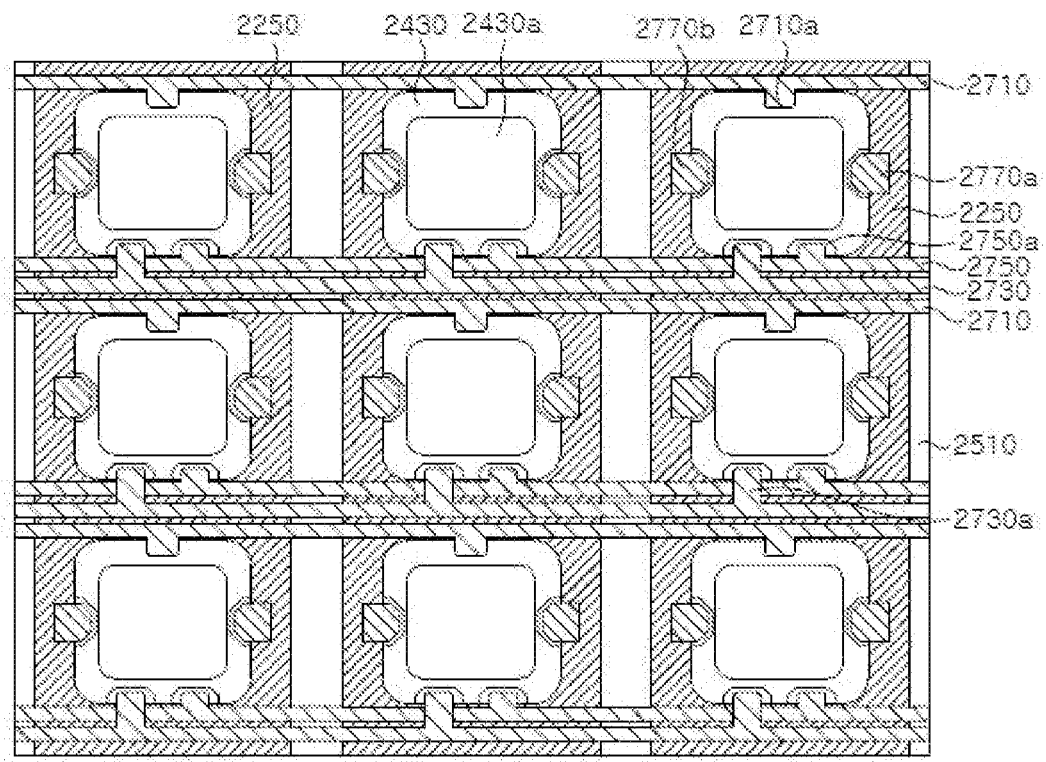
FIG. 31 is a schematic plan view of a display apparatus according to an exemplary embodiment.
Figure 32:
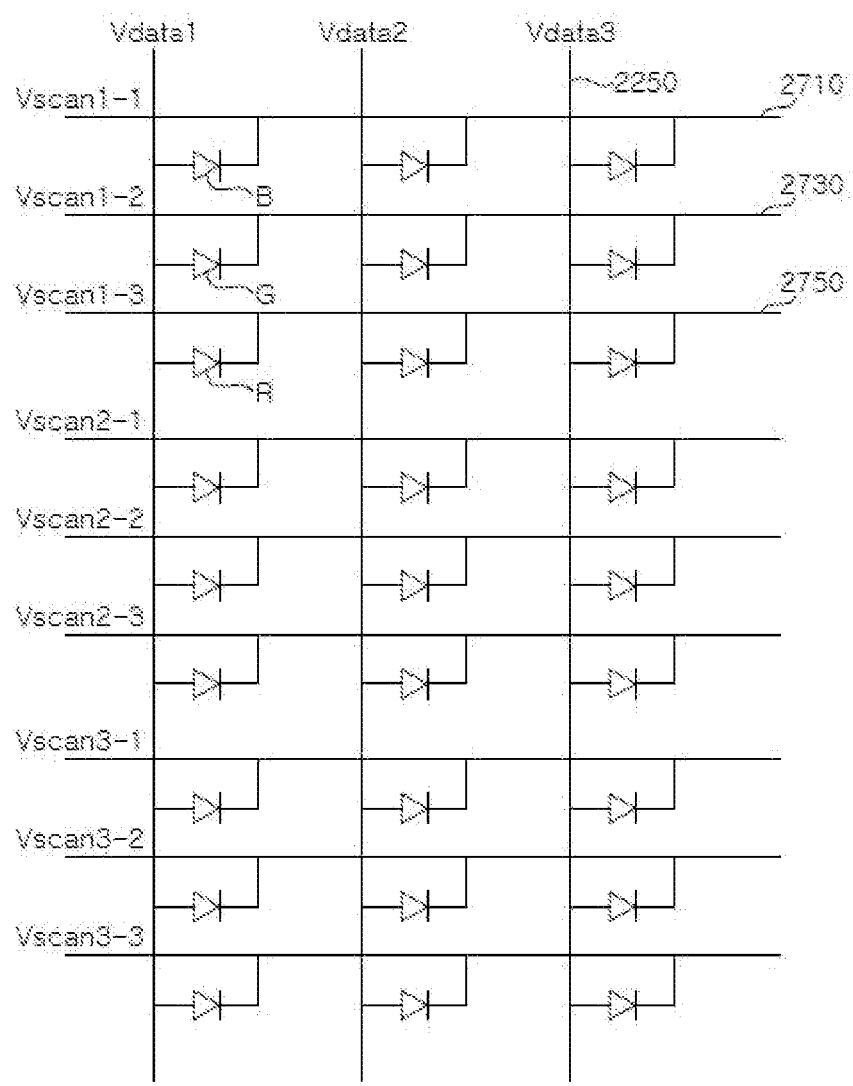
FIG. 32 is a schematic circuit diagram of a display apparatus according to an exemplary embodiment.

FIG. 31 is a schematic plan view of a display apparatus according to an exemplary embodiment. FIG. 32 is a schematic circuit diagram of a display apparatus according to an exemplary embodiment.

Referring to FIG. 31 and FIG. 32, the display apparatus according to an exemplary embodiment may be implemented to be driven in a passive matrix manner.

The light emitting diode stack for a display shown in FIG. 29 has the structure including the first to third LED stacks 2230, 2330, and 2430 stacked in the vertical direction. Since one pixel includes three light emitting diodes R, G, and B, a first light emitting diode R may correspond to the first LED stack 2230, a second light emitting diode G may correspond to the second LED stack 2330, and a third light emitting diode B may correspond to the third LED stack 2430.

Referring to FIGS. 31 and 32, one pixel includes the first to third light emitting diodes R, G, and B, each of which may correspond to a subpixel. Anodes of the first to third light emitting diodes R, G, and B are connected to a common line, for example, a data line, and cathodes thereof are connected to different lines, for example, scan lines. For example, in a first pixel, the anodes of the first to third light emitting diodes R, G, and B are commonly connected to a data line Vdata1, and the cathodes thereof are connected to scan lines Vscan1-1, Vscan1-2, and Vscan1-3, respectively. As such, the light emitting diodes R, G, and B in each pixel can be driven independently.

In addition, each of the light emitting diodes R, G, and B may be driven by a pulse width modulation or by changing the magnitude of electric current to control the brightness of each subpixel.

Referring to FIG. 31, a plurality of pixels is formed by patterning the stack of FIG. 29, and each of the pixels is connected to the reflective electrodes 2250 and interconnection lines 2710, 2730, and 2750. As shown in FIG. 31, the reflective electrode 2250 may be used as the data line Vdata and the interconnection lines 2710, 2730, and 2750 may be formed as the scan lines.

The pixels may be arranged in a matrix form in which the anodes of the light emitting diodes R, G, and B of each pixel are commonly connected to the reflective electrode 2250, and the cathodes thereof are connected to the interconnection lines 2710, 2730, and 2750 separated from one another. Here, the interconnection lines 2710, 2730, and 2750 may be used as the scan lines Vscan.

Figure 33:
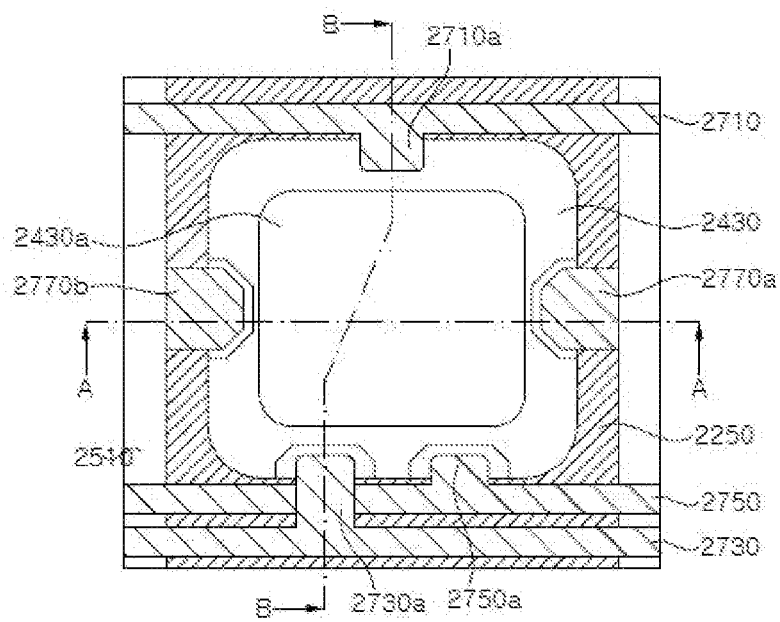
FIG. 33 is an enlarged plan view of one pixel of the display apparatus of FIG. 32.
Figure 34:
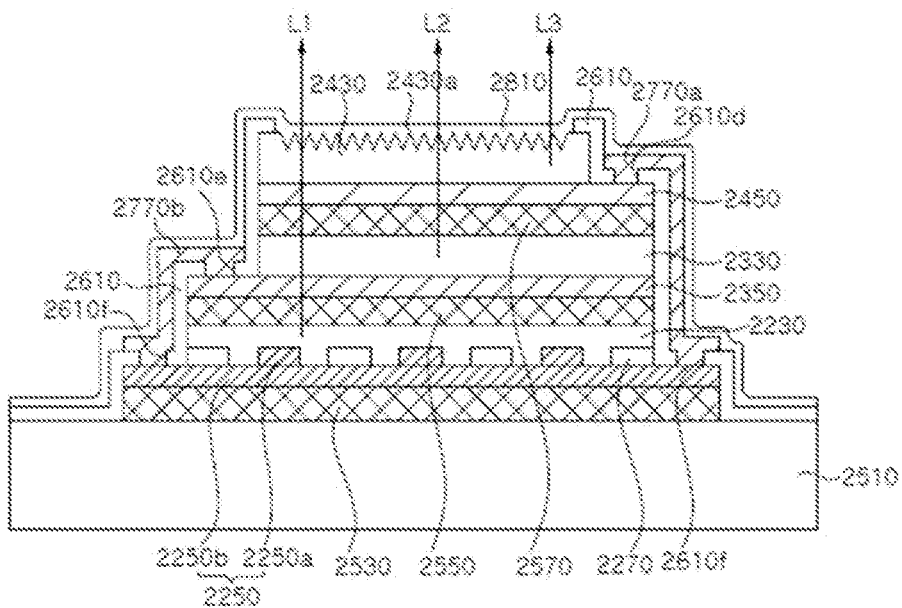
FIG. 34 is a schematic cross-sectional view taken along line A-A of FIG. 33.
Figure 35:
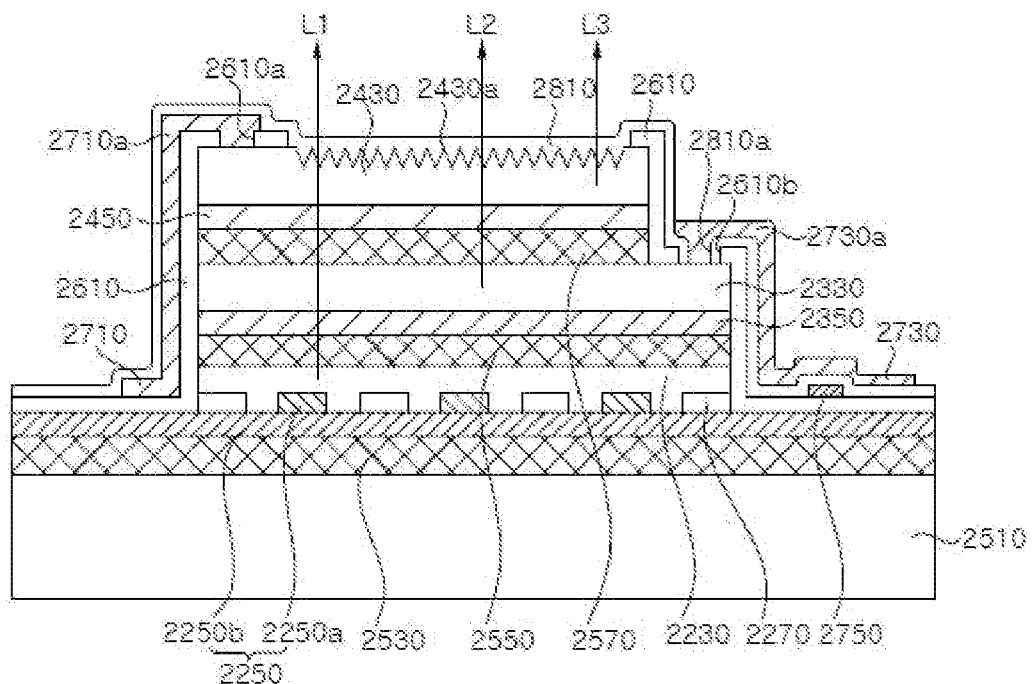
FIG. 35 is a schematic cross-sectional view taken along line B-B of FIG. 33.

FIG. 33 is an enlarged plan view of one pixel of the display apparatus of FIG. 32, FIG. 34 is a schematic cross-sectional view taken along line A-A of FIG. 33, and FIG. 35 is a schematic cross-sectional view taken along line B-B of FIG. 33.

Referring to FIG. 32, FIG. 33, FIG. 34, and FIG. 35, in each pixel, a portion of the reflective electrode 2250, the ohmic electrode 2290 formed on the upper surface of the first LED stack 2230, a portion of the second-p transparent electrode 2350, a portion of the upper surface of the second LED stack 2330, a portion of the third-p transparent electrode 2450, and the upper surface of the third LED stack 2430 are exposed to the outside.

The third LED stack 2430 may have a roughened surface 2430a on the upper surface thereof. The roughened surface 2430a may be formed over the entirety of the upper surface of the third LED stack 2430 or may be formed in some regions thereof.

A lower insulation layer 2610 may cover a side surface of each pixel. The lower insulation layer 2610 may be formed of a light transmissive material, such as $SiO_2$. In this case, the lower insulation layer 2610 may cover substantially the entire upper surface of the third LED stack 2430. Alternatively, the lower insulation layer 2610 may include a distributed Bragg reflector to reflect light traveling towards the side surfaces of the first to third LED stacks 2230, 2330, and 2430. In this case, the lower insulation layer 2610 may partially expos the upper surface of the third LED stack 2430. Still alternatively, the lower insulation layer 2610 may be a black-based insulation layer that absorbs light. Furthermore, an electrically floating metallic reflective layer may be further formed on the lower insulation layer 2610 to reflect light emitted through the side surfaces of the first to third LED stacks 2230, 2330, and 2430.

The lower insulation layer 2610 may include an opening 2610a which exposes the upper surface of the third LED stack 2430, an opening 2610b which exposes the upper surface of the second LED stack 2330, an opening 2610c (see FIG. 36H) which exposes the ohmic electrode 2290 of the first LED stack 2230, an opening 2610d which exposes the third-p transparent electrode 2450, an opening 2610e which exposes the second-p transparent electrode 2350, and openings 2610f which expose the first-p reflective electrode 2250.

The interconnection lines 2710 and 2750 may be formed near the first to third LED stacks 2230, 2330, and 2430 on the support substrate 2510, and may be disposed on the lower insulation layer 2610 to be insulated from the first-p reflective electrode 2250. A connecting portion 2770a connects the third-p transparent electrode 2450 to the reflective electrode 2250, and a connecting portion 2770b connects the second-p transparent electrode 2350 to the reflective electrode 2250, such that the anodes of the first LED stack 2230, the second LED stack 2330, and the third LED stack 2430 are commonly connected to the reflective electrode 2250.

A connecting portion 2710a connects the upper surface of the third LED stack 2430 to the interconnection line 2710, and a connecting portion 2750a connects the ohmic electrode 2290 on the first LED stack 2230 to the interconnection line 2750.

An upper insulation layer 2810 may be disposed on the interconnection lines 2710 and 2750 and the lower insulation layer 2610 to cover the upper surface of the third LED stack 2430. The upper insulation layer 2810 may have an opening 2810a which partially exposes the upper surface of the second LED stack 2330.

The interconnection line 2730 may be disposed on the upper insulation layer 2810, and the connecting portion 2730a may connect the upper surface of the second LED stack 2330 to the interconnection line 2730. The connecting portion 2730a may pass through an upper portion of the interconnection line 2750 and is insulated from the interconnection line 2750 by the upper insulation layer 2810.

Although the electrodes of each pixel are described as being connected to the data line and the scan lines, the inventive concepts are not limited thereto. Further, while the interconnection lines 2710 and 2750 are described as being formed on the lower insulation layer 2610 and the interconnection line 2730 is described as being formed on the upper insulation layer 2810, the inventive concepts are not limited thereto. For example, all of the interconnection lines 2710, 2730, and 2750 may be formed on the lower insulation layer 2610, and may be covered by the upper insulation layer 2810, which may have openings that expose the interconnection line 2730. In this manner, the connecting portion 2730a may connect the upper surface of the second LED stack 2330 to the interconnection line 2730 through the openings of the upper insulation layer 2810.

Alternatively, the interconnection lines 2710, 2730, and 2750 may be formed inside the support substrate 2510, and the connecting portions 2710a, 2730a, and 2750a on the lower insulation layer 2610 may connect the ohmic electrode 2290, the upper surface of the first LED stack 2230, and the upper surface of the third LED stack 2430 to the interconnection lines 2710, 2730, and 2750.

According to an exemplary embodiment, light L1 generated from the first LED stack 2230 is emitted to the outside through the second and third LED stacks 2330, and 2430, and light L2 generated from the second LED stack 2330 is emitted to the outside through the third LED stack 2430. Furthermore, a portion of light L3 generated from the third LED stack 2430 may enter the second LED stack 2330, and a portion of light L2 generated from the second LED stack 2330 may enter the first LED stack 2230. Furthermore, a secondary light may be generated from the second LED stack 2330 by the light L3, and a secondary light may also be generated from the first LED stack 2230 by the light L2. However, such secondary light may have low intensity.

FIG. 36A to FIG. 36K are schematic plan views illustrating a method of manufacturing a display apparatus according to an exemplary embodiment. Hereinafter, the following descriptions will be given with reference to a method of forming the pixel of FIG. 33.

First, the light emitting diode stack 2000 described in FIG. 29 is prepared.

Figure 36A:
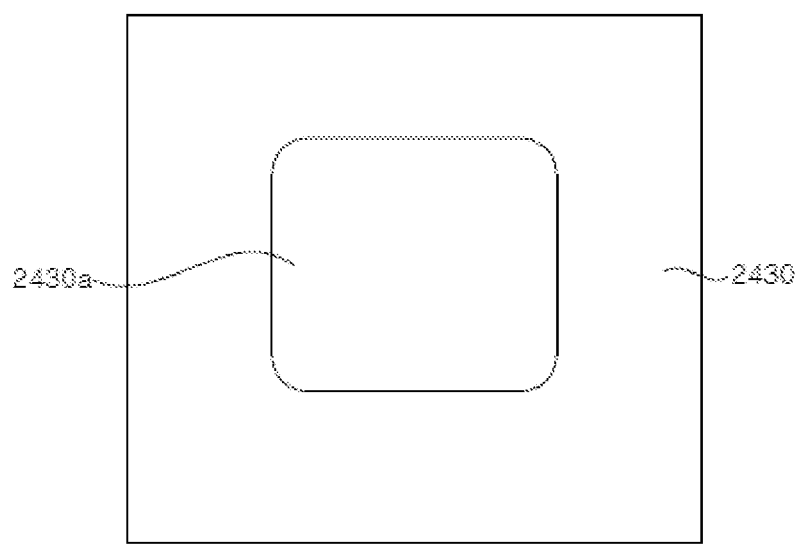
FIGS. 36A, 36B, 36C, 36D, 36E, 36F, 36G, 36H, 36I, 36J, and 36K are schematic cross-sectional views illustrating a method of manufacturing a display apparatus according to an exemplary embodiment.

Referring to FIG. 36A, a roughened surface 2430a may be formed on the upper surface of the third LED stack 2430. The roughened surface 2430a may be formed on the upper surface of the third LED stack 2430 to correspond to each pixel region. The roughened surface 2430a may be formed by chemical etching, for example, photo-enhanced chemical etching (PEC) or the like.

The roughened surface 2430a may be partially formed in each pixel region by taking into account a region of the third LED stack 2430 to be etched in the subsequent process, without being limited thereto. Alternatively, the roughened surface 2430a may be formed over the entire upper surface of the third LED stack 2430.

Figure 36B:
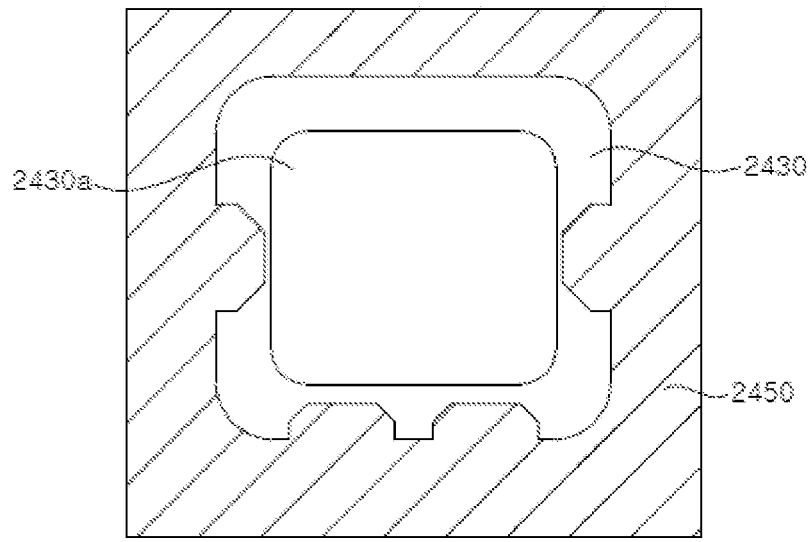

Referring to FIG. 36B, a surrounding region of the third LED stack 2430 in each pixel is removed by etching to expose the third-p transparent electrode 2450. As shown in the drawings, the exposed third LED stack 2430 may be remained to have a rectangular shape or a square shape. The third LED stack 2430 may have a plurality of depressions formed along edges thereof.

Figure 36C:
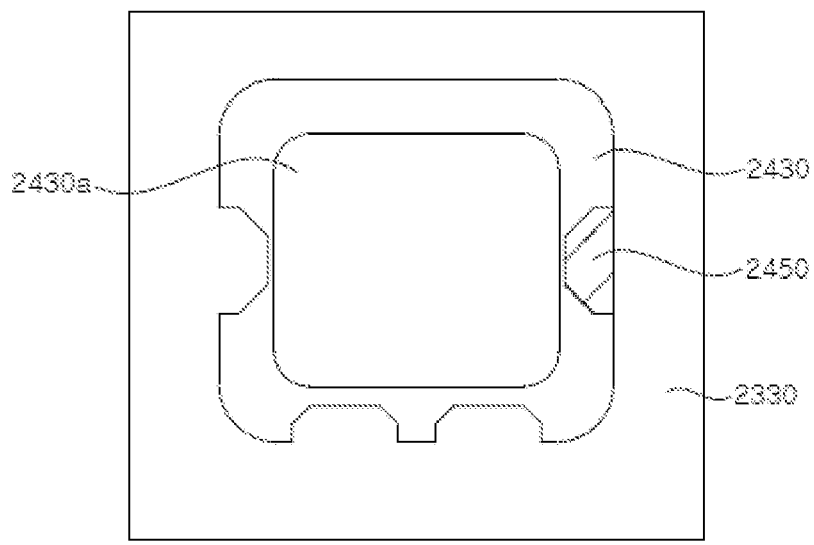

Referring to FIG. 36C, the upper surface of the second LED stack 2330 is exposed by removing the exposed third-p transparent electrode 2450 in areas other than in one depression. Accordingly, the upper surface of the second LED stack 2330 is exposed around the third LED stack 2430 and in other depressions other than the depression where the third-p transparent electrode 2450 is partially remained.

Figure 36D:
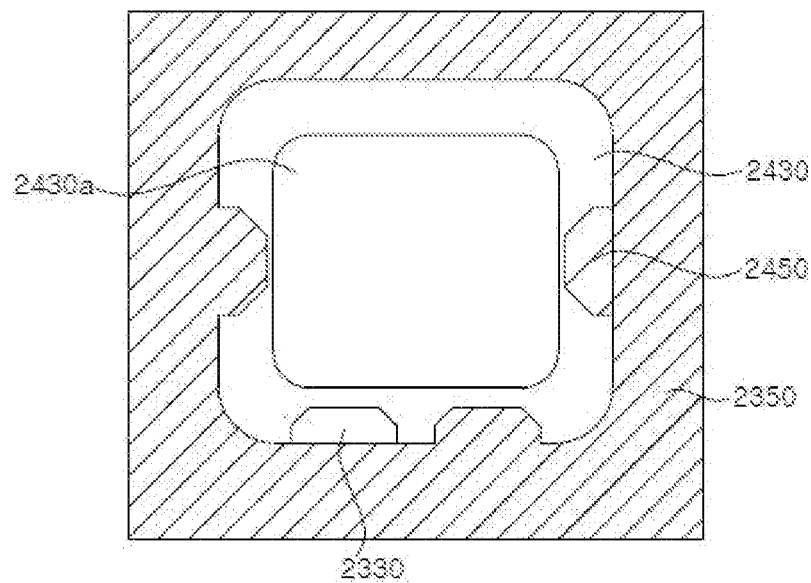

Referring to FIG. 36D, the second-p transparent electrode 2350 is exposed by removing the exposed second LED stack 2330 in areas other than one depression.

Figure 36E:
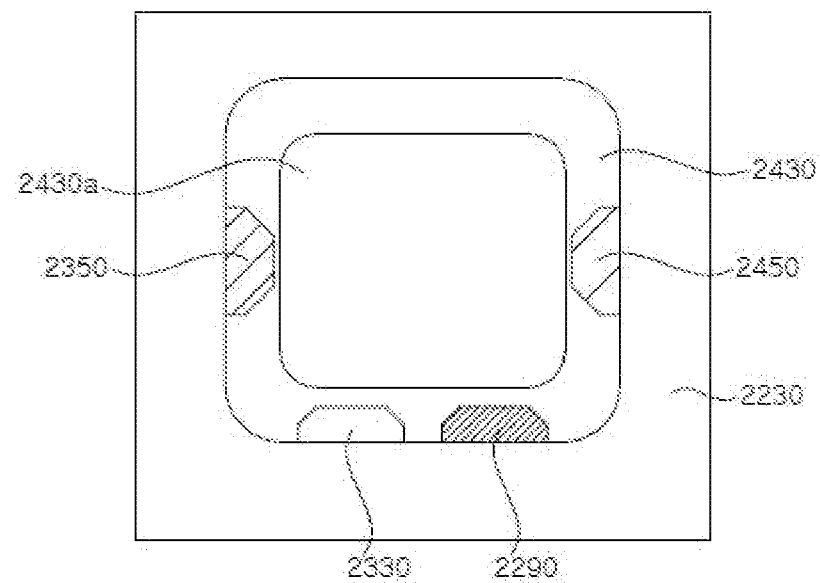

Referring to FIG. 36E, the ohmic electrode 2290 is exposed together with the upper surface of the first LED stack 2230 by removing the exposed second-p transparent electrode 2350 in areas other than in one depression. Here, the ohmic electrode 2290 may be exposed in one depression. Accordingly, the upper surface of the first LED stack 2230 is exposed around the third LED stack 2430, and an upper surface of the ohmic electrode 2290 is exposed in at least one of the depressions formed in the third LED stack 2430.

Figure 36F:
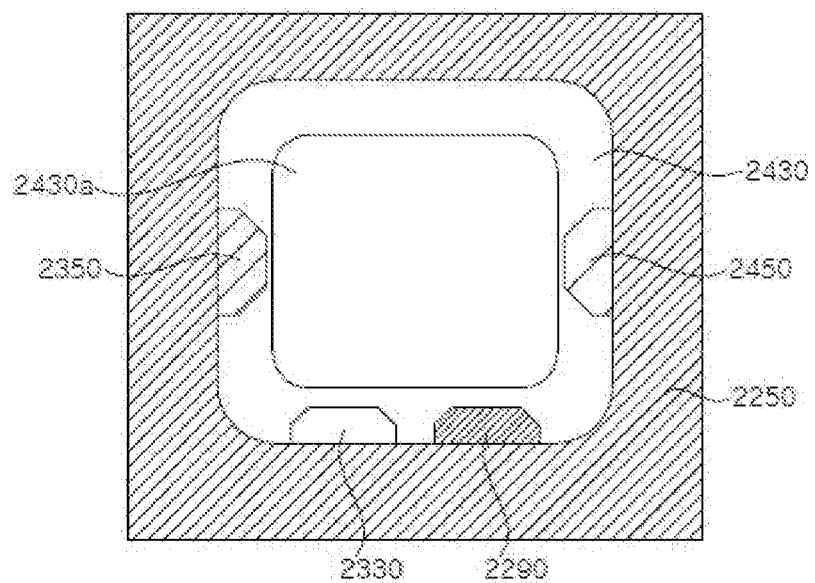

Referring to FIG. 36F, the reflective electrode 2250 is exposed by removing an exposed portion of the first LED stack 2230 in areas other than in one depression. As such, the reflective electrode 2250 is exposed around the third LED stack 2430.

Figure 36G:
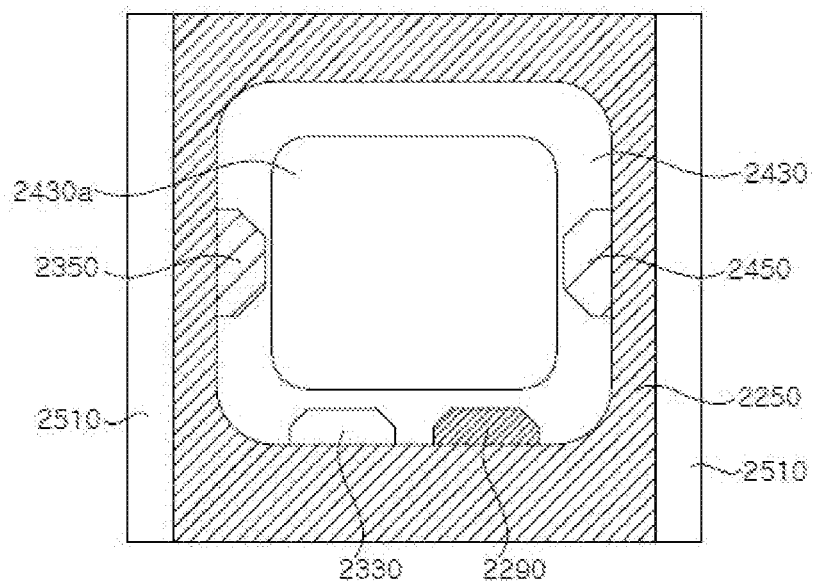

Referring to FIG. 36G, linear interconnection lines are formed by patterning the reflective electrode 2250. Here, the support substrate 2510 may be exposed. The reflective electrode 2250 may connect pixels arranged in one row to each other among pixels arranged in a matrix (see FIG. 32).

Figure 36H:
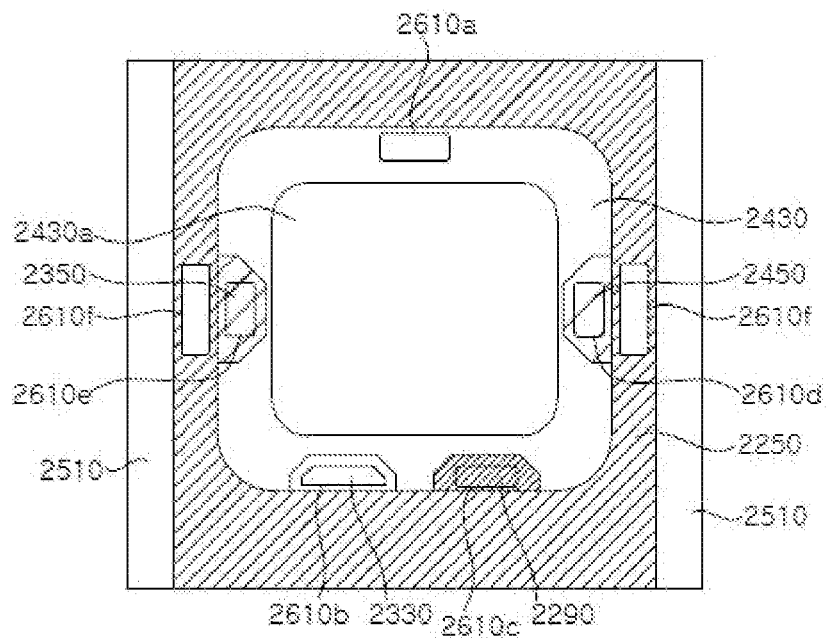

Referring to FIG. 36H, a lower insulation layer 2610 (see FIG. 34 and FIG. 35) is formed to cover the pixels. The lower insulation layer 2610 covers the reflective electrode 2250 and side surfaces of the first to third LED stacks 2230, 2330, and 2430. In addition, the lower insulation layer 2610 may partially cover the upper surface of the third LED stack 2430. If the lower insulation layer 2610 is a transparent layer such as a $SiO_2$ layer, the lower insulation layer 2610 may cover substantially the entire upper surface of the third LED stack 2430. Alternatively, the lower insulation layer 2610 may include a distributed Bragg reflector. In this case, the lower insulation layer 2610 may partially expose the upper surface of the third LED stack 2430 to allow light to be emitted to the outside.

The lower insulation layer 2610 may include an opening 2610a which exposes the third LED stack 2430, an opening 2610b which exposes the second LED stack 2330, an opening 2610c which exposes the ohmic electrode 2290, an opening 2610d which exposes the third-p transparent electrode 2450, an opening 2610e which exposes the second-p transparent electrode 2350, and an opening 2610f which exposes the reflective electrode 2250. The opening 2610f that exposes the reflective electrode 2250 may be formed singularly or in plural.

Figure 36I:
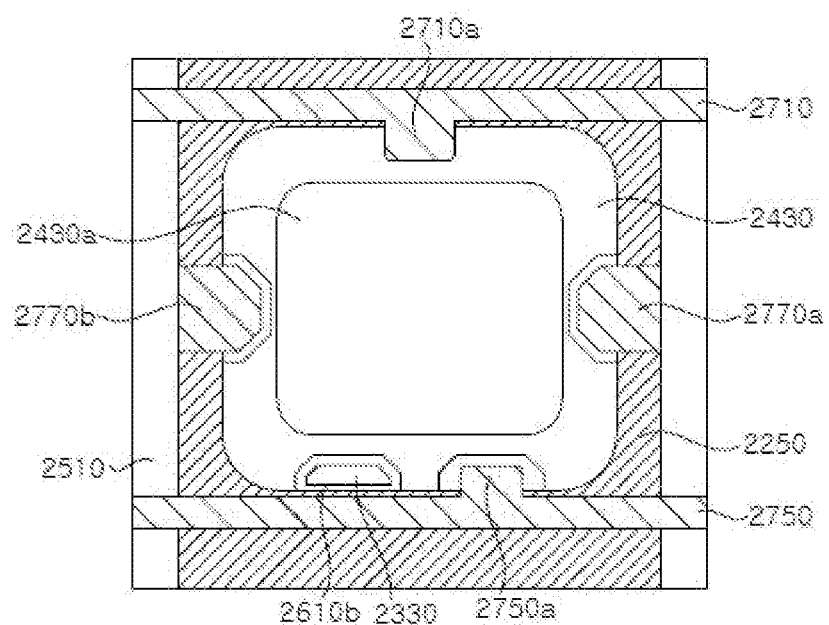

Referring to FIG. 36I, interconnection lines 2710 and 2750 and connecting portions 2710a, 2750a, 2770a, and 2770b are formed, by a lift-off process or the like. The interconnection lines 2710 and 2750 are insulated from the reflective electrode 2250 by the lower insulation layer 2610. The connecting portion 2710a electrically connects the third LED stack 2430 to the interconnection line 2710, and the connecting portion 2750a electrically connects the ohmic electrode 2290 to the interconnection line 2750 such that the first LED stack 2230 is electrically connected to the interconnection line 2750. The connecting portion 2770a electrically connects the third-p transparent electrode 2450 to the first-p reflective electrode 2250, and the connecting portion 2770b electrically connects the second-p transparent electrode 2350 to the first-p reflective electrode 2250.

Figure 36J:
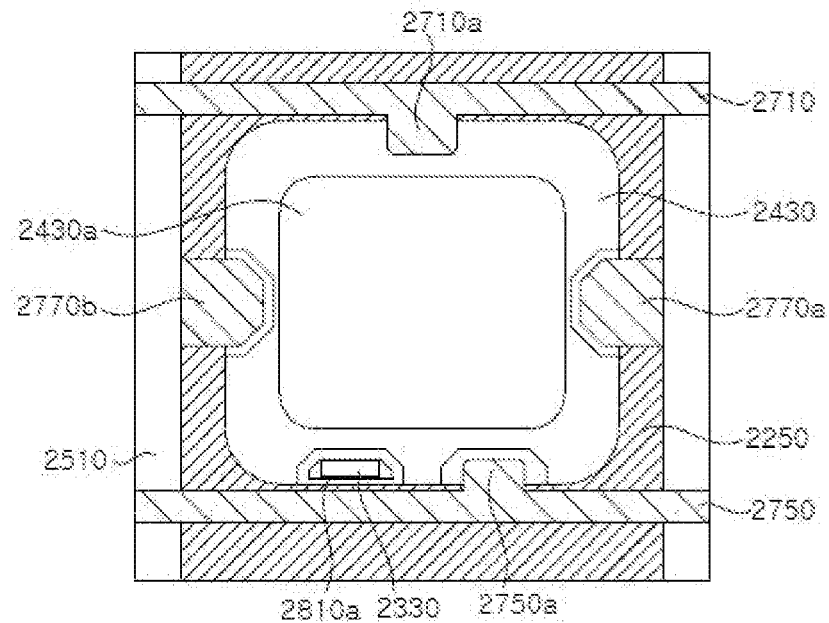

Referring to FIG. 36J, an upper insulation layer 2810 (see FIG. 34 and FIG. 35) covers the interconnection lines 2710, 2750 and the connecting portions 2710a, 2750a, 2770a, and 2770b. The upper insulation layer 2810 may also cover substantially the entire upper surface of the third LED stack 2430. The upper insulation layer 2810 has an opening 2810a which exposes the upper surface of the second LED stack 2330. The upper insulation layer 2810 may be formed of, for example, silicon oxide or silicon nitride, and may include a distributed Bragg reflector. When the upper insulation layer 2810 includes the distributed Bragg reflector, the upper insulation layer 2810 may expose at least a part of the upper surface of the third LED stack 2430 to allow light to be emitted to the outside.

Figure 36K:
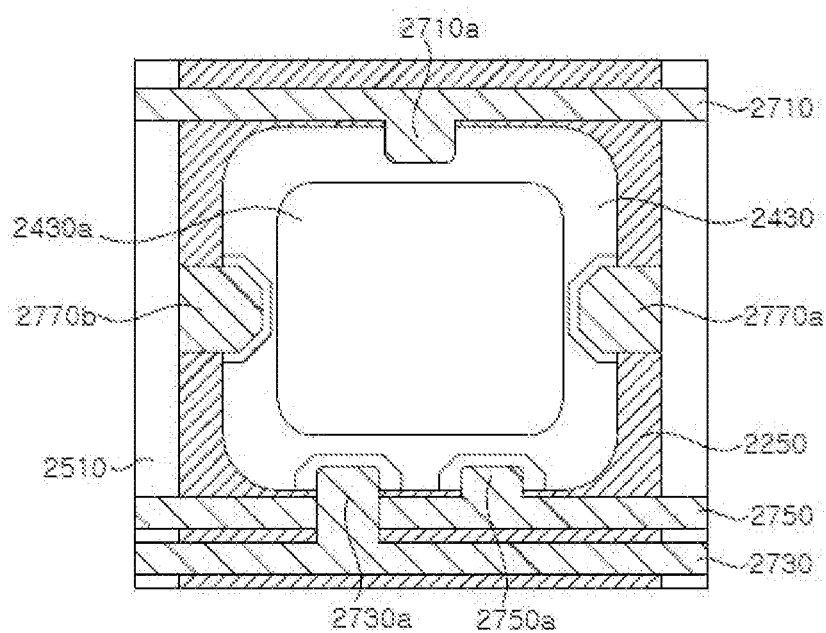

Referring to FIG. 36K, an interconnection line 2730 and a connecting portion 2730a are formed. An interconnection line 2730 and a connecting portion 2730a may be formed by a lift-off process or the like. The interconnection line 2730 is disposed on the upper insulation layer 2810, and is insulated from the reflective electrode 2250 and the interconnection lines 2710 and 2750. The connecting portion 2730a electrically connects the second LED stack 2330 to the interconnection line 2730. The connecting portion 2730a may pass through an upper portion of the interconnection line 2750, and is insulated from the interconnection line 2750 by the upper insulation layer 2810.

As such, a pixel region shown in FIG. 33 may be formed. In addition, as shown in FIG. 32, a plurality of pixels may be formed on the support substrate 2510 and may be connected to one another by the first-p the reflective electrode 2250 and the interconnection lines 2710, 2730, and 2750, to be operated in a passive matrix manner.

Although the above describes a method of manufacturing a display apparatus that may be operated in the passive matrix manner, the inventive concepts are not limited thereto. More particularly, a display apparatus according to exemplary embodiments may be manufactured in various ways so as to be operated in the passive matrix manner using the light emitting diode stack shown in FIG. 29.

For example, while the interconnection line 2730 is described as being formed on the lower insulation layer 2610, the interconnection line 2730 may be formed together with the interconnection lines 2710 and 2750 on the lower insulation layer 2610, and the connecting portion 2730a may be formed on the upper insulation layer 2810 to connect the second LED stack 2330 to the interconnection line 2730. Alternatively, the interconnection lines 2710, 2730, and 2750 may be disposed inside the support substrate 2510.

Figure 37:
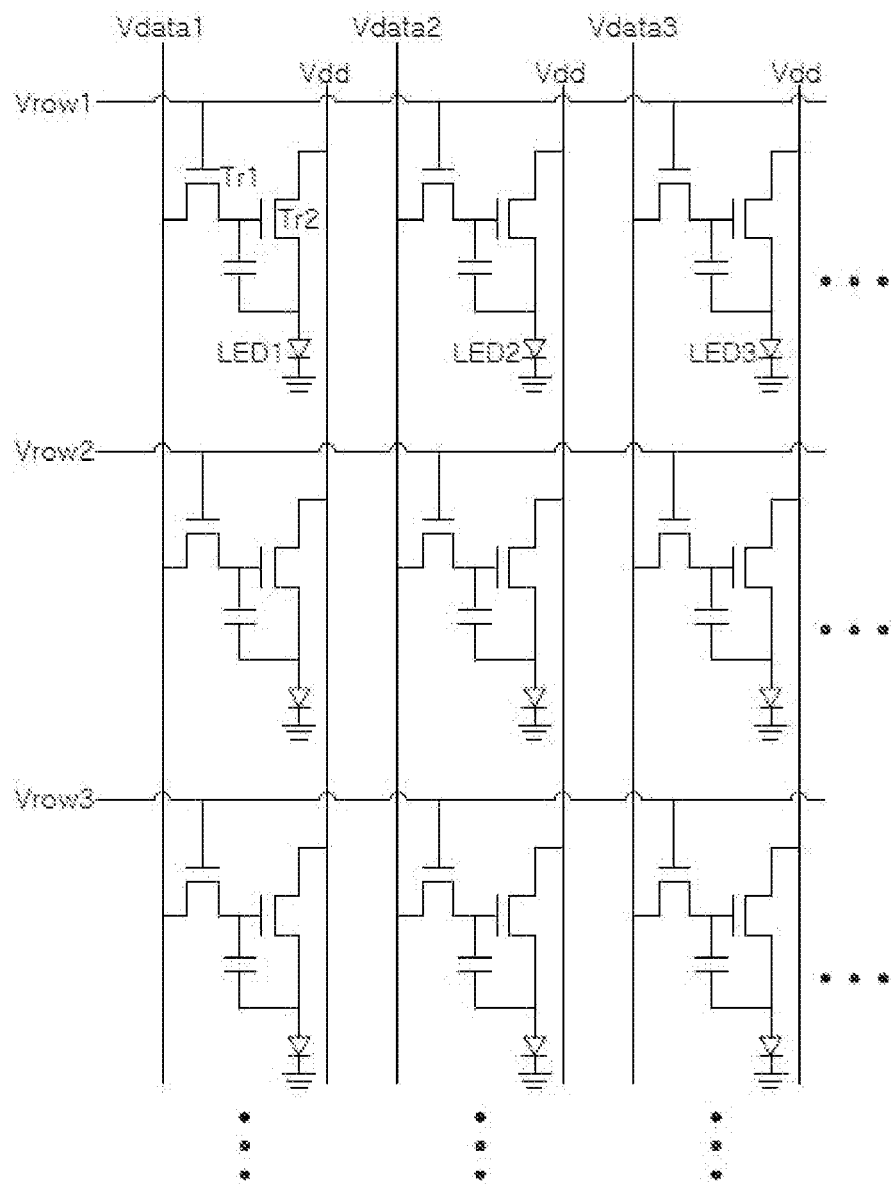
FIG. 37 is a schematic circuit diagram of a display apparatus according to another exemplary embodiment.

FIG. 37 is a schematic circuit diagram of a display apparatus according to another exemplary embodiment. The circuit diagram of FIG. 37 relates to a display apparatus driven in an active matrix manner.

Referring to FIG. 37, the drive circuit according to an exemplary embodiment includes at least two transistors Tl, Tr2 and a capacitor. When a power source is connected to selection lines Vrow1 to Vrow3 and voltage is applied to data lines Vdata1 to Vdata3, the voltage is applied to the corresponding light emitting diode. In addition, the corresponding capacitors are charged according to the values of Vdata1 to Vdata3. Since a turned-on state of the transistor Tr2 can be maintained by the charged voltage of the capacitor, the voltage of the capacitor can be maintained and applied to the light emitting diodes LED1 to LED3, even when power supplied to Vrow1 is cut off. In addition, electric current flowing in the light emitting diodes LED1 to LED3 can be changed depending upon the values of Vdata1 to Vdata3. Electric current can be continuously supplied through Vdd, and thus, light may be emitted continuously.

The transistors Tr1, Tr2 and the capacitor may be formed inside the support substrate 2510. For example, thin film transistors formed on a silicon substrate may be used for active matrix driving.

Here, the light emitting diodes LED1 to LED3 may correspond to the first to third LED stacks 2230, 2330, and 2430 stacked in one pixel, respectively. The anodes of the first to third LED stacks 2230, 2330, and 2430 are connected to the transistor Tr2 and the cathodes thereof are connected to the ground.

Although FIG. 37 shows the circuit for active matrix driving according to an exemplary embodiment, other types of circuits may be variously used. In addition, although the anodes of the light emitting diodes LED1 to LED3 are described as being connected to different transistors Tr2 and the cathodes thereof are described as being connected to the ground, the anodes of the light emitting diodes may be connected to current supplies Vdd and the cathodes thereof may be connected to different transistors in some exemplary embodiments.

Figure 38:
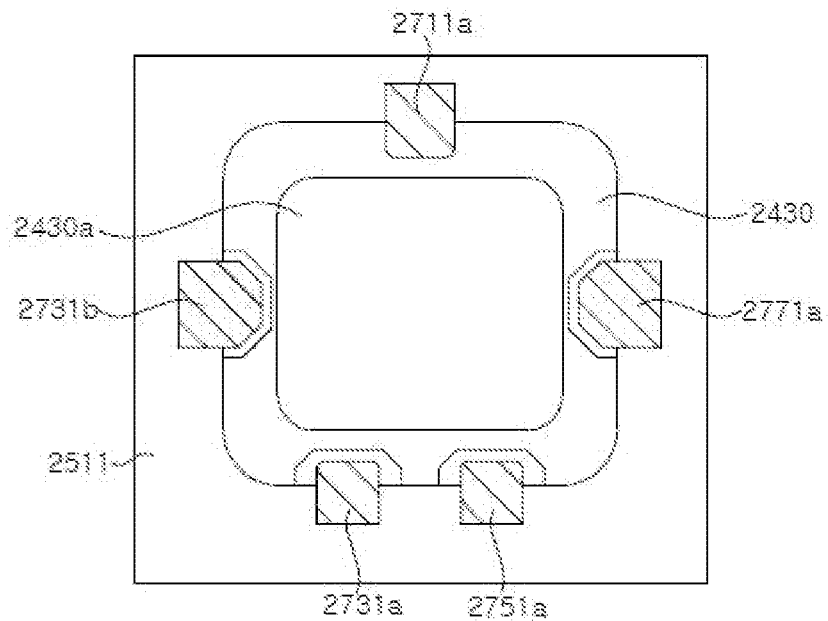
FIG. 38 is a schematic plan view of a pixel according to another exemplary embodiment.

FIG. 38 is a schematic plan view of a display apparatus according to another exemplary embodiment. Hereinafter, the following description will be given with reference to of one pixel among a plurality of pixels arranged on the support substrate 2511.

Referring to FIG. 38, the pixel according to an exemplary embodiment are substantially similar to the pixel described with reference to FIG. 32 to FIG. 35, except that the support substrate 2511 is a thin film transistor panel including transistors and capacitors and the reflective electrode 2250 is disposed in a lower region of the first LED stack 2230.

The cathode of the third LED stack 2430 is connected to the support substrate 2511 through the connecting portion 2711a. For example, as shown in FIG. 37, the cathode of the third LED stack 2430 may be connected to the ground through electrical connection to the support substrate 2511. The cathodes of the second LED stack 2330 and the first LED stack 2230 may also be connected to the ground through electrical connection to the support substrate 2511 via the connecting portions 2731a and 2751a.

The reflective electrode is connected to the transistors Tr2 (see FIG. 37) inside the support substrate 2511. The third-p transparent electrode and the second-p transparent electrode are also connected to the transistors Tr2 (see FIG. 37) inside the support substrate 2511 through the connecting portions 2711b and 2731b.

In this manner, the first to third LED stacks are connected to one another, thereby forming a circuit for active matrix driving, as shown in FIG. 37.

Although FIG. 38 shows a pixel having an electrical connection for active matrix driving according to an exemplary embodiment, the inventive concepts are not limited thereto, and the circuit for the display apparatus can be modified into various circuits for active matrix driving in various ways.

In addition, the reflective electrode 2250, the second-p transparent electrode 2350, and the third-p transparent electrode 2450 of FIG. 29 are described as forming ohmic contact with the p-type semiconductor layer of each of the first LED stack 2230, the second LED stack 2330, and the third LED stack 2430, and the ohmic electrode 2290 is described as forming ohmic contact with the n-type semiconductor layer of the first LED stack 2230, the n-type semiconductor layer of each of the second LED stack 2330 and the third LED stack 2430 is not provided with a separate ohmic contact layer. Although there is less difficulty in current spreading even without formation of a separate ohmic contact layer in the n-type semiconductor layer when the pixel have a small size of 200 µm or less, however, a transparent electrode layer may be disposed on the n-type semiconductor layer of each of the LED stacks in order to secure current spreading according to some exemplary embodiments.

In addition, although FIG. 29 shows the coupling of the first to third LED stacks 2230, 2330, and 2430 to one another via a bonding layer, the inventive concepts are not limited thereto, and the first to third LED stacks 2230, 2330, and 2430 may be connected to one another in various sequences and using various structures.

According to exemplary embodiments, since it is possible to form a plurality of pixels at the wafer level using the light emitting diode stack 2000 for a display, the need for individual mounting of light emitting diodes may be obviated. In addition, the light emitting diode stack according to exemplary embodiments has the structure in which the first to third LED stacks 2230, 2330, and 2430 are stacked in the vertical direction, and thus, an area for subpixels may be secured in a limited pixel area. Furthermore, the light emitting diode stack according to the exemplary embodiments allows light generated from the first LED stack 2230, the second LED stack 2330, and the third LED stack 2430 to be emitted outside therethrough, thereby reducing light loss.

Figure 39:
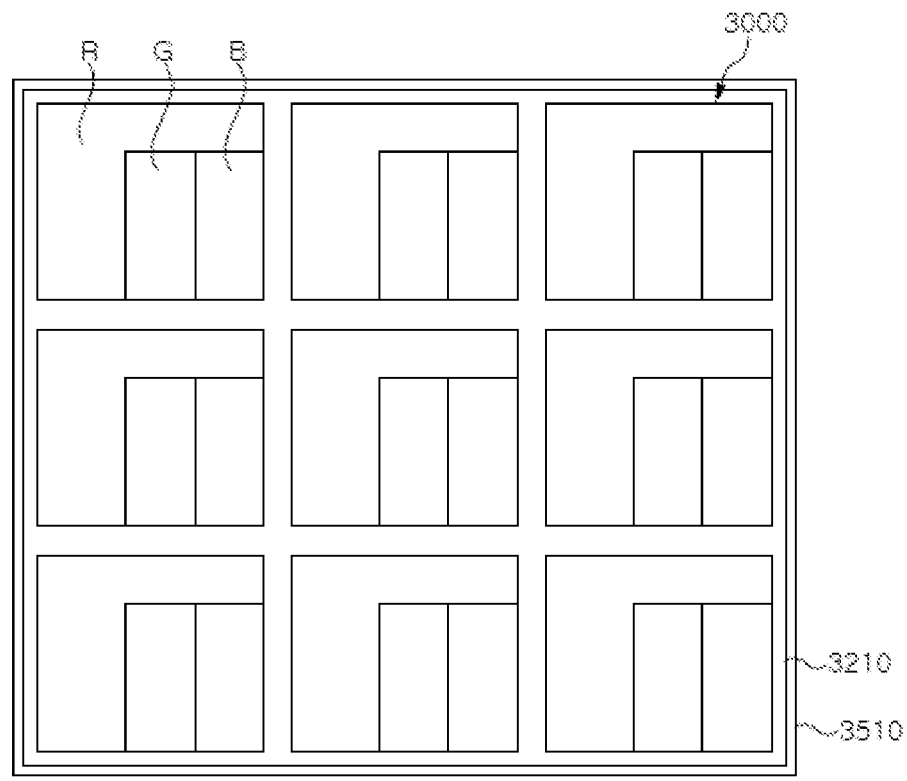
FIG. 39 is a schematic plan view of a display apparatus according to an exemplary embodiment of the invention.
Figure 40:
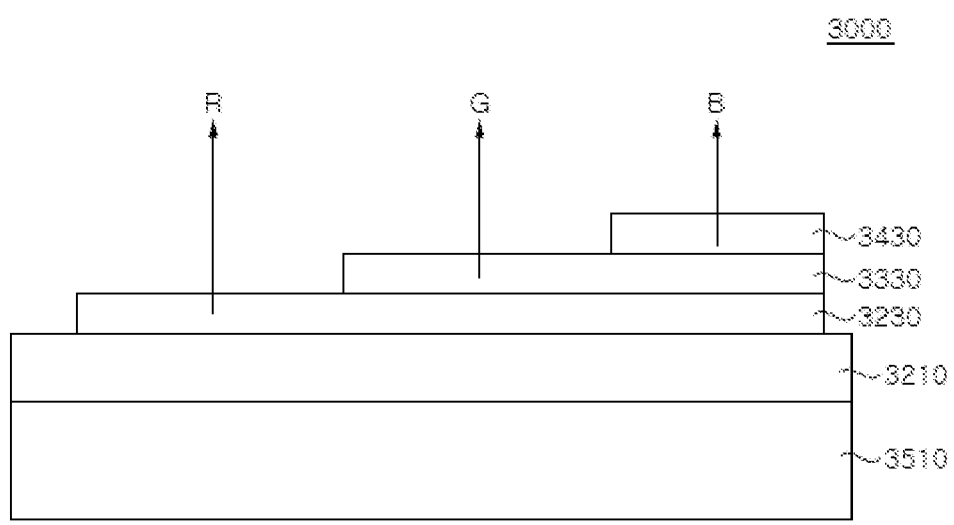
FIG. 40 is a schematic cross-sectional view of a light emitting diode pixel for a display according to an exemplary embodiment.

FIG. 39 is a schematic plan view of a display apparatus according to an exemplary embodiment, and FIG. 40 is a schematic cross-sectional view of a light emitting diode pixel for a display according to an exemplary embodiment.

Referring to FIG. 39 and FIG. 40, the display apparatus includes a circuit board 3510 and a plurality of pixels 3000. Each of the pixels 3000 includes a substrate 3210 and first to third subpixels R, G, and B disposed on the substrate 3210.

The circuit board 3510 may include a passive circuit or an active circuit. The passive circuit may include, for example, data lines and scan lines. The active circuit may include, for example, a transistor and a capacitor. The circuit board 3510 may have a circuit on a surface thereof or therein. The circuit board 3510 may include, for example, a glass substrate, a sapphire substrate, a Si substrate, or a Ge substrate.

The substrate 3210 supports first to third subpixels R, G, and B. The substrate 3210 is continuous over the plurality of pixels 3000 and electrically connects the subpixels R, G, and B to the circuit board 3510. For example, the substrate 3210 may be a GaAs substrate.

The first subpixel R includes a first LED stack 3230, the second subpixel G includes a second LED stack 3330, and the third subpixel B includes a third LED stack 3430. The first subpixel R is configured to allow the first LED stack 3230 to emit light, the second subpixel G is configured to allow the second LED stack 3330 to emit light, and the third subpixel B is configured adapted to allow the third LED stack 3430 to emit light. The first to third LED stacks 3230, 3330, and 3430 may be independently driven.

The first LED stack 3230, the second LED stack 3330, and the third LED stack 3430 are stacked to overlap one another in the vertical direction. Here, as shown in the drawings, the second LED stack 3330 may be disposed in a portion of the first LED stack 3230. For example, the second LED stack 3330 may be disposed towards one side on the first LED stack 3230. The third LED stack 3430 may be disposed in a portion of the second LED stack 3330. For example, the third LED stack 3430 may be disposed towards one side on the second LED stack 3330. Although the third LED stack 3430 is illustrated as being disposed towards the right side, the inventive concepts are not limited thereto. Alternatively, the third LED stack 3430 may be disposed towards the left side of the second LED stack 3330.

Light R generated from the first LED stack 3230 may be emitted through a region not covered by the second LED stack 3330, and light G generated from the second LED stack 3330 may be emitted through a region not covered by the third LED stack 3430. More particularly, light generated from the first LED stack 3230 may be emitted to the outside without passing through the second LED stack 3330 and the third LED stack 3430, and light generated from the second LED stack 3330 may be emitted to the outside without passing through the third LED stack 3430.

The region of the first LED stack 3230 through which the light R is emitted, the region of the second LED stack 3330 through which the light G is emitted, and the region of the third LED stack 3340 may have different areas, and the intensity of light emitted from each of the LED stacks 3230, 3330, and 3430 may be adjusted by adjusting the areas thereof.

However, the inventive concepts are not limited thereto. Alternatively, light generated from the first LED stack 3230 may be emitted to the outside after passing through the second LED stack 3330 or after passing through the second LED stack 3330 and the third LED stack 3430, and light generated from the second LED stack 3330 may be emitted to the outside after passing through the third LED stack 3430.

Each of the first LED stack 3230, the second LED stack 3330, and the third LED stack 3430 may include a first conductivity type (for example, n-type) semiconductor layer, a second conductivity type (for example, p-type) semiconductor layer, and an active layer interposed therebetween. The active layer may have a multi-quantum well structure. The first to third LED stacks 3230, 3330, and 3430 may include different active layers to emit light having different wavelengths. For example, the first LED stack 3230 may be an inorganic light emitting diode configured to emit red light, the second LED stack 3330 may be an inorganic light emitting diode configured to emit green light, and the third LED stack 3430 may be an inorganic light emitting diode configured to emit blue light. To this end, the first LED stack 3230 may include an AlGaInP-based well layer, the second LED stack 3330 may include an AlGaInP or AlGaInN-based well layer, and the third LED stack 3430 may include an AlGaInN-based well layer. However, the inventive concepts are not limited thereto. The wavelengths of light generated from the first LED stack 3230, the second LED stack 3330, and the third LED stack 3430 may be changed. For example, the first LED stack 3230, the second LED stack 3330, and the third LED stack 3430 may emit green light, red light, and blue light, respectively, or may emit green light, blue light and, red light, respectively.

In addition, a distributed Bragg reflector may be interposed between the substrate 3210 and the first LED stack 3230 to prevent loss of light generated from the first LED stack 3230 through absorption by the substrate 3210. For example, a distributed Bragg reflector formed by alternately stacking AlAs and AlGaAs semiconductor layers one above another may be interposed therebetween.

Figure 41:
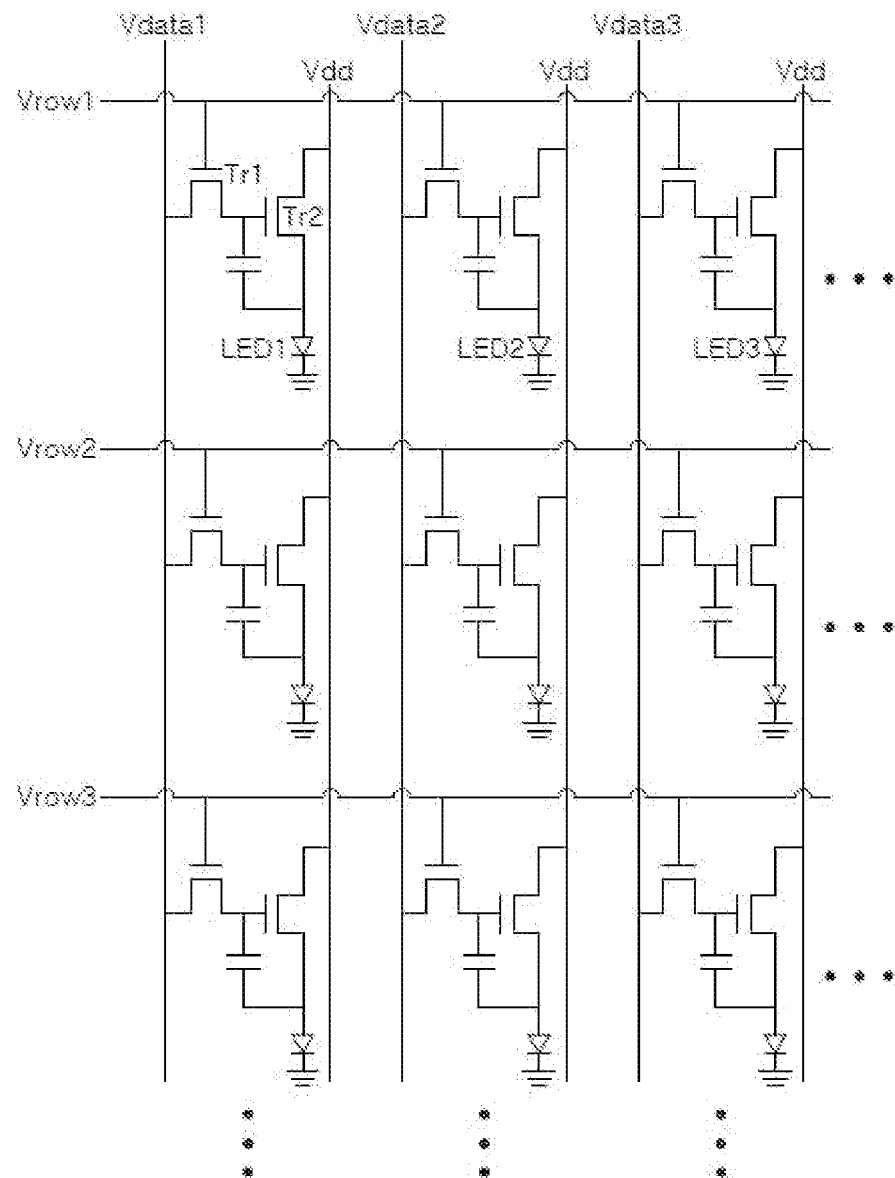
FIG. 41 is a schematic circuit diagram of a display apparatus according to an exemplary embodiment.

FIG. 41 is a schematic circuit diagram of a display apparatus according to an exemplary embodiment.

Referring to FIG. 41, the display apparatus according to an exemplary embodiment may be driven in an active matrix manner. As such, the circuit board may include an active circuit.

For example, the drive circuit may include at least two transistors Tr1, Tr2 and a capacitor. When a power source is connected to selection lines Vrow1 to Vrow3 and voltage is applied to data lines Vdata1 to Vdata3, the voltage is applied to the corresponding light emitting diode. In addition, the corresponding capacitors are charged according to the values of Vdata1 to Vdata3. Since a turned-on state of the transistor Tr2 can be maintained by the charged voltage of the capacitor, the voltage of the capacitor can be maintained and applied to the light emitting diodes LED1 to LED3 even when power supplied to Vrow1 is cut off. In addition, electric current flowing in the light emitting diodes LED1 to LED3 can be changed depending upon the values of Vdata1 to Vdata3. Electric current can be continuously supplied through Vdd, and thus, light may be emitted continuously.

The transistors Tr1, Tr2 and the capacitor may be formed inside the support substrate 3510. Here, the light emitting diodes LED1 to LED3 may correspond to the first to third LED stacks 3230, 3330, and 3430 stacked in one pixel, respectively. The anodes of the first to third LED stacks 3230, 3330, and 3430 are connected to the transistor Tr2 and the cathodes thereof are connected to the ground. The cathodes of the first to third LED stacks 3230, 3330, and 3430, for example, may be commonly connected to the ground.

Although FIG. 41 shows the circuit for active matrix driving according to an exemplary embodiment, other types of circuits may also be used. In addition, although the anodes of the light emitting diodes LED1 to LED3 are described as being connected to different transistors Tr2 and the cathodes thereof are described as being connected to the ground, the anodes of the light emitting diodes may be commonly connected and the cathodes thereof may be connected to different transistors in some exemplary embodiments.

Although the active circuit for active matrix driving is illustrated above, the inventive concepts are not limited thereto, and the pixels according to an exemplary embodiment may be driven in a passive matrix manner. As such, the circuit board 3510 may include data lines, and scan lines arranged thereon and each of the subpixels may be connected to the data line and the scan line. In an exemplary embodiment, the anodes of the first to third LED stacks 3230, 3330, and 3430 may be connected to different data lines and the cathodes thereof may be commonly connected to a scan line. In another exemplary embodiments, the anodes of the first to third LED stacks 3230, 3330, and 3430 may be connected to different scan lines and the cathodes thereof may be commonly connected to a data line.

In addition, each of the LED stacks 3230, 3330, and 3430 may be driven by a pulse width modulation or by changing the magnitude of electric current, thereby controlling the brightness of each subpixel. Furthermore, the brightness may be adjusted by adjusting the areas of the first to third LED stacks 3230, 3330, and 3430, and the areas of the regions of the LED stacks 3230, 3330, and 3430 through which light R, G, and B is emitted. For example, an LED stack emitting light having low visibility, for example, the first LED stack 3230, has a larger area than the second LED stack 3330 or the third LED stack 3430, and thus, can emit light with a higher intensity under the same current density. In addition, since the area of the second LED stack 3330 is larger than the area of the third LED stack 3430, the second LED stack 3330 can emit light with a higher intensity under the same current density than the third LED stack 3430. In this manner, light output can be adjusted based on the visibility of light emitted from the first to third LED stacks 3230, 3330, and 3430 by adjusting the areas of the first LED stack 3230, the second LED stack 3330, and the third LED stack 3430.

Figure 42A:
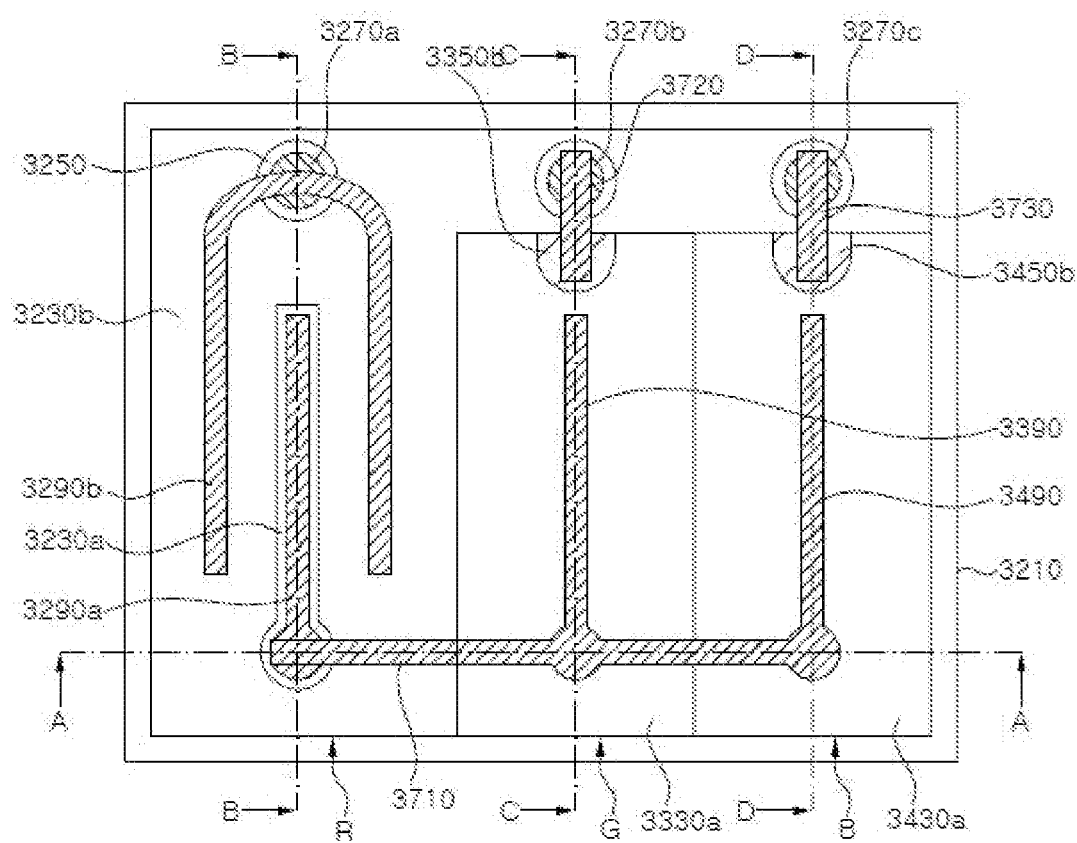
FIG. 42A and FIG. 42B are a top view and a bottom view of one pixel of a display apparatus according to an exemplary embodiment.
Figure 42B:
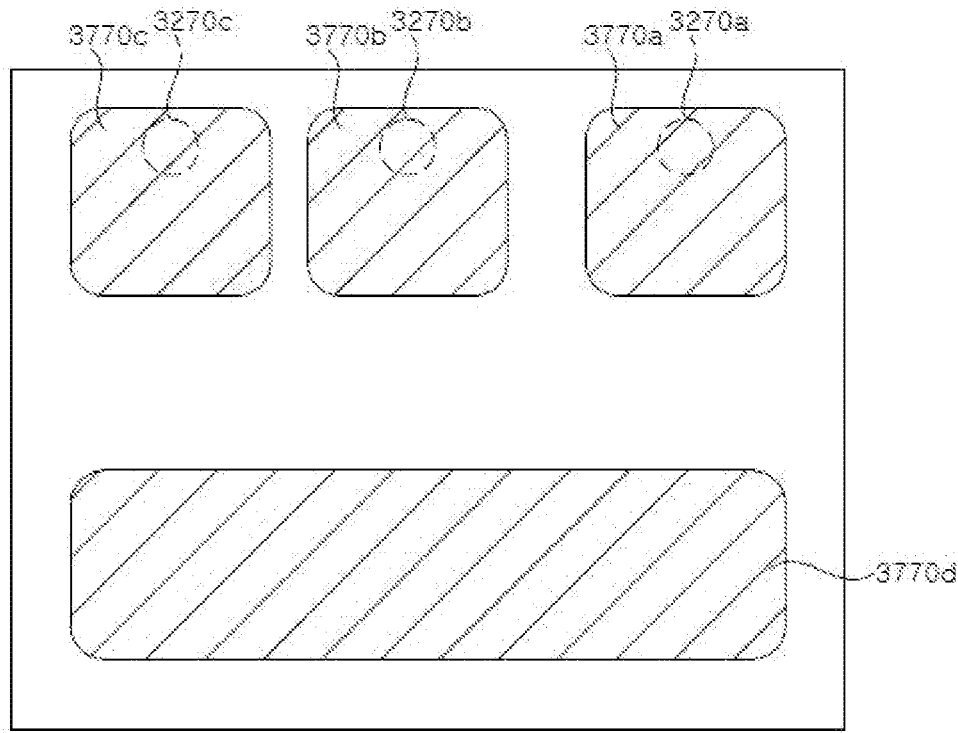
Figure 43A:
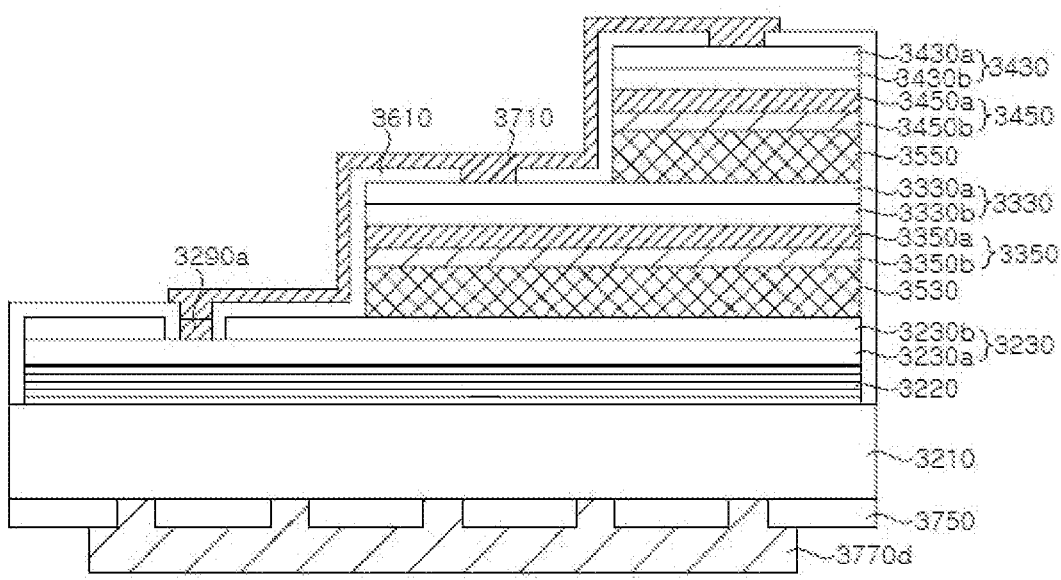
FIG. 43A is a schematic cross-sectional view taken along line A-A of FIG. 42A.
Figure 43B:
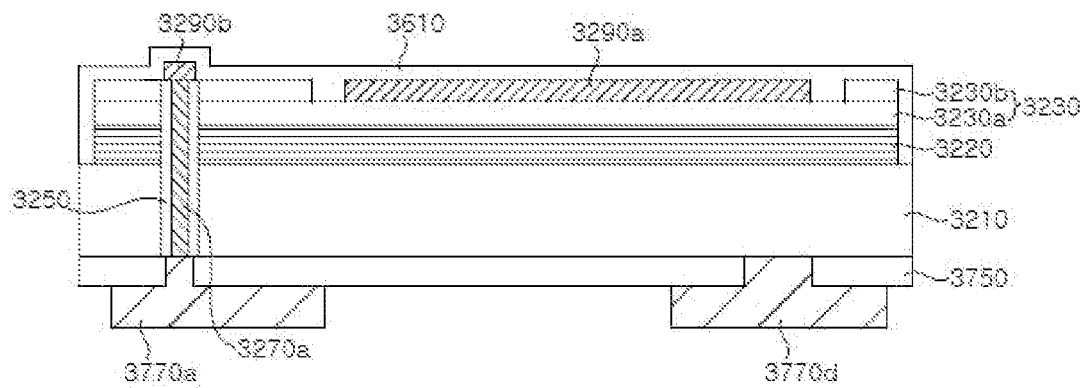
FIG. 43B is a schematic cross-sectional view taken along line B-B of FIG. 42A.
Figure 43C:
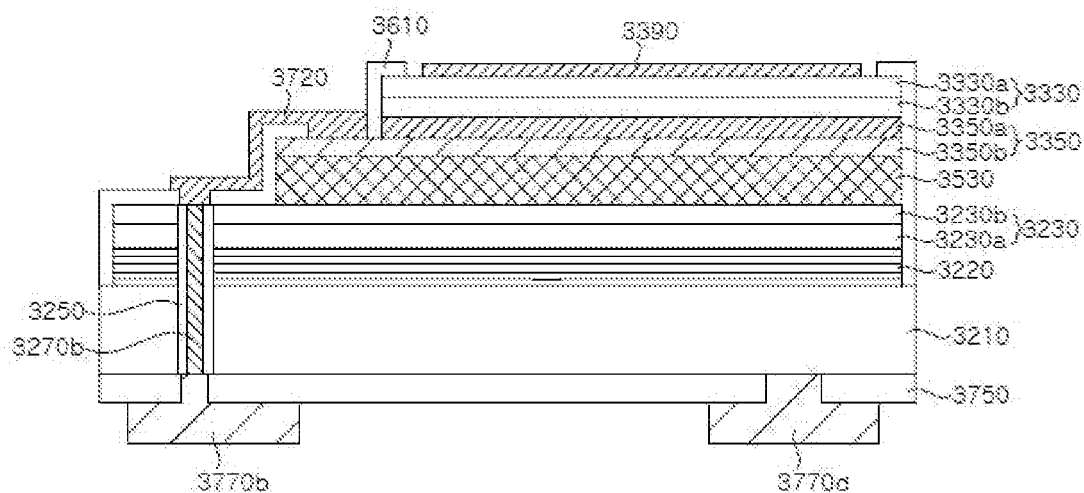
FIG. 43C is a schematic cross-sectional view taken along line C-C of FIG. 42A.
Figure 43D:
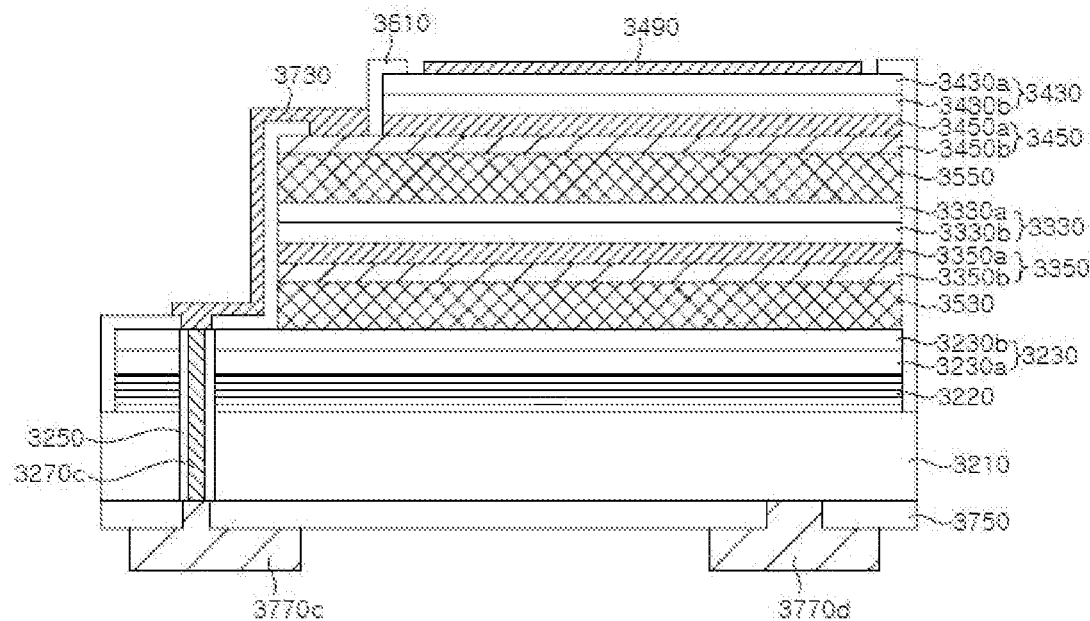
FIG. 43D is a schematic cross-sectional view taken along line D-D of FIG. 42A.

FIG. 42A and FIG. 42B are a top view and a bottom view of one pixel of a display apparatus according to an exemplary embodiment, and FIG. 43A, FIG. 43B, FIG. 43C, and FIG. 43D are schematic cross-sectional views taken along lines A-A, B-B, C-C, and D-D of FIG. 42A, respectively.

In the display apparatus, pixels are arranged on a circuit board 3510 (see FIG. 39) and each of the pixel includes a substrate 3210 and subpixels R, G, and B. The substrate 3210 may be continuous over the plurality of pixels. Hereinafter, a configuration of a pixel according to an exemplary embodiment will be described.

Referring to FIG. 42A, FIG. 42B, FIG. 43A, FIG. 43B, FIG. 43C, and FIG. 43D, the pixel includes a substrate 3210, a distributed Bragg reflector 3220, an insulation layer 3250, through-hole vias 3270*a*, 3270*b*, and 3270*c*, a first LED stack 3230, a second LED stack 3330, a third LED stack 3430, a first-1 ohmic electrode 3290*a*, a first-2 ohmic electrode 3290*b*, a second-1 ohmic electrode 3390, a second-2 ohmic electrode 3350, a third-1 ohmic electrode 3490, a third-2 ohmic electrode 3450, a first bonding layer 3530, a second bonding layer 3550, an upper insulation layer 3610, connectors 3710, 3720, 3730, a lower insulation layer 3750, and electrode pads 3770*a*, 3770*b*, 3770*c*, 3770*d*.

Each of subpixels R, G, and B includes the LED stacks 3230, 3330, and 3430 and ohmic electrodes. In addition, anodes of the first to third subpixels R, G, and B may be electrically connected to the electrode pads 3770*a*, 3770*b*, and 3770*c*, respectively, and cathodes thereof may be electrically connected to the electrode pad 3770*d*, thereby allowing the first to third subpixels R, G, and B to be independently driven.

The substrate 3210 supports the LED stacks 3230, 3330, and 3430. The substrate 3210 may be a growth substrate on which AlGaInP-based semiconductor layers may be grown thereon, for example, a GaAs substrate. In particular, the substrate 3210 may be a semiconductor substrate exhibiting n-type conductivity.

The first LED stack 3230 includes a first conductivity type semiconductor layer 3230*a* and a second conductivity type semiconductor layer 3230*b*, the second LED stack 3330 includes a first conductivity type semiconductor layer 3330*a* and a second conductivity type semiconductor layer 3330*b*, and the third LED stack 3430 includes a first conductivity type semiconductor layer 3430*a* and a second conductivity type semiconductor layer 3430*b*. An active layer may be interposed between the first conductivity type semiconductor layer 3230*a*, 3330*a*, or 3430*a* and the second conductivity type semiconductor layer 3230*b*, 3330*b*, or 3430*b*.

According to an exemplary embodiment, each of the first conductivity type semiconductor layers 3230*a*, 3330*a*, and 3430a may be an n-type semiconductor layer, and each of the second conductivity type semiconductor layers 3230b, 3330b, and 3430b may be a p-type semiconductor layer. A roughened surface may be formed on an upper surface of each of the first conductivity type semiconductor layers 3230a, 3330a, and 3430a by surface texturing. However, the inventive concepts are not limited thereto, and the first and second conductivity types can be changed vice versa.

The first LED stack 3230 is disposed near the substrate 3210, the second LED stack 3330 is disposed on the first LED stack 3230, and the third LED stack 3430 is disposed on the second LED stack 3330. The second LED stack 3330 is disposed in some region on the first LED stack 3230, so that the first LED stack 3230 partially overlaps the second LED stack 3330. The third LED stack 3430 is disposed in some region on the second LED stack 3330, so that the second LED stack 3330 partially overlaps the third LED stack 3430. Accordingly, light generated from the first LED stack 3230 can be emitted to the outside without passing through the second and third LED stacks 3330 and 3430. In addition, light generated from the second LED stack 3330 can be emitted to the outside without passing through the third LED stack 3430.

Materials for the first LED stack 3230, the second LED stack 3330, and the third LED stack 3430 are substantially the same as those described with reference to FIG. 40, and thus, detailed descriptions thereof will be omitted to avoid redundancy.

The distributed Bragg reflector 3220 is interposed between the substrate 3210 and the first LED stack 3230. The distributed Bragg reflector 3220 may include a semiconductor layer grown on the substrate 3210. For example, the distributed Bragg reflector 3220 may be formed by alternately stacking AlAs layers and AlGaAs layers. The distributed Bragg reflector 3220 may include a semiconductor layer that electrically connects the substrate 3210 to the first conductivity type semiconductor layer 3230a of the first LED stack 3230.

Through-hole vias 3270a, 3270b, 3270c are formed through the substrate 3210. The through-hole vias 3270a, 3270b, and 3270c may be formed to pass through the first LED stack 3230. The through-hole vias 3270a, 3270b, 3270c may be formed of conductive pastes or by plating.

The insulation layer 3250 is disposed between the through-hole vias 3270a, 3270b, and 3270c and an inner wall of a through-hole formed through the substrate 3210 and the first LED stack 3230 to prevent short circuit between the first LED stack 3230 and the substrate 3210.

The first-1 ohmic electrode 3290a forms ohmic contact with the first conductivity type semiconductor layer 3230a of the first LED stack 3230. The first-1 ohmic electrode 3290a may be formed of, for example, Au—Te or Au—Ge alloys.

In order to form the first-1 ohmic electrode 3290a, the second conductivity type semiconductor layer 3230b and the active layer may be partially removed to expose the first conductivity type semiconductor layer 3230a. The first-1 ohmic electrode 3290a may be disposed apart from the region where the second LED stack 3330 is disposed. Furthermore, the first-1 ohmic electrode 3290a may include a pad region and an extension, and the connector 3710 may be connected to the pad region of the first-1 ohmic electrode 3290a, as shown in FIG. 42A.

The first-2 ohmic electrode 3290b forms ohmic contact with the second conductivity type semiconductor layer 3230b of the first LED stack 3230. As shown in FIG. 42A, the first-2 ohmic electrode 3290b may be formed to partially surround the first-1 ohmic electrode 3290a in order to assist in current spreading. The first-2 ohmic electrode 3290b may not include the extension. The first-2 ohmic electrode 3290b may be formed of, for example, Au—Zn or Au—Be alloys. Furthermore, the first-2 ohmic electrode 3290b may have a single layer or multiple layers.

The first-2 ohmic electrode 3290b may be connected to the through-hole via 3270a such that the through-hole via 3270a can be electrically connected to the second conductivity type semiconductor layer 3230b.

The second-1 ohmic electrode 3390 forms ohmic contact with the first conductivity type semiconductor layer 3330a of the second LED stack 3330. The second-1 ohmic electrode 3390 may also include a pad region and an extension. As shown in FIG. 42A, the connector 3710 may electrically connect the second-1 ohmic electrode 3390 to the first-1 ohmic electrode 3290a. The second-1 ohmic electrode 3390 may be disposed apart from the region where the third LED stack 3430 is disposed.

The second-2 ohmic electrode 3350 forms ohmic contact with the second conductivity type semiconductor layer 3330b of the second LED stack 3330. The second-2 ohmic electrode 3350 may include a reflective layer 3350a and a barrier layer 3350b. The reflective layer 3350a reflects light generated from the second LED stack 3330 to improve luminous efficacy of the second LED stack 3330. The barrier layer 3350b may act as a connection pad, which provides the reflective layer 3350a, and is connected to the connector 3720. Although the second-2 ohmic electrode 3350 is described as including a metal layer in this exemplary embodiment, the inventive concepts are not limited thereto. For example, the second-2 ohmic electrode 3350 may be formed of a transparent conductive oxide, such as a conductive oxide semiconductor layer.

The third-1 ohmic electrode 3490 forms ohmic contact with the first conductivity type semiconductor layer 3430a of the third LED stack 3430. The third-1 ohmic electrode 3490 may also include a pad region and an extension, and the connector 3710 may connect the third-1 ohmic electrode 3490 to the first-1 ohmic electrode 3290a, as shown in FIG. 42A.

The third-2 ohmic electrode 3450 may form ohmic contact with the second conductivity type semiconductor layer 3430b of the third LED stack 3430. The third-2 ohmic electrode 3450 may include a reflective layer 3450a and a barrier layer 3450b. The reflective layer 3450a reflects light generated from the third LED stack 3430 to improve luminous efficacy of the third LED stack 3430. The barrier layer 3450b may act as a connection pad, which provides the reflective layer 3450a, and is connected to the connector 3730. Although the third-2 ohmic electrode 3450 is described as including a metal layer in this exemplary embodiment, the inventive concepts are not limited thereto. Alternatively, the third-2 ohmic electrode 3450 may be formed of a transparent conductive oxide, such as a conductive oxide semiconductor layer.

The first-2 ohmic electrode 3290b, the second-2 ohmic electrode 3350, and the third-2 ohmic electrode 3450 may form ohmic contact with the p-type semiconductor layers of the corresponding LED stacks to assist in current spreading, and the first-1 ohmic electrode 3290a, the second-1 ohmic electrode 3390, and the third-1 ohmic electrode 3490 may form ohmic contact with the n-type semiconductor layers of the corresponding LED stacks to assist in current spreading.

The first bonding layer 3530 couples the second LED stack 3330 to the first LED stack 3230. As shown in the drawings, the second-2 ohmic electrode 3350 may adjoin the first bonding layer 3530. The first bonding layer 3530 may be a light transmissive layer or an opaque layer. The first bonding layer 3530 may be formed of an organic material or an inorganic material. Examples of the organic material may include SU8, poly(methyl methacrylate) (PMMA), polyimide, Parylene, benzocyclobutene (BCB), or others, and examples of the inorganic material may include $Al_2O_3$, $SiO_2$, SiNx, or others. The organic material layer may be bonded under high vacuum and the inorganic material layer may be bonded under high vacuum after flattening the surface of the first bonding layer by, for example, chemical mechanical polishing, followed by adjusting surface energy through plasma treatment. The first bonding layer 3530 may be formed of spin-on-glass or may be a metal bonding layer formed of AuSn or the like. For the metal bonding layer, an insulation layer may be disposed on the first LED stack 3230 to secure electrical insulation between the first LED stack 3230 and the metal bonding layer. Furthermore, a reflective layer may be further disposed between the first bonding layer 3530 and the first LED stack 3230 to prevent light generated from the first LED stack 3230 from entering the second LED stack 3330.

The second bonding layer 3550 couples the second LED stack 3330 to the third LED stack 3430. The second bonding layer 3550 may be interposed between the second LED stack 3330 and the third-2 ohmic electrode 3450 to bond the second LED stack 3330 to the third-2 ohmic electrode 3450. The second bonding layer 3550 may be formed of substantially the same bonding material as the first bonding layer 3530. Furthermore, an insulation layer and/or a reflective layer may be further disposed between the second LED stack 3330 and the second bonding layer 3550.

When the first bonding layer 3530 and the second bonding layer 3550 are formed of a light transmissive material, and the second-2 ohmic electrode 3350 and the third-2 ohmic electrode 3450 are formed of a transparent oxide material, some fractions of light generated from the first LED stack 3230 may be emitted through the second LED stack 3330 after passing through the first bonding layer 3530 and the second-2 ohmic electrode 3350, and may also be emitted through the third LED stack 3430 after passing through the second bonding layer 3550 and the third-2 ohmic electrode 3450. In addition, some fractions of light generated from the second LED stack 3330 may be emitted through the third LED stack 3430 after passing through the second bonding layer 3550 and the third-2 ohmic electrode 3450.

In this case, light generated from the first LED stack 3230 should be prevented from being absorbed by the second LED stack 3330 while passing through the second LED stack 3330. As such, light generated from the first LED stack 3230 may have a smaller bandgap than the second LED stack 3330, and thus, may have a longer wavelength than light generated from the second LED stack 3330.

In addition, in order to prevent light generated from the second LED stack 3330 from being absorbed by the third LED stack 3430 while passing through the third LED stack 3430, light generated from the second LED stack 3330 may have a longer wavelength than the light generated from third LED stack 3430.

When the first bonding layer 3530 and the second bonding layer 3550 are formed of opaque materials, the reflective layers are interposed between the first LED stack 3230 and the first bonding layer 3530, and between the second LED stack 3330 and the second bonding layer 3550, respectively, to reflect light having been generated from the first LED stack 3230 and entering the first bonding layer 3530, and light having been generated from the second LED stack 3330 and entering the second bonding layer 3550. The reflected light may be emitted through the first LED stack 3230 and the second LED stack 3330.

The upper insulation layer 3610 may cover the first to third LED stacks 3230, 3330, and 3430. In particular, the upper insulation layer 3610 may cover side surfaces of the second LED stack 3330 and the third LED stack 3430, and may also cover the side surface of the first LED stack 3230.

The upper insulation layer 3610 has openings that expose the first to third the through-hole vias 3270a, 3270b, and 3270c, and openings that expose the first conductivity type semiconductor layer 3330a of the second LED stack 3330, the first conductivity type semiconductor layer 3430a of the third LED stack 3430, the second-2 ohmic electrode 3350, and the third-2 ohmic electrode 3450.

The upper insulation layer 3610 may be formed of any insulation material, for example, silicon oxide or silicon nitride, without being limited thereto.

The connector 3710 electrically connects the first-1 ohmic electrode 3290a, the second-1 ohmic electrode 3390, and the third-1 ohmic electrode 3490 to one another. The connector 3710 is formed on the upper insulation layer 3610, and is insulated from the second conductivity type semiconductor layer 3430b of the third LED stack 3430, the second conductivity type semiconductor layer 3330b of the second LED stack 3330, and the second conductivity type semiconductor layer 3230b of the first LED stack 3230.

The connector 3710 may be formed of substantially the same material as the second-1 ohmic electrode 3390 and the third-1 ohmic electrode 3490, and thus, may be formed together with the second-1 ohmic electrode 3390 and the third-1 ohmic electrode 3490. Alternatively, the connector 3710 may be formed of a different conductive material from the second-1 ohmic electrode 3390 or the third-1 ohmic electrode 3490, and thus, may be separately formed in a different process from the second-1 ohmic electrode 3390 and/or the third-1 ohmic electrode 3490.

The connector 3720 may electrically connect the second-1 ohmic electrode 3350, for example, the barrier layer 3350b, to the second through-hole via 3270b. The connector 3730 electrically connects the third-1 ohmic electrode, for example, the barrier layer 3450b, to the third through-hole via 3270c. The connector 3720 may be electrically insulated from the first LED stack 3230 by the upper insulation layer 3610. The connector 3730 may also be electrically insulated from the second LED stack 3330 and the first LED stack 3230 by the upper insulation layer 3610.

The connectors 3720, 3730 may be formed together by the same process. The connector 3720, 3730 may also be formed together with the connector 3710. Furthermore, the connectors 3720, 3730 may be formed of substantially the same material as the second-1 ohmic electrode 3390 and the third-1 ohmic electrode 3490, and may be formed together therewith. Alternatively, the connectors 3720, 3730 may be formed of a different conductive material from the second-1 ohmic electrode 3390 or the third-1 ohmic electrode 3490, and thus may be separately formed by a different process from the second-1 ohmic electrode 3390 and/or the third-1 ohmic electrode 3490.

The lower insulation layer 3750 covers a lower surface of the substrate 3210. The lower insulation layer 3750 may include openings which expose the first to third through-hole vias 3270a, 3270b, and 3270c at a lower side of the substrate 3210, and may also include openings which expose the lower surface of the substrate 3210.

The electrode pads 3770a, 3770b, 3770c, and 3770d are disposed on the lower surface of the substrate 3210. The electrode pads 3770a, 3770b, and 3770c are connected to the through-hole vias 3270a, 3270b, and 3270c through the openings of the lower insulation layer 3750, and the electrode pad 3770d is connected to the substrate 3210.

The electrode pads 3770a, 3770b, and 3770c are provided to each pixel to be electrically connected to the first to third LED stacks 3230, 3330, and 3430 of each pixel, respectively. Although the electrode pad 3770d may also be provided to each pixel, the substrate 3210 is continuously disposed over a plurality of pixels, which may obviate the need for providing the electrode pad 3770d to each pixel.

The electrode pads 3770a, 3770b, 3770c, 3770d are bonded to the circuit board 3510, thereby providing a display apparatus.

Next, a method of manufacturing the display apparatus according to an exemplary embodiment will be described.

FIG. 44A to FIG. 51B are schematic plan views and cross-sectional views illustrating a method of manufacturing the display apparatus according to an exemplary embodiment. Each of the cross-sectional views is taken along a line shown in each corresponding plan view.

Figure 44A:
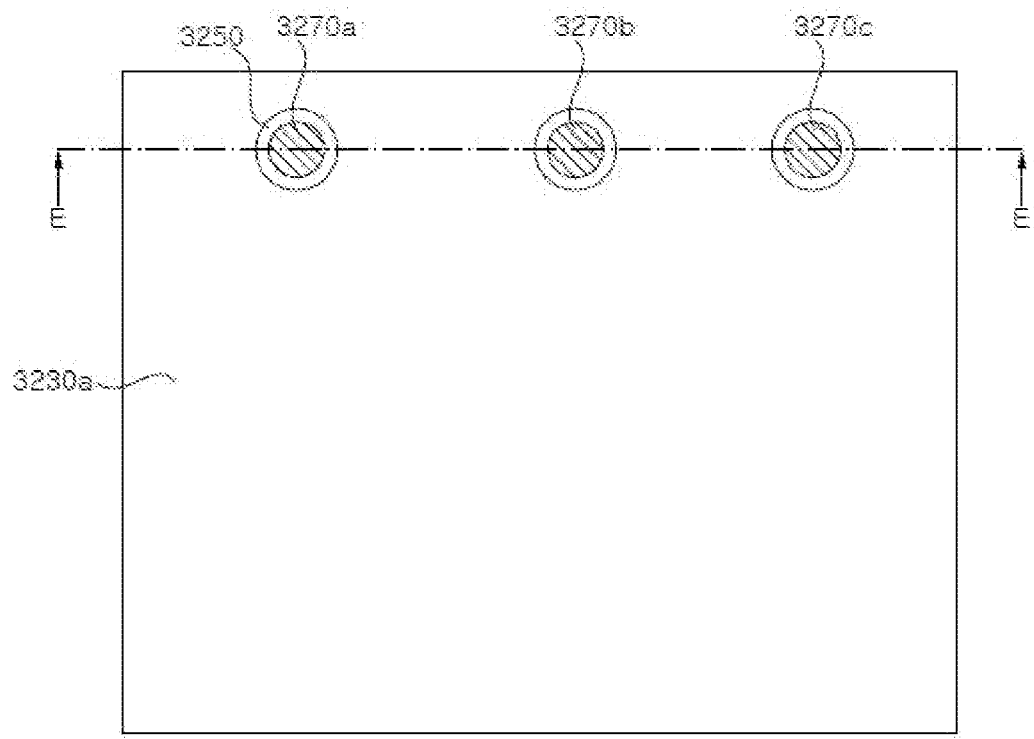
FIGS. 44A, 44B, 45A, 45B, 46A, 46B, 47A, 47B, 48A, 48B, 49A, 49B, 50A, 50B, 51A, and 51B are schematic plan views and cross-sectional views illustrating a method of manufacturing a display apparatus according to an exemplary embodiment.
Figure 44B:
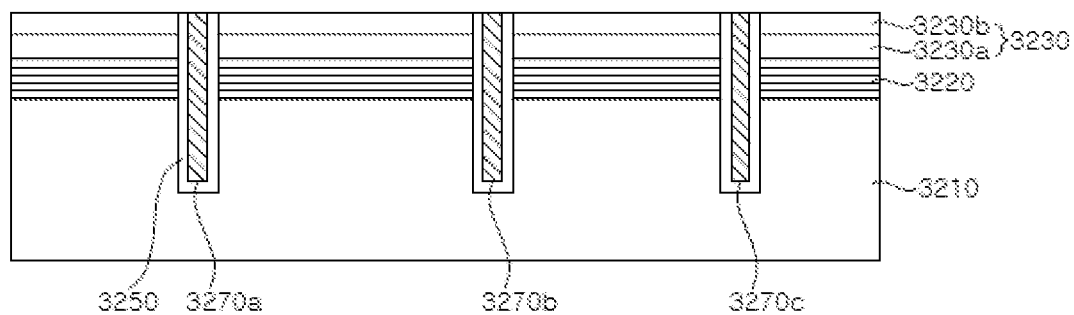

Referring to FIGS. 44A and 44B, a first LED stack 3230 is grown on a substrate 3210. The substrate 3210 may be, for example, a GaAs substrate. The first LED stack 3230 is formed of AlGaInP-based semiconductor layers, and includes a first conductivity type semiconductor layer 3230a, an active layer, and a second conductivity type semiconductor layer 3230b. A distributed Bragg reflector 3220 may be formed prior to growth of the first LED stack 3230. The distributed Bragg reflector 3220 may have a stack structure formed by repeatedly stacking, for example, AlAs/AlGaAs layers.

Then, grooves are formed on the first LED stack 3230 and the substrate 3210 through photolithography and etching. The grooves may be formed to pass through the substrate 3210 or may be formed to a predetermined depth in the substrate 3210, as shown in FIG. 44B.

Then, an insulation layer 3250 is formed to cover sidewalls of the grooves and through-hole vias 3270a, 3270b, and 3270c are formed to fill the grooves. The through-hole vias 3270a, 3270b, and 3270c may be formed by, for example, forming an insulation layer to cover the sidewalls of the grooves, filling the groove with a conductive material layer or conductive pastes through plating, and removing the insulation and the conductive material layer from an upper surface of the first LED stack 3230 through chemical mechanical polishing.

Figure 45A:
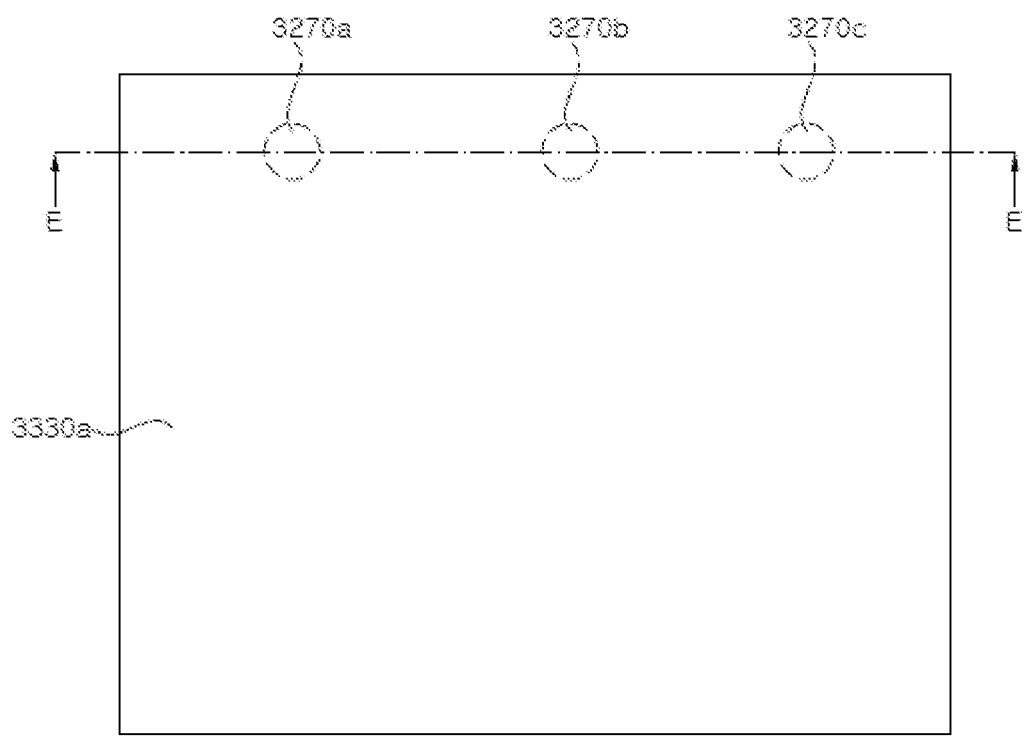
Figure 45B:
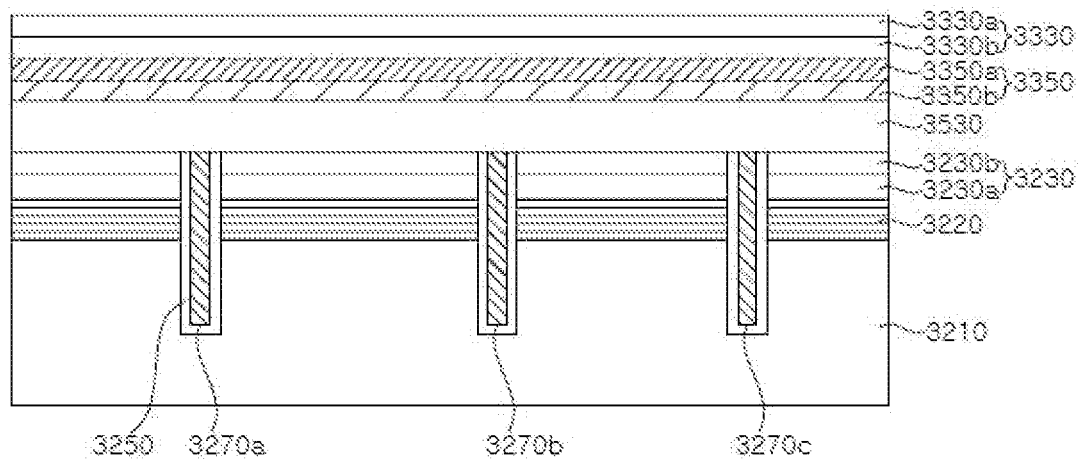

Referring to FIG. 45A and FIG. 45B, a second LED stack 3330 and a second-2 ohmic electrode 3350 may be coupled to the first LED stack 3230 via the first bonding layer 3530.

The second LED stack 3330 is grown on a second substrate and the second-2 ohmic electrode 3350 is formed on the second LED stack 3330. The second LED stack 3330 is formed of AlGaInP-based or AlGaInN-based semiconductor layers, and may include a first conductivity type semiconductor layer 3330a, an active layer, and a second conductivity type semiconductor layer 3330b. The second substrate may be a substrate on which AlGaInP-based semiconductor layers may be grown thereon, for example, a GaAs substrate, or a substrate on which AlGaInN-based semiconductor layers may be grown thereon, for example, a sapphire substrate. The composition ratio of Al, Ga and In for the second LED stack 3330 may be determined such that the second LED stack 3330 can emit green light. The second-2 ohmic electrode 3350 forms ohmic contact with the second conductivity type semiconductor layer 3330b, for example, a p-type semiconductor layer. The second-2 ohmic electrode 3350 may include a reflective layer 3350a, which reflects light generated from the second LED stack 3330, and a barrier layer 3350b.

The second-2 ohmic electrode 3350 is disposed to face the first LED stack 3230 and is coupled to the first LED stack 3230 by the first bonding layer 3530. Thereafter, the second substrate is removed from the second LED stack 3330 to expose the first conductivity type semiconductor layer 3330a by chemical etching or laser lift-off. A roughened surface may be formed on the exposed first conductivity type semiconductor layer 3330a by surface texturing.

According to an exemplary embodiment, an insulation layer and a reflective layer may be further formed on the first LED stack 3230 before formation of the first bonding layer 3530.

Figure 46A:
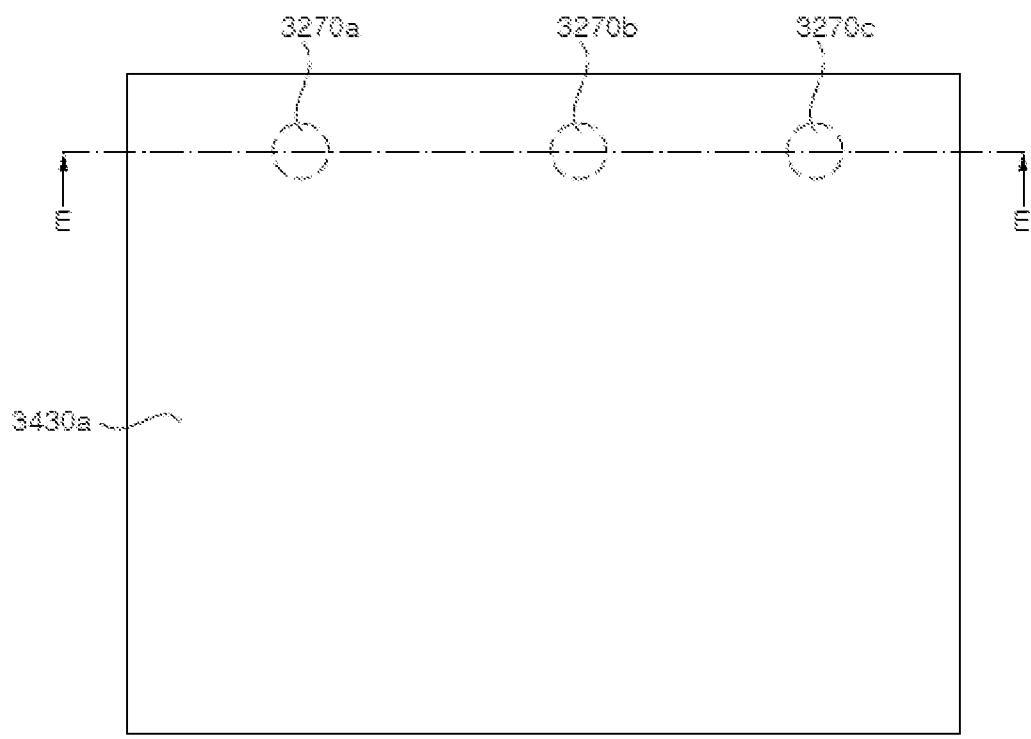
Figure 46B:
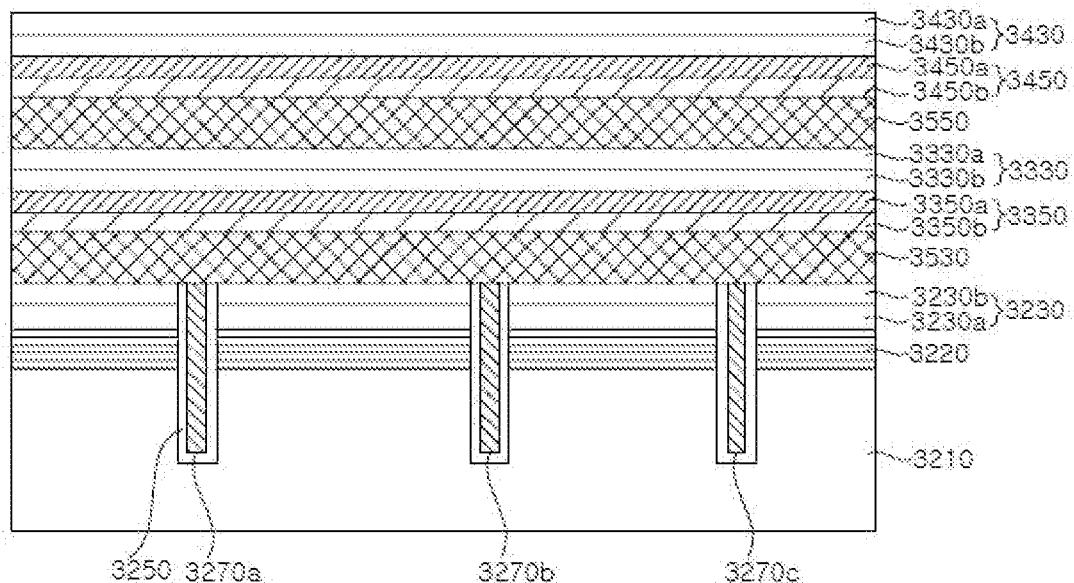

Referring to FIG. 46A and FIG. 46B, a third LED stack 3430 and a third-2 ohmic electrode 3450 may be coupled to the second LED stack 3330 via the second bonding layer 3550.

The third LED stack 3430 is grown on a third substrate, and the third-2 ohmic electrode 3450 is formed on the third LED stack 3430. The third LED stack 3430 is formed of AlGaInN-based semiconductor layers, and may include a first conductivity type semiconductor layer 3430a, an active layer, and a second conductivity type semiconductor layer 3430b. The third substrate is a substrate on which GaN-based semiconductor layers may be grown thereon, and is different from the first substrate 3210. The composition ratio of AlGaInN for the third LED stack 3430 may be determined such that the third LED stack 3430 can emit blue light. The third-2 ohmic electrode 3450 forms ohmic contact with the second conductivity type semiconductor layer 3430b, for example, a p-type semiconductor layer. The third-2 ohmic electrode 3450 may include a reflective layer 3450a, which reflects light generated from the third LED stack 3430, and a barrier layer 3450b.

The third-2 ohmic electrode 3450 is disposed to face the second LED stack 3330 and is coupled to the second LED stack 3330 by the second bonding layer 3550. Thereafter, the third substrate is removed from the third LED stack 3430 to expose the first conductivity type semiconductor layer 3430a by chemical etching or laser lift-off. A roughened surface may be formed on the exposed first conductivity type semiconductor layer 3430a by surface texturing.

According to an exemplary embodiment, an insulation layer and a reflective layer may be further formed on the second LED stack 3330 before formation of the second bonding layer 3550.

Figure 47A:
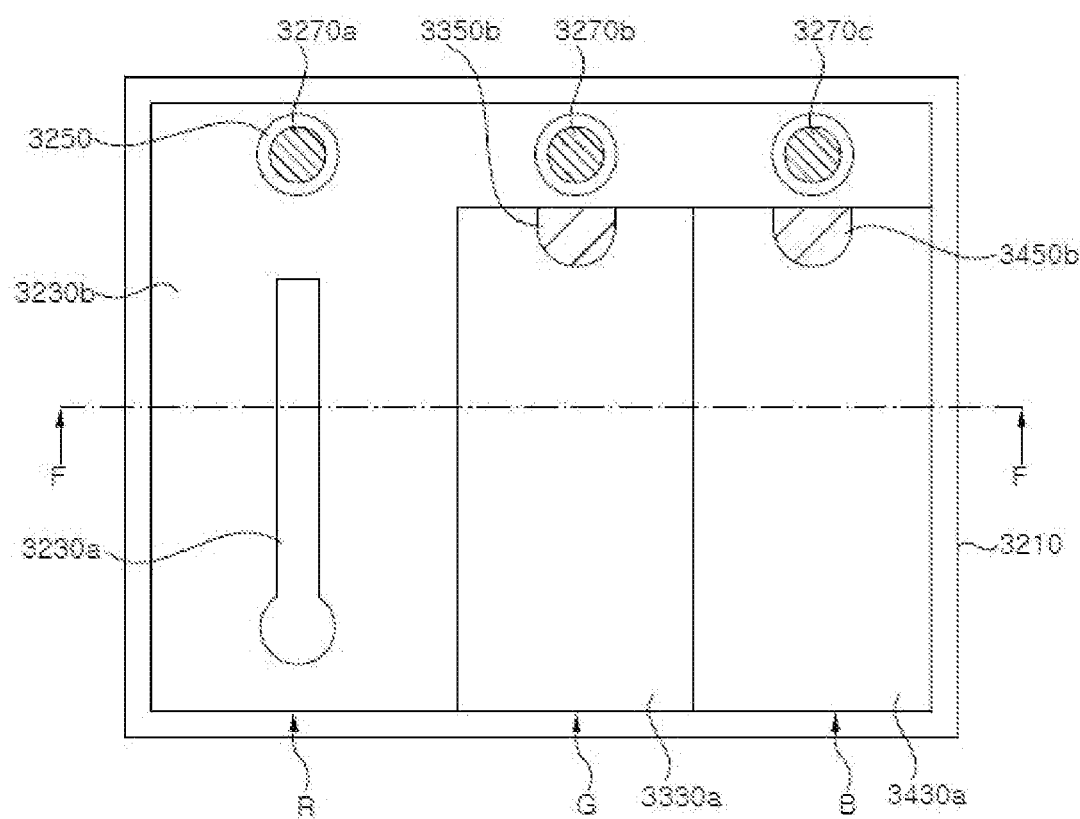
Figure 47B:
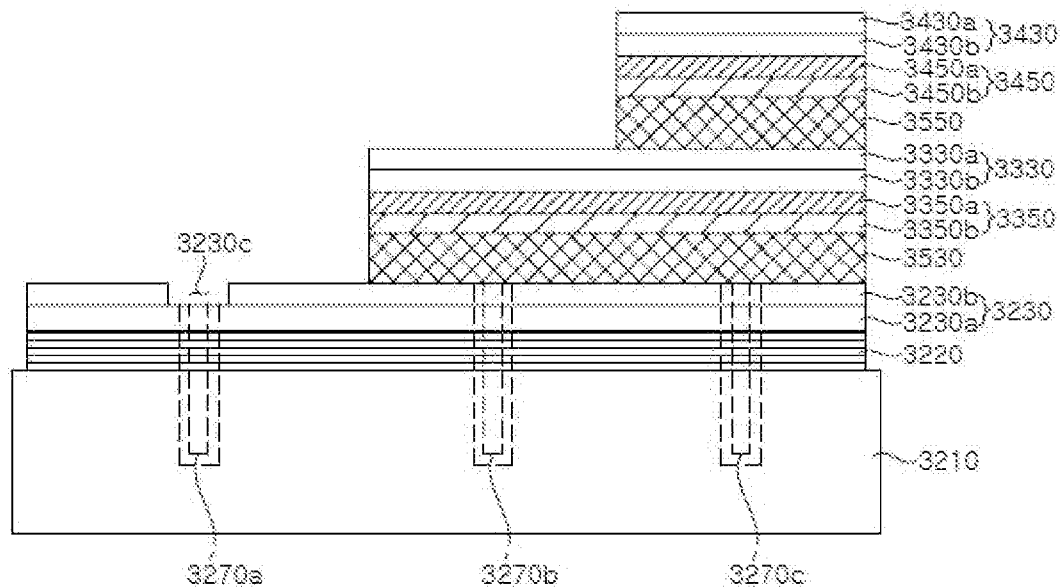

Referring to FIG. 47A and FIG. 47B, in each of pixel regions, the third LED stack 3430 is patterned to remove the third LED stack 3430 other than in the third subpixel B. In a region of the third subpixel B, an indentation is formed on the third LED stack 3430 to expose the barrier layer 3450b through the indentation.

Then, in regions other than the third subpixel B, the third-2 ohmic electrode 3450 and the second bonding layer 3550 are removed to expose the second LED stack 3330. As such, the third-2 ohmic electrode 3450 is restrictively placed near the region of the third subpixel B.

In each pixel region, the second LED stack 3330 is patterned to remove the second LED stack 3330 in regions other than the second subpixel G. In the region of the second subpixel G, the second LED stack 3330 partially overlaps the third LED stack 3430.

By patterning the second LED stack 3330, the second-2 ohmic electrode 3350 is exposed. The second LED stack 3330 may include an indentation, and the second-2 ohmic electrode 3350, for example, the barrier layer 3350b, may be exposed through the indentation.

Thereafter, the second-2 ohmic electrode 3350 and the first bonding layer 3530 are removed to expose the first LED stack 3230. As such, the second-2 ohmic electrode 3350 is disposed near the region of the second subpixel G. On the other hand, the first to third through-hole vias 3270a, 3270b, and 3270c are also exposed together with the first LED stack 3230.

In each pixel region, the first conductivity type semiconductor layer 3230a is exposed by patterning the second conductivity type semiconductor layer 3230b of the first LED stack 3230. As shown in FIG. 47A, the first conductivity type semiconductor layer 3230a may be exposed in an elongated shape, without being limited thereto.

Furthermore, the pixel regions are divided from one another by patterning the first LED stack 3230. As such, a region of the first subpixel R is defined. Here, the distributed Bragg reflector 3220 may also be divided. Alternatively, the distributed Bragg reflector 3220 may be continuously disposed over the plurality of pixels, rather than being divided. Further, the first conductivity type semiconductor layer 3230a may also be continuously disposed over the plurality of pixels.

Figure 48A:
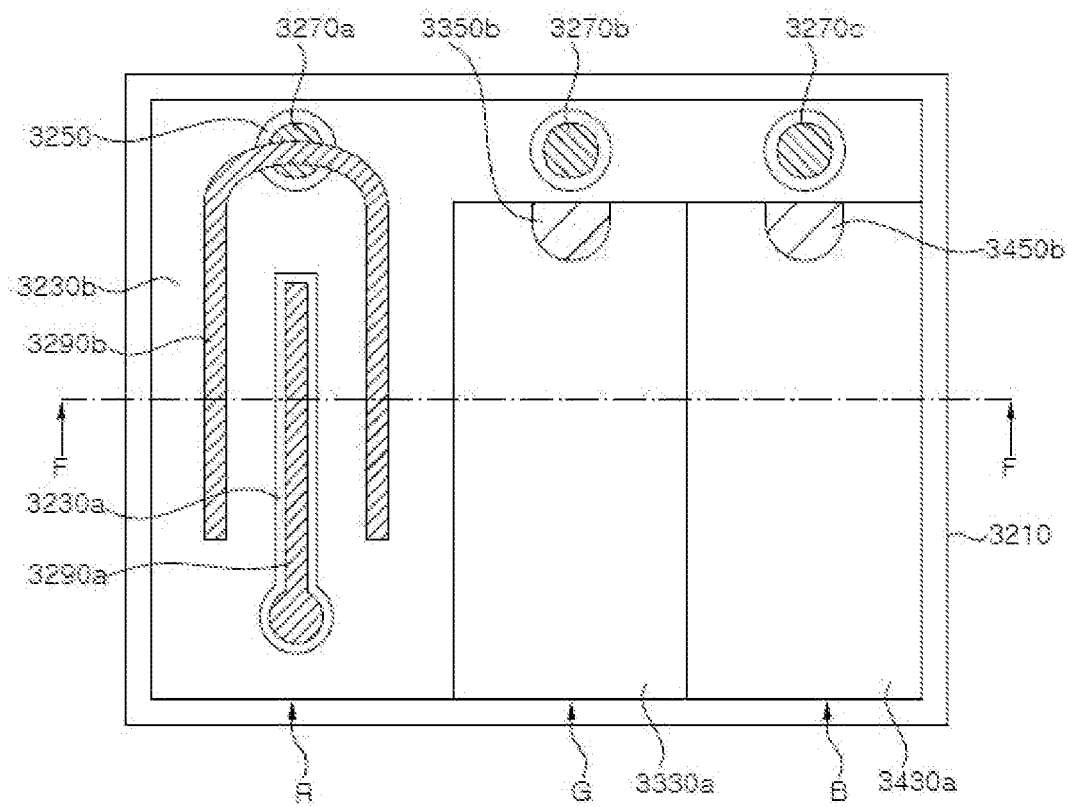
Figure 48B:
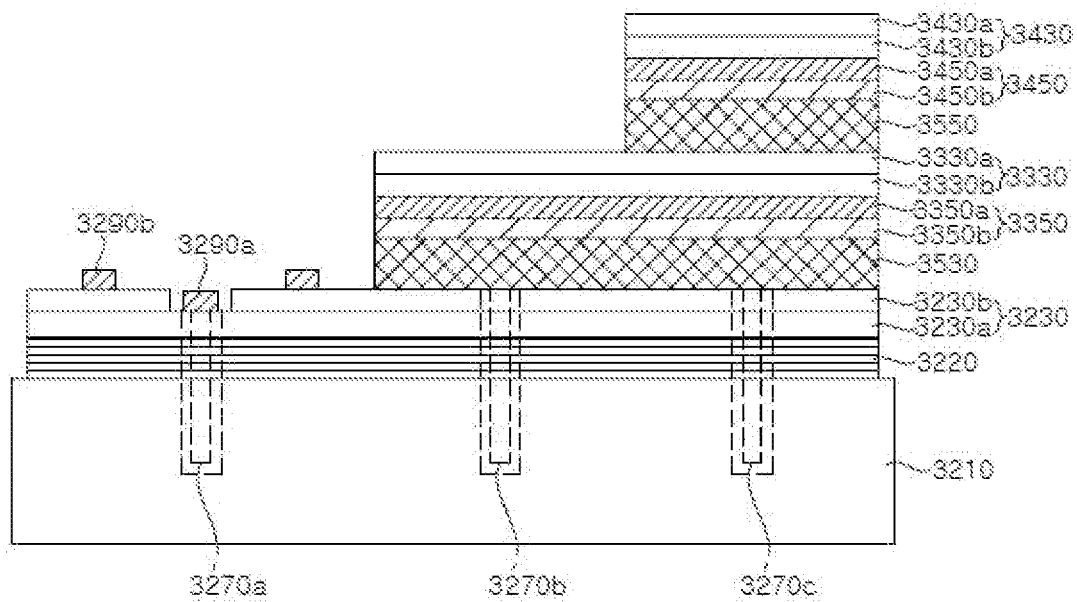

Referring to FIG. 48A and FIG. 48B, a first-1 ohmic electrode 3290a and a first-2 ohmic electrode 3290b are formed on the first LED stack 3230. The first-1 ohmic electrode 3290a may be formed of, for example, Au—Te or Au—Ge alloys on the exposed first conductivity type semiconductor layer 3230a. The first-2 ohmic electrode 3290b may be formed of, for example, Au—Be or Au—Zn alloys on the second conductivity type semiconductor layer 3230b. The first-2 ohmic electrode 3290b may be formed prior to the first-1 ohmic electrode 3290a, or vice versa. The first-2 ohmic electrode 3290b may be connected to the first through-hole via 3270a. On the other hand, the first-1 ohmic electrode 3290a may include a pad region and an extension, which may extend from the pad region towards the first through-hole via 3270a.

For current spreading, the first-2 ohmic electrode 3290b may be disposed to at least partially surround the first-1 ohmic electrode 3290a. Although each of the first-1 ohmic electrode 3290a and the first-2 ohmic electrode 3290b is being illustrated as having an elongated shape in FIG. 48A, the inventive concepts are not limited thereto. Alternatively, each of the first-1 ohmic electrode 3290a and the first-2 ohmic electrode 3290b may have a circular shape, for example.

Figure 49A:
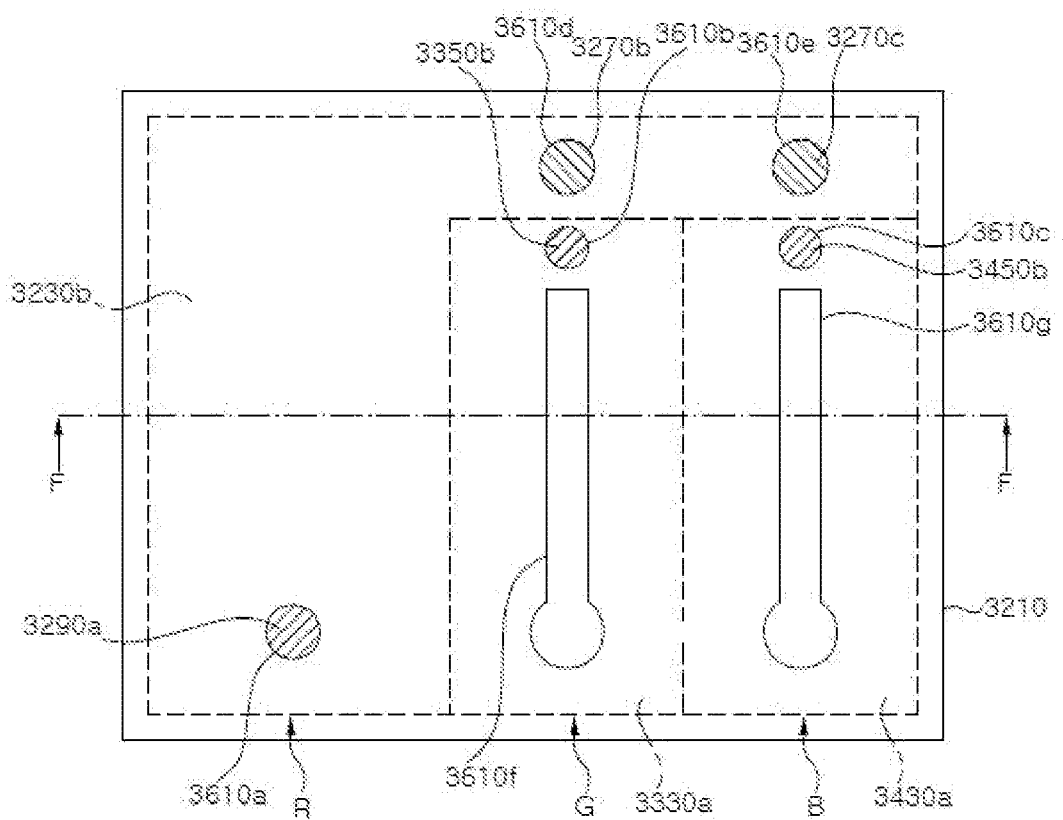
Figure 49B:
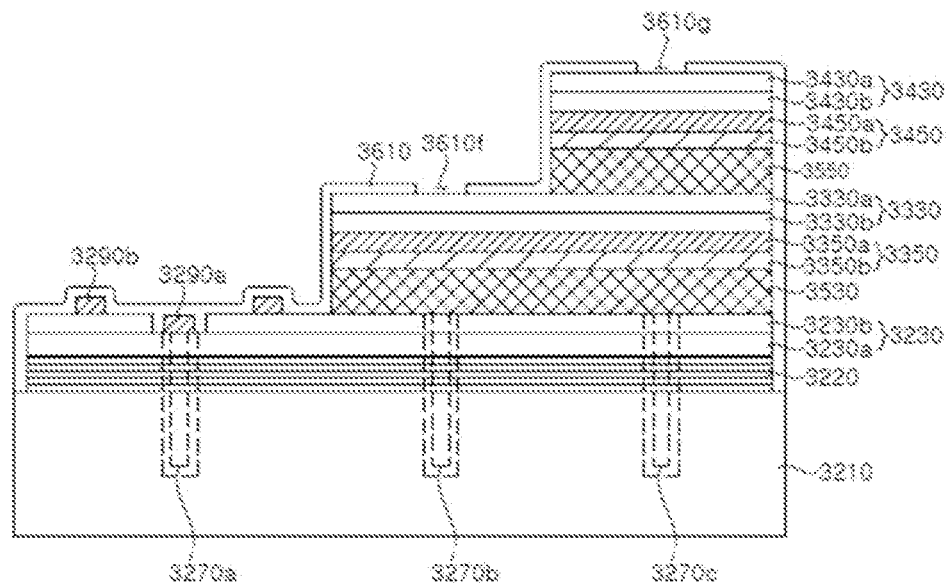

Referring to FIG. 49A and FIG. 49B, an upper insulation layer 3610 is formed to cover the first to third LED stacks 3230, 3330, and 3430. The upper insulation layer 3610 may cover the first-1 ohmic electrode 3290a and the first-2 ohmic electrode 3290b. The upper insulation layer 3610 may also cover side surfaces of the first to third LED stacks 3230, 3330, and 3430, and a side surface of the distributed Bragg reflector 3220.

The upper insulation layer 3610 may have an opening 3610a which exposes the first-1 ohmic electrode 3290a, openings 3610b, 3610c which expose the barrier layers 3350b, 3450b, openings 3610d, 3610e which expose the second and third through-hole vias 3270b, 3270c, and openings 3610f, 3610g which expose the first conductivity type semiconductor layers 3330a, 3430a of the second LED stack 3330 and the third LED stack 3430.

Figure 50A:
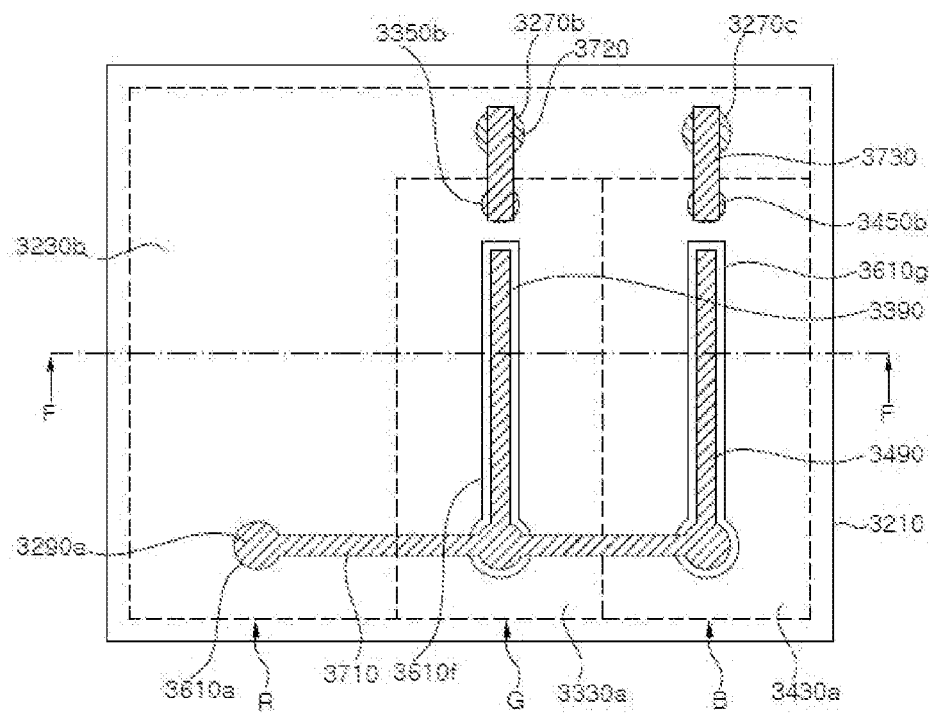
Figure 50B:
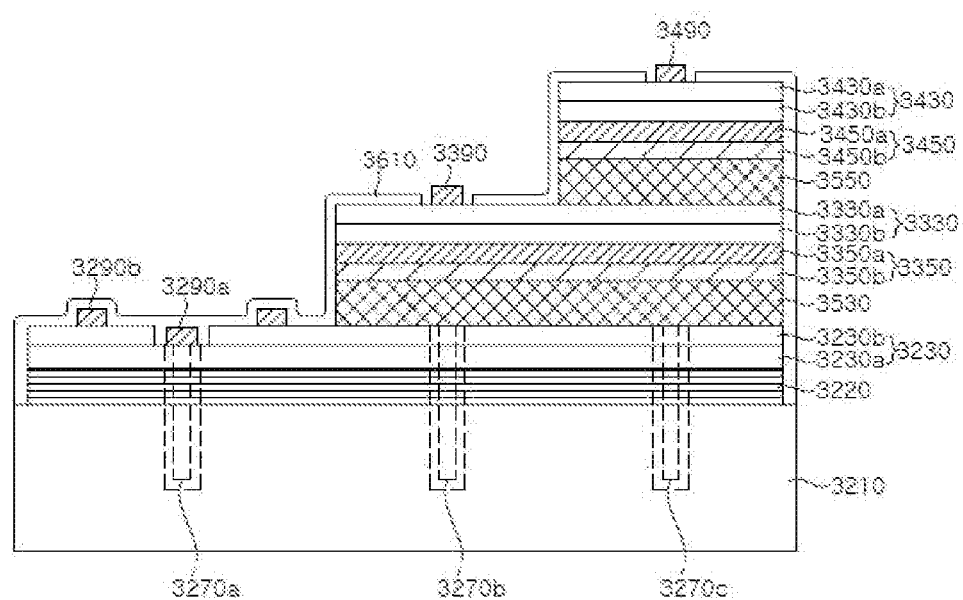

Referring to FIG. 50A and FIG. 50B, a second-1 ohmic electrode 3390, a third-1 ohmic electrode 3490 and connectors 3710, 3720, 3730 are formed. The second-1 ohmic electrode 3390 is formed in the opening 3610f to form ohmic contact with the first conductivity type semiconductor layer 3330a, and the third-1 ohmic electrode 3490 is formed in the opening 3610g to form ohmic contact with the first conductivity type semiconductor layer 3430a.

The connector 3710 electrically connects the second-1 ohmic electrode 3390 and the third-1 ohmic electrode 3490 to the first-1 ohmic electrode 3290a. The connector 3710 may be connected to, for example, the first-1 ohmic electrode 3290a exposed in the opening 3610a. The connector 3710 is formed on the upper insulation layer 3610 to be insulated from the second conductivity type semiconductor layers 3230b, 3330b, and 3430b.

The connector 3720 electrically connects the second-2 ohmic electrode 3350 to the second through-hole via 3270b, and the connector 3730 electrically connects the third-2 ohmic electrode 3450 to the third through-hole via 3270c. The connectors 3720, 3730 are disposed on the upper insulation layer 3610 to prevent short circuit to the first to third LED stacks 3230, 3330, and 3430.

The second-1 ohmic electrode 3390, the third-1 ohmic electrode 3490, and the connectors 3710, 3720, 3730 may be formed of substantially the same material by the same process. However, the inventive concepts are not limited thereto. Alternatively, the second-1 ohmic electrode 3390, the third-1 ohmic electrode 3490, and the connectors 3710, 3720, 3730 may be formed of different materials by different processes.

Figure 51A:
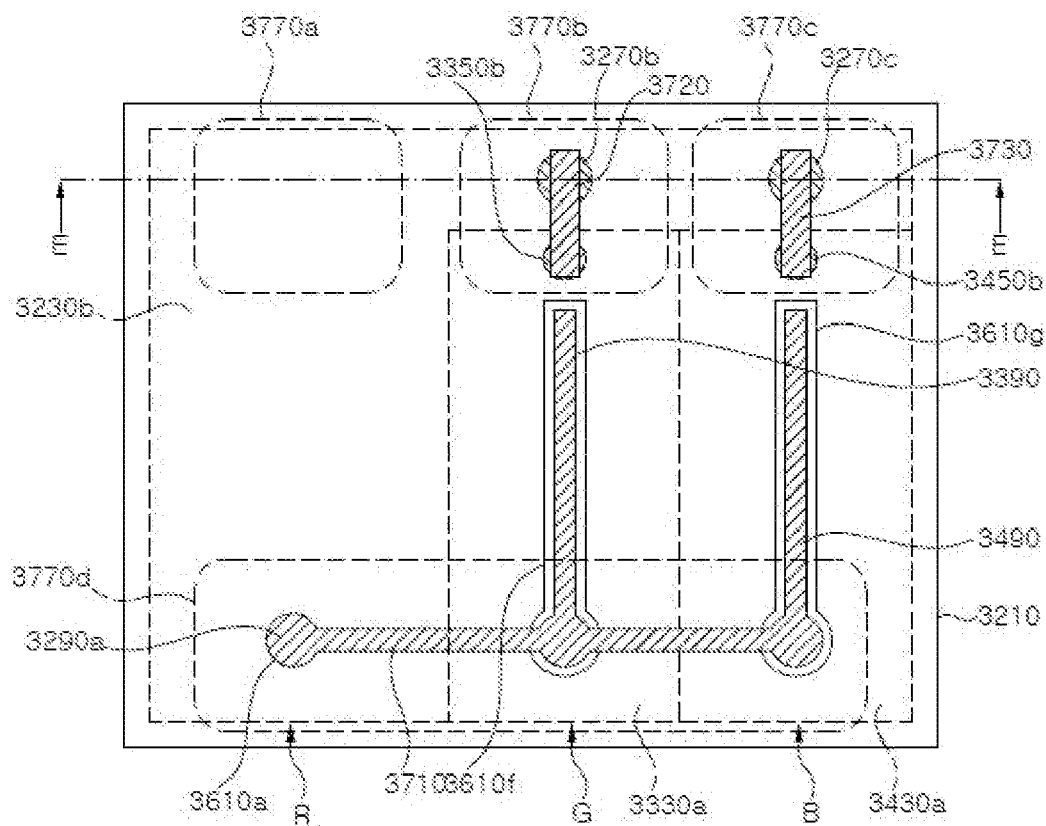
Figure 51B:
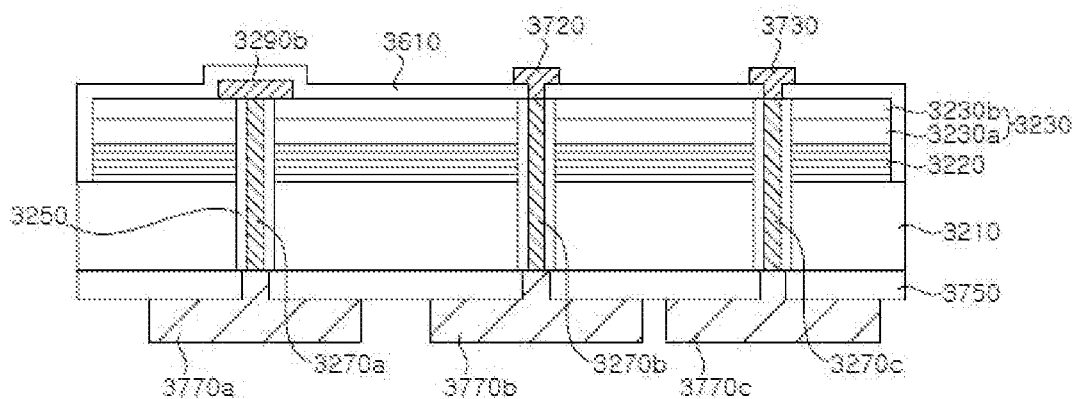

Thereafter, referring to FIG. 51A and FIG. 51B, a lower insulation layer 3750 is formed on a lower surface of the substrate 3210. The lower insulation layer 3750 has openings which expose the first to third the through-hole vias 3270a, 3270b, 3270c, and may also have opening(s) which expose the lower surface of the substrate 3210.

Electrode pads 3770a, 3770b, 3770c, 3770d are formed on the lower insulation layer 3750. The electrode pads 3770a, 3770b, 3770c are connected to the first to third the through-hole vias 3270a, 3270b, 3270c, respectively, and the electrode pad 3770d is connected to the substrate 3210.

Accordingly, the electrode pad 3770a is electrically connected to the second conductivity type semiconductor layer 3230b of the first LED stack 3230 through the first through-hole via 3270a, the electrode pad 3770b is electrically connected to the second conductivity type semiconductor layer 3330b of the second LED stack 3330 through the second through-hole via 3270b, and the electrode pad 3770c is electrically connected to the second conductivity type semiconductor layer 3430b of the third LED stack 3430 through the third through-hole via 3270c. The first conductivity type semiconductor layers 3230a, 3330a, 3430a of the first to third LED stacks 3230, 3330, 3430 are commonly electrically connected to the electrode pad 3770d.

In this manner, a display apparatus according to an exemplary embodiment may be formed by bonding the electrode pads 3770a, 3770b, 3770c, 3770d of the substrate 3210 to the circuit board 3510 shown in FIG. 39. As described above, the circuit board 3510 may include an active circuit or a passive circuit, whereby the display apparatus can be driven in an active matrix manner or in a passive matrix manner.

Figure 52:
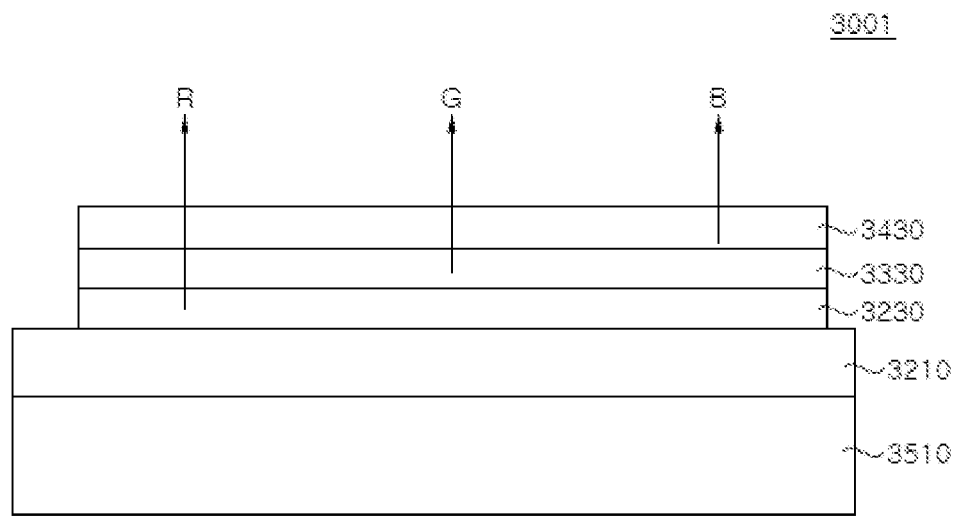
FIG. 52 is a schematic cross-sectional view of a light emitting diode pixel for a display according to another exemplary embodiment.

FIG. 52 is a cross-sectional view of a light emitting diode pixel for a display according to another exemplary embodiment.

Referring to FIG. 52, the light emitting diode pixel 3001 of the display apparatus according to an exemplary embodiment is generally similar to the light emitting diode pixel 3000 of the display apparatus of FIG. 40, except that the second LED stack 3330 covers most of the first LED stack 3230 and the third LED stack 3430 covers most of the second LED stack 3330. In this manner, light generated from the first subpixel R is emitted to the outside after substantially passing through the second LED stack 3330 and the third LED stack 3430, and light generated from the second LED stack 3330 is emitted to the outside after substantially passing through the third LED stack 3430.

The first LED stack 3230 may include an active layer having a narrower bandgap than the second LED stack 3330 and the third LED stack 3430 to emit light having a longer wavelength than the second LED stack 3330 and the third LED stack 3430, and the second LED stack 3330 may include an active layer having a narrower bandgap than the third LED stack 3430 to emit light having a longer wavelength than the third LED stack 3430.

Figure 53:
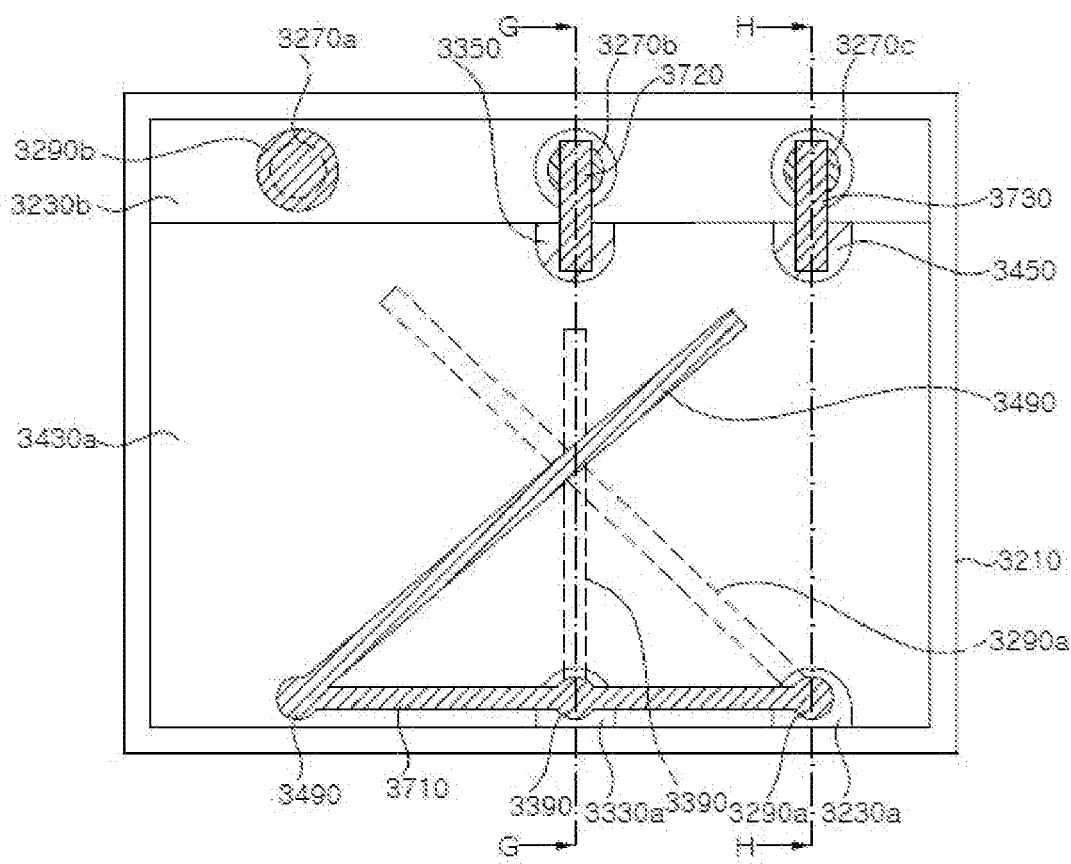
FIG. 53 is an enlarged top view of one pixel of a display apparatus according to an exemplary embodiment.
Figure 54A:
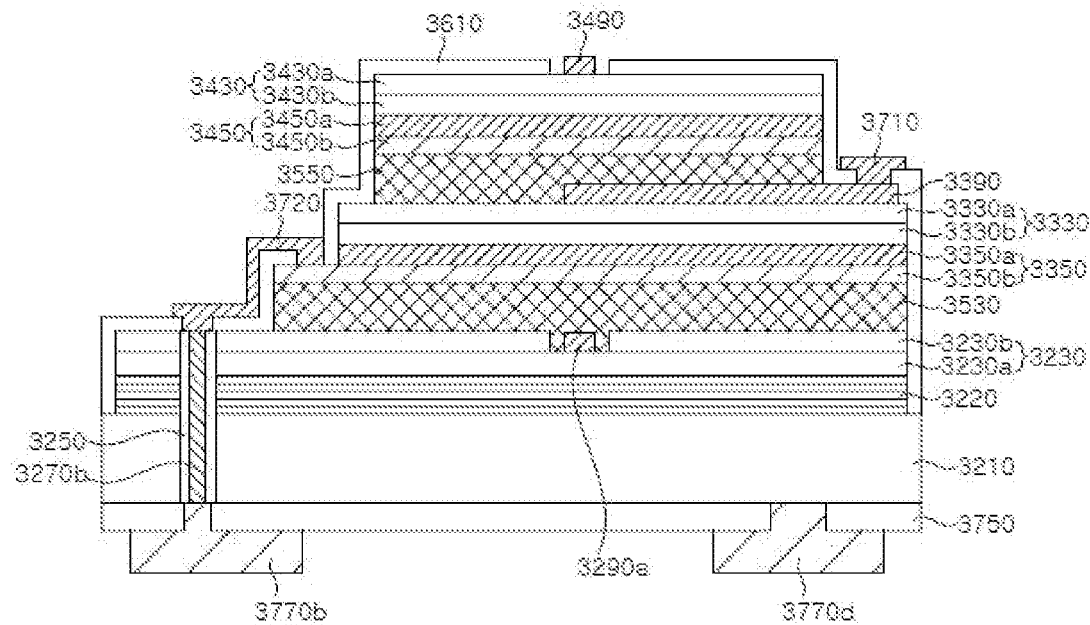
FIG. 54A and FIG. 54B are cross-sectional views taken along lines G-G and H-H of FIG. 53.
Figure 54B:
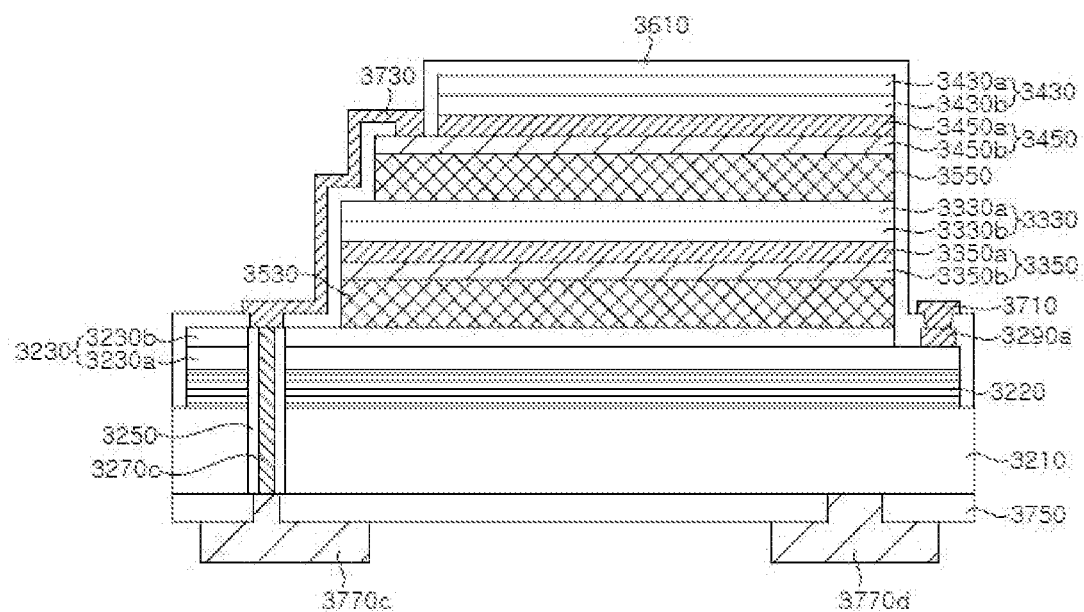

FIG. 53 is an enlarged top view of one pixel of a display apparatus according to an exemplary embodiment, and FIG. 54A and FIG. 54B are cross-sectional views taken along lines G-G and H-H of FIG. 53, respectively.

Referring to FIG. 53, FIG. 54A, and FIG. 54B, the pixel according to an exemplary embodiment is generally similar to the pixel of FIG. 42A, FIG. 42B, FIG. 43A, FIG. 43B, FIG. 43C, and FIG. 43D except that the second LED stack 3330 covers most of the first LED stack 3230 and the third LED stack 3430 covers most of the second LED stack 3330. The first to third through-hole vias 3270a, 3270b, 3270c may be disposed outside the second LED stack 3330 and the third LED stack 3430.

In addition, a portion of the first-1 ohmic electrode 3290a and a portion of the second-1 ohmic electrode 3390 may be disposed under the third LED stack 3430. As such, the first-1 ohmic electrode 3290a may be formed before the second LED stack 3330 is coupled to the first LED stack 3230, and the second-1 ohmic electrode 3390 may also be formed before the third LED stack 3430 is coupled to the second LED stack 3330.

Furthermore, light generated from the first LED stack 3230 is emitted to the outside after substantially passing through the second LED stack 3330 and the third LED stack 3430, and light generated from the second LED stack 3330 is emitted to the outside after substantially passing through the third LED stack 3430. Accordingly, the first bonding layer 3530 and the second bonding layer 3550 are formed of light transmissive materials, and the second-2 ohmic electrode 3350 and the third-2 ohmic electrode 3450 are composed of transparent conductive layers.

On the other hand, as shown in the drawings, an indentation may be formed on the third LED stack 3430 to expose the third-2 ohmic electrode 3450, and an indentation is continuously formed on the third LED stack 3430 and the second LED stack 3330 to expose the second-2 ohmic electrode 3350. The second-2 ohmic electrode 3350 and the third-2 ohmic electrode 3450 are electrically connected to the second through-hole via 3270b and the third through-hole via 3270c through the connectors 3720, 3730, respectively.

Furthermore, the indentation may be formed on the third LED stack 3430 to expose the second-1 ohmic electrode 3390 formed on the first conductivity type semiconductor layer 3330a of the second LED stack 3330, and the indentation may be continuously formed on the third LED stack 3430 and the second LED stack 3330 to expose the first-1 ohmic electrode 3290a formed on the first conductivity type semiconductor layer 3230a of the first LED stack 3230. The connector 3710 may connect the first-1 ohmic electrode 3290a and the second-1 ohmic electrode 3390 to the third-1 ohmic electrode 3490. The third-1 ohmic electrode 3490 may be formed together with the connector 3710 and may be connected to the pad regions of the first-1 ohmic electrode 3290a and the second-1 ohmic electrode 3390.

The first-1 ohmic electrode 3290a and the second-1 ohmic electrode 3390 are partially disposed under the third LED stack 3430, but the inventive concepts are not limited thereto. For example, the portions of the first-1 ohmic electrode 3290a and the second-1 ohmic electrode 3390 disposed under the third LED stack 3430 may be omitted. Furthermore, the second-1 ohmic electrode 3390 may be omitted and the connector 3710 may form ohmic contact with the first conductivity type semiconductor layer 3330a.

According to exemplary embodiments, a plurality of pixels may be formed at the wafer level through wafer bonding, and thus, the process of individually mounting light emitting diodes may be obviated or substantially reduced.

Furthermore, since the through-hole vias 3270a, 3270b, 3270c are formed in the substrate 3210 and used as current paths, the substrate 3210 may not need to be removed. Accordingly, a growth substrate used for growth of the first LED stack 3230 can be used as the substrate 3210 without being removed from the first LED stack 3230.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting module comprising:
   a circuit;
   a light source connected to the circuit, the light source including:
      a first light emitter configured to emit light of a first color,
      a second light emitter configured to emit light of a second color, and
      a third light emitter configured to emit light of a third color, the first, second, and third light emitters being vertically stacked;
   a plurality of vias electrically connected to the first, second, and third light emitters, each of the vias having a surface exposed from the light source for external connection and an opposite surface electrically connected to the light source, a part of the vias having an inclined portion; and
   a first passivation layer covering at least a part of the light source,
      wherein the light source has at least one mesa structure and at least one sidewall having a stepped structure,
      wherein the first passivation layer exposes the light source to permit light from the first, second, and third light emitters to be emitted from the light source, and
      wherein a distance between the surface and the opposite surface of each of the vias is substantially the same.

2. The light emitting module according to claim 1, wherein the first passivation layer comprises a polymer material.

3. The light emitting module according to claim 2, wherein the first passivation layer comprises at least one of polyimide and epoxy molding compound (EMC).

4. The light emitting module according to claim 1, wherein:

the first light emitter comprises a first transparent electrode and a first mesa structure, the first mesa structure having a first n-type semiconductor layer, a first active layer, and a first p-type semiconductor layer vertically stacked;

the second light emitter comprises a second transparent electrode and a second mesa structure, the second mesa structure having a second p-type semiconductor layer, a second active layer, and a second n-type semiconductor layer vertically stacked; and the third light emitter comprises a third transparent electrode and a third mesa structure, the third mesa structure having a third p-type semiconductor layer, a third active layer, and a third n-type semiconductor layer vertically stacked.

5. The light emitting module according to claim 4, further comprising:
a first thin film conductive pattern electrically coupled with the first n-type semiconductor layer;
a second thin film conductive pattern electrically coupled with the second n-type semiconductor layer;
a third thin film conductive pattern electrically coupled with the third n-type semiconductor layer; and
a fourth thin film conductive pattern electrically coupled with the first, second, and third p-type semiconductor layers.

6. The light emitting module according to claim 4, further comprising:
a first thin film conductive pattern electrically coupled with the first p-type semiconductor layer;
a second thin film conductive pattern electrically coupled with the second p-type semiconductor layer;
a third thin film conductive pattern electrically coupled with the third p-type semiconductor layer; and
a fourth thin film conductive pattern electrically coupled with the first, second, and third n-type semiconductor layers.

7. The light emitting module according to claim 4, wherein:
the third n-type semiconductor layer has an area smaller than the third transparent electrode and exposes a portion of the third transparent electrode;
the third transparent electrode has an area smaller than the second n-type semiconductor layer and exposes a portion of the second n-type semiconductor layer;
the second n-type semiconductor layer has an area smaller than the second transparent electrode and exposes a portion of the second transparent electrode;
the second transparent electrode has an area smaller than the first transparent electrode and exposes a portion of the first transparent electrode; and
the first transparent electrode has an area smaller than the first n-type semiconductor layer and exposes a portion of the first n-type semiconductor layer.

8. The light emitting module according to claim 7, wherein:
the portion of the third transparent electrode exposed by the third n-type semiconductor layer is thinner than the third transparent electrode covered by the third n-type semiconductor layer;
the portion of the second transparent electrode exposed by the second n-type semiconductor layer is thinner than the second transparent electrode covered by the second n-type semiconductor layer; and the portion of the first transparent electrode exposed by the second transparent electrode is thinner than the first transparent electrode covered by the second transparent electrode.

9. The light emitting module according to claim 7, further comprising:
a first conductive pattern disposed on the portion of the first n-type semiconductor layer exposed by the first transparent electrode and electrically coupled with the first n-type semiconductor layer;
a second conductive pattern, disposed on the portion of the first transparent electrode exposed by the second transparent electrode and on the portion of the second transparent electrode exposed by the second n-type semiconductor layer, and electrically coupled with the first and second transparent electrodes;
a third conductive pattern disposed on the portion of the second n-type semiconductor layer exposed by the third transparent electrode and electrically coupled with the second n-type semiconductor layer;
a fourth conductive pattern disposed on the portion of the third transparent electrode exposed by the third n-type semiconductor layer and electrically coupled with the third transparent electrode; and
a fifth conductive pattern disposed on the third n-type semiconductor layer and electrically coupled with the third n-type semiconductor layer.

10. The light emitting module according to claim 9, further comprising:
a first thin film conductive pattern electrically coupled with the first conductive pattern;
a second thin film conductive pattern electrically coupled with the second and fourth conductive patterns;
a third thin film conductive pattern electrically coupled with the third conductive pattern; and
a fourth thin film conductive pattern electrically coupled with the fifth conductive pattern.

11. The light emitting module according to claim 10, wherein:
the light source has a width that decreases from a top surface thereof,
the first n-type semiconductor layer comprises a first n-type extended semiconductor layer extending from a sidewall of the first mesa structure; and
each of the first, second, third, and fourth thin film conductive patterns extends from a top surface of the third light emitter to the first n-type extended semiconductor layer, covers the first n-type extended semiconductor layer, and includes a connector portion.

12. The light emitting module according to claim 11, wherein the vias comprise:
a first via contact passing through the first passivation layer and electrically coupled with the connector portion of the first thin film conductive pattern covering the first n-type extended semiconductor layer;
a second via contact passing through the first passivation layer and electrically coupled with the connector portion of the second thin film conductive pattern covering the first n-type extended semiconductor layer;
a third via contact passing through the first passivation layer and electrically coupled with the connector portion of the third thin film conductive pattern covering the first n-type extended semiconductor layer; and
a fourth via contact passing through the first passivation layer and electrically coupled with the connector portion of the fourth thin film conductive pattern covering the first n-type extended semiconductor layer.

13. The light emitting module according to claim 12, wherein each of the first, second, third, and fourth via contacts overlaps at least a portion of the first, second, and third active layers.

14. The light emitting module according to claim 12, wherein the first via contact overlaps with at least a portion of the first conductive pattern.

15. The light emitting module according to claim 12, further comprising a second passivation layer disposed on the first passivation layer and including fifth, sixth, seventh, and eighth via contacts configured to electrically communicate with the first, second, third, and fourth via contacts, respectively.

16. The light emitting module according to claim 12, further comprising a through-silicon via (TSV) substrate disposed on the first passivation layer, the TSV substrate comprising patterns that correspond to the first, second, third, and fourth via contacts, respectively.

17. The light emitting module according to claim 1, wherein the light source has an inclined sidewall.

18. The light emitting module according to claim 1, further comprising:
 a first color filter and a first bonding portion disposed between the first and second light emitters; and
 a second color filter and a second bonding portion disposed between the second and third light emitters.

19. The light emitting module according to claim 1, wherein the light source comprises a micro light emitting diode having a surface area less than about 10,000 square µm.

20. The light emitting module according to claim 1, wherein a bottom surface of the first passivation layer and a bottom surface of the first light emitter are disposed on substantially the same plane.

21. The light emitting module according to claim 1, wherein:
 the first light emitter is configured to emit one of red, green, or blue light;
 the second light emitter is configured to emit a different one of red, green, or blue light from the first light emitter and is stacked above the first light emitter; and
 the third light emitter is configured to emit a different one of red, green, or blue light from the first and second light emitters and is stacked above the second light emitter.

22. The light emitting module according to claim 21, wherein there are no color filters disposed between first and second light emitters and between the second and third light emitters.

* * * * *